US011942429B2

(12) United States Patent
Hinoue et al.

(10) Patent No.: US 11,942,429 B2
(45) Date of Patent: Mar. 26, 2024

(54) THREE-DIMENSIONAL MEMORY DEVICE AND METHOD OF MAKING THEREOF USING DOUBLE PITCH WORD LINE FORMATION

(71) Applicant: SANDISK TECHNOLOGIES LLC, Addison, TX (US)

(72) Inventors: Tatsuya Hinoue, Yokkaichi (JP); Naoki Takeguchi, Nagoya (JP); Masanori Tsutsumi, Yokkaichi (JP); Seiji Shimabukuro, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 278 days.

(21) Appl. No.: 17/351,811

(22) Filed: Jun. 18, 2021

(65) Prior Publication Data

US 2022/0406720 A1 Dec. 22, 2022

(51) Int. Cl.

*H01L 23/535* (2006.01)
*H01L 21/768* (2006.01)

(Continued)

(52) U.S. Cl.

CPC ...... *H01L 23/535* (2013.01); *H01L 21/76805* (2013.01); *H01L 21/76895* (2013.01);

(Continued)

(58) Field of Classification Search

CPC ............... H01L 23/535; H01L 23/5226; H01L 23/5329; H01L 21/76805; H01L 21/76895;

(Continued)

(56) References Cited

U.S. PATENT DOCUMENTS 8,349,681 B2 1/2013 Alsmeier et al.
9,252,151 B2 2/2016 Chien et al.

(Continued)

FOREIGN PATENT DOCUMENTS

CN 109326608 A 2/2019
WO WO2021-029916 A1 2/2021

OTHER PUBLICATIONS

ISR—Notification of Transmittal of The International Search Report and Written Opinion of the International Searching Authority for International Patent Application No. PCT/US2022/013971, dated Jun. 2, 2022, 17 pages.

(Continued)

*Primary Examiner* — Shahed Ahmed
*Assistant Examiner* — Vicki B. Booker
(74) *Attorney, Agent, or Firm* — THE MARBURY LAW GROUP PLLC

(57) ABSTRACT

A vertical repetition of multiple instances of a unit layer stack is formed over a substrate. The unit layer stack includes an insulating layer and a sacrificial material layer. Lateral recesses are formed by removing the sacrificial material layers selective to the insulating layers. Each lateral recess is sequentially fill with at least one conductive fill material and an insulating fill material, and vertically-extending portions of the at least one conductive fill material are removed such that a vertical layer stack including a first-type electrically conductive layer, a seamed insulating layer, and a second-type electrically conductive layer are formed in each lateral recess. Memory opening fill structures including a respective vertical stack of memory elements is formed through the insulating layers and the layer stacks. Memory openings, contact via cavities, or backside trenches may be used as access points for removing the sacrificial material layers.

14 Claims, 109 Drawing Sheets

(51) Int. Cl.

| | |
|---|---|
| ***H01L 23/522*** | (2006.01) |
| ***H01L 23/532*** | (2006.01) |
| ***H10B 41/27*** | (2023.01) |
| ***H10B 43/27*** | (2023.01) |

(52) U.S. Cl.
CPC ...... *H01L 23/5226* (2013.01); *H01L 23/5329* (2013.01); *H10B 41/27* (2023.02); *H10B 43/27* (2023.02)

(58) Field of Classification Search
CPC ... H01L 29/40117; H10B 41/27; H10B 43/10; H10B 43/27; H10B 43/50
See application file for complete search history.

(56) References Cited

U.S. PATENT DOCUMENTS

| | | | | |
|---|---|---|---|---|
| 9,576,975 | B2 | 2/2017 | Zhang et al. | |
| 9,716,105 | B1 | 7/2017 | Tsutsumi | |
| 9,922,987 | B1 | 3/2018 | Mizutani et al. | |
| 9,960,181 | B1 | 5/2018 | Cui et al. | |
| 9,972,640 | B1 | 5/2018 | Kai et al. | |
| 10,083,982 | B2 | 9/2018 | Shigemura et al. | |
| 10,192,784 | B1 | 1/2019 | Cui et al. | |
| 10,256,247 | B1 | 4/2019 | Kanakamedala et al. | |
| 10,290,648 | B1 | 5/2019 | Zhou et al. | |
| 10,347,654 | B1 | 7/2019 | Iwai et al. | |
| 10,453,854 | B2 | 10/2019 | Kanno et al. | |
| 10,461,163 | B2 | 10/2019 | Kanakamedala et al. | |
| 10,608,010 | B2 | 3/2020 | Terasawa et al. | |
| 10,615,172 | B2 | 4/2020 | Nagata et al. | |
| 10,651,196 | B1 | 5/2020 | Sharangpani et al. | |
| 10,700,089 | B1 | 6/2020 | Hojo et al. | |
| 10,707,233 | B1 | 7/2020 | Cui et al. | |
| 10,818,542 | B2 | 10/2020 | Cui et al. | |
| 10,923,498 | B2 | 2/2021 | Otsu et al. | |
| 2012/0001249 | A1 | 1/2012 | Alsmeier et al. | |
| 2015/0008505 | A1 | 1/2015 | Chien et al. | |
| 2015/0294980 | A1* | 10/2015 | Lee | H10B 43/27 438/591 |
| 2015/0380431 | A1* | 12/2015 | Kanamori | H10B 43/35 257/324 |
| 2016/0086972 | A1 | 3/2016 | Zhang et al. | |
| 2017/0125538 | A1 | 5/2017 | Sharangpani et al. | |
| 2018/0138194 | A1 | 5/2018 | Shigemura et al. | |
| 2019/0148392 | A1 | 5/2019 | Kanno et al. | |
| 2019/0148506 | A1 | 5/2019 | Kanakamedala et al. | |
| 2019/0280001 | A1 | 9/2019 | Terasawa et al. | |
| 2019/0348435 | A1 | 11/2019 | Nagata et al. | |
| 2021/0091106 | A1 | 3/2021 | Wang et al. | |

OTHER PUBLICATIONS

Endoh et al., "Novel Ultra High Density Memory with a Stacked-Surrounding Gate Transistor (S-SGT) Structured Cell," IEDM Proc. (2001) 33-36.

U.S. Appl. No. 16/916,476, filed Jun. 30, 2020, SanDisk Technologies LLC.

U.S. Appl. No. 16/918,463, filed Jul. 1, 2020, SanDisk Technologies LLC.

U.S. Appl. No. 16/918,493, filed Jul. 1, 2020, SanDisk Technologies LLC.

U.S. Appl. No. 16/934,445, filed Jul. 21, 2020, SanDisk Technologies LLC.

U.S. Appl. No. 17/081,458, filed Oct. 27, 2020, SanDisk Technologies LLC.

U.S. Appl. No. 17/169,987, filed Feb. 8, 2021, SanDisk Technologies LLC.

U.S. Appl. No. 17/189,153, filed Mar. 1, 2021, SanDisk Technologies LLC.

U.S. Appl. No. 17/192,463, filed Mar. 4, 2021, SanDisk Technologies LLC.

U.S. Appl. No. 17/233,799, filed Apr. 19, 2021, SanDisk Technologies LLC.

U.S. Appl. No. 17/351,756, filed Jun. 18, 2021, SanDisk Technologies LLC.

U.S. Appl. No. 17/351,789, filed Jun. 18, 2021, SanDisk Technologies LLC.

* cited by examiner

THREE-DIMENSIONAL MEMORY DEVICE AND METHOD OF MAKING THEREOF USING DOUBLE PITCH WORD LINE FORMATION

FIELD

The present disclosure relates generally to the field of semiconductor devices, and particularly to a three-dimensional memory device and method of making thereof using double pitch word line formation.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: a vertical repetition of multiple instances of a unit layer stack, wherein the unit layer stack comprises, from bottom to top, a seamless insulating layer that is free of any seam therein, a first-type electrically conductive layer, a seamed insulating layer including a horizontally-extending seam therein, and a second-type electrically conductive layer; memory openings vertically extending through the vertical repetition; and memory opening fill structures located within the memory openings, wherein each of the memory opening fill structures comprises a respective vertical stack of memory elements.

According to another aspect of the present disclosure, a method of forming a three-dimensional memory device is provided, which comprises: forming a vertical repetition of multiple instances of a unit layer stack over a substrate, wherein the unit layer stack comprises an insulating layer and a sacrificial material layer; forming memory openings vertically extending through the vertical repetition; removing the sacrificial material layers selective to the insulating layers by introducing an isotropic etchant that etches a material of the sacrificial material layers selective to a material of the insulating layers into the memory openings, whereby lateral recesses are formed in volumes from which the sacrificial material layers are removed; depositing at least one conductive fill material at peripheral portions of the lateral recesses; depositing an insulating fill material over the at least one conductive fill material within remaining volumes of the lateral recesses; removing peripheral portions of the insulating fill material from inside the memory openings; and forming memory opening fill structures within volumes of the memory openings, wherein each of the memory opening fill structures comprises a respective vertical stack of memory elements.

According to yet another aspect of the present disclosure, a three-dimensional memory device is provided, which comprises: a vertical repetition of multiple instances of a unit layer stack, wherein the unit layer stack comprises, from bottom to top, a first-type insulating layer, a first-type electrically conductive layer, a second-type insulating layer, and a second-type electrically conductive layer; memory openings vertically extending through the vertical repetition; memory opening fill structures located within the memory openings, wherein each of the memory opening fill structures comprises a respective vertical stack of memory elements; and a laterally insulated contact structure comprising: a tubular contact via structure vertically extending through at least one instance of the unit layer stack and contacting an annular top surface of the second-type electrically conductive layer in an underlying instance of the unit layer stack; and a cylindrical contact via structure laterally surrounded by the tubular contact via structure and contacting an annular top surface of the first-type electrically conductive layer in the underlying instance of the unit layer stack.

According to still another aspect of the present disclosure, a method of forming a three-dimensional memory device is provided, which comprises: forming a vertical repetition of multiple instances of a unit layer stack over a substrate, wherein the unit layer stack comprises an insulating layer and a sacrificial material layer; forming sacrificial memory opening fill structures vertically extending through the vertical repetition; forming contact via cavities having different depths through the vertical repetition, wherein a surface of a respective sacrificial material layer of the sacrificial material layers is physically exposed at a bottom of each of the contact via cavities; removing the sacrificial material layers selective to the insulating layers by isotropically etching a material of the sacrificial material layers selective to a material of the insulating layers, whereby lateral recesses are formed in volumes from which the sacrificial material layers are removed; depositing at least one conductive fill material at peripheral portions of the lateral recesses and the contact via cavities; depositing an insulating fill material over the at least one conductive fill material within remaining volumes of the lateral recesses and the contact via cavities; forming memory cavities by removing the sacrificial memory opening fill structures; removing proximal portions of the at least one conductive fill material from around the memory cavities; and forming memory opening fill structures within volumes of the memory cavities and additional volumes of voids formed by removal of the proximal portions of the at least one conductive fill material, wherein each of the memory opening fill structures comprises a vertical repetition of memory elements.

According to even another aspect of the present disclosure, a three-dimensional memory device is provided, which comprises: a vertical repetition of multiple instances of a unit layer stack, wherein the unit layer stack comprises, from bottom to top, a first-type insulating layer, a first-type electrically conductive layer comprising a first conductive barrier liner and a first conductive fill material layer, a second-type insulating layer, and a second-type electrically conductive layer comprising a second conductive fill material layer and a second conductive barrier liner; memory openings vertically extending through the vertical repetition; and memory opening fill structures located within the memory openings, wherein each of the memory opening fill structures comprises a respective vertical stack of memory elements. The first conductive fill material layer and the second conductive fill material layer are in direct contact with horizontal surfaces of the second-type insulating layer. The first conductive barrier liner is in direct contact with a horizontal surface of the first-type insulating layer. The second conductive barrier liner is in direct contact with a horizontal surface of another first-type insulating layer of an adjacent unit layer stack.

According to further another aspect of the present disclosure, a method of forming a three-dimensional memory device is provided, which comprises: forming a vertical repetition of multiple instances of a unit layer stack over a substrate, wherein the unit layer stack comprises an insulating layer and a sacrificial material layer; forming memory openings vertically extending through the vertical repetition; forming sacrificial memory opening fill structures within the memory openings; forming backside trenches through the vertical repetition; removing the sacrificial material layers selective to the insulating layers through the backside trenches, whereby lateral recesses are formed in volumes from which the sacrificial material layers are removed, and wherein the lateral recesses laterally surround remaining portions of the sacrificial memory opening fill structures; depositing at least one conductive fill material at peripheral portions of the lateral recesses; depositing an insulating fill material over the at least one conductive fill material within remaining volumes of the lateral recesses; removing the sacrificial memory opening fill structures; removing proximal portions of the at least one conductive fill material from around memory cavities formed by removal of the sacrificial memory opening fill structures, wherein voids are formed within volumes of the memory openings; and forming memory opening fill structures within volumes of the memory openings, wherein each of the memory opening fill structures comprises a respective vertical stack of memory elements.

DETAILED DESCRIPTION

Figure 1:
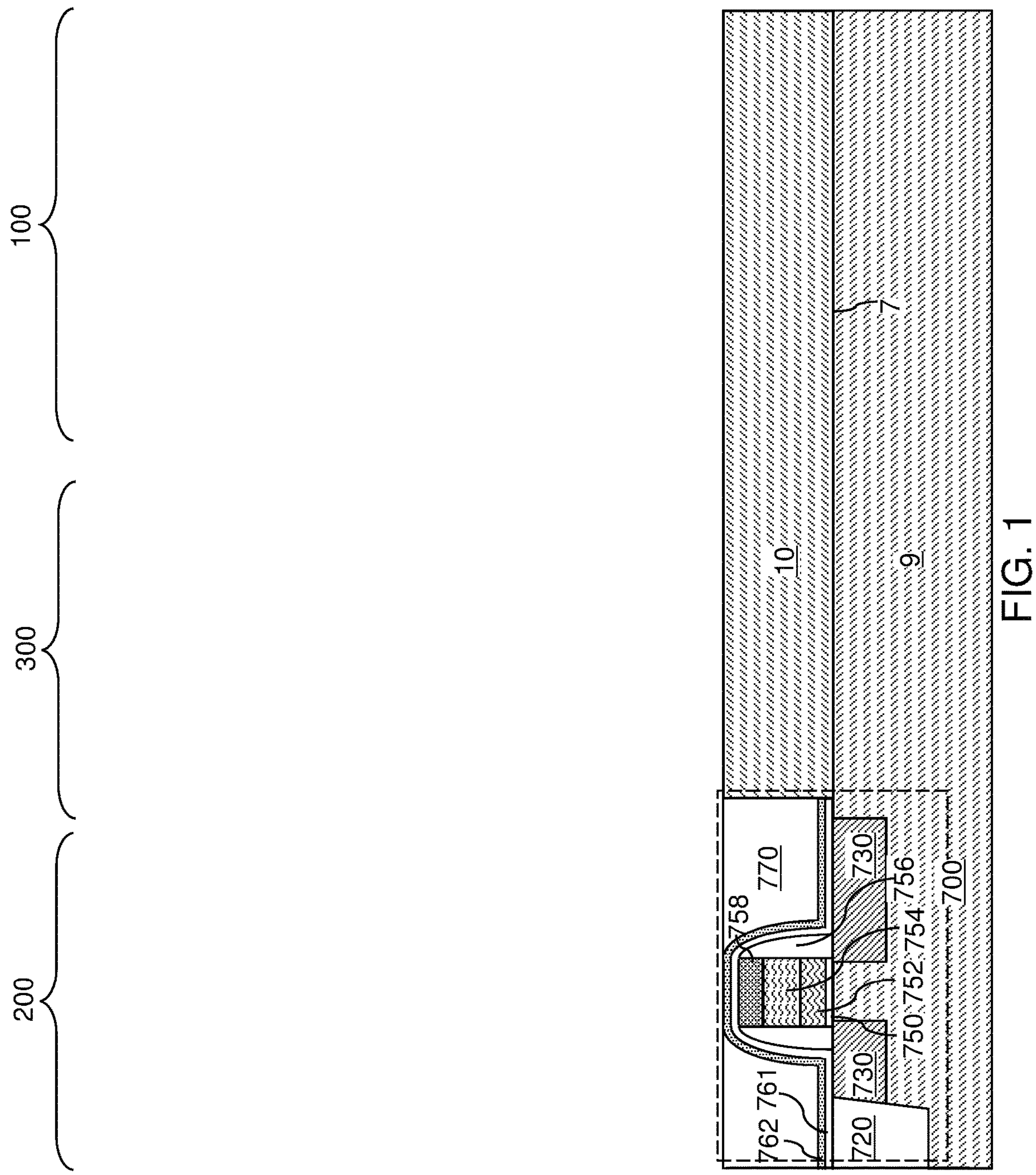
FIG. 1 is a schematic vertical cross-sectional view of a first exemplary structure after formation of at least one peripheral device, a semiconductor material layer, and a gate dielectric layer according to a first embodiment of the present disclosure.

As discussed above, the embodiments of the present disclosure are directed to three-dimensional memory devices and methods of making thereof using double pitch word line formation, the various aspects of which are described below. The sacrificial material layers are thicker than insulating layers in the stack of sacrificial material layers and insulating layers. When the sacrificial layers are removed from the stack, the resulting recesses are wider than if the sacrificial material layers had the same thickness as the insulating layers. Therefore, it is easier to deposit word lines into the wider recesses. Two word lines may be deposited into each recess followed by depositing an insulating layer into the gap between the word lines. Thus, the double pitch word line formation with the wider recesses may reduce or overcome material clogging in the recesses between memory openings which leads to incomplete filling of the recesses by the word lines, without increasing the total height of the stack.

The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, a first exemplary structure according to a first embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "conductive material" refers to a conductive material including at least one conductive element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
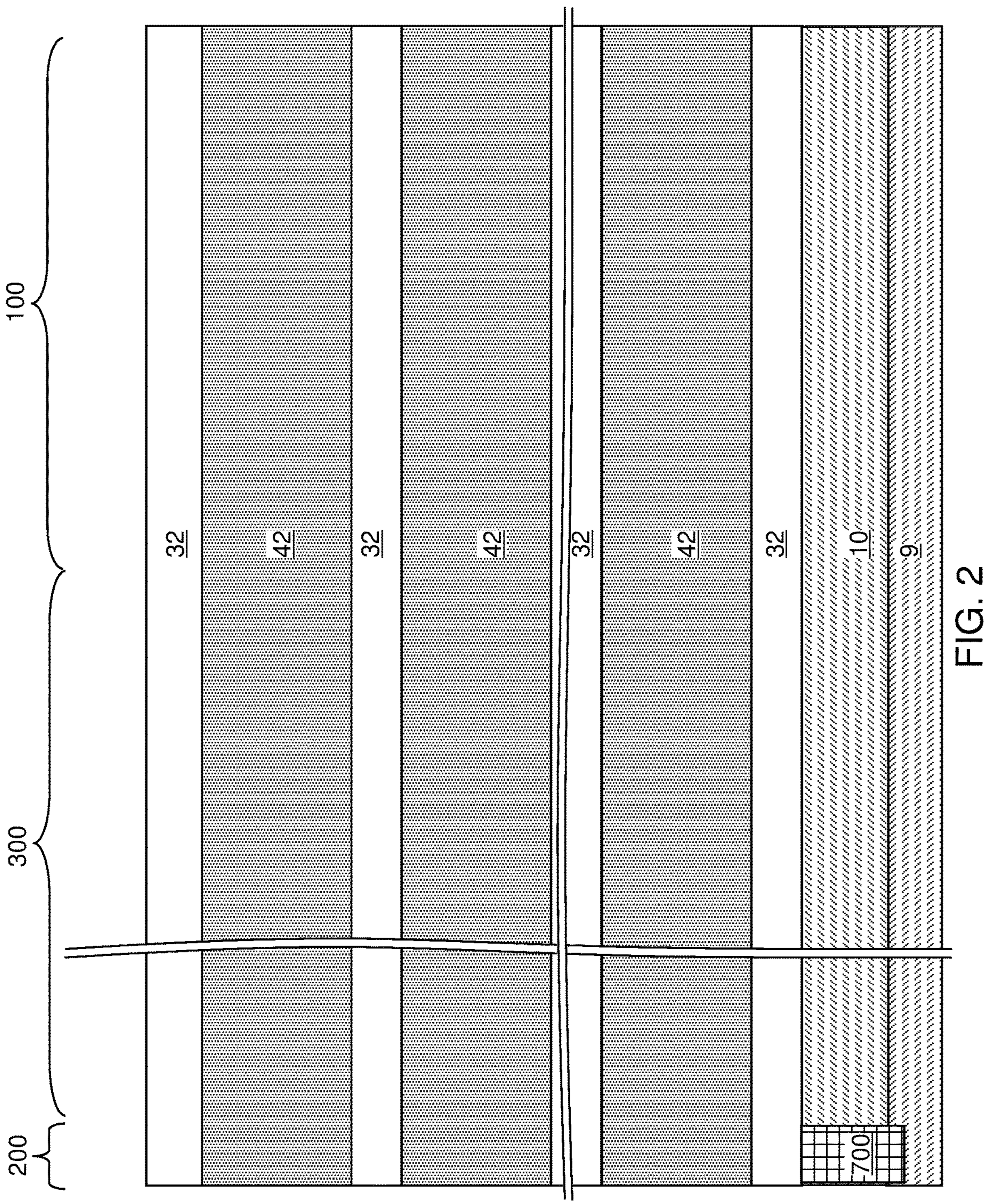
FIG. 2 is a schematic vertical cross-sectional view of the first exemplary structure after formation of a vertical repetition of a unit layer stack according to the first embodiment of the present disclosure.

Referring to FIG. 2, a vertical repetition of a unit layer stack (32, 42) can be formed over the semiconductor material layer 10. Multiple instances of the unit layer stack (32, 42) are repeated along the vertical direction. In one embodiment, the vertical repetition of the unit layer stack (32, 42) may comprise a periodic vertical repetition along the vertical direction, in which each unit layer stack (32, 42) has a same structure and a same set of material compositions. In one embodiment, each instance of the unit layer stack (32, 42) may include a first-type insulating layer 32 and a sacrificial material layer 42.

The first-type insulating layer 32 is an insulating layer that includes, and/or consists essentially of, a first insulating material such as undoped silicate glass (i.e., silicon oxide). The first-type insulating layer 32 can be free of any seam therein. The first-type insulating layers 32 may be deposited, for example, by chemical vapor deposition. The thickness of each first-type insulating layer 32 can be in a range from 15 nm to 50 nm, although lesser and greater thicknesses may also be employed.

The sacrificial material layers 42 includes a sacrificial material that can be removed selective to the material of the first-type insulating layers 32. For example, the sacrificial material layers 42 can include silicon nitride. The sacrificial material layers 42 may be deposited, for example, by chemical vapor deposition. The thickness of each sacrificial material layer 42 can be in a range from 45 nm to 150 nm, although lesser and greater thicknesses may also be employed. Generally, the thickness of the sacrificial material layers 42 may be greater than the thickness of insulating layers 32 by a factor in a range from 2 to 6.

The total number of repetitions of a pair of a first-type insulating layer 32 and a sacrificial material layer 42 can be in a range from 8 to 1,024, such as from 64 to 256, although lesser and greater total number of repetitions may also be employed. A topmost first-type insulating layer 32 may be formed at the top of the vertically repetition of the first-type insulating layers 32 and the sacrificial material layers 42. Generally, a vertical repetition of multiple instances of a unit layer stack (32, 42) can be formed over a substrate (9, 10). The unit layer stack (32, 42) comprises a first-type insulating layer 32 and a sacrificial material layer 42.

Figure 3:
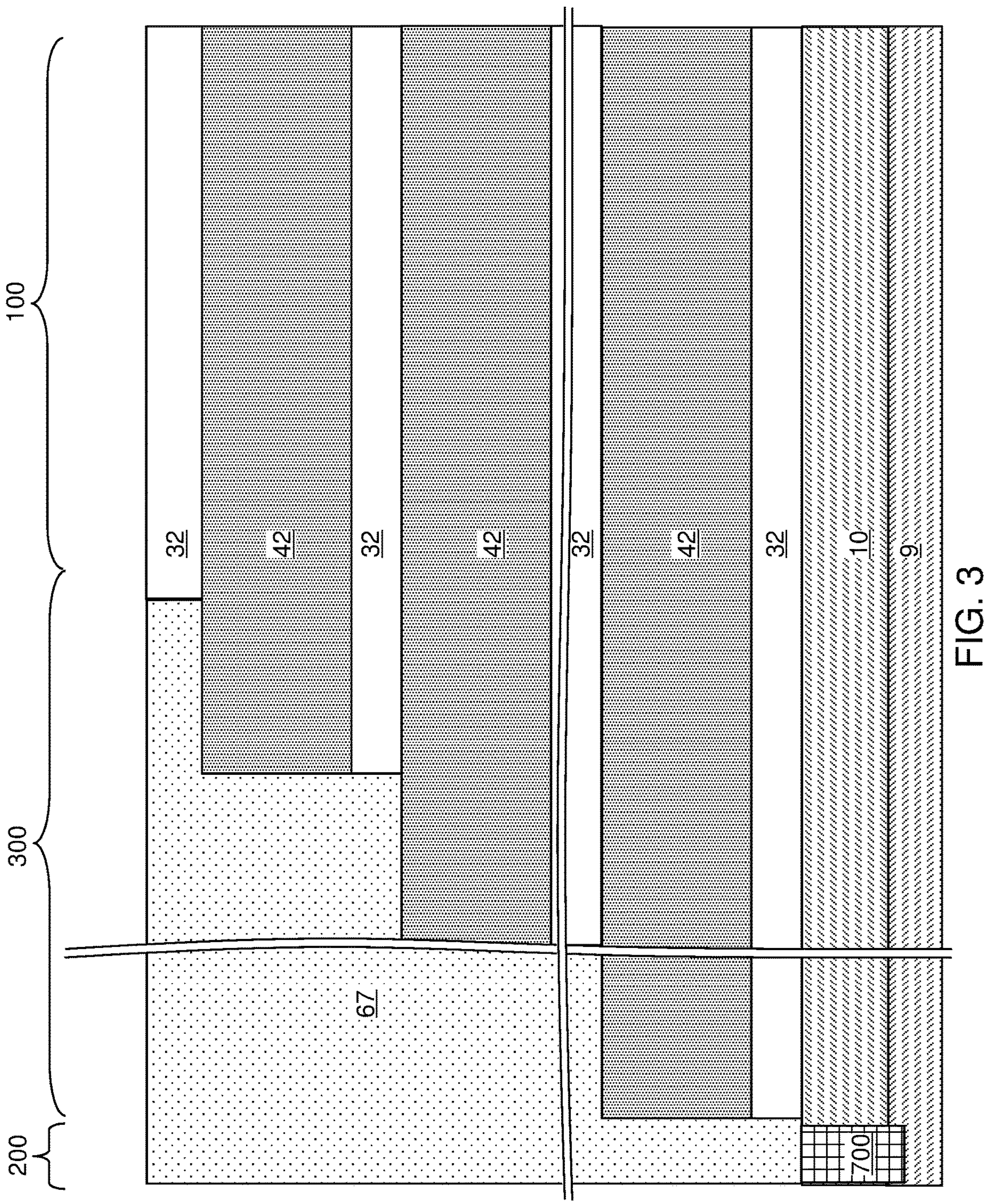
FIG. 3 is a schematic vertical cross-sectional view of the first exemplary structure after formation of stepped terraces and a sacrificial retro-stepped dielectric material portion according to the first embodiment of the present disclosure.

Referring to FIG. 3, stepped surfaces can be formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertical repetition (32, 42) are removed through formation of the stepped surfaces. A "stepped cavity" refers to a cavity having stepped surfaces.

The contact region 300 can be located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the vertical repetition (32, 42) laterally extends farther than any overlying sacrificial material layer 42 within the vertical repetition (32, 42) in the terrace region. The terrace region includes stepped surfaces of the vertical repetition (32, 42) that continuously extend from a bottommost layer within the vertical repetition (32, 42) to a topmost layer within the vertical repetition (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A sacrificial retro-stepped dielectric material portion 67 (i.e., an insulating fill material portion) can be formed in the stepped cavity by deposition of a sacrificial material that can provide an etch rate that is at least 100 times the etch rate of the first-type insulating layers 32. For example, if the first-type insulating layers 32 include undoped silicate glass, then organosilicate glass or borosilicate glass that provide an etch rate in dilute hydrofluoric acid that is at least 100 times the etch rate of undoped silicate glass in dilute hydrofluoric acid can be employed as the material of the sacrificial retro-stepped dielectric material portion 67. Excess portions of the deposited dielectric material can be removed from above the top surface of the topmost first-type insulating layer 32, for example, by chemical mechanical planarization (CMP). The remaining portion of the deposited dielectric material filling the stepped cavity constitutes the sacrificial retro-stepped dielectric material portion 67. As used herein, a "retro-stepped" element refers to an element that has stepped surfaces and a horizontal cross-sectional area that increases monotonically as a function of a vertical distance from a top surface of a substrate on which the element is present.

Generally, stepped surfaces can be formed by patterning the vertical repetition in a staircase region which is located in the contact region 300. The stepped surfaces comprise vertically-extending surfaces including a sidewall of a respective instance of the unit layer stack (32, 42) that extends vertically from a bottommost surface of the respective instance of the unit layer stack (32, 42), such as a bottom surface of a first-type insulating layer 32, to a topmost surface of the respective instance of the unit layer stack (32, 42), such as a top surface of a sacrificial material layer 42. A sacrificial retro-stepped dielectric material portion 67 is formed over the stepped surfaces.

Figure 4A:
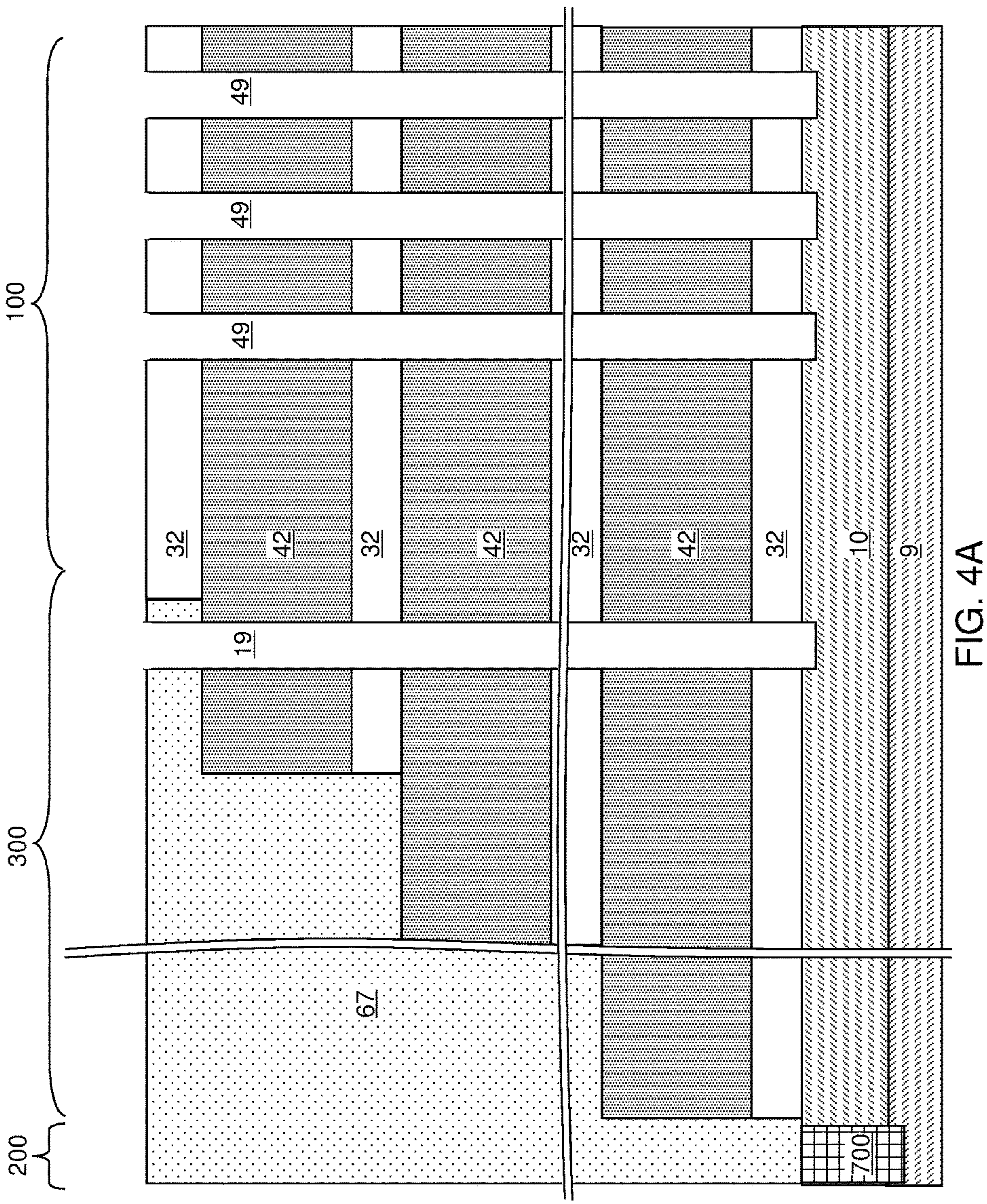
FIG. 4A is a schematic vertical cross-sectional view of the first exemplary structure after formation of memory openings and support openings according to the first embodiment of the present disclosure.
Figure 4B:
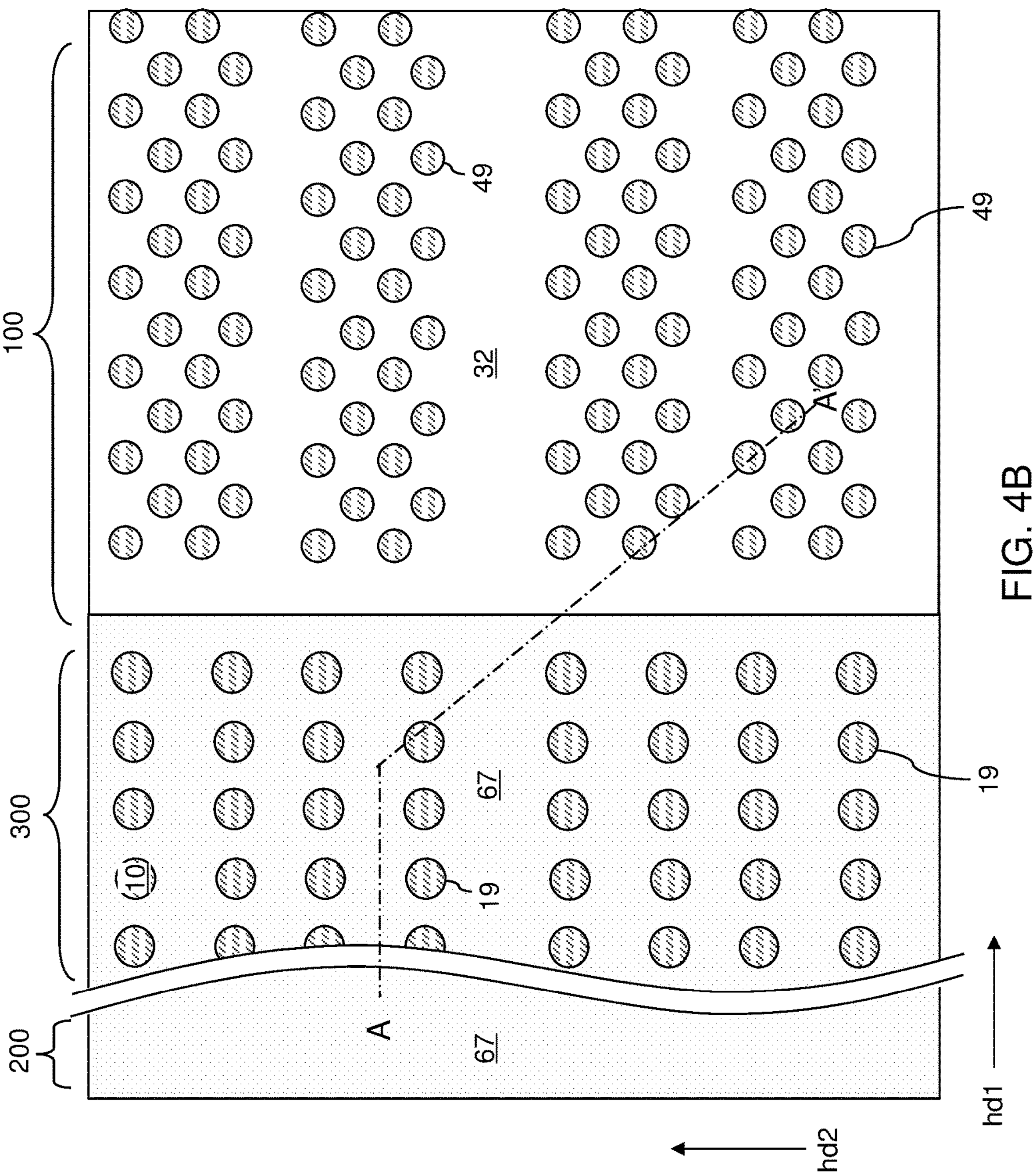
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost first-type insulating layer 32 and the sacrificial retro-stepped dielectric material portion 67, and can be lithographically patterned to form openings therein. The openings include a first set of openings formed over the memory array region 100 and a second set of openings formed over the contact region 300. The pattern in the lithographic material stack can be transferred through the topmost first-type insulating layer 32 or the sacrificial retro-stepped dielectric material portion 67, and through the vertical repetition (32, 42) by at least one anisotropic etch that employs the patterned lithographic material stack as an etch mask. Portions of the vertical repetition (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost first-type insulating layer 32 and the entirety of the vertical repetition (32, 42) in the memory array region 100. The support openings 19 are formed through the sacrificial retro-stepped dielectric material portion 67 and the portion of the vertical repetition (32, 42) that underlie the stepped surfaces in the contact region 300.

The memory openings 49 extend through the entirety of the vertical repetition (32, 42). The support openings 19 extend through a subset of layers within the vertical repetition (32, 42). The chemistry of the anisotropic etch process employed to etch through the materials of the vertical repetition (32, 42) can alternate to optimize etching of the first and second materials in the vertical repetition (32, 42).

The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the vertical repetition (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 5:
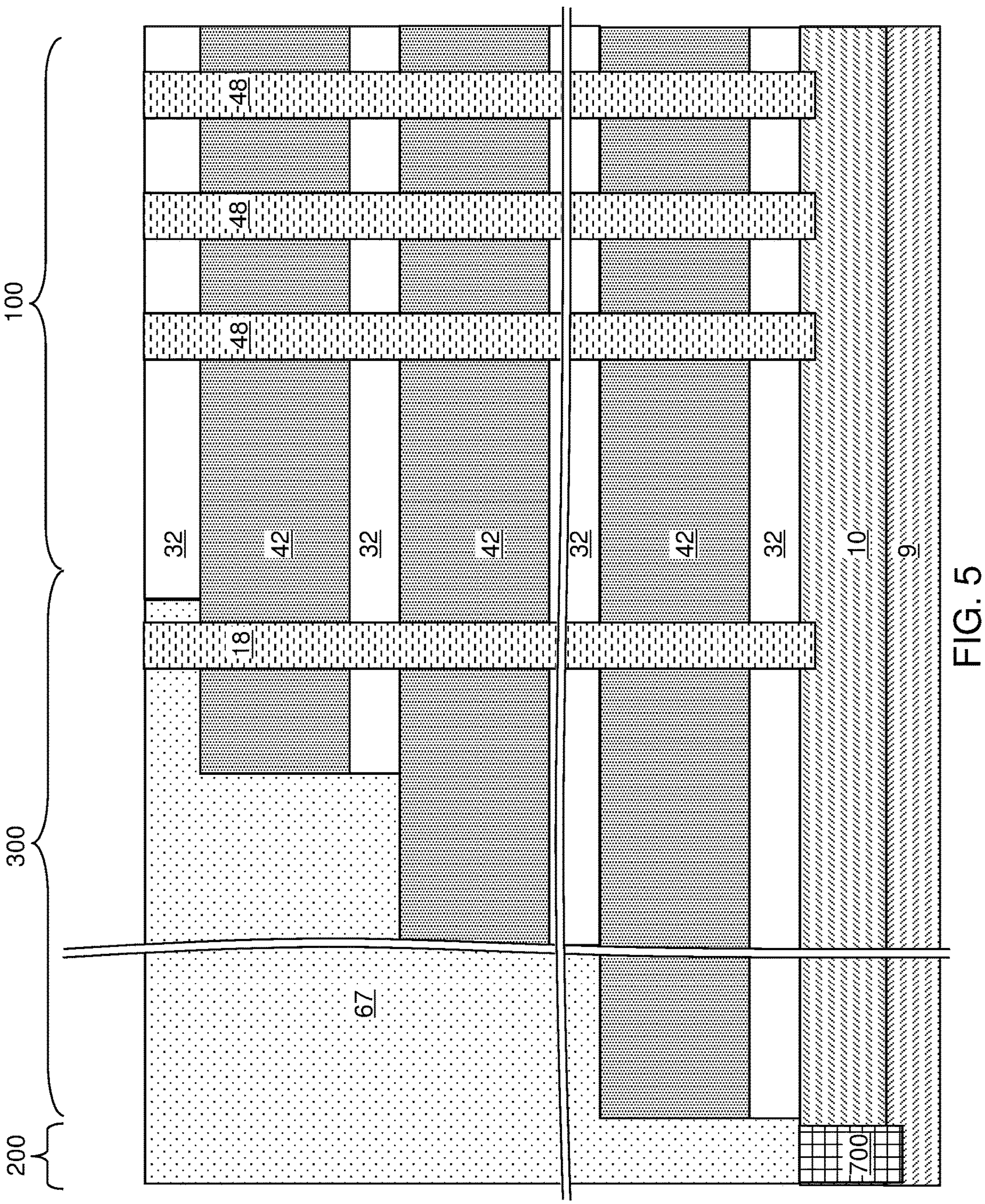
FIG. 5 is a schematic vertical cross-sectional view of the first exemplary structure after formation of sacrificial memory opening fill structures and sacrificial support opening fill structures according to the first embodiment of the present disclosure.

Referring to FIG. 5, a first sacrificial fill material that is different from the materials of the first-type insulating layers 32 and the sacrificial material layers 42 can be deposited in the memory openings 49 and the support openings 19. The first sacrificial fill material may include, for example, amorphous silicon, amorphous carbon, diamond-like carbon, germanium, or silicon-germanium. Excess portions of the first sacrificial fill material can be removed from the horizontal plane including the top surface of the topmost first-type insulating layer 32. Each remaining portion of the first sacrificial fill material located in a memory opening 49 constitutes a sacrificial memory opening fill structure 48. Each remaining portion of the first sacrificial fill material located in a support opening 19 constitutes a sacrificial support opening fill structure 18.

Figure 6A:
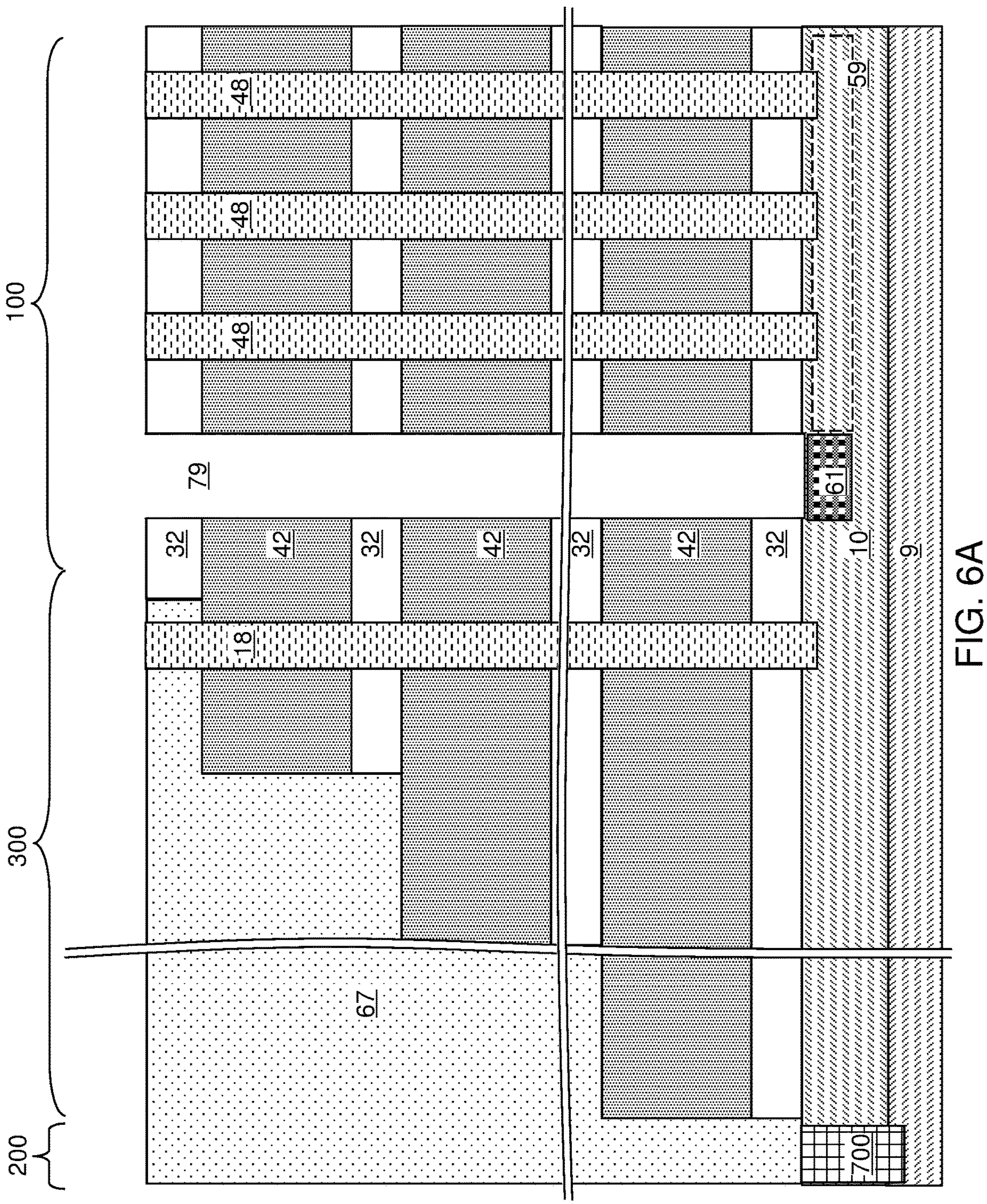
FIG. 6A is a schematic vertical cross-sectional view of the first exemplary structure after formation of backside trenches according to the first embodiment of the present disclosure.
Figure 6B:
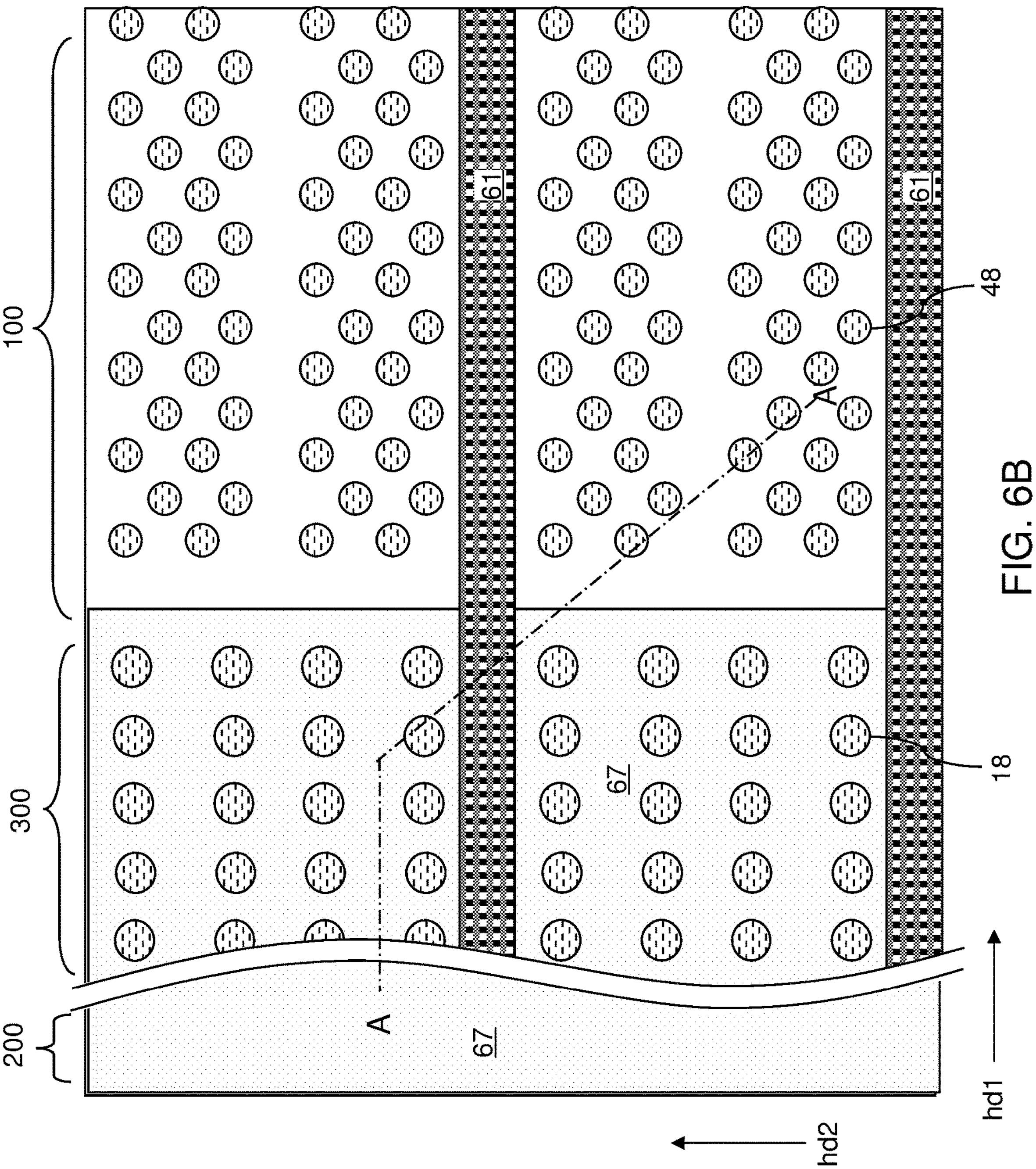
FIG. 6B is a partial see-through top-down view of the first exemplary structure of FIG. 6A. The vertical plane A-A' is the plane of the schematic vertical cross-sectional view of FIG. 6A.

Referring to FIGS. 6A and 6B, a photoresist layer (not shown) can be applied over the vertical repetition (32, 42), the sacrificial retro-stepped dielectric material portion 67, the sacrificial memory opening fill structures 48, and the sacrificial support opening fill structures 18, and can be lithographically patterned to form elongated openings in areas between clusters of the sacrificial memory opening fill structures 48. The pattern in the photoresist layer can be transferred through vertical repetition (32, 42) and/or the sacrificial retro-stepped dielectric material portion 67 employing an anisotropic etch to form backside trenches 79, which vertically extend from the top surface of the topmost first-type insulating layer 32 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other long a second horizontal direction (e.g., bit line direction) hd2 that is perpendicular to the first horizontal direction hd1. The sacrificial memory opening fill structures 58 can be arranged in rows that extend along the first horizontal direction hd1. Each backside trench 79 can have a uniform width that is invariant along the lengthwise direction (i.e., along the first horizontal direction hd1). Multiple rows of sacrificial memory opening fill structures 48 can be located between a neighboring pair of backside trenches 79. The photoresist layer can be removed, for example, by ashing.

An optional source region 61 can be formed at a surface portion of the semiconductor material layer 10 under each backside trench 79 by implantation of electrical dopants into physically exposed surface portions of the semiconductor material layer 10. In one embodiment, the semiconductor material layer 10 may have a doping of the first conductivity type, and the source regions 61 may have a doping of a second conductivity type that is the opposite of the first conductivity type. A horizontal semiconductor channel 59 can be formed between each source region 61 and bottom surfaces of an adjacent set of sacrificial memory opening fill structures 48.

Figure 7A:
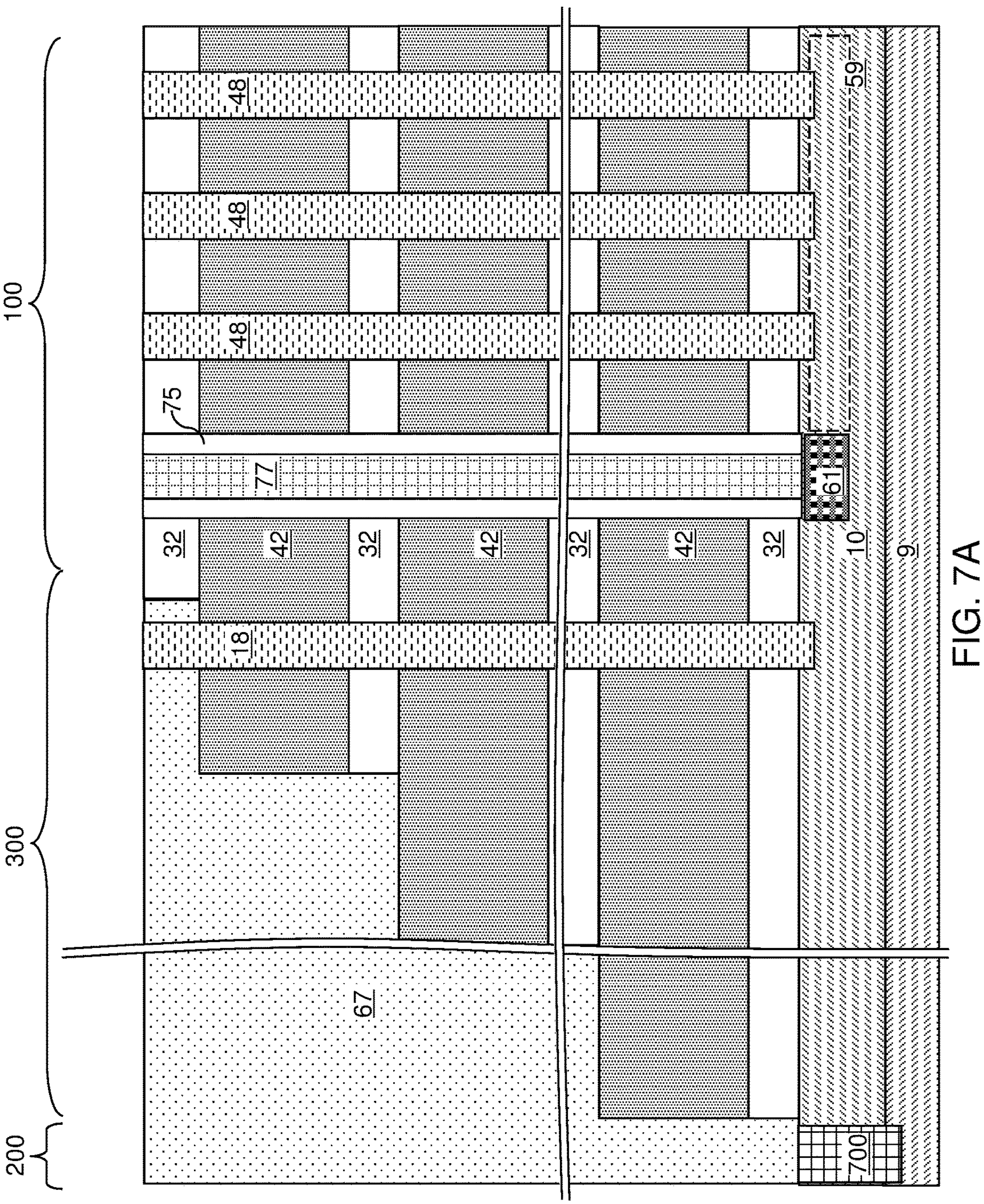
FIG. 7A is a schematic vertical cross-sectional view of the first exemplary structure after formation of sacrificial backside trench fill structures according to the first embodiment of the present disclosure.
Figure 7B:
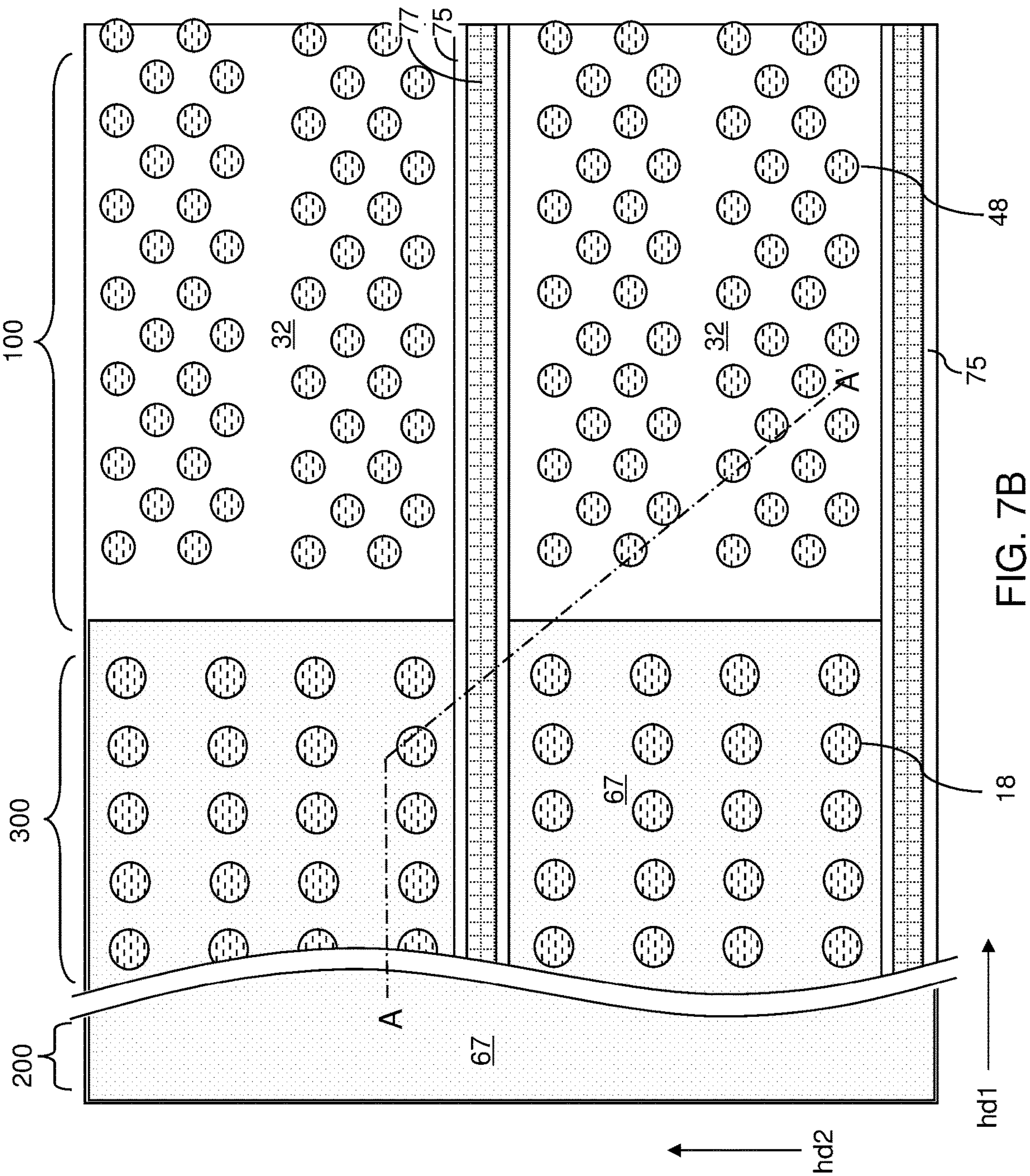
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, an optional etch-stop spacer 75 may be formed at the periphery of each backside trench 79 by conformally depositing and anisotropically etching an etch-stop material. The etch-stop material comprises a material that is different from the material of the sacrificial material layers 42. For example, the optional etch stop spacer 75 may include silicon oxide. The thickness of each etch-stop spacer 75, as measured between an inner sidewall and an outer sidewall, can be in a range from 5 nm to 100 nm, such as from 10 nm to 50 nm, although lesser and greater thicknesses may also be employed.

A second sacrificial fill material can be deposited in remaining volumes of the backside trenches 79. The second sacrificial fill material can include any material that may be employed for the first sacrificial fill material. The second sacrificial fill material is preferably different from the first sacrificial fill material of the sacrificial memory opening fill structures 48 and the sacrificial support opening fill structure 18. Excess portions of the second sacrificial fill material can be removed from above the horizontal plane including the top surface of the topmost first-type insulating layers 32 by a planarization process, which may employ a chemical mechanical polishing (CMP) process and/or a recess etch process. Each remaining portion of the second sacrificial fill material located within a respective one of the backside trenches 79 constitutes a sacrificial trench fill material portion 77. In one embodiment, the sacrificial trench fill material portion 77 may comprise a carbon material. The optional etch-stop spacer 75 and the sacrificial trench fill material portion 77 located within a backside trench 79 are collectively referred to as a sacrificial backside trench fill structure (75, 77).

Figure 8:
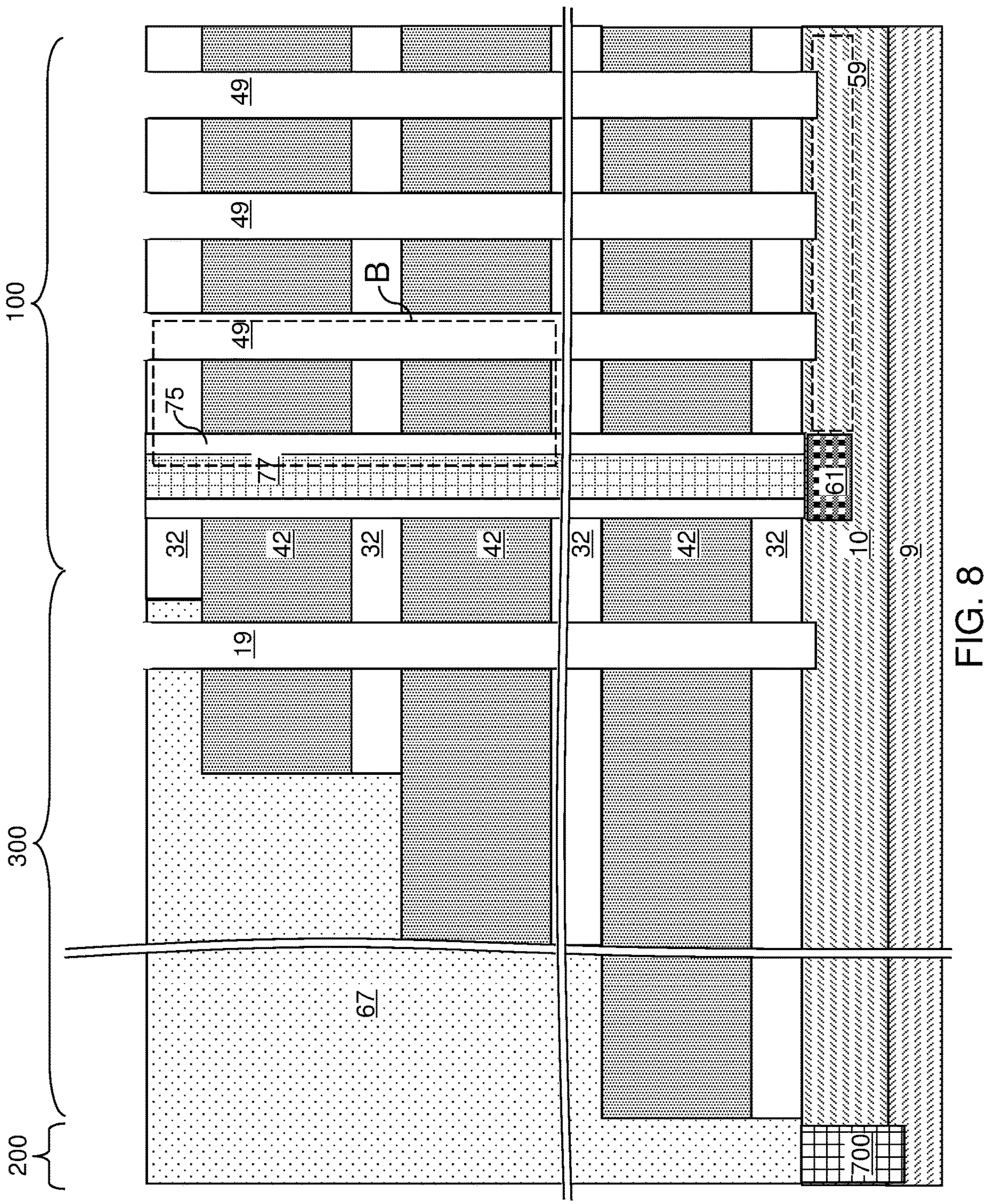
FIG. 8 is a schematic vertical cross-sectional view of the first exemplary structure after formation of voids within the volumes of the memory openings and the support openings according to the first embodiment of the present disclosure.

Referring to FIG. 8, the first sacrificial fill material of the sacrificial memory opening fill structures 48 and the sacrificial support opening fill structures 18 can be removed selective to the materials of the first-type insulating layers 32, the sacrificial material layers 42, and the sacrificial retro-stepped dielectric material portion 67. In case the first sacrificial fill material is different from the second sacrificial fill material, the first sacrificial fill material can be removed selective to the second sacrificial fill material. For example, if the first sacrificial fill material comprises amorphous silicon or silicon-germanium, then a wet etch process using hot trimethyl-2 hydroxyethyl ammonium hydroxide ("hot TMY") or tetramethyl ammonium hydroxide (TMAH) may be used to remove the sacrificial memory opening fill structures 48 and the sacrificial support opening fill structures 18. Voids are formed within the volumes of the memory openings 49 and the support openings 19.

FIGS. 9A-9J are sequential vertical cross-sectional views of a region between a memory opening 49 and a sacrificial backside trench fill structure (75, 77) during formation of in-process electrically conductive layers (44, 45') according to the first embodiment of the present disclosure.

Figure 9B:
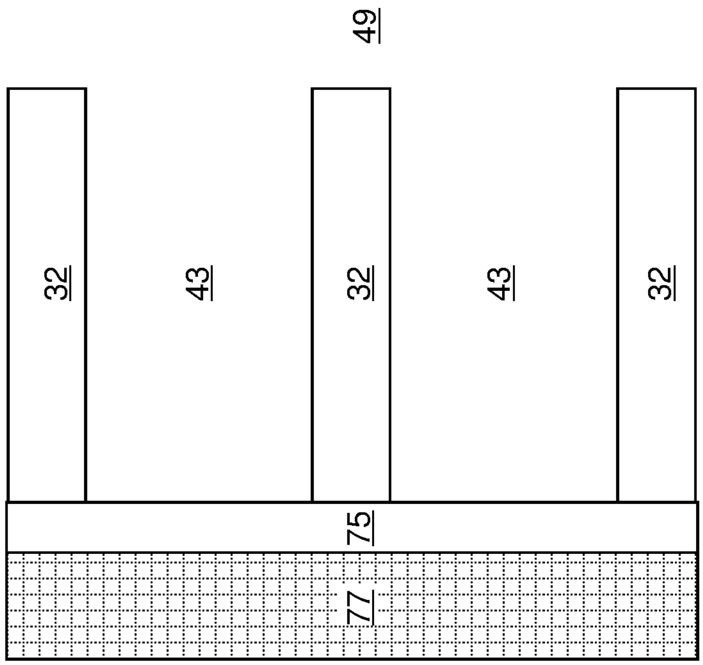
FIGS. 9A-9J are sequential vertical cross-sectional views of a region between a memory opening and a sacrificial backside trench fill structure during formation of in-process electrically conductive layers according to the first embodiment of the present disclosure.
Figure 9A:
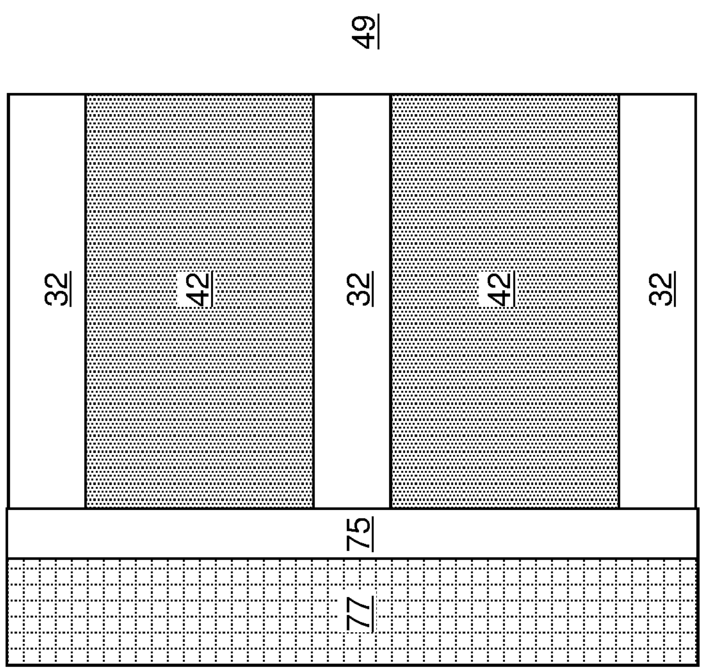

Referring to FIG. 9A, the region between the memory opening 49 and the sacrificial backside trench fill structure (75, 77) is illustrated at the processing steps of FIG. 8.

Referring to FIG. 9B, the sacrificial material layers 42 can be removed selective to the first-type insulating layers 32 by introducing an isotropic etchant that etches the material of the sacrificial material layers 42 selective to the material of the first-type insulating layers into the memory openings 49 and the support openings 19. Lateral recesses 43 are formed in volumes from which the sacrificial material layers 42 are removed. The removal of the second material of the sacrificial material layers 42 can be selective to the first material of the first-type insulating layers 32, the material of the sacrificial retro-stepped dielectric material portion 67, the semiconductor material of the semiconductor material layer 10, and the material of the optional etch-stop spacers 75 or the material of the sacrificial trench fill material portions 77. In one embodiment, the sacrificial material layers 42 can include silicon nitride, and the materials of the first-type insulating layers 32 and the sacrificial retro-stepped dielectric material portion 67 can be selected from silicon oxide and dielectric metal oxides.

In an illustrative example, if the sacrificial material layers 42 include silicon nitride, then the etch process can be a wet etch process in which the exemplary structure is immersed within a wet etch tank including phosphoric acid, which etches silicon nitride selective to silicon oxide, silicon, and various other materials employed in the art. The sacrificial backside trench fill structures (75, 77) and the sacrificial retro-stepped dielectric material portion 67 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. Each of the plurality of lateral recesses 43 can extend substantially parallel to the top surface of the substrate (9, 10). A lateral recess 43 can be vertically bounded by a top surface of an underlying first-type insulating layer 32 and a bottom surface of an overlying first-type insulating layer 32. In one embodiment, each lateral recess 43 can have a uniform height throughout.

Figure 9D:
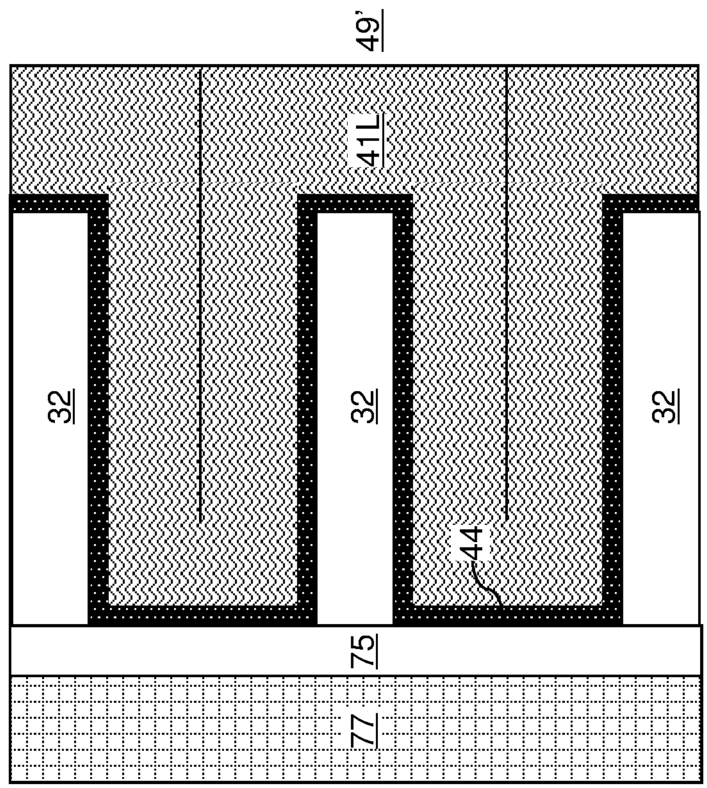
Figure 9C:
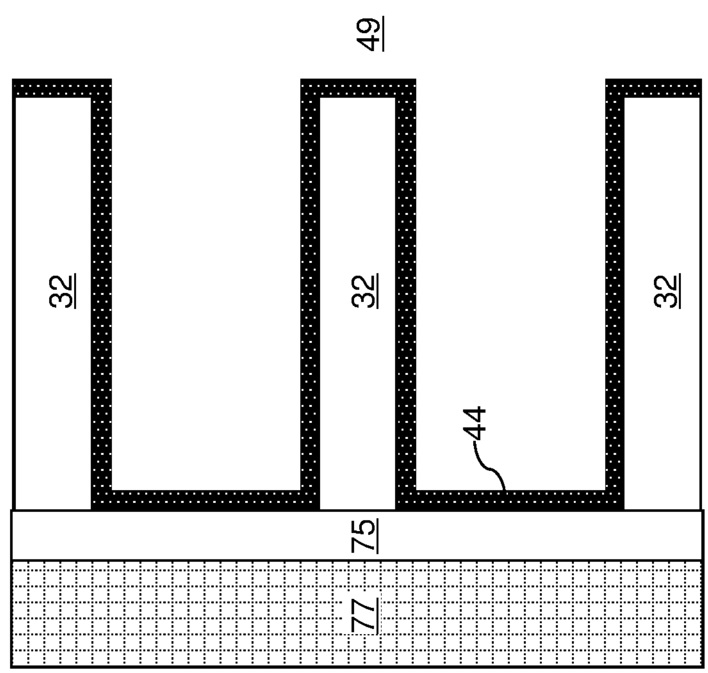

Referring to FIG. 9C, a liner 44 is formed at peripheral portions of the lateral recesses 43 by a conformal deposition method, such as area selective deposition (ASD). In one embodiment, the at least one electrically conductive material is deposited directly on physically exposed surfaces of instances of the first-type insulating layer 32 and on physically exposed sidewalls of the sacrificial backside trench fill structures (75, 77) to form a conductive barrier liner 44. The conductive barrier liner 44 includes a metal or metal nitride conductive barrier material such as TiN, TaN, WN, MoN or Ru. Alternatively, the liner 44 may comprise a sacrificial liner, such as an amorphous silicon, which can be used as a sacrificial nucleation layer for deposition of tungsten word lines in a subsequent step. The thickness of the liner 44 may be in a range from 1 nm to 10 nm, such as from 1 nm to 5 nm, although lesser and greater thicknesses may also be employed.

Referring to FIG. 9D, a sacrificial masking material layer 41L may be deposited by a conformal deposition process within the lateral recesses 43. For example, a semiconductor material, such as amorphous silicon, germanium or silicon-germanium, or an insulating material, such as amorphous carbon or diamond-like carbon, or a conductive material, such as titanium nitride, may be deposited in the lateral recesses 43. For example, if the liner 44 comprises TiN or Ru, then layer 41L may comprise amorphous silicon. If the liner 44 comprises MoN, then layer 41L may comprise amorphous silicon or TiN. If the liner 44 comprises amorphous silicon, then layer 41L may comprise TiN. A memory cavity 49' may be present within a center portion of each memory opening 49 after deposition of the sacrificial masking material layer 41L.

Figure 9F:
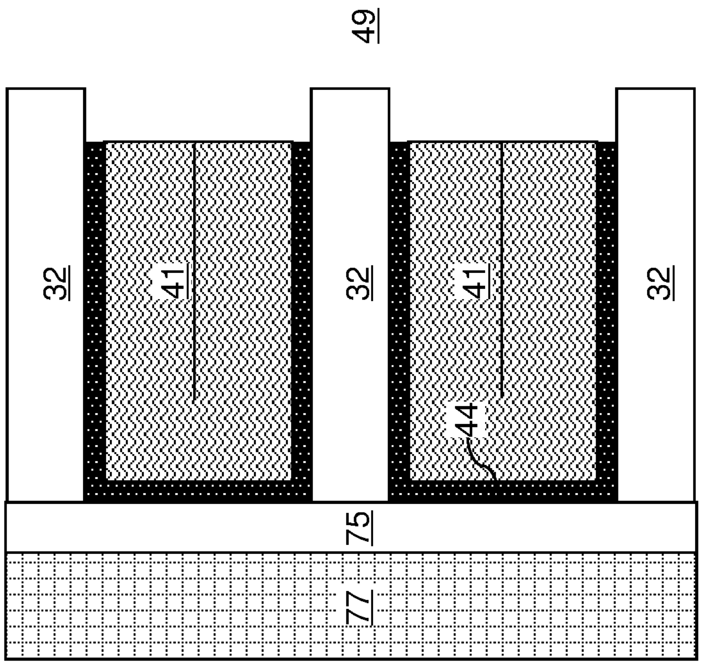
Figure 9E:
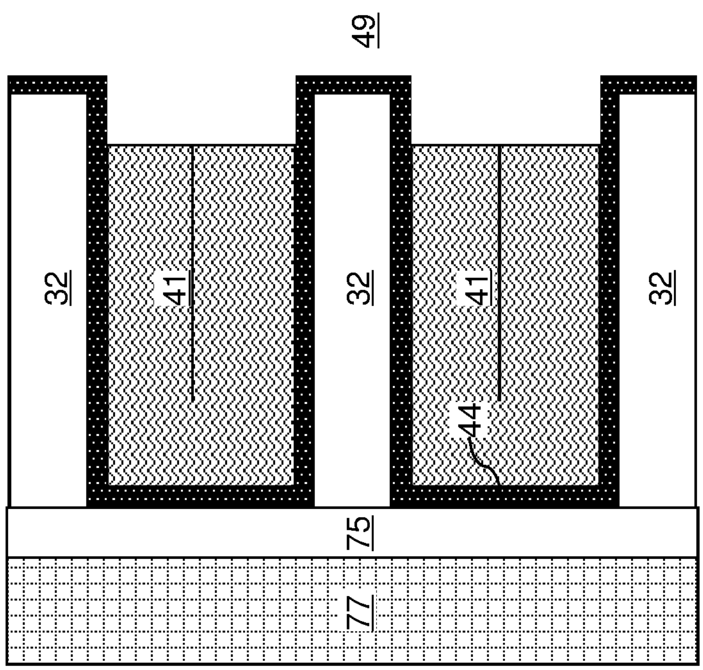

Referring to FIG. 9E, the sacrificial masking material layer 41L can be recessed within each memory opening 49 and within each support opening, for example, employing an isotropic etch process or a combination of anisotropic and isotropic etch processes. Each remaining portion of the sacrificial masking material layer 41L constitutes a sacrificial masking material portion 41, which may have sidewalls that are laterally recessed outward from the sidewall of each memory opening 49 and from the sidewall of each support opening 19.

Referring to FIG. 9F, a selective etch process may be performed to remove physically exposed portions of the liner 44. Portions of the liner 44 overlying sidewalls of the first-type insulating layers 32 can be removed from around each of the memory openings 49 and from around each of the support openings 19. The liner 44 can be divided into a plurality of liners 44 located at a respective level of the sacrificial masking material portions 41.

Figure 9H:
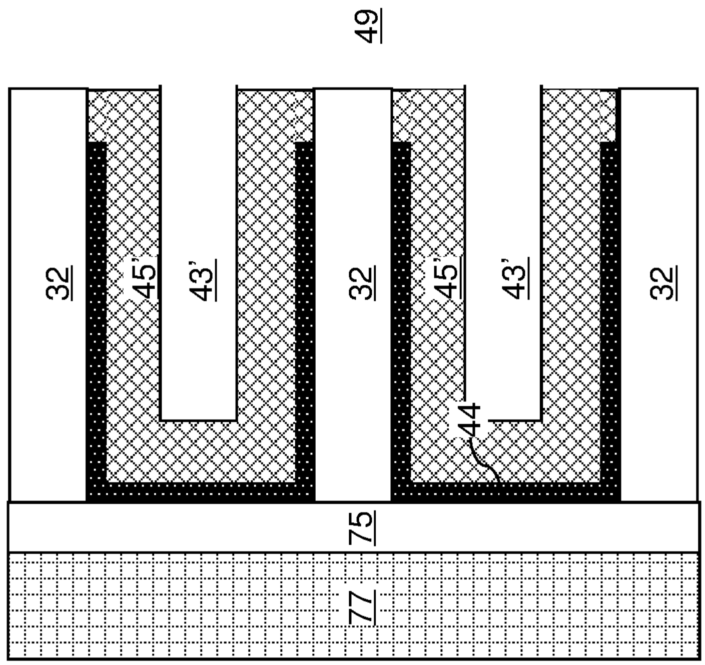
Figure 9G:
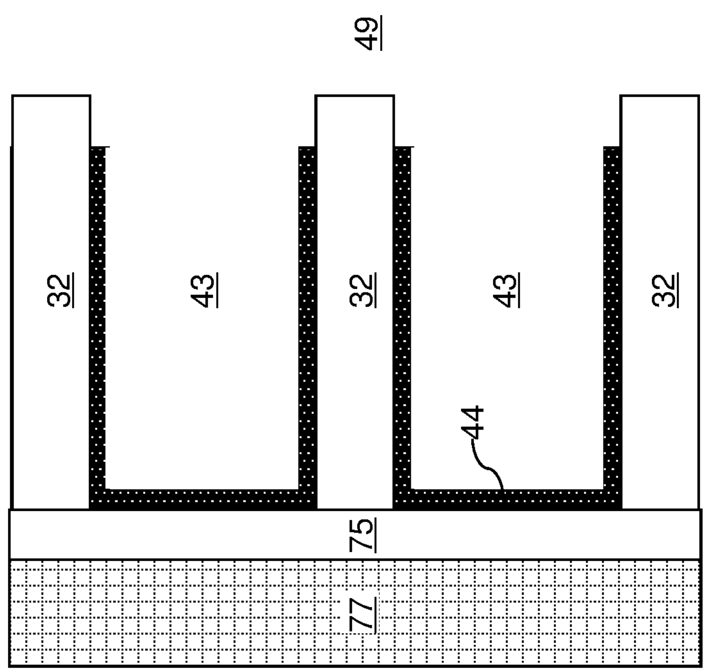

Referring to FIG. 9G, the sacrificial masking material portions 41 can be removed selective to the liners 44 and the first-type insulating layers 32 by a selective etch process. For example, if the sacrificial masking material portions 41 include amorphous silicon and the liners 44 include TiN or MoN, then a wet etch process employing hot trimethyl-2 hydroxyethyl ammonium hydroxide ("hot TMY") or tetramethyl ammonium hydroxide (TMAH) may be used to remove the sacrificial masking material portions 41.

Referring to FIG. 9H, a selective conductive material deposition process may be performed to grow a conductive fill material layer 45' directly from physically exposed surfaces of the liners 44. In one embodiment, a chemical vapor deposition process or an atomic layer deposition process employing a metal-containing precursor gas can be performed to selectively grow the conductive fill material layer 45' from each physically exposed surface of the liners 44. The conductive fill material layer 45' includes at least one conductive material such as W, Co, Ru, Mo, Cu, Al, etc. If the liners 44 comprise conductive barrier liners (e.g., metal nitride liners, such as TiN or MoN), then the liners 44 are retained in the exemplary structure. Alternatively, if the liners 44 comprise sacrificial liners, such as amorphous silicon, then they are consumed during the deposition of the conductive fill material, such as tungsten. In one embodiment, the liners 44 comprise TiN or Ru and the conductive fill material comprises W. In another embodiment, the liners 44 comprise MoN and the conductive fill material comprises Mo. In another embodiment, the liners 44 comprise amorphous silicon sacrificial liners and the conductive fill material comprises W. In one embodiment, the thickness of each conductive fill material layer 45' can be in a range from 20% to 45%, such as from 25% to 35%, of the thickness of the sacrificial material layers 42. In one embodiment, the conductive fill material layer 45' may have a thickness that is about the same as the lateral recess distance of the liners 44 from the memory openings 49 and from the support openings 19. Lateral cavities 43' are present within volumes of the lateral recesses 43 that are not filled by the conductive fill material layers 45'.

Figure 9J:
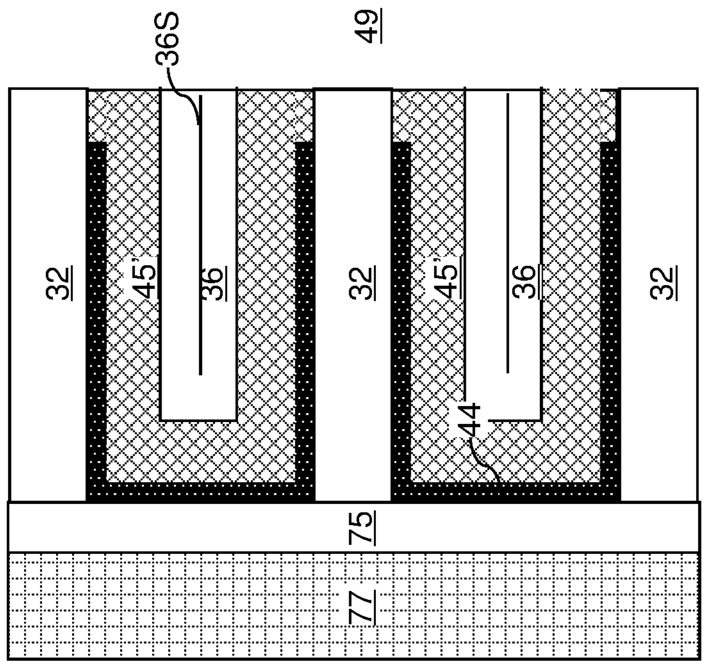
Figure 9I:
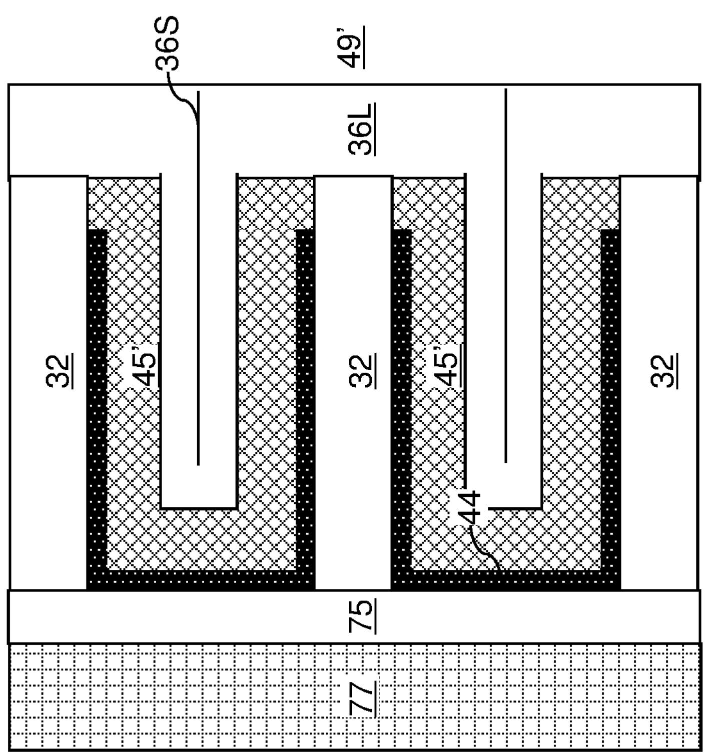

Referring to FIG. 9I, an insulating fill material can be deposited over the at least one conductive fill material (44, 45') within remaining volumes of the lateral recesses 43 by a conformal deposition process. The insulating fill material includes an insulating material such as undoped silicate glass (i.e., silicon oxide) or a doped silicate glass. The thickness of the insulating fill material can be selected such that a horizontal seam 36S is formed at each levels of the lateral recesses 43. The deposited insulating fill material forms an insulating fill material layer 36L.

Referring to FIG. 9J, peripheral portions of the insulating fill material can be removed from inside the memory openings 49 and the support openings 19, for example, by performing an isotropic etch process or an anisotropic etch process. In one embodiment, the insulating fill material layer 36L comprises silicon oxide, and removal of the peripheral portions of the insulating fill material can be removed from inside the memory openings 49 and the support openings 19 employing an isotropic etch process such as a wet etch process employing dilute hydrofluoric acid. In one embodiment, an anisotropic etch process may be performed to etch peripheral portions of the conductive fill material layers 45' so that cylindrical sidewalls of the conductive fill material layers 45' are physically exposed around each memory opening 49 and around each support opening 19.

Remaining portions of the insulating fill material that remain in volumes of the lateral recesses 43 after removing the peripheral portions of the insulating fill material from inside the memory openings comprise seamed insulating layers comprising a respective horizontally-extending seam 36S therein. The seamed insulating layers are herein referred to as second-type insulating layers 36. The second-type insulating layers 36 may include the same material as, or may include a material that is different from, the material of the first-type insulating layers 32. In one embodiment, the horizontally-extending seam 36S within each second-type insulating layer 36 can be equidistant from a horizontal plane including a top surface of the second-type insulating layer 36 and from a horizontal plane including a bottom surface of the second-type insulating layer 36.

FIGS. 10A-10F are sequential vertical cross-sectional views of a region around a memory opening 49 and a backside trench fill structure (75, 77) during formation of memory opening fill structures according to the first embodiment of the present disclosure.

Figure 10A:
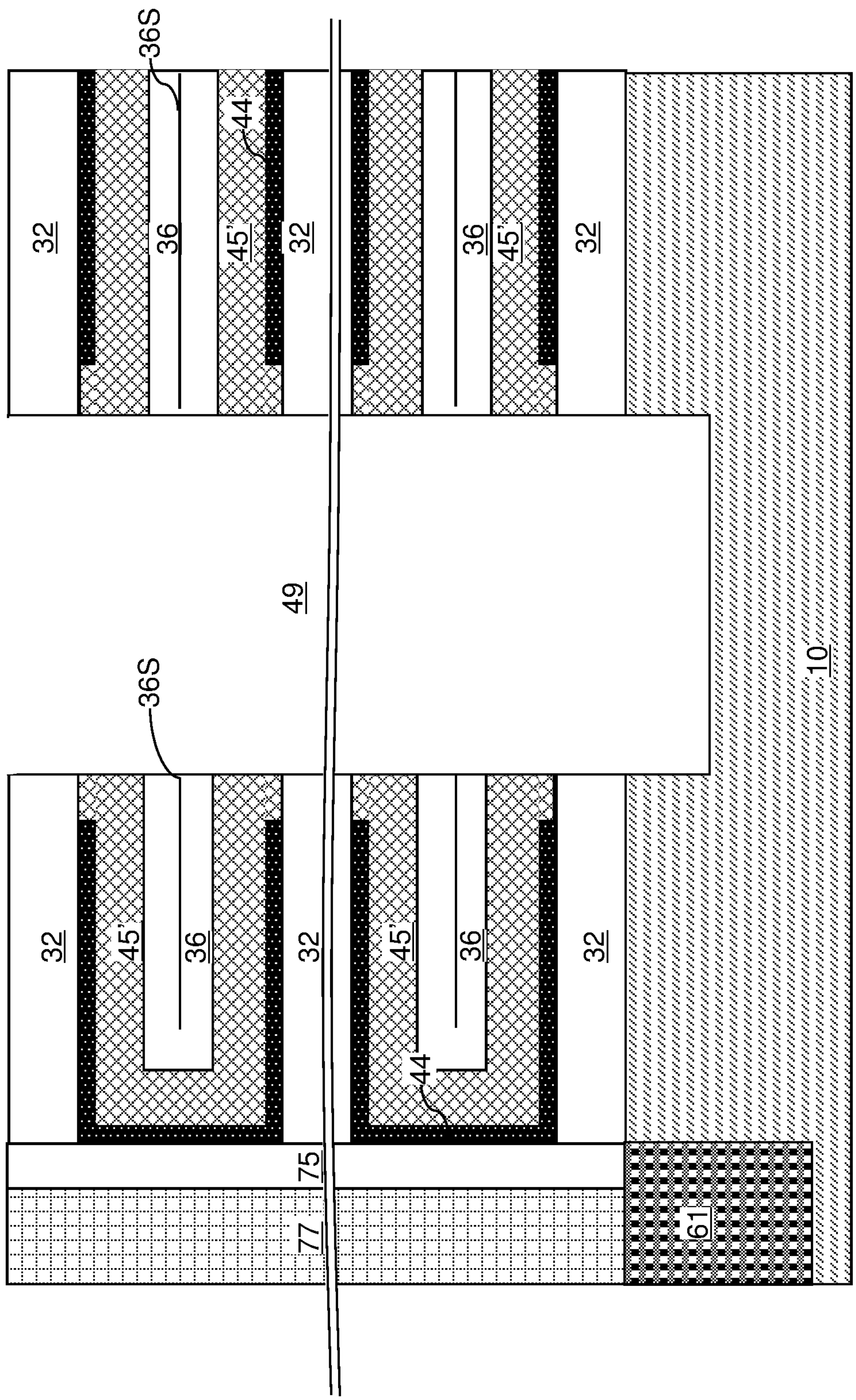
FIGS. 10A-10F are sequential vertical cross-sectional views of a region around a memory opening and a backside trench fill structure during formation of memory opening fill structures according to the first embodiment of the present disclosure.

Referring to FIG. 10A, the region around the memory opening 49 and the backside trench fill structure (75, 77) is illustrated at a processing step that corresponds to the processing step of FIG. 9J.

Figure 10B:
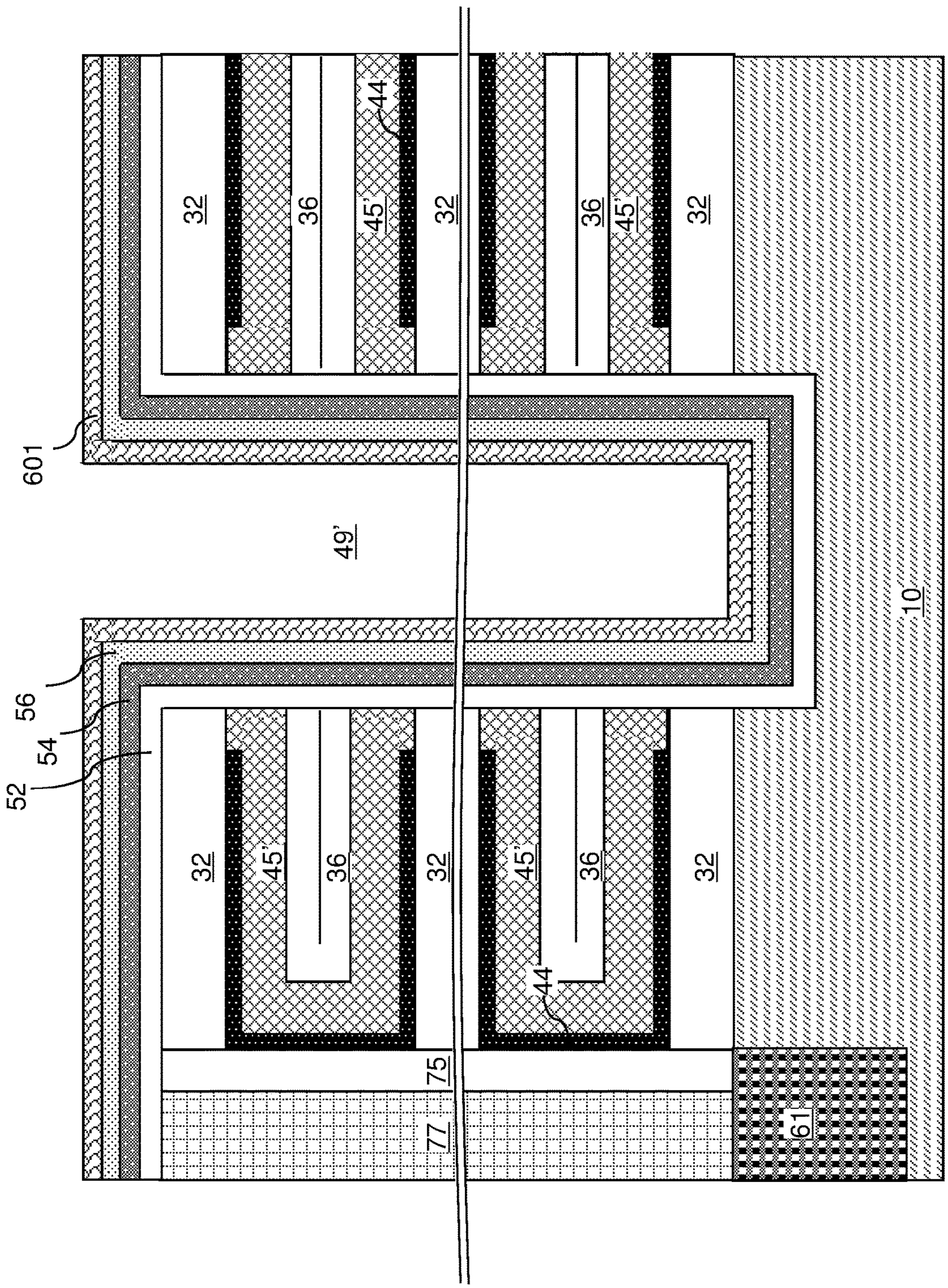

Referring to FIG. 10B, a stack of layers including a blocking dielectric layer 52, a memory material layer 54, a tunneling dielectric layer 56, and an optional sacrificial cover material layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one conductive element and at least oxygen. The dielectric metal oxide may consist essentially of the at least one conductive element and oxygen, or may consist essentially of the at least one conductive element, oxygen, and at least one non-conductive element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of lateral recesses on surfaces of memory films to be subsequently formed.

Subsequently, the memory material layer 54 can be formed. In one embodiment, the memory material layer 54 can be a continuous layer or patterned discrete portions of a charge trapping (i.e., charge storage) material, such as a dielectric charge trapping material, which can be, for example, silicon nitride. Alternatively, the memory material layer 54 can include a continuous layer or patterned discrete portions of a conductive material such as doped polysilicon or a conductive material that is patterned into multiple electrically isolated portions (e.g., floating gates), for example, by being formed within lateral recesses into sacrificial material layers 42. In one embodiment, the memory material layer 54 includes a silicon nitride layer. Alternatively, the memory material layer 54 may comprise a ferroelectric material, such as orthorhombic phase hafnium oxide doped with Al, Si and/or Zr. The ferroelectric material stores data based on the direction of its ferroelectric polarization.

The memory material layer 54 can be formed as a single charge storage or ferroelectric layer of homogeneous composition, or can include a stack of multiple charge storage or ferroelectric layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed. The tunneling dielectric layer 56 may be omitted if the memory material layer 54 comprises a ferroelectric material.

The optional sacrificial cover material layer 601 includes a sacrificial material that can be subsequently removed selective to the material of the tunneling dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Figure 10C:
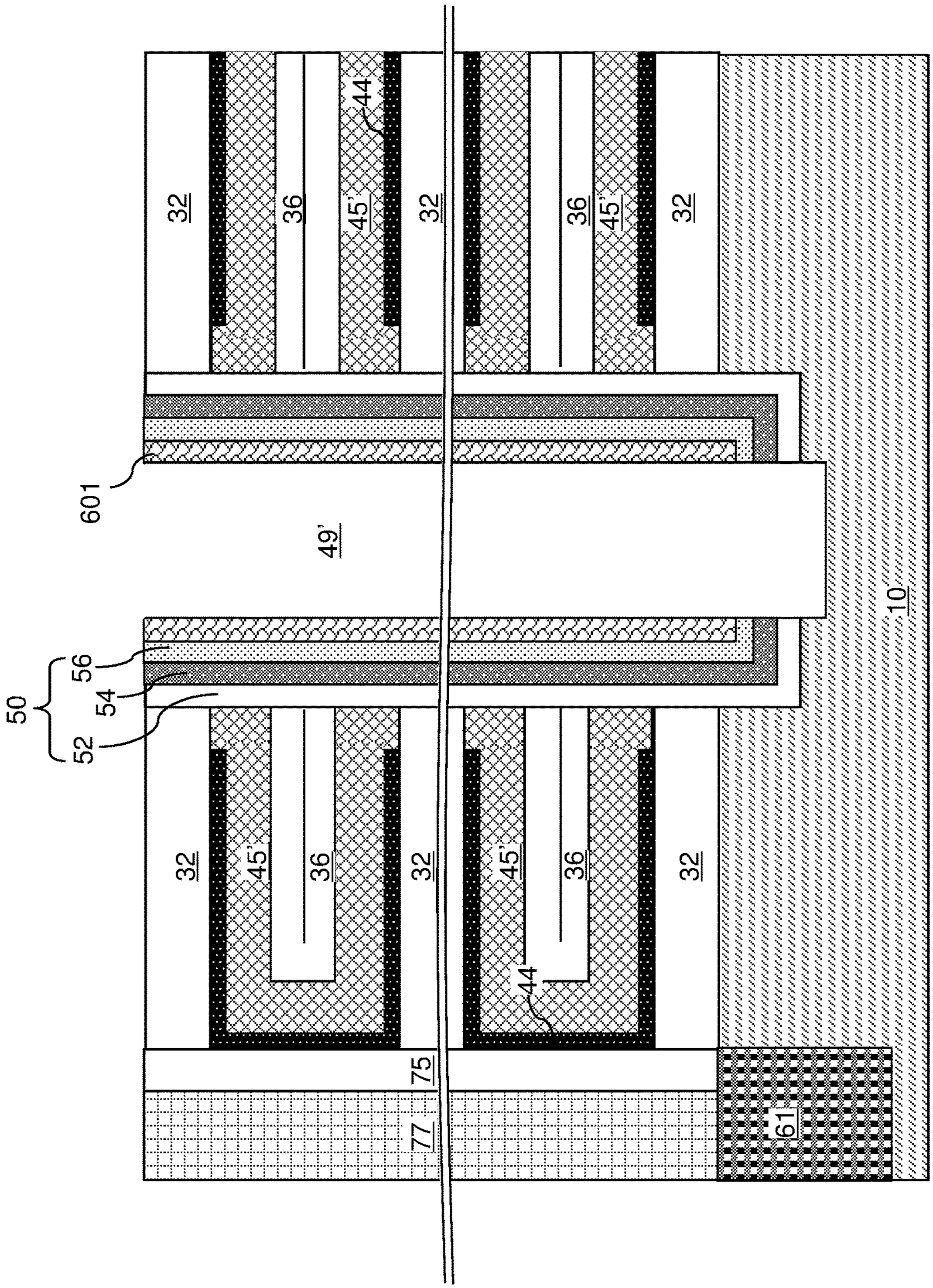

Referring to FIG. 10C, the optional sacrificial cover material layer 601, the tunneling dielectric layer 56, the memory material layer 54, the blocking dielectric layer 52 are sequentially anisotropically etched employing at least one anisotropic etch process. The portions of the sacrificial cover material layer 601, the tunneling dielectric layer 56, the memory material layer 54, and the blocking dielectric layer 52 located above the top surface of the topmost first-type insulating layer 32 can be removed by the at least one anisotropic etch process. Further, the horizontal portions of the sacrificial cover material layer 601, the tunneling dielectric layer 56, the memory material layer 54, and the blocking dielectric layer 52 at a bottom of each memory cavity 49' can be removed to form openings in remaining portions thereof. Each of the sacrificial cover material layer 601, the tunneling dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material or a ferroelectric material. In one embodiment, each memory material layer 54 can include a vertical repetition of charge storage regions that store electrical charges upon programming. In one embodiment, the memory material layer 54 can be a memory material layer in which each portion adjacent to the sacrificial material layers 42 constitutes a charge storage region. The physically exposed semiconductor surface at the bottom of each memory cavity 49' can be vertically recessed so that the recessed semiconductor surface underneath the memory cavity 49' is vertically offset from the topmost surface of the semiconductor material layer 10 by a recess distance. A tunneling dielectric layer 56 may be located over the memory material layer 54. A set of a blocking dielectric layer 52, a memory material layer 54, and a tunneling dielectric layer 56 in a memory opening 49 constitutes a memory film 50, which may include a plurality of charge storage regions (comprising portions of the memory material layer 54) that are insulated from surrounding materials by the blocking dielectric layer 52 and the tunneling dielectric layer 56. In one embodiment, the sacrificial cover material layer 601, the tunneling dielectric layer 56, the memory material layer 54, and the blocking dielectric layer 52 can have vertically coincident sidewalls. The sacrificial cover material layer 601 can be subsequently removed selective to the material of the tunneling dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained if it comprises amorphous silicon or polysilicon.

Figure 10D:
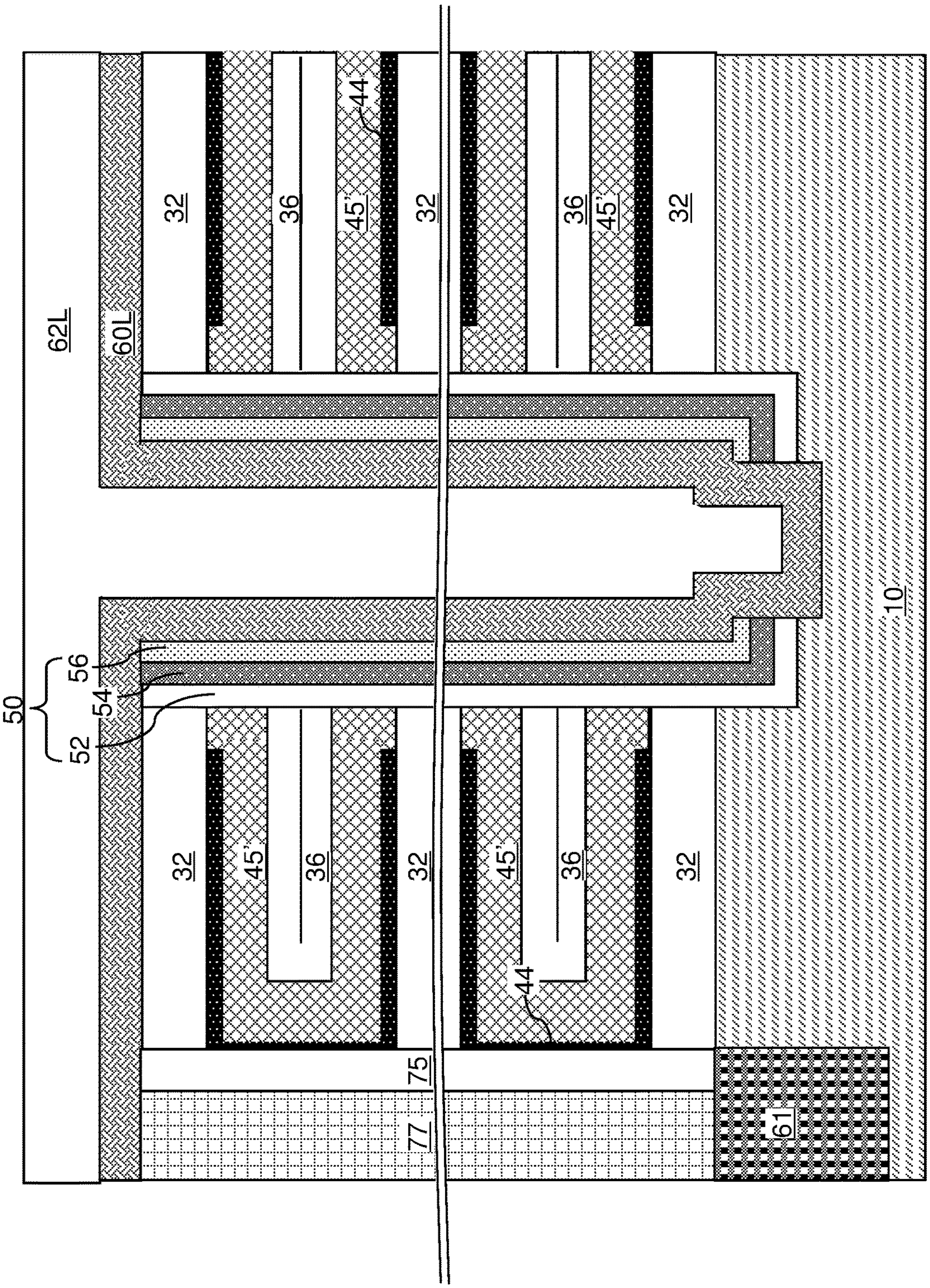

Referring to FIG. 10D, a semiconductor channel layer 60L can be deposited directly on the semiconductor surface of the pedestal channel portion 11 or the semiconductor material layer 10 if the pedestal channel portion 11 is omitted, and directly on the tunneling dielectric layer 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

In case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 10E:
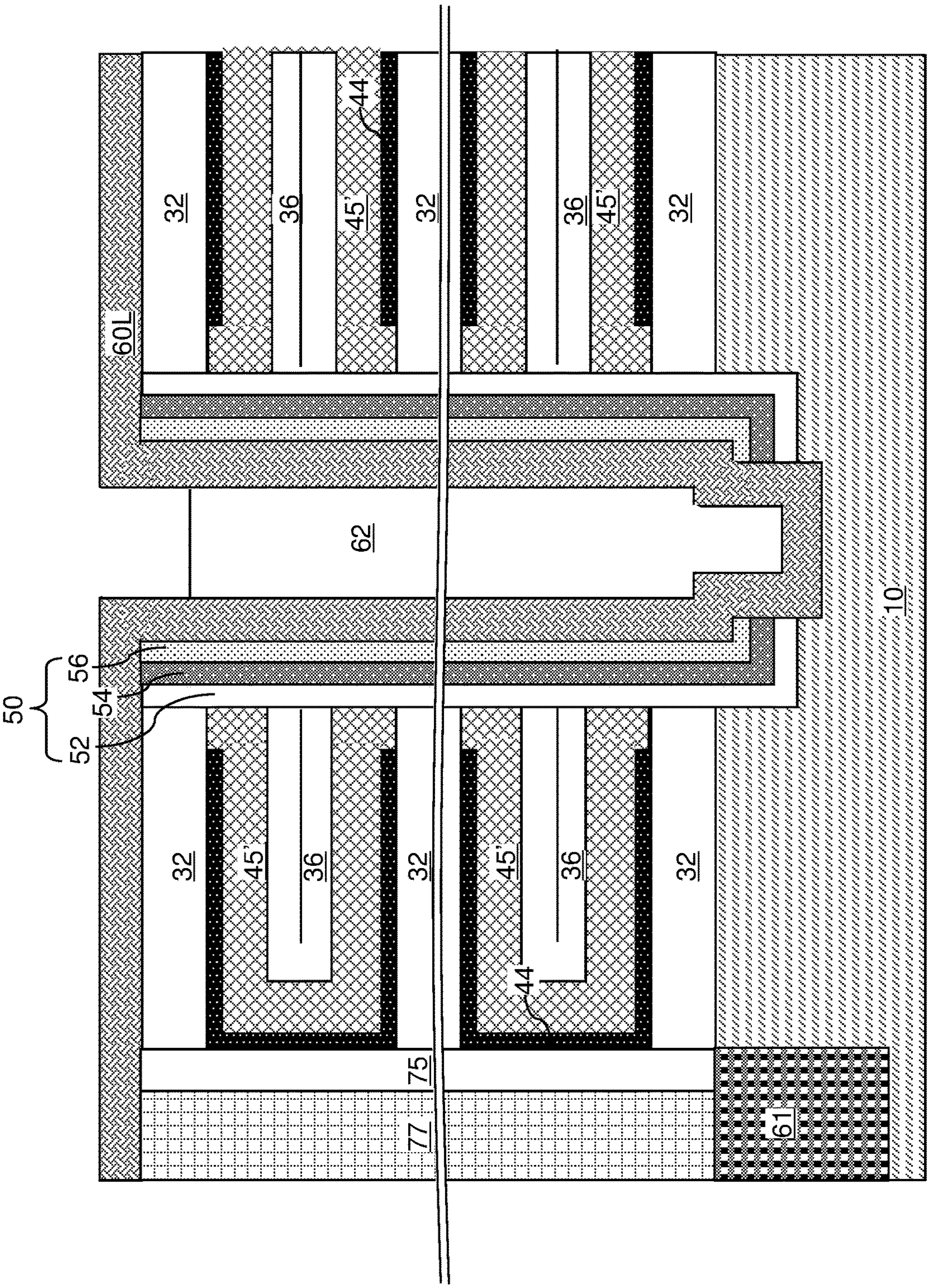

Referring to FIG. 10E, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Figure 10F:
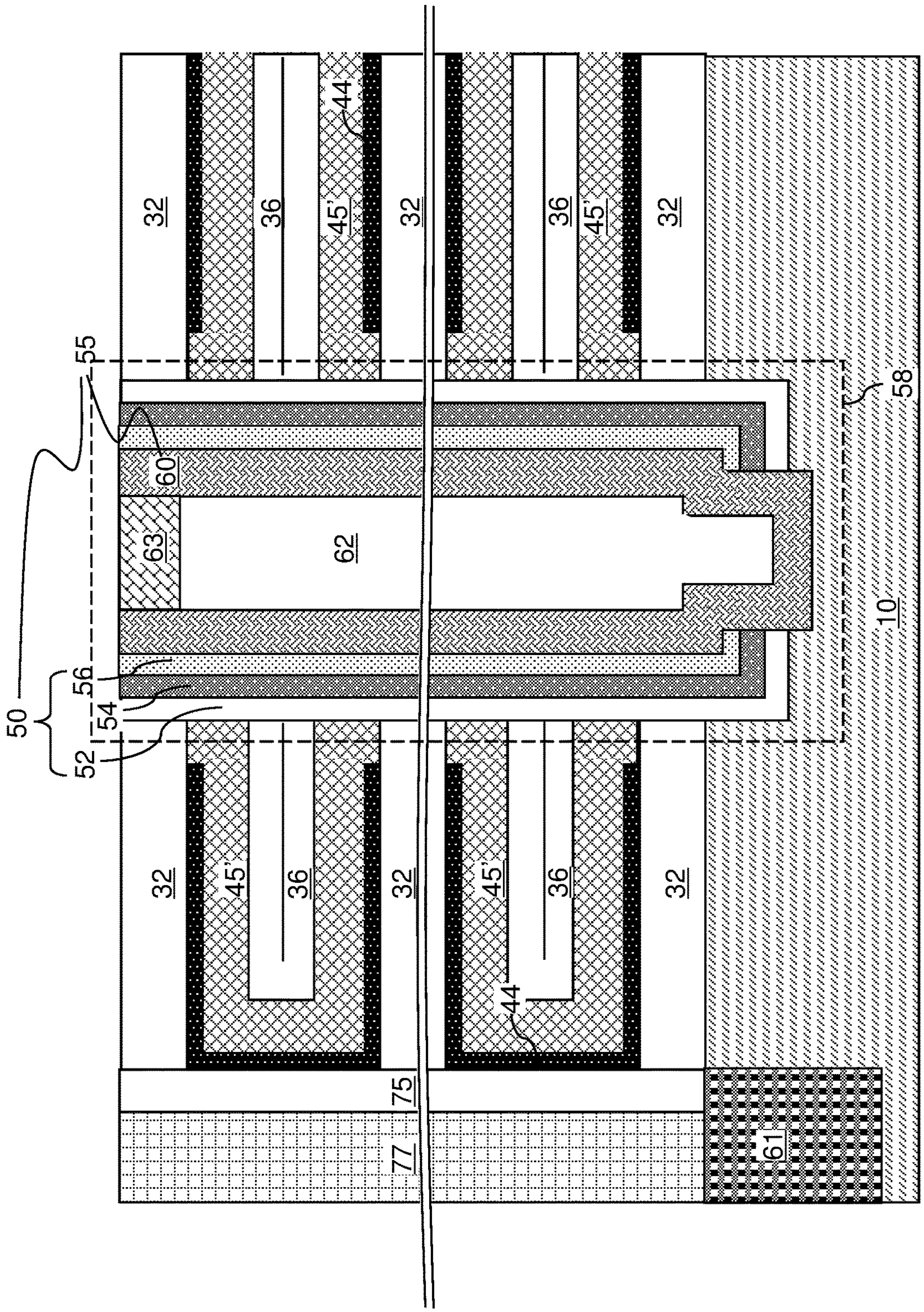

Referring to FIG. 10F, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges or electrical polarization with a macroscopic retention time. In some embodiments, a blocking dielectric layer 52 may not be present in the memory film 50 at this step, and a blocking dielectric layer may be subsequently formed after formation of lateral recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the memory material layer 54, and an optional blocking dielectric layer 52. An entire set of material portions (e.g., memory stack structure 55, dielectric core 63 and drain region 63) filling a memory opening 49 is herein referred to as a memory opening fill structure 58. An entire set of material portion filling a support opening 19 is herein referred to as a support opening fill structure. Each of the memory opening fill structures 58 contacts a closed periphery of a respective horizontally-extending seam in each of the seamed insulating layers, i.e., the second-type insulating layers 36.

FIGS. 11A-11D are sequential vertical cross-sectional views of a region around a memory opening 49 and a backside trench 79 during replacement of sacrificial backside trench fill structures (75, 77) with backside trench fill structures (74, 76) according to the first embodiment of the present disclosure.

Figure 11A:
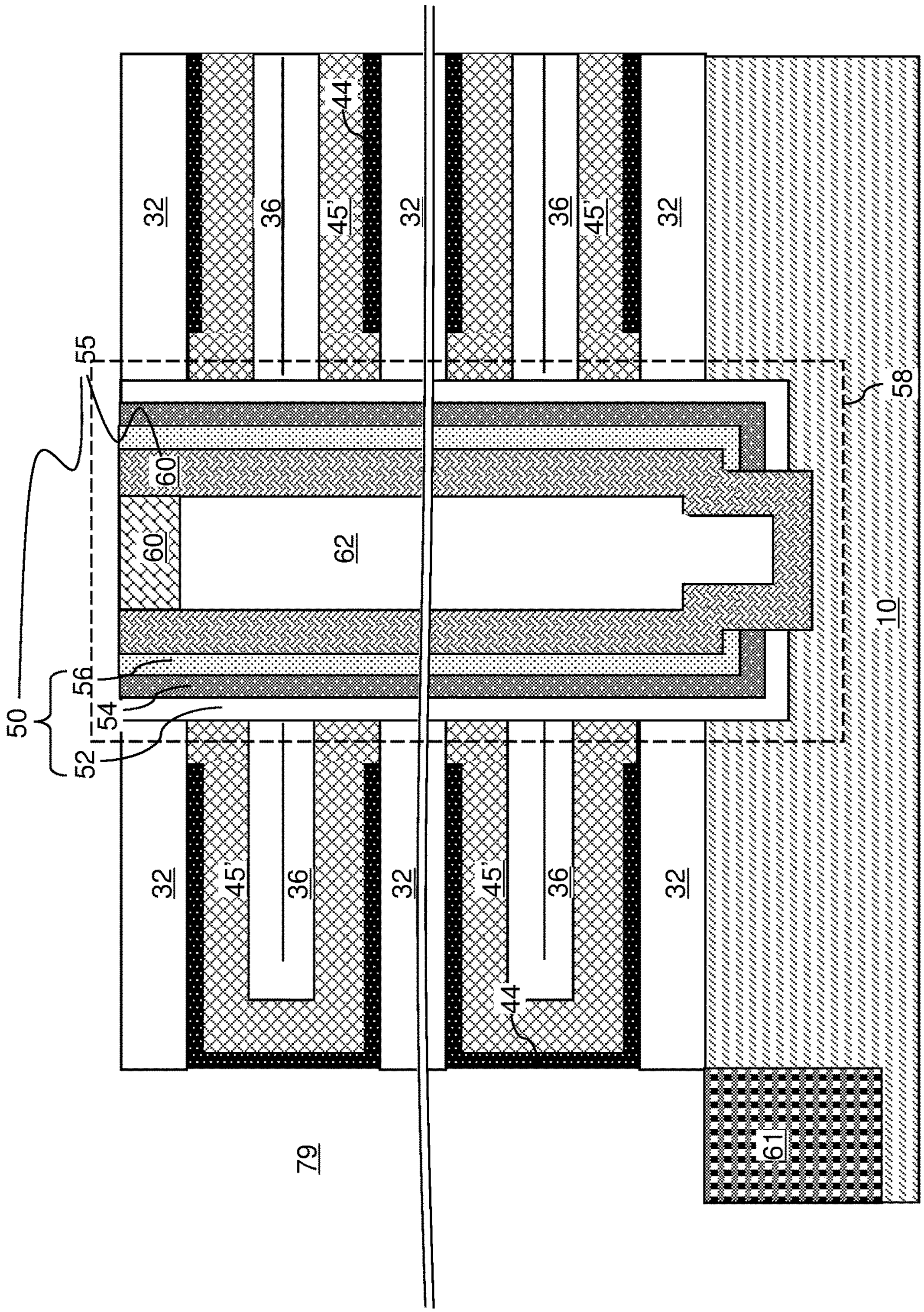
FIGS. 11A-11D are sequential vertical cross-sectional views of a region around a memory opening and a backside trench during replacement of sacrificial backside trench fill structures with backside trench fill structures according to the first embodiment of the present disclosure.

Referring to FIG. 11A, the sacrificial backside trench fill structures (75, 77) can be removed selective to the first-type insulating layers 32, the second-type insulating layers 36, and the in-process electrically conductive layers (44, 45'). If the liners 44 comprise the sacrificial liners (e.g., amorphous silicon), then the liners 44 are not present in the in-process electrically conductive layers. For example, a first etch process (or an ashing process if portion 77 comprises carbon) can be performed to etch the sacrificial trench fill material portion 77 selective to the etch-stop spacer 75, and a second etch process can be performed to etch the etch-stop spacer 75.

Figure 11B:
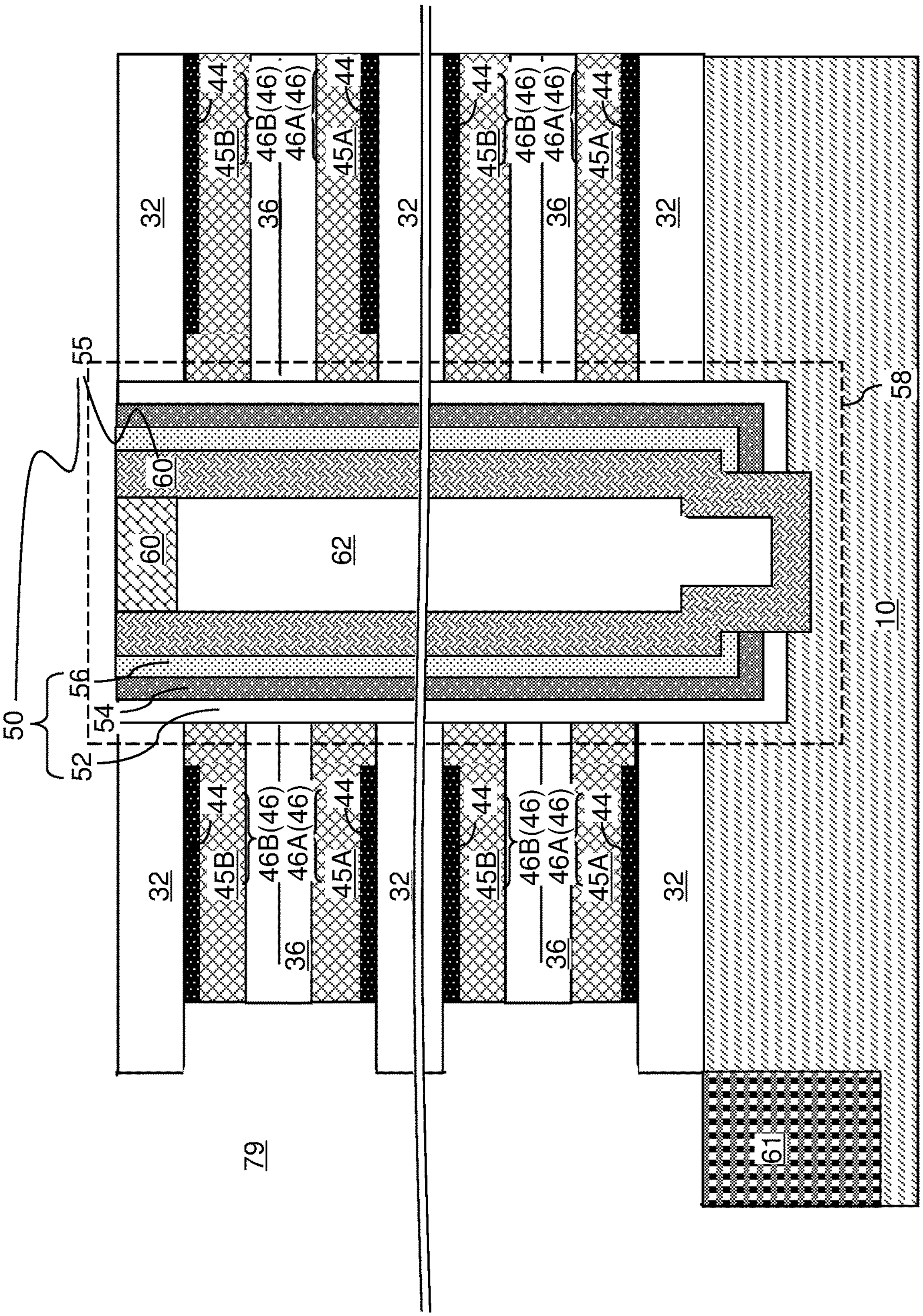

Referring to FIG. 11B, proximal portions of the at least one conductive fill material of the in-process electrically conductive layers (44, 45') can be recessed around the backside trenches 79 by performing an isotropic etch process that etches the conductive materials of the in-process electrically conductive layers (44, 45'). In one embodiment, the isotropic etch process may be a wet etch process that etches the conductive materials of the in-process electrically conductive layers (44, 45') selective to the materials of the insulating layers (32, 36). The duration of the isotropic etch process can be selected such that each vertically-extending portion of the in-process electrically conductive layers (44, 45') located between a vertically neighboring pair of first-type insulating layers 32 is removed by the isotropic etch process.

Each portion of the at least one conductive fill material filling a respective one of the lateral recesses 43 (i.e., each in-process electrically conductive layers (44, 45')) is divided into a respective pair of a first-type electrically conductive layer 46A and a second-type electrically conductive layer 46B that are disjoined from, and are vertically spaced from, each other. A second-type insulating layer 36 is located between a vertically-neighboring pair of a first-type electrically conductive layer 46A and a second-type electrically conductive layer 46B. Each first-type electrically conductive layer 46A comprises, from bottom to top, an optional first conductive barrier liner 44 and a first conductive fill material layer 45A. Each second-type electrically conductive layer 46B comprises, from bottom to top, a second conductive fill material layer 45B and an optional second conductive barrier liner 44. The first conductive fill material layer 45A and the second conductive fill material 45B are in direct contact with horizontal surfaces of the second-type insulating layer 36.

A vertical repetition of multiple instances of a unit layer stack (32, 46A, 36, 46B) can be formed over the substrate (9, 10). The unit layer stack comprises, from bottom to top, a seamless insulating layer (such as a first-type insulating layer 32) that is free of any seam therein, a first-type electrically conductive layer 46A, a seamed insulating layer (such as a second-type insulating layer 36) including a horizontally-extending seam therein 36S, and a second-type electrically conductive layer 46B.

Figure 11C:
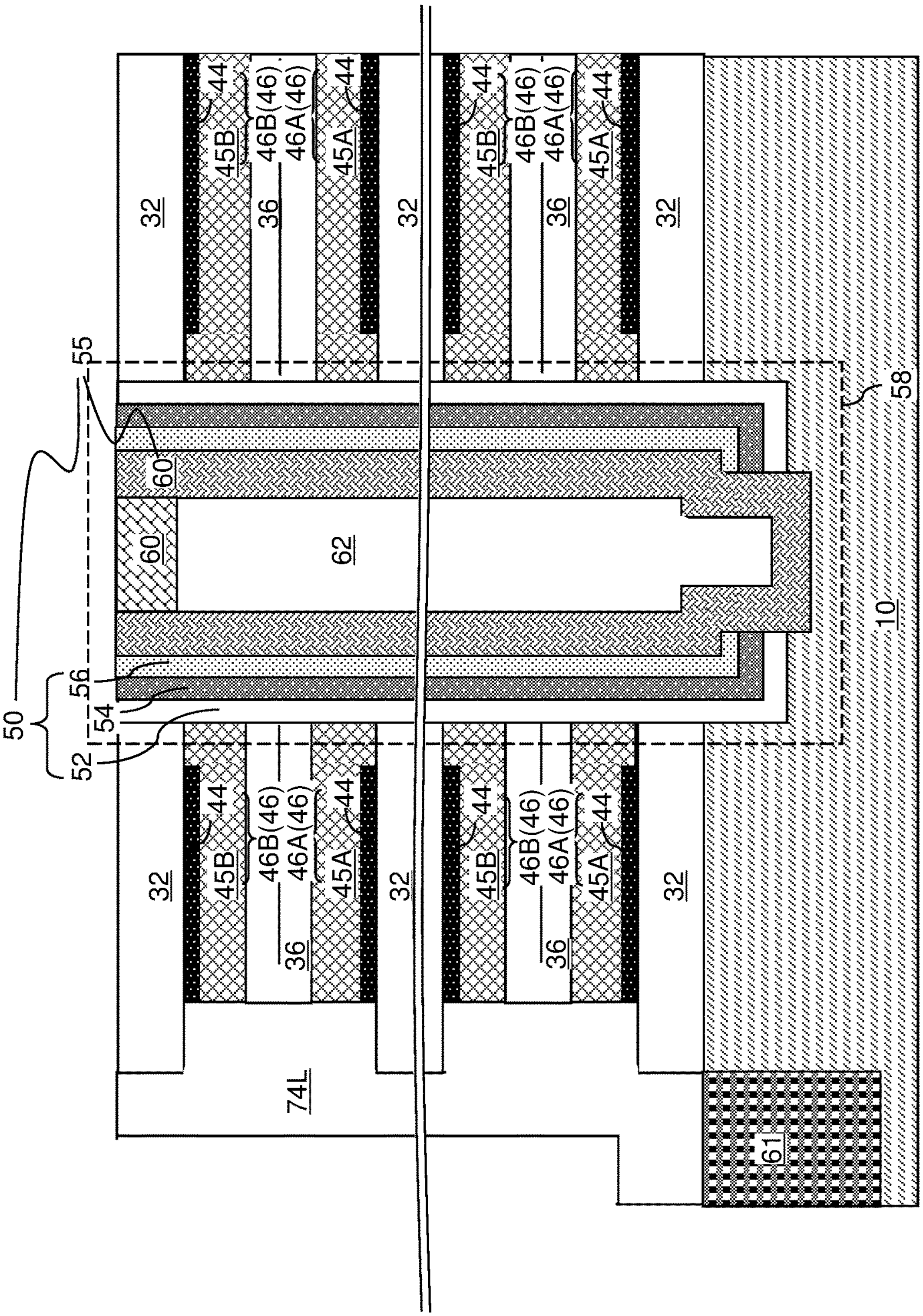

Referring to FIG. 11C, an insulating spacer layer 74L can be deposited in peripheral portions of the backside trenches 79 and over the vertical repetition (32, 46A, 36, 46B). The insulating spacer layer 74L includes an insulating material such as silicon oxide. Lateral protrusions of the backside trenches 79 at levels of the first-type electrically conductive layers 46A, the second-type insulating layers 36, and the second-type electrically conductive layers 46B can be filled with the insulating spacer layer 74L.

Figure 11D:
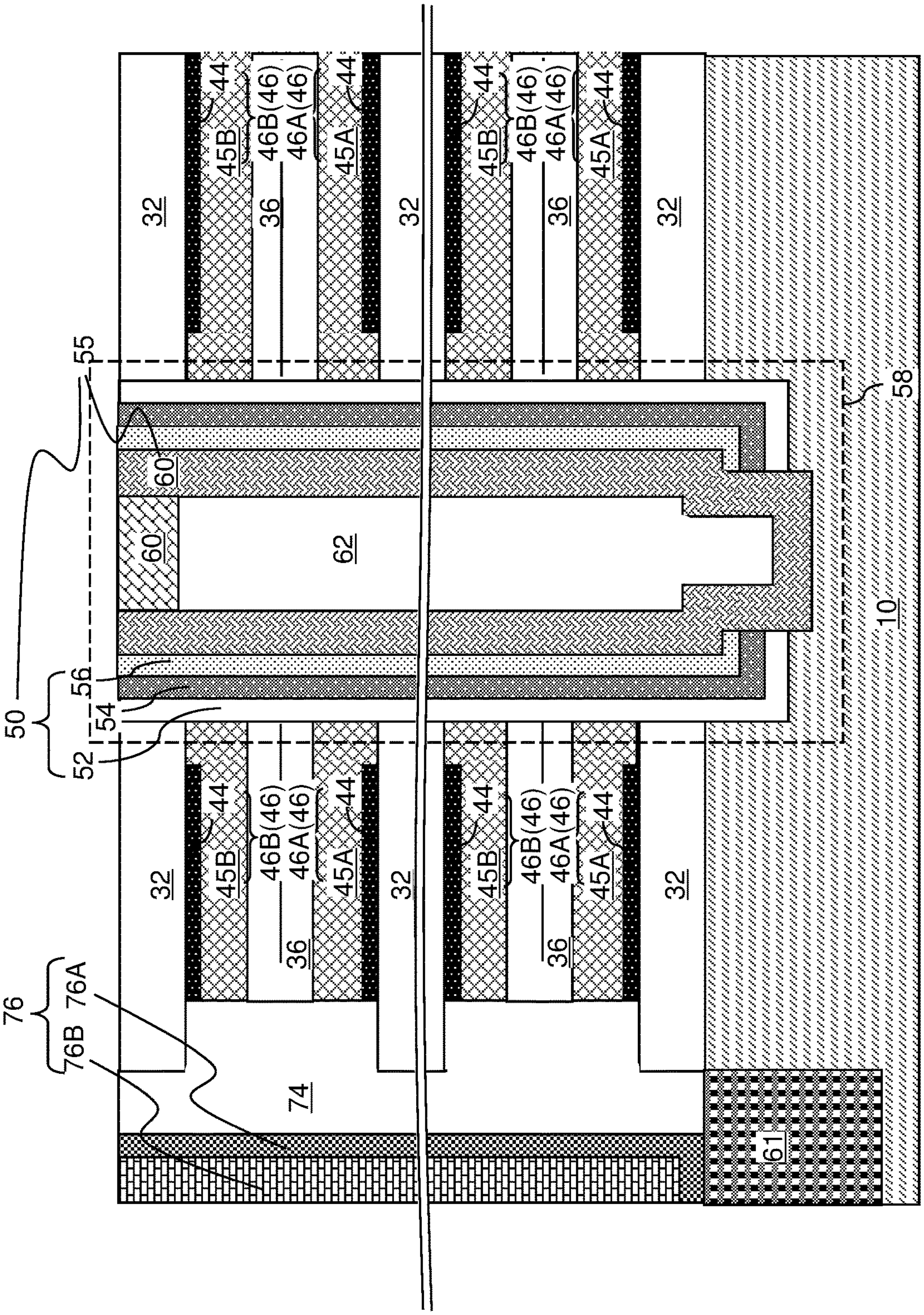

Referring to FIG. 11D, an anisotropic etch process can be performed to remove horizontally-extending portions of the insulating spacer layer 74L. An insulating spacer 74 can be formed in peripheral volumes of each backside trench 79. At least one conductive material can be deposited in unfilled volumes of the backside trenches 79. For example, a backside conductive barrier liner 76A and a backside conductive fill material portion 76B can be formed within each backside trench 79 by deposition and planarization of a conductive barrier material (such as TiN, TaN, or WN) and a conductive fill material such as W, Ru, Mo, Co, etc. Each combination of a backside conductive barrier liner 76A and a backside conductive fill material portion 76B is herein referred to as a backside contact via structure 76. Alternatively, the above described insulating spacer layer 74L can be deposited to completely fill the entire volume of a backside trench 79 and may consist essentially of at least one dielectric material. In this alternative embodiment, the source region 61 and the backside contact via structure 76 may be omitted, and a horizontal source line (e.g., direct strap contact) may contact a side of the lower portion of the semiconductor channel 60.

Generally, a first backside trench fill structure (74, 76) and a second backside trench fill structure (74, 76) can be formed on sidewalls of each vertical repetition of instances of a unit layer stack (32, 46A, 36, 46B). A first backside trench fill structure (74, 76) comprising a first dielectric surface can contact first sidewalls of each layer within the vertically stack, and can laterally extend along a first horizontal direction. A second backside trench fill structure (74, 76) comprising a second dielectric surface can contact second sidewalls of each layer within the vertical repetition, can laterally extend along the second horizontal direction, and can be laterally spaced from the first backside trench fill structure (74, 76) along a second horizontal direction.

In one embodiment, vertical interfaces between an insulating spacer 74 and a contiguous set of a first-type electrically conductive layers 46A, a second-type insulating layers 36, and a second-type electrically conductive layers 46B can be laterally offset from vertical interfaces between the insulating spacer 74 and the first-type insulating layers 32. In this case, each of the first backside trench fill structure (74, 76) and the second backside trench fill structure (74, 76) has a respective laterally-undulating vertical cross-sectional profile in a vertical plane that is perpendicular to the first horizontal direction, and each of the first backside trench fill structure (74, 76) and the second backside trench fill structure (74, 76) has a greater width at levels of the first-type electrically conductive layers 46A, the seamed insulating layers (as embodied as the second-type insulating layers 36), and the second-type electrically conductive layers 46B than at levels of the seamless insulating layers (as embodied as the first-type insulating layers 32).

In one embodiment, each horizontally-extending seam within the seamed insulating layers (as embodied as the second-type insulting layers 36) may be laterally spaced from, and does not contact, any of the first backside trench fill structure (74, 76) and the second backside trench fill structure (74, 76). In one embodiment, each of the first backside trench fill structure (74, 76) and the second backside trench fill structure (74, 76) comprises: a backside contact via structure 76 contacting a respective source region 61 in the substrate (9, 10); and an insulating spacer 74 laterally surrounding the backside contact via structure 76 and comprising a respective one of the first dielectric surface and the second dielectric surface as an outer surface. In one embodiment, each of the memory opening fill structures 58 comprises a respective straight outer sidewall that extends through each layer within the vertical repetition and contacts each layer within the vertical repetition.

Figure 12:
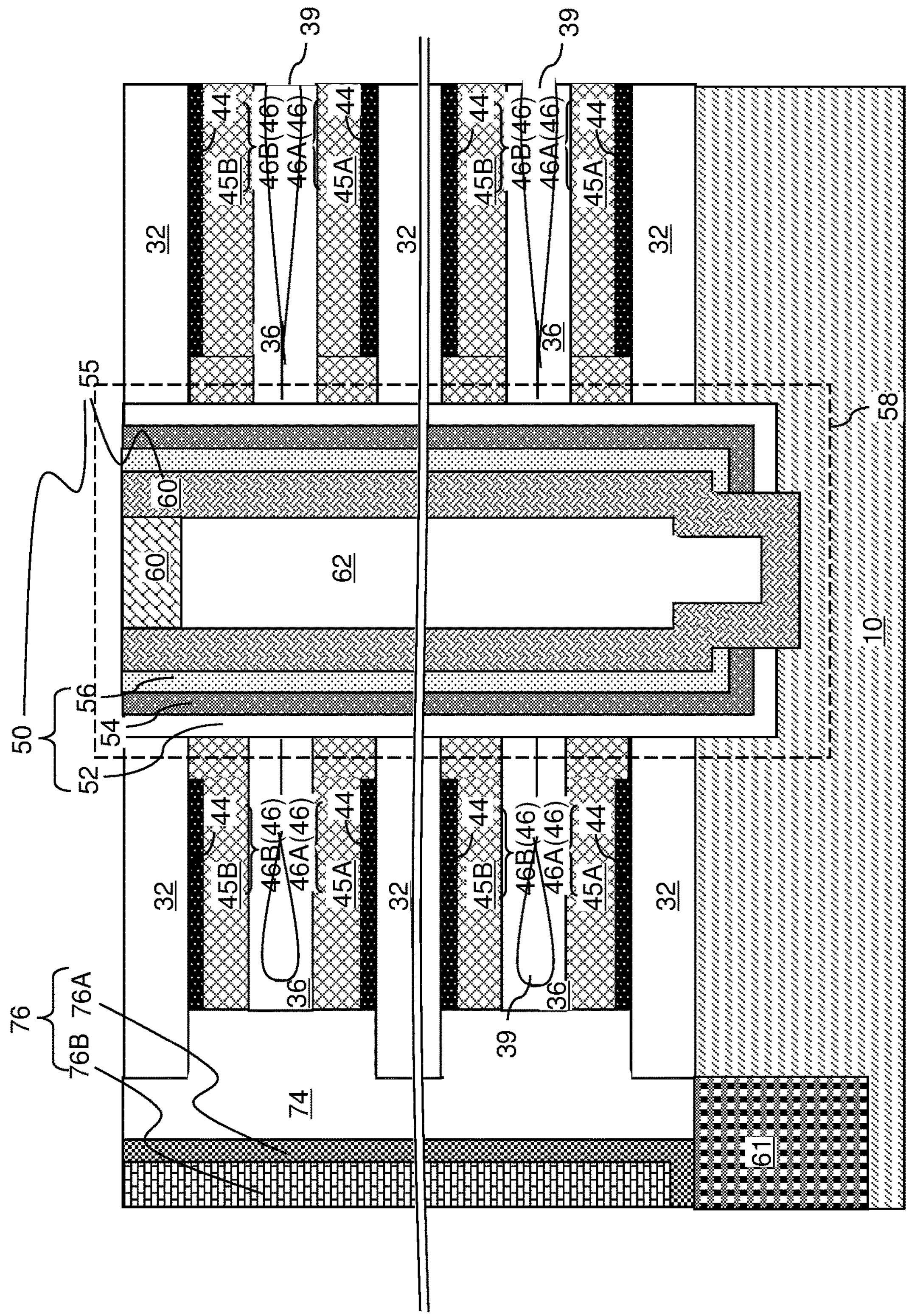
FIG. 12 is a vertical cross-sectional view of a first alternative configuration of a region of the first exemplary structure according to the first embodiment of the present disclosure.

Referring to FIG. 12, a first alternative configuration of a region of the first exemplary structure is illustrated at a processing step that is equivalent to the processing step of FIG. 11D. The first alternative configuration can be derived from the first exemplary structure illustrated in FIG. 11D by employing a non-conformal deposition process at the processing step of FIG. 9 to deposit an insulating fill material layer 36L. In this case, at least one instance, or each instance, of the seamed insulating layers (i.e., the second-type insulating layers 36) comprises an air gap 39 (e.g., an encapsulated cavity that is free of any solid phase material and is encapsulated by the second-type insulating layer 36). The dielectric material layer has an upper horizontally-extending portion and a lower horizontally-extending portion that are adjoined to each other at a periphery of the air gap 39 at a respective horizontally-extending seam (which contact the memory opening fill structures 58 and the support pillar structures).

Figure 13:
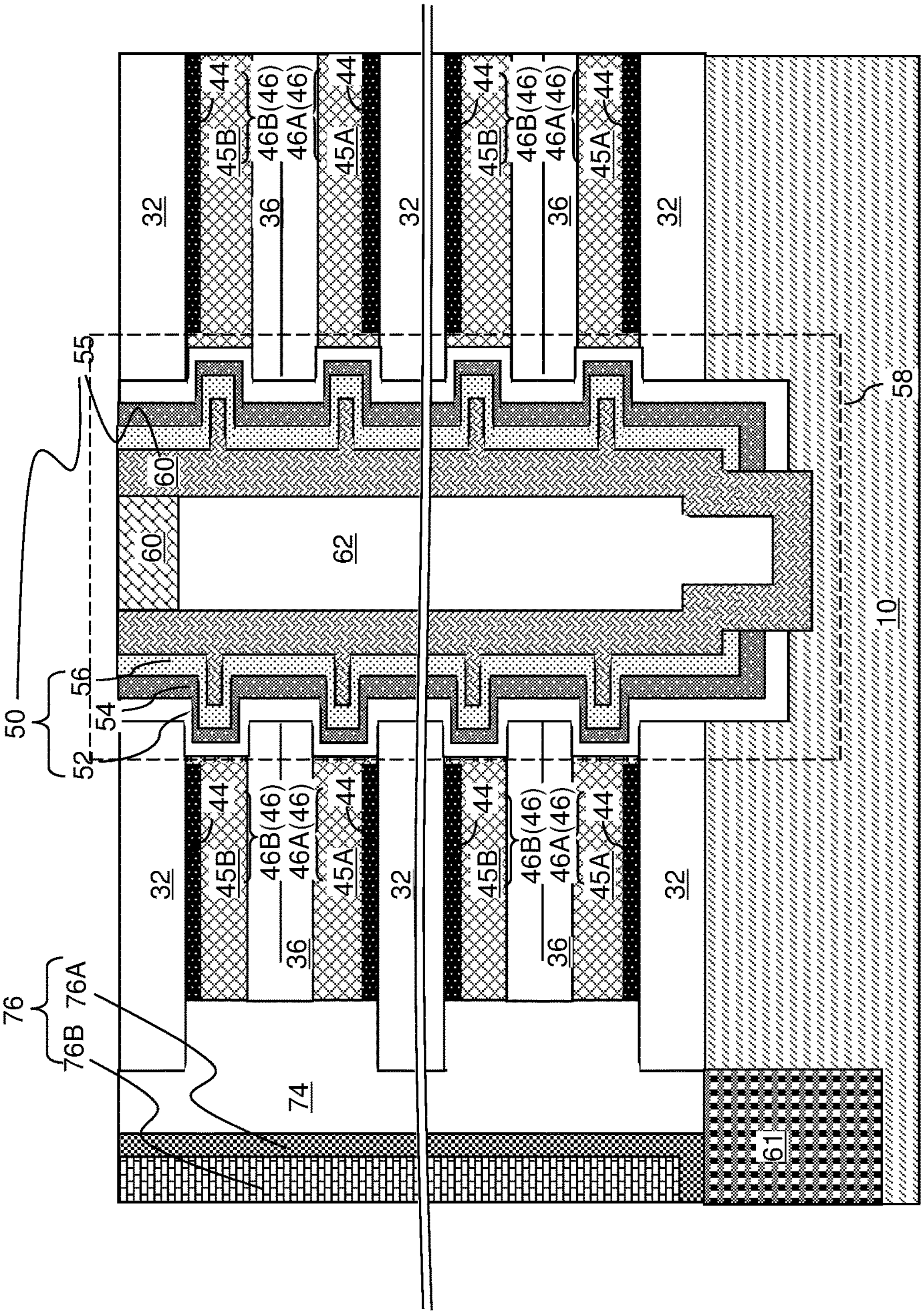
FIG. 13 is a vertical cross-sectional view of a second alternative configuration of a region of the first exemplary structure according to the first embodiment of the present disclosure.

Referring to FIG. 13, a second alternative configuration of a region of the first exemplary structure is illustrated at a processing step that is equivalent to the processing step of FIG. 11D. The first exemplary structure illustrated in FIG. 10A can be modified prior to the processing steps of FIG. 10B by laterally recessing the conductive fill material layers 45' selective to the first-type insulating layers 32 and selective to the second-type insulating layers 36. In this embodiment, the memory opening fill structures 58 comprise a respective laterally-undulating outer sidewall that extends through each layer within the vertical repetition (32, 46A, 36, 46B) and laterally protrudes outward at levels of the first-type electrically conductive layers 46A and the second-type electrically conductive layers 46B relative to levels of the first-type insulating layers and the second-type (seamed) insulating layers 36, as shown in FIG. 13.

Figure 14:
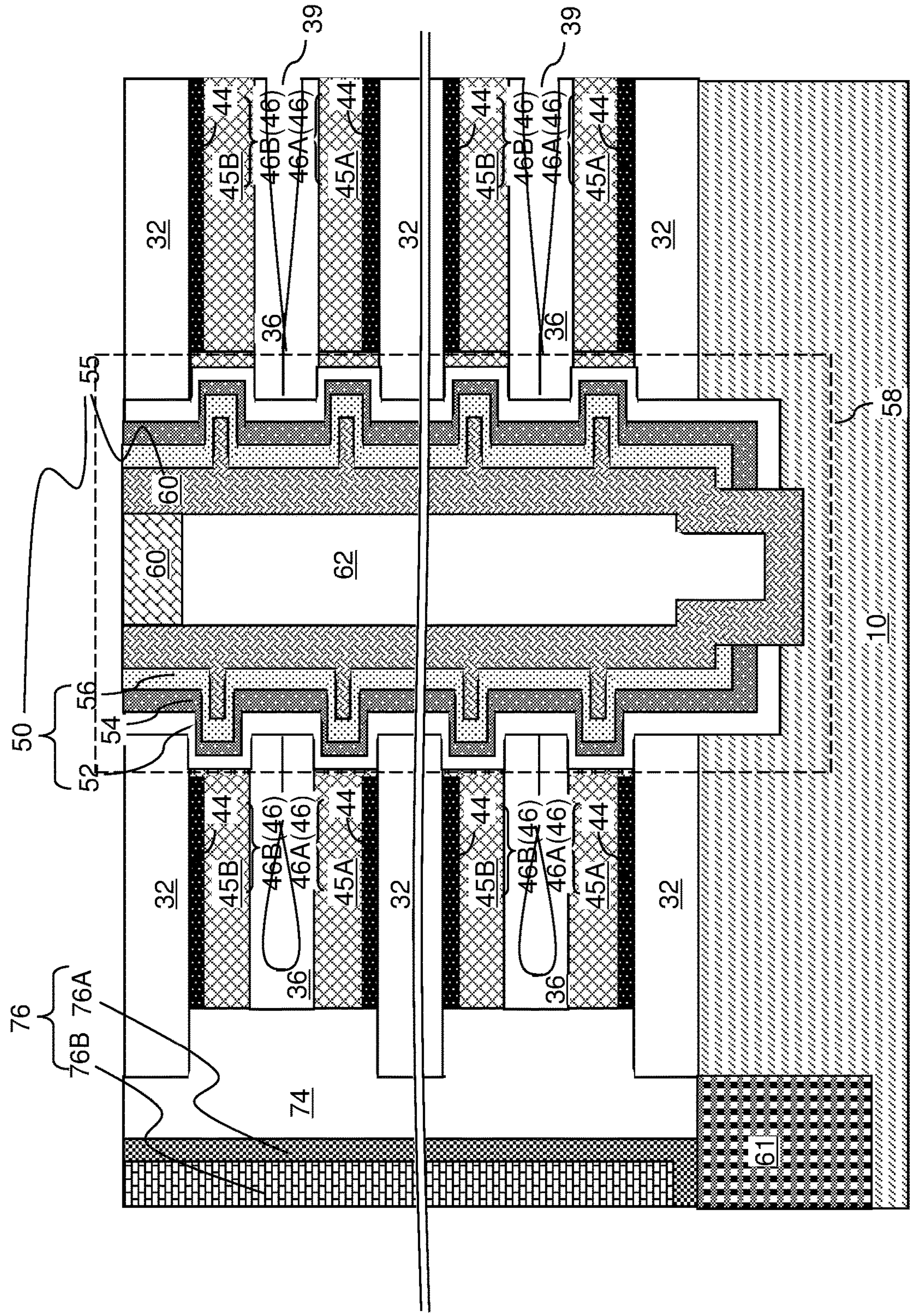
FIG. 14 is a vertical cross-sectional view of a third alternative configuration of a region of the first exemplary structure according to the first embodiment of the present disclosure.

FIG. 14 is a vertical cross-sectional view of a third alternative configuration of a region of the first exemplary structure is illustrated at a processing step that is equivalent to the processing step of FIG. 11D. A non-conformal deposition process at the processing step of FIG. 9 to deposit an insulating fill material layer 36L. Further, the first exemplary structure illustrated in FIG. 10A can be modified prior to the processing steps of FIG. 10B by laterally recessing the conductive fill material layers 45' selective to the first-type insulating layers 32 and selective to the second-type insulating layers 36. In this embodiment, each of the memory opening fill structures 58 comprises a respective laterally-undulating outer sidewall, and the second-type insulating layers 36 include air gaps 39.

Figure 15A:
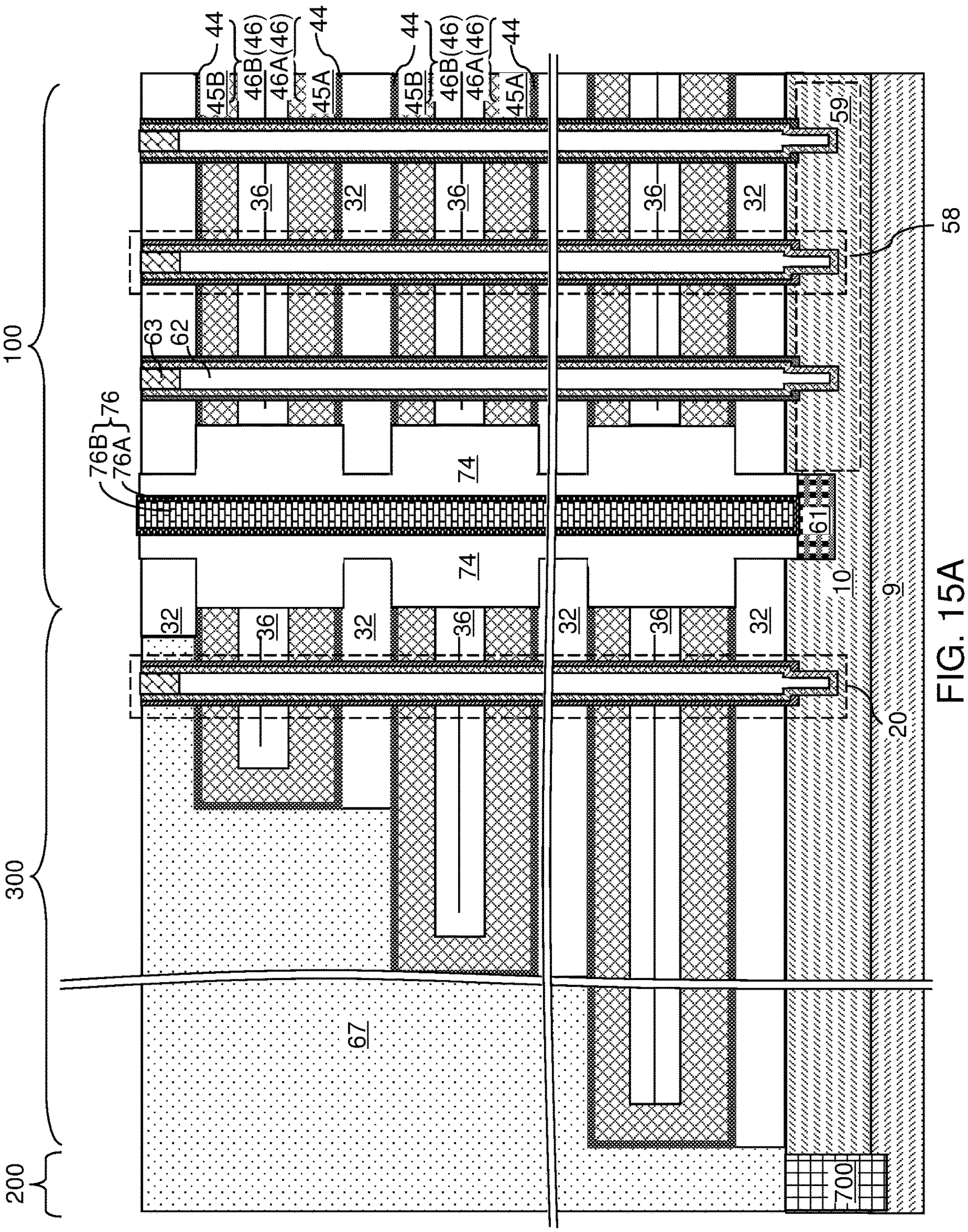
FIG. 15A is a vertical cross-sectional view of the first exemplary structure after replacement of the sacrificial backside trench fill structures with backside trench fill structures according to the first embodiment of the present disclosure.
Figure 15B:
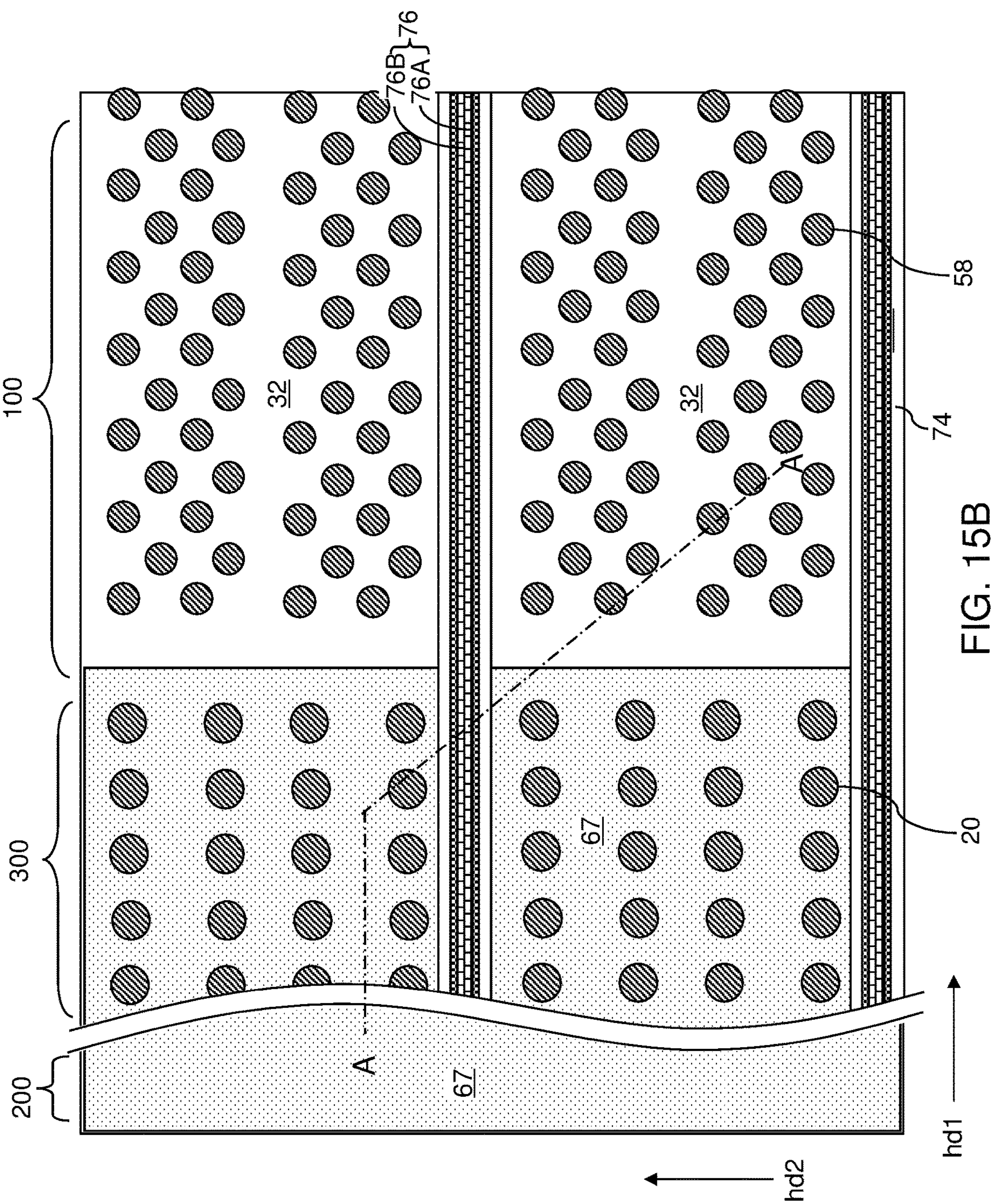
FIG. 15B is a partial see-through top-down view of the first exemplary structure of FIG. 15A. The vertical plane A-A' is the plane of the schematic vertical cross-sectional view of FIG. 15A.

Referring to FIGS. 15A and 15B, the first exemplary structure is illustrated after replacement of the sacrificial backside trench fill structures (75, 77) with backside trench fill structures (74, 76). Memory opening fill structures 58 are located within the memory openings 49, and support pillar structures 20 are located within the support openings 19.

Figure 16:
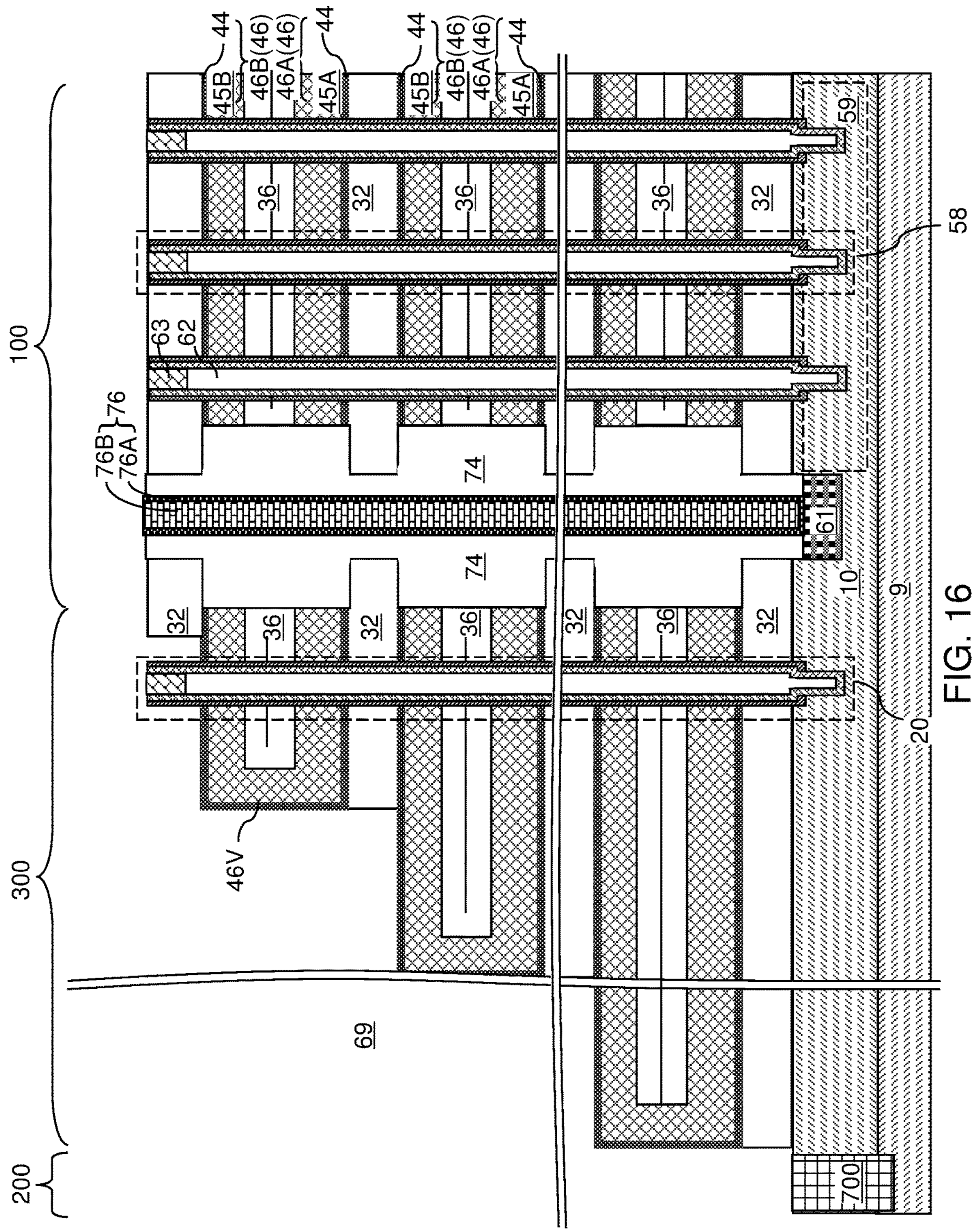
FIG. 16 is a vertical cross-sectional view of the first exemplary structure after removal of the sacrificial retro-stepped dielectric material portion according to the first embodiment of the present disclosure.

Referring to FIG. 16, the sacrificial retro-stepped dielectric material portion 67 can be removed selective to the materials of the first-type insulating layers 32, the electrically conductive layers (46A, 46B), the memory opening fill structures 58, and the support pillar structures 20. For example, if the sacrificial retro-stepped dielectric material portion 67 comprises organosilicate glass or a doped silicate glass, a wet etch process employing dilute hydrofluoric acid may be performed to remove the sacrificial retro-stepped dielectric material portion 67. A retro-stepped cavity 69 can be formed in the volume from which the sacrificial retro-stepped dielectric material portion 67 is removed. In one embodiment, each first-type electrically conductive layer 46A can be connected to a respective second-type electrically conductive layer 46B by a vertically-connecting electrically conductive material portion (i.e., vertical conductive strap) 46V including the same material as the first-type electrically conductive layers 46A and the second-type electrically conductive layers 46B and located underneath the stepped surfaces within the contact region 300.

Figure 17:
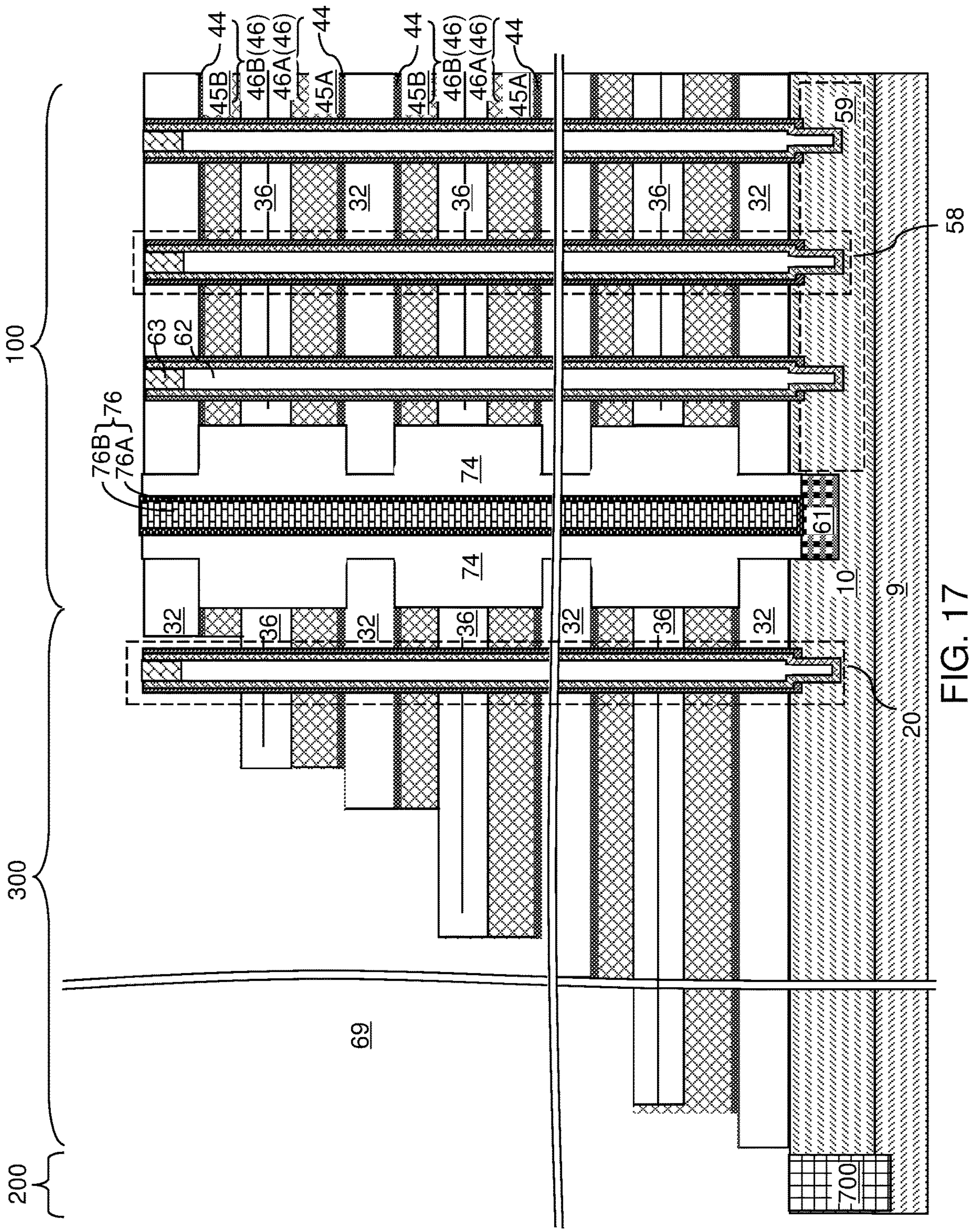
FIG. 17 is a vertical cross-sectional view of the first exemplary structure after removing vertically-connecting portions of the electrically conductive layers according to the first embodiment of the present disclosure.

Referring to FIG. 17, an isotropic etch process can be performed to remove proximal portions of the at least one conductive fill material of the electrically conductive layers (46A, 46B) from the staircase region (i.e., contact region 300). Vertically-extending portions (i.e., portions 46V) of the at least one conductive fill material are removed from sidewalls of the second-type insulating layers 36 located within the staircase region. Specifically, the vertically-connecting electrically conductive material portions 46V of the at least one conductive fill material located underneath the stepped surfaces within the contact region 300 can be removed by the isotropic etch process. Each pair of a first-type electrically conductive layer 46A and a second-type electrically conductive layer 46B connected by a respective vertically-connecting electrically conductive material portion 46V can be physically detached from each other, and can be electrically isolated from each other, upon removal of the vertically-connecting electrically conductive material portions 46V. In one embodiment, a wet etch process that etches the conductive materials of the vertically-connecting electrically conductive material portions 46V selective to the materials of the first-type insulating layers 32 and the second-type insulating layers 36 can be employed to etch the vertically-connecting electrically conductive material portions 46V. Sidewalls of the second-type insulating layers 36 can be physically exposed after the isotropic etch process.

Figure 18A:
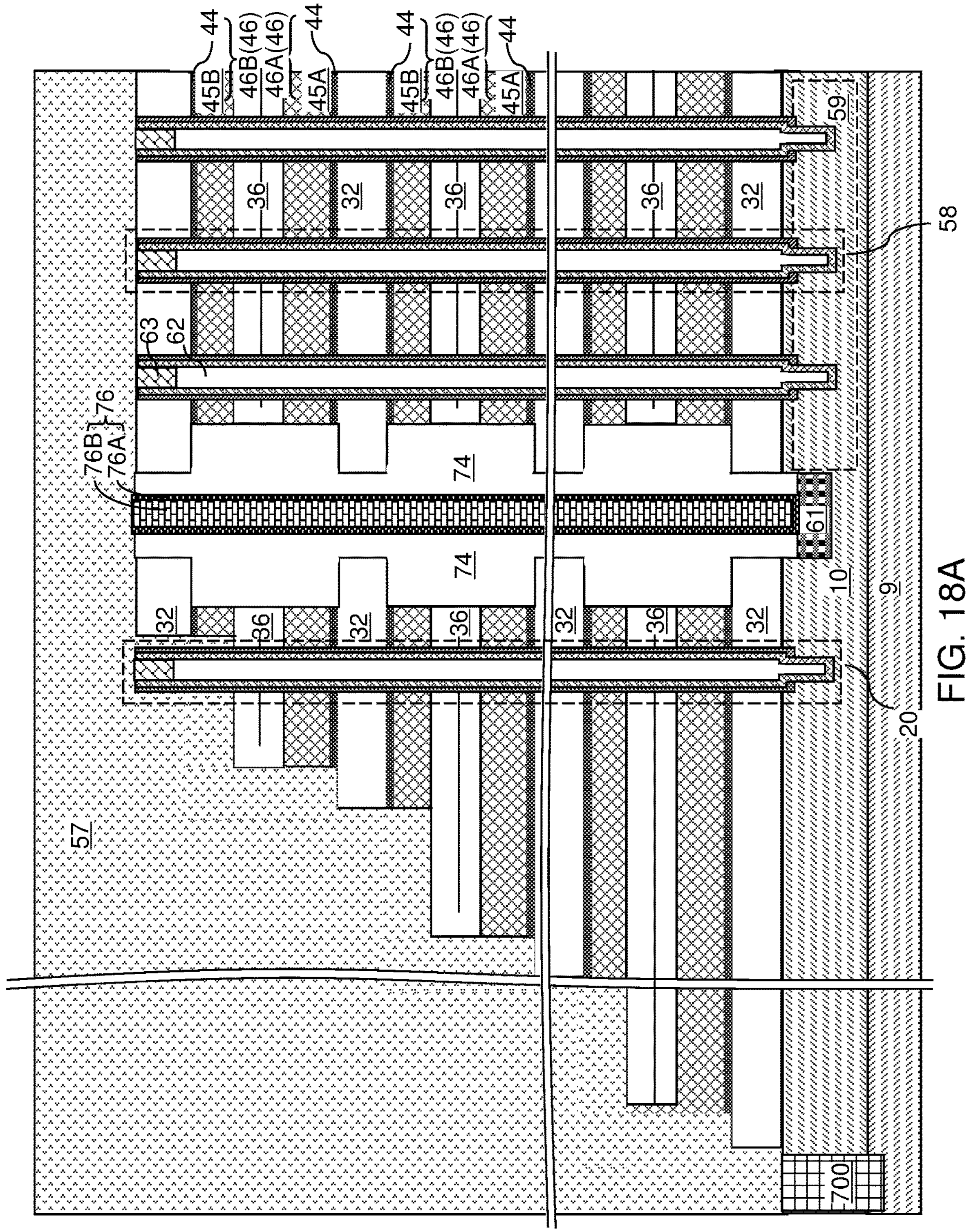
FIG. 18A is a vertical cross-sectional view of the first exemplary structure after application and pattering of a photoresist layer and an anisotropic etch process according to the first embodiment of the present disclosure.
Figure 18B:
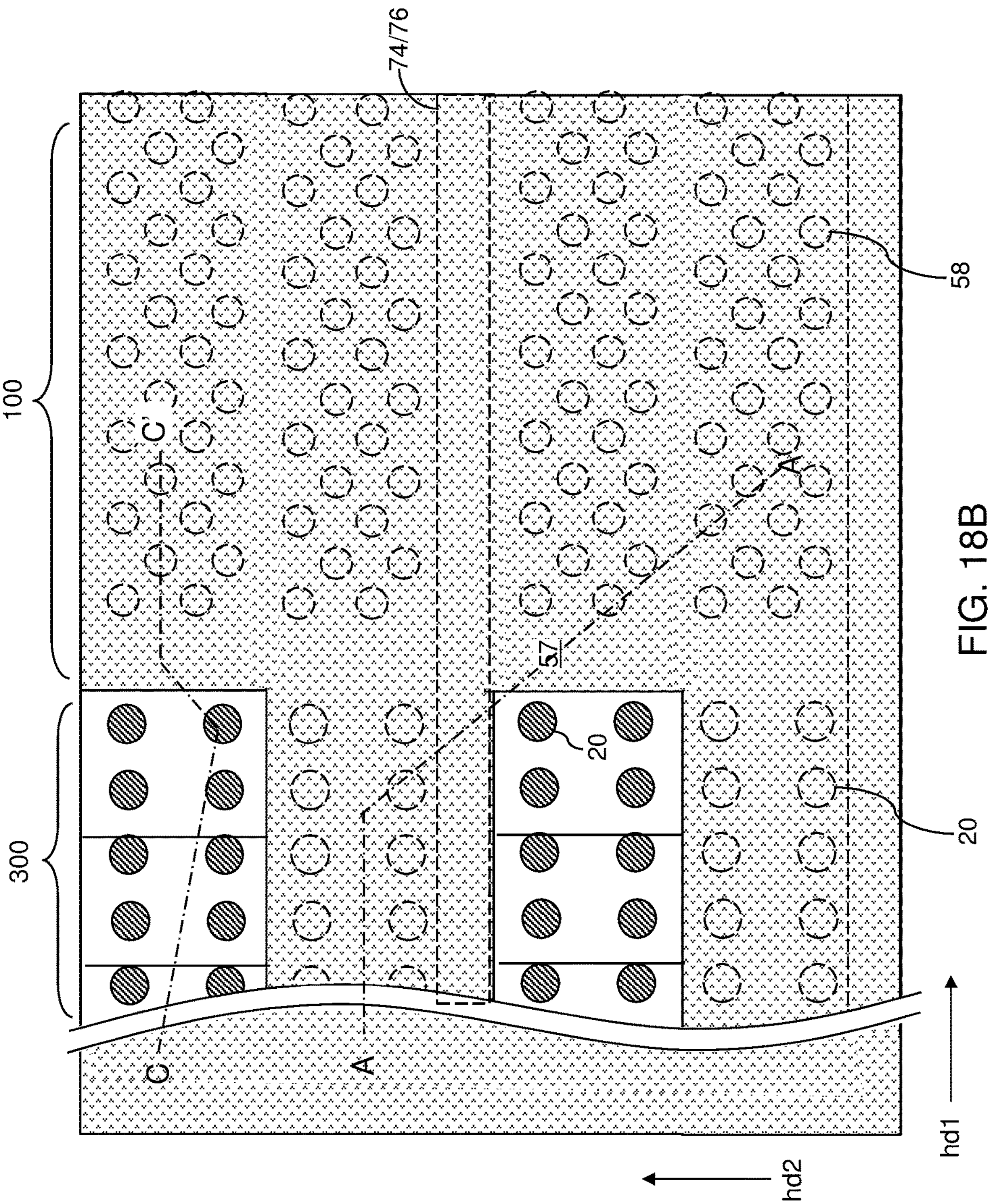
FIG. 18B is a partial see-through top-down view of the first exemplary structure of FIG. 18A. The vertical plane A-A' is the plane of the schematic vertical cross-sectional view of FIG. 18A.
Figure 18C:
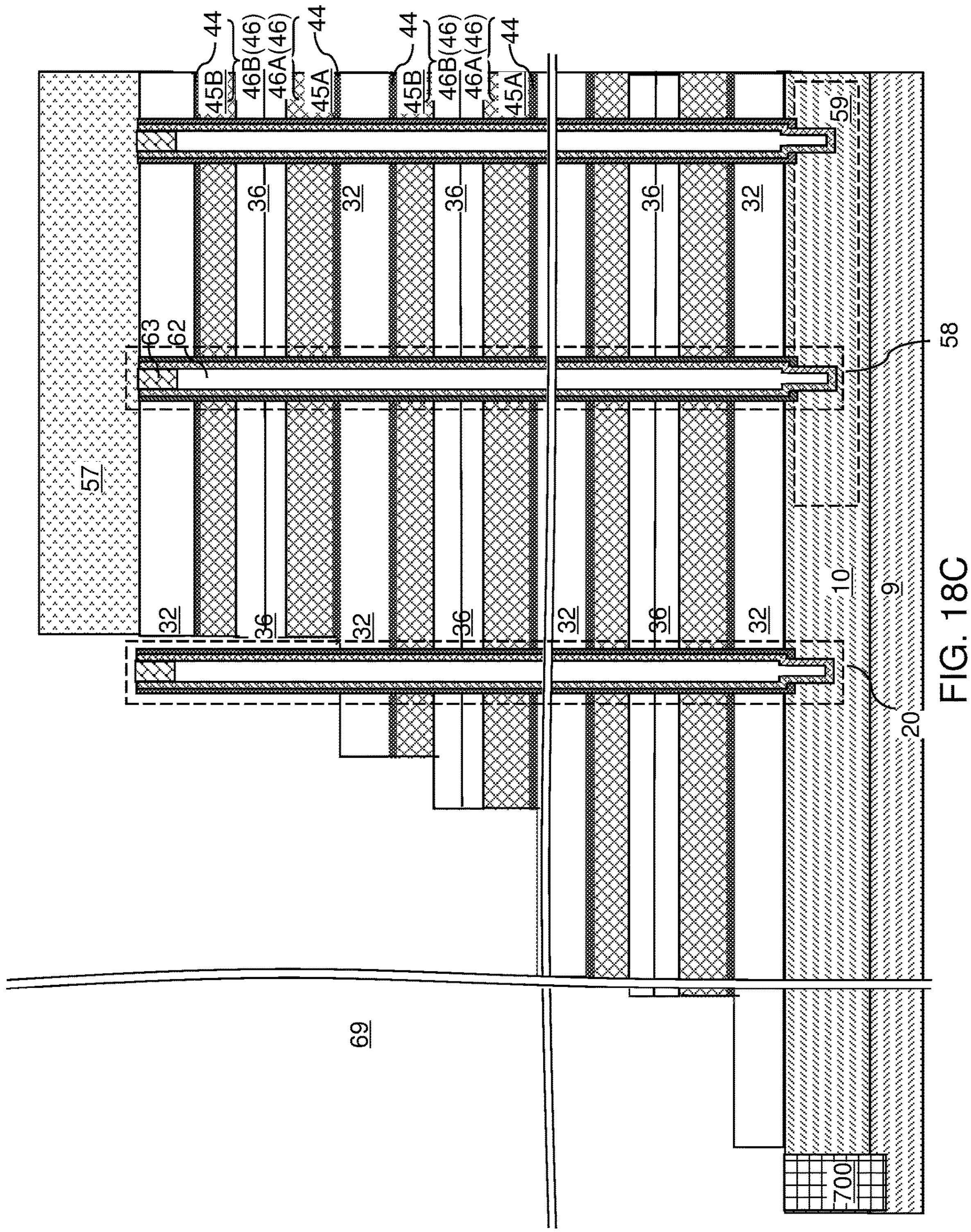
FIG. 18C is a vertical cross-sectional view along the vertical plane C-C' of FIG. 18B.

Referring to FIGS. 18A-18C, an optional etch mask layer 57 can be applied over the exemplary structure, and can be lithographically patterned to cover first areas within the contact region 300 without covering second areas of the contact region 300. In one embodiment, the etch mask layer 57 may be a patterned photoresist layer. In one embodiment, a first subset of the support pillar structures 20 can be covered by the etch mask layer 57, while a second subset of the support pillar structures 20 is not covered by the etch mask layer 57. The second areas of the staircase region that are not covered with the etch mask layer 57 can optionally be anisotropically etched such that a second-type insulating layer 36 and a first-type electrically conductive layer 46A are etched within the second areas. In this case, portions of the stepped surfaces within the second area are vertically recessed at least by a sum of the thickness of an instance of the second-type insulating layer 36 and the thickness of a first-type electrically conductive layer 46A that includes a horizontally-extending portion of the at least one conductive fill material. The etch mask layer 57 can be subsequently removed.

Figure 19A:
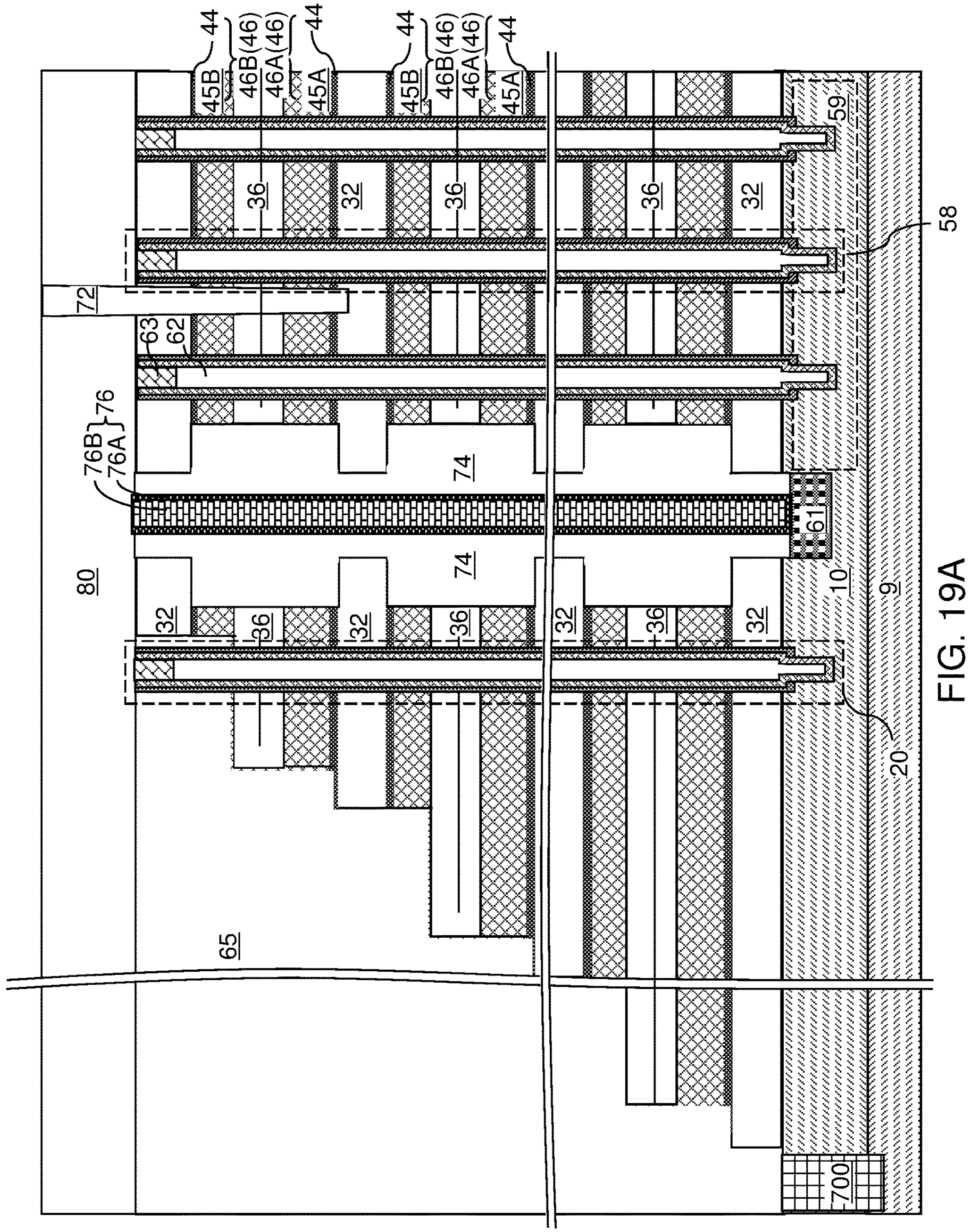
FIG. 19A is a vertical cross-sectional view of the first exemplary structure after formation of a retro-stepped dielectric material portion and a contact-level dielectric layer according to the first embodiment of the present disclosure.
Figure 19B:
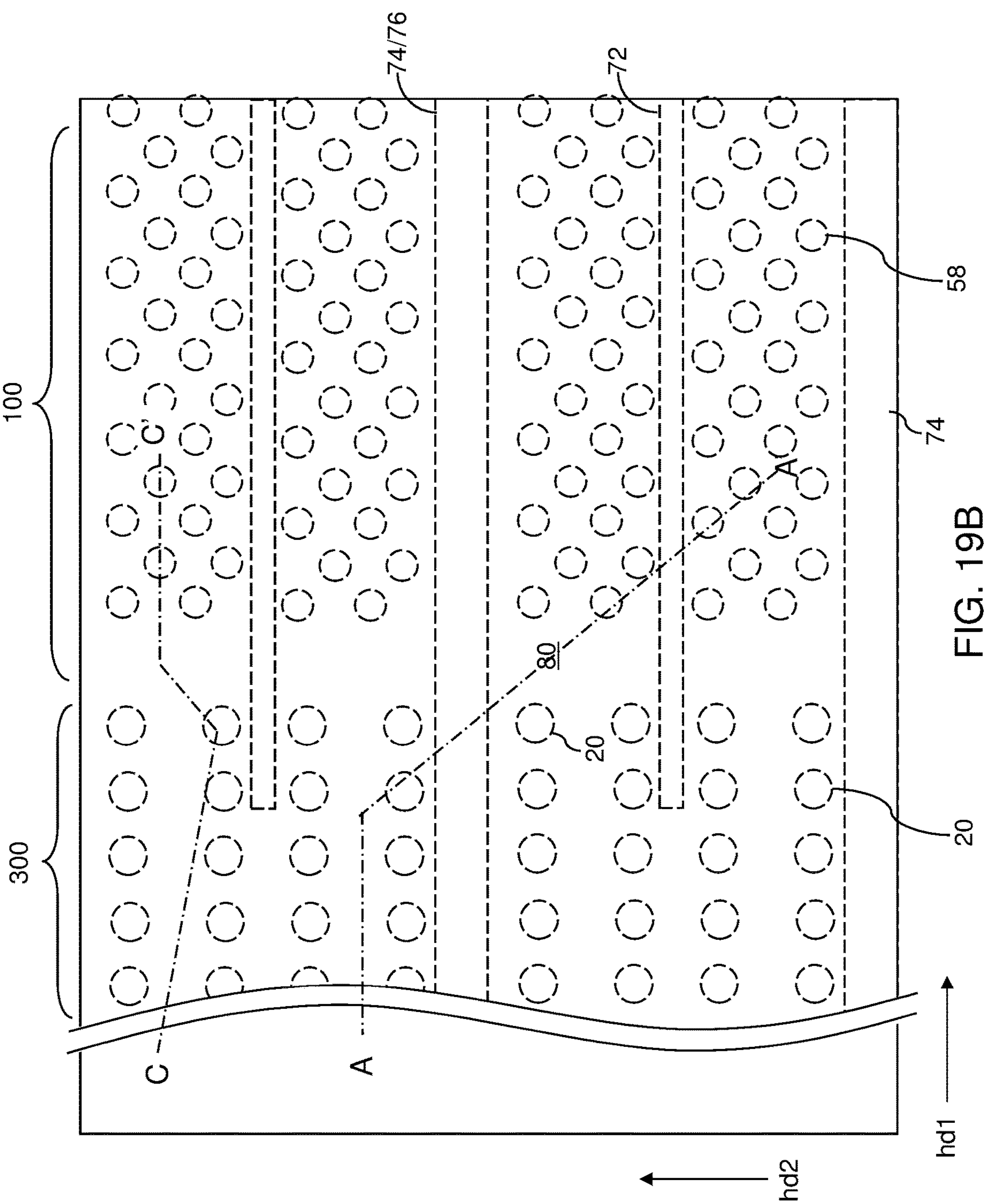
FIG. 19B is a partial see-through top-down view of the first exemplary structure of FIG. 19A. The vertical plane A-A' is the plane of the schematic vertical cross-sectional view of FIG. 19A.
Figure 19C:
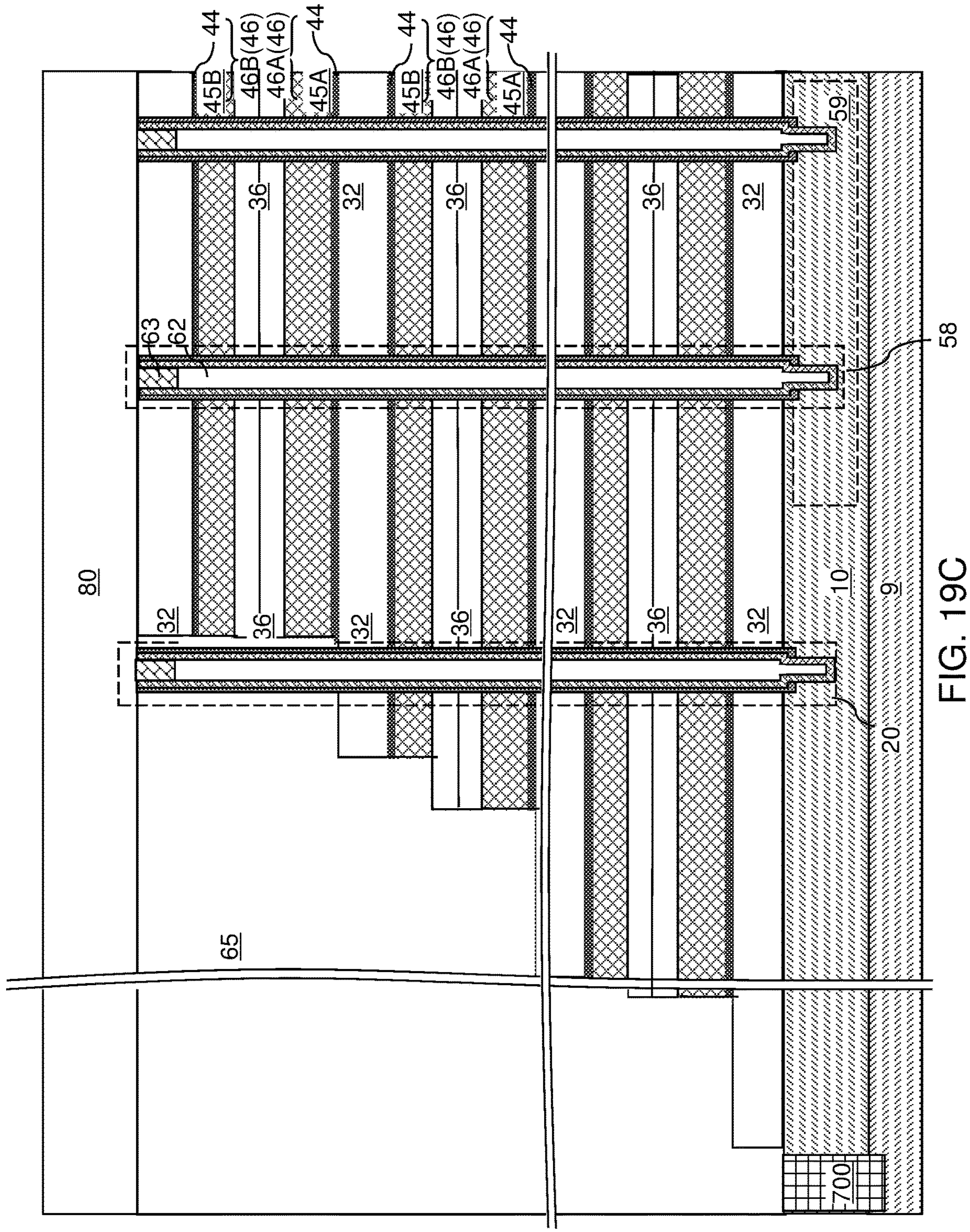
FIG. 19C is a vertical cross-sectional view along the vertical plane C-C' of FIG. 19B.

Referring to FIGS. 19A-19C, at least one dielectric material can be deposited in the retro-stepped cavity 69 and over the vertical repetition (32, 46A, 36, 46B). The at least one dielectric material can include, for example, undoped silicate glass, a doped silicate glass, and/or organosilicate glass. The portion of the at least one dielectric material that fills the retro-stepped cavity 69 constitutes a retro-stepped dielectric material portion 65. The portion of the at least one dielectric material that overlies the horizontal plane including the topmost surface of the vertical repetition (32, 46A, 36, 46B) constitutes a contact-level dielectric layer 80.

Figure 20A:
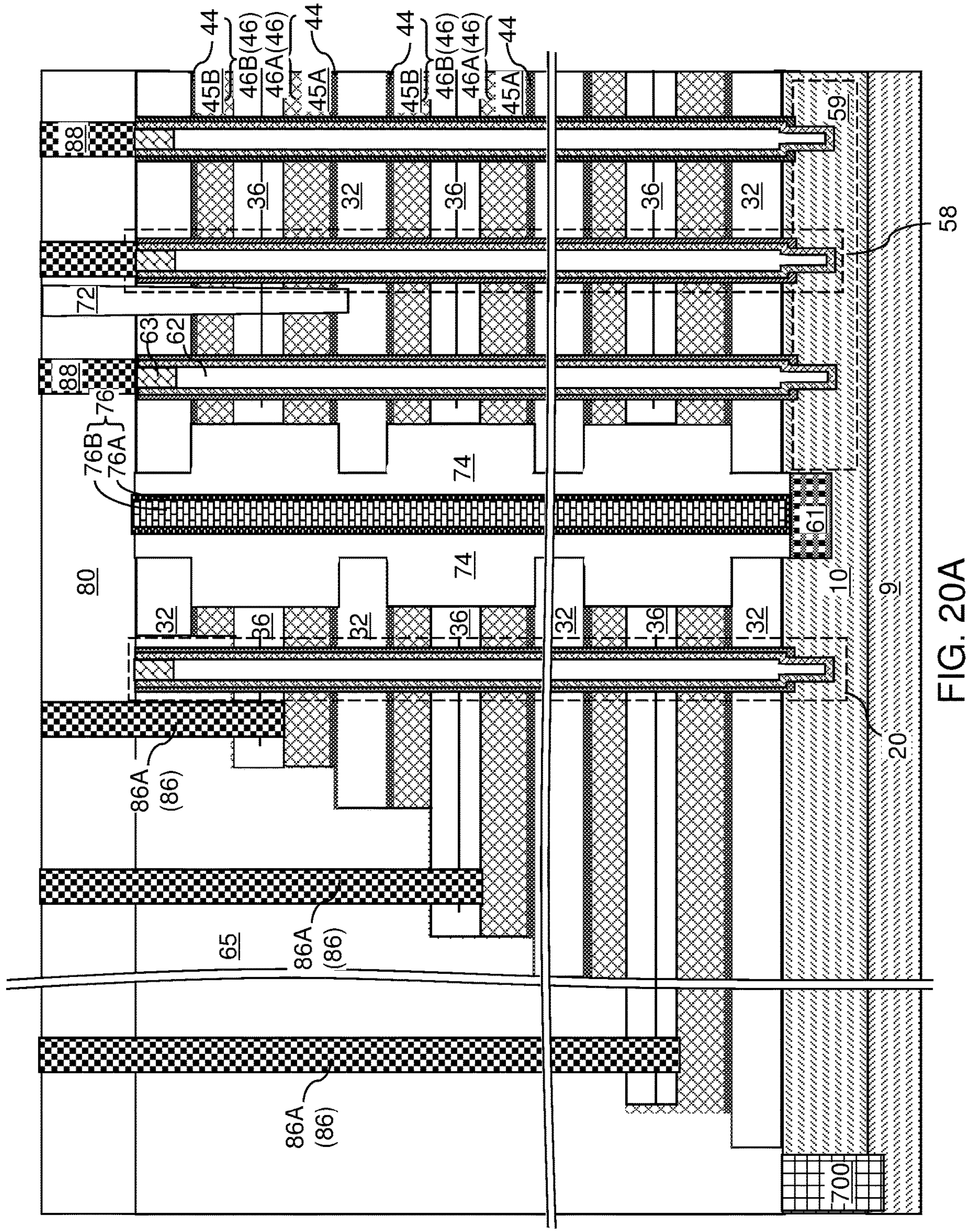
FIG. 20A is a vertical cross-sectional view of the first exemplary structure after formation of contact via structures according to the first embodiment of the present disclosure.
Figure 20B:
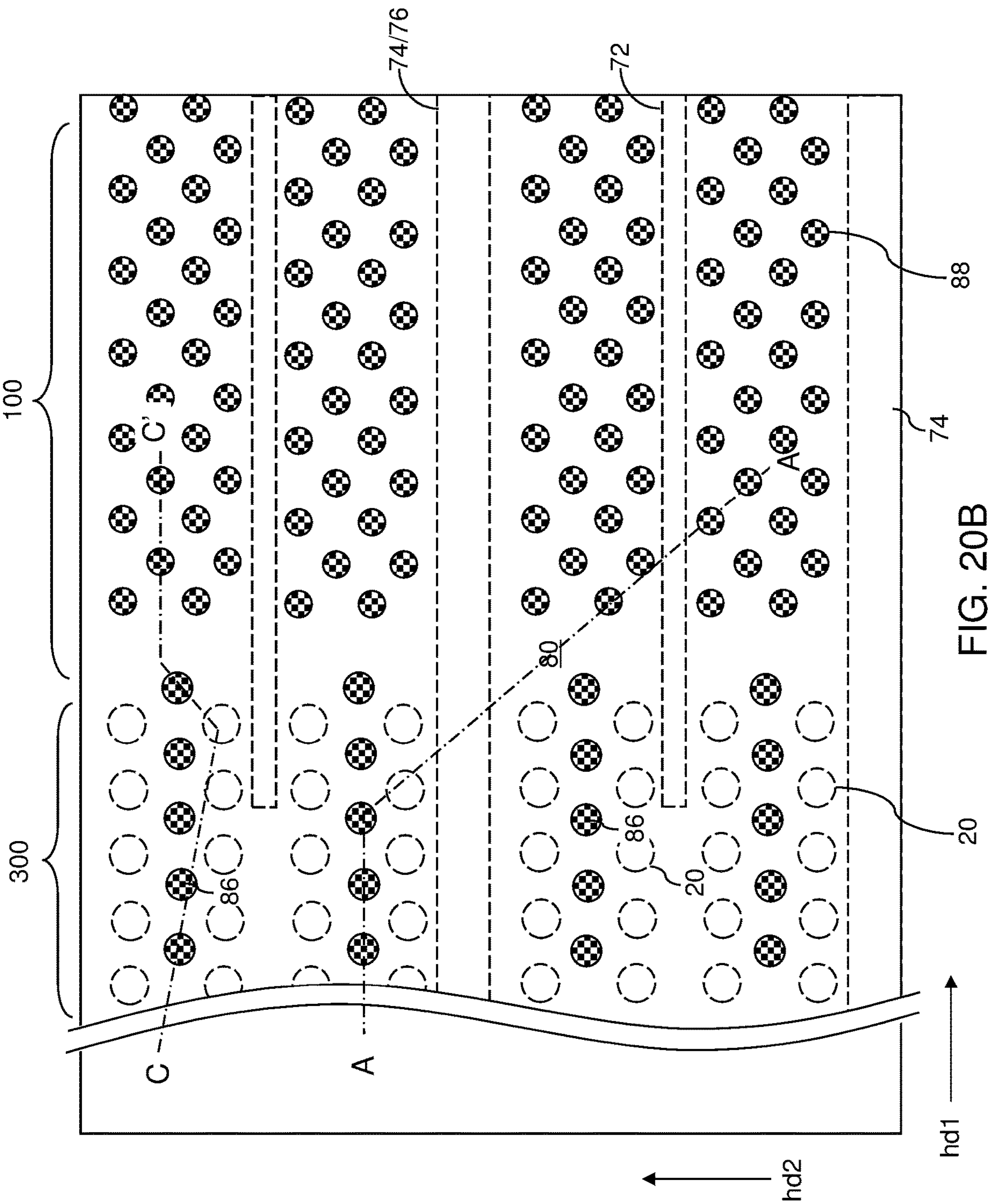
FIG. 20B is a partial see-through top-down view of the first exemplary structure of FIG. 20A. The vertical plane A-A' is the plane of the schematic vertical cross-sectional view of FIG. 20A.
Figure 20C:
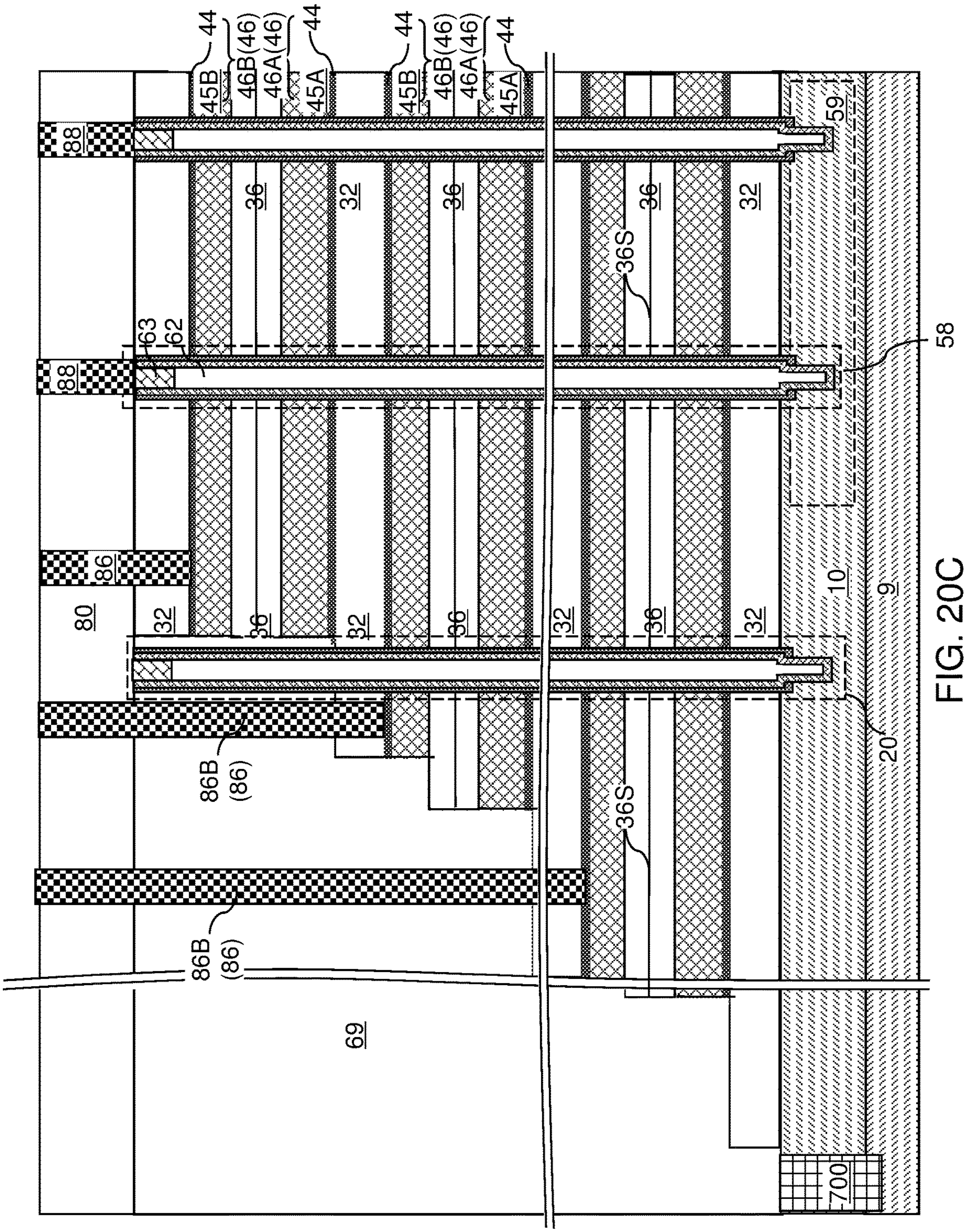
FIG. 20C is a vertical cross-sectional view along the vertical plane C-C' of FIG. 20B.

Referring to FIGS. 20A-20C, via cavities can be formed through the contact-level dielectric layer 80 and the retro-stepped dielectric material portion 65. The via cavities can vertically extend down to a top surface of a respective one of the drain regions 63 or to a top surface of a respective one of the first-type electrically conductive layers 46A and the second-type electrically conductive layers 46B. At least one conductive material, such as at least one conductive material, can be deposited in the via cavities. Drain contact via structures 88 can be formed on the top surfaces of the drain regions 63, and layer contact via structures (e.g., word line contact via structures) 86 can be formed on the top surfaces of the electrically conductive layers 46. The layer contact via structures 86 can include first layer contact via structures 86A contacting a top surface of a respective one of the first-type electrically conductive layers 46A, and second layer contact via structures 86B contacting a top surface of a respective one of the second-type electrically conductive layers 46B.

Drain-select-level dielectric isolation structures 72 can be formed along the first horizontal direction hd1 that is parallel to the lengthwise direction of the backside trench fill structures (74, 76) at drain select levels, which are levels of a topmost subset of the electrically conductive layers 46 (i.e., the levels of the drain side select gate electrodes). Each drain-select-level dielectric isolation structure 72 can vertically extend through at least a topmost electrically conductive layer 46B of the first-type electrically conductive layer 46A and the second-type electrically conductive layer 46B.

Figure 21:
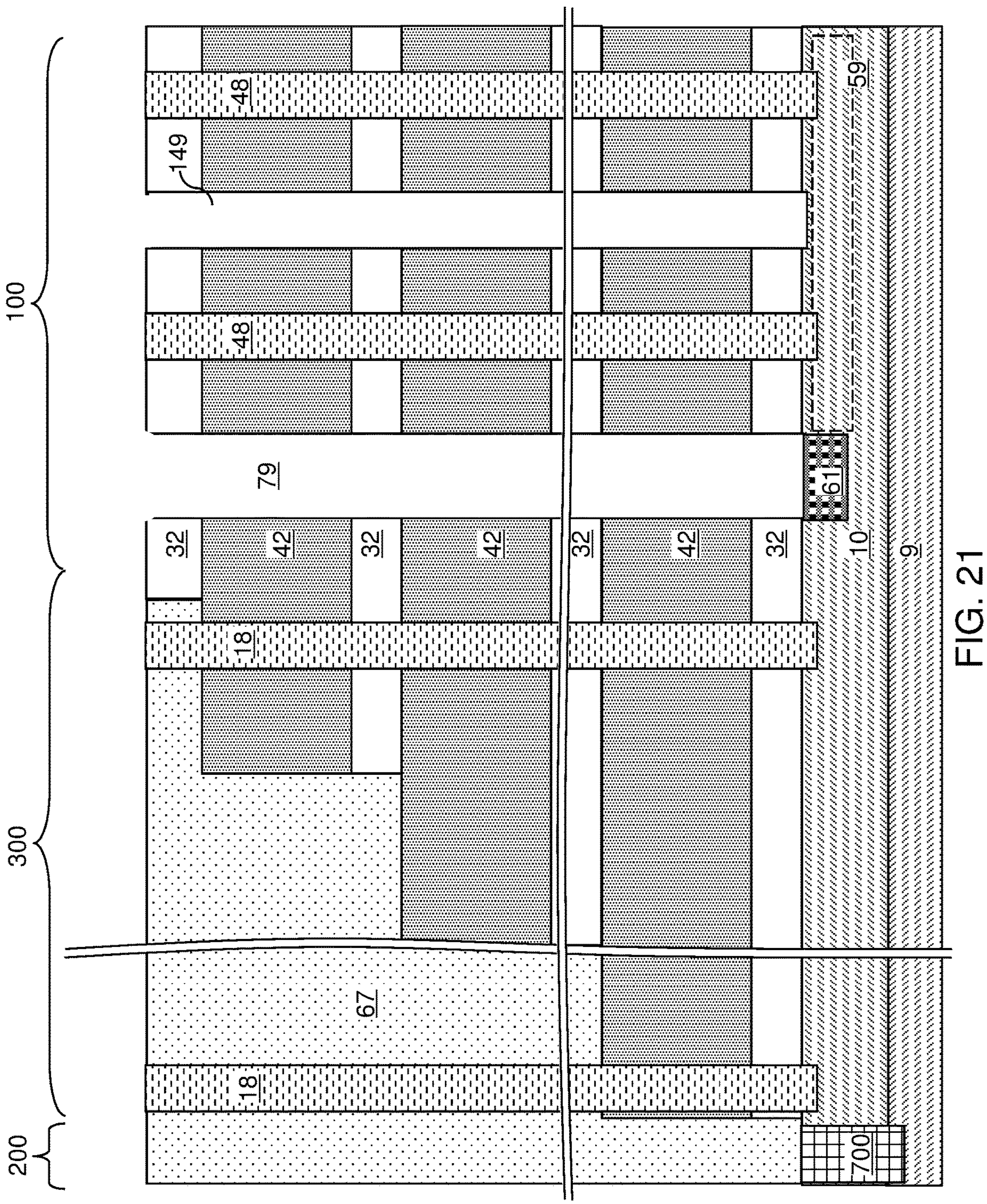
FIG. 21 is a vertical cross-sectional view of an alternative embodiment of the first exemplary structure after formation of backside trenches and pillar cavities according to the first embodiment of the present disclosure.

Referring to FIG. 21, an alternative embodiment of the first exemplary structure is illustrated at a processing step corresponding to the processing steps of FIGS. 6A and 6B. In the alternative embodiment, pillar cavities 149 are formed concurrently with formation of the backside trenches 79. In one embodiment, the pillar cavities 149 may be formed as cylindrical cavities located between laterally neighboring pairs of backside trenches 79. The pillar cavities 149 may be formed in the memory array region 100 and in the contact region 300 between respective memory openings 49 and the support openings 19.

Figure 22A:
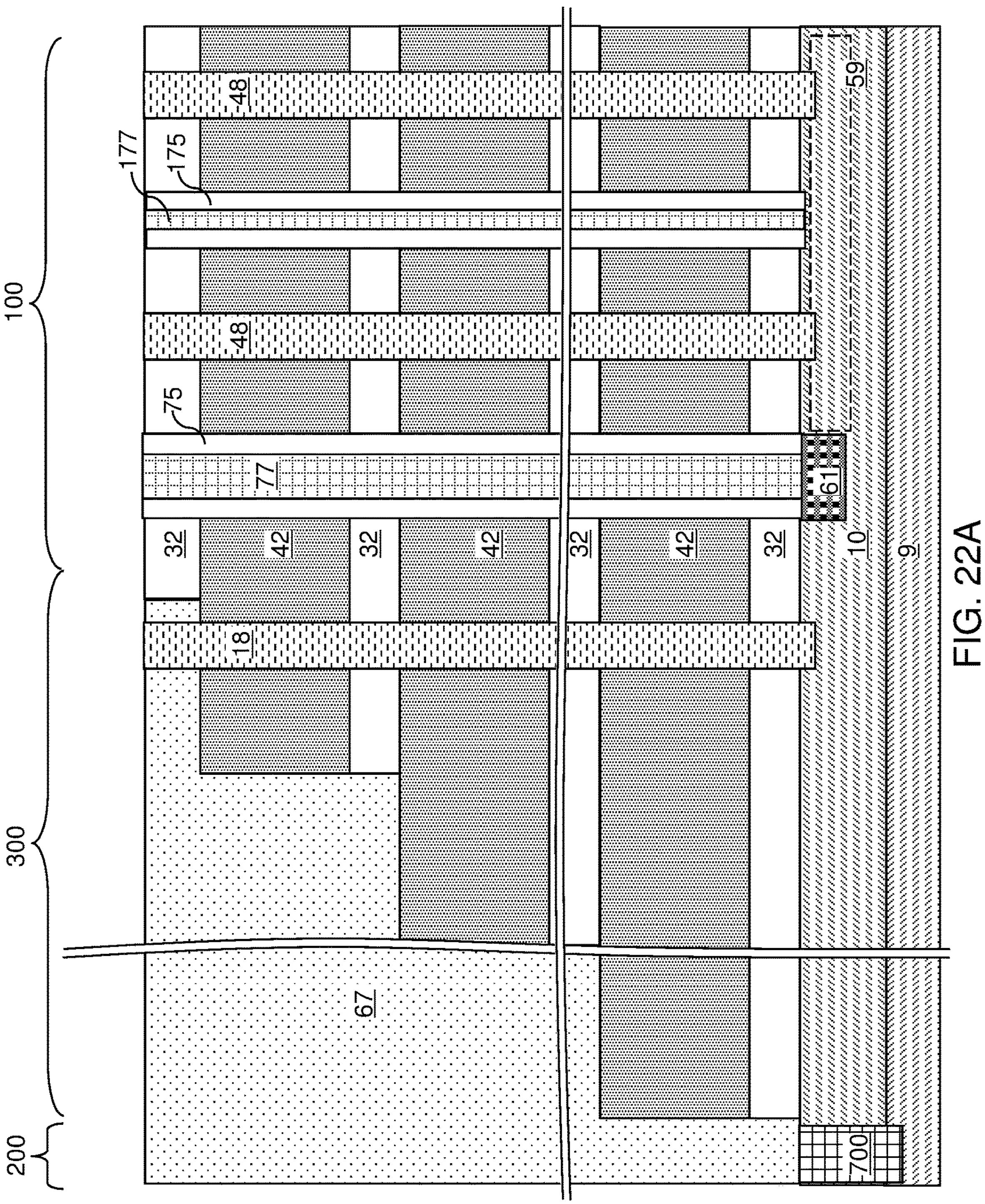
FIG. 22A is a vertical cross-sectional view of the alternative embodiment of the first exemplary structure after formation of sacrificial backside trench fill structures and sacrificial pillar structures according to the first embodiment of the present disclosure.
Figure 22B:
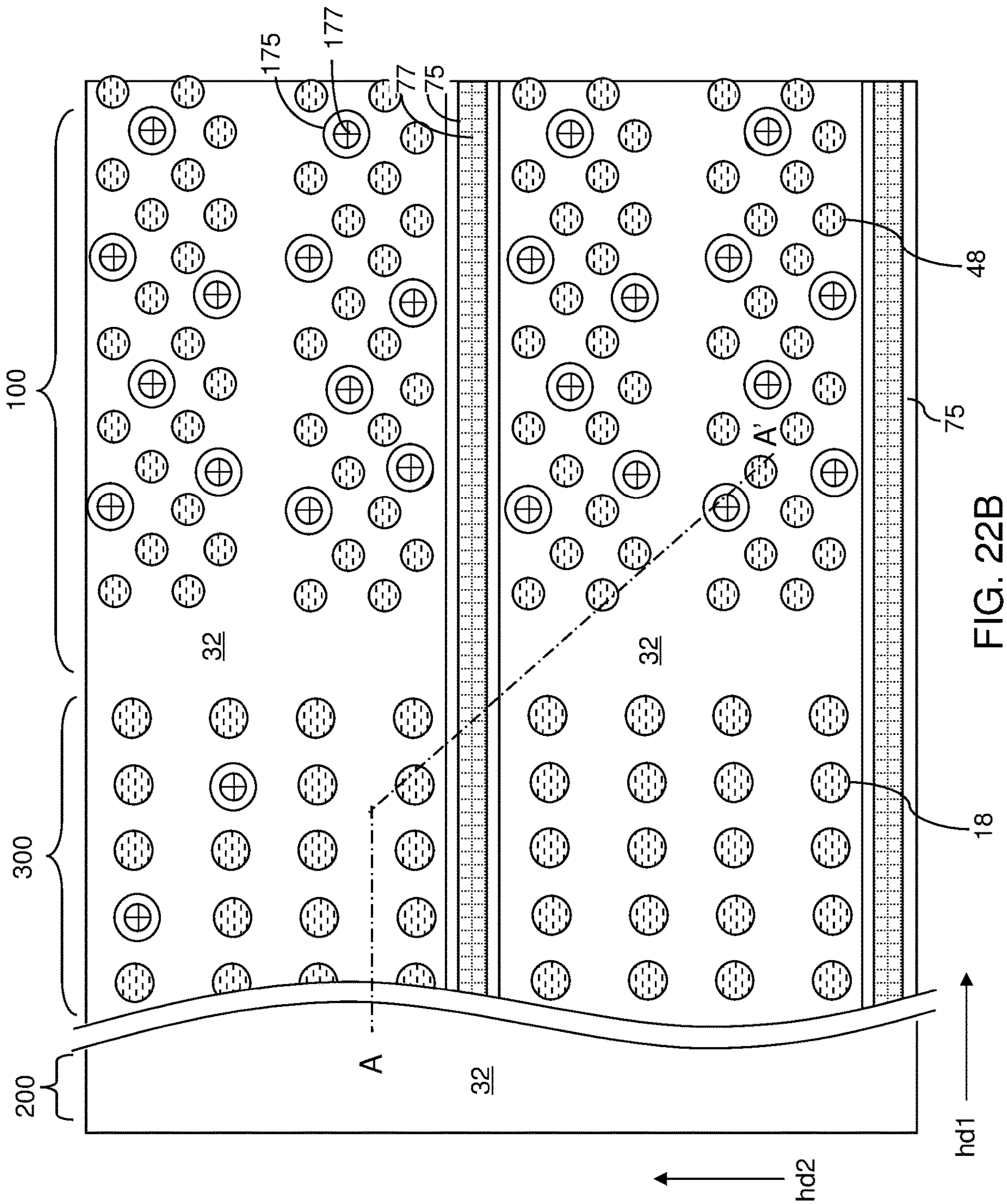
FIG. 22B is a partial see-through top-down view of the first exemplary structure of FIG. 22A. The vertical plane A-A' is the plane of the schematic vertical cross-sectional view of FIG. 22A.

Referring to FIGS. 22A and 22B, sacrificial pillar structures (175, 177) can be formed in the pillar cavities 149 concurrently with formation of sacrificial backside trench fill structures (75, 77). Each sacrificial pillar structure (175, 177) may include an optional cylindrical etch-stop spacer 175 including a same material as the optional etch-stop spacers 75, and a sacrificial pillar fill material portion 177 including a same material as the sacrificial trench fill material portions 77.

FIGS. 23A, 23B, 24A, 24B, 25A, 25B, 26A and 26B are sequential vertical cross-sectional views of a region between a memory opening 49 and a sacrificial pillar structure (175, 177) during formation of in-process electrically conductive layers (44, 45') according to the alternative embodiment of the first exemplary structure of first embodiment of the present disclosure. The steps in FIGS. 23A, 23B, 24A, 24B, 25A, 25B, 26A and 26B correspond to respective steps shown in FIGS. 9A-9H of the first embodiment of the present disclosure.

Figure 23B:
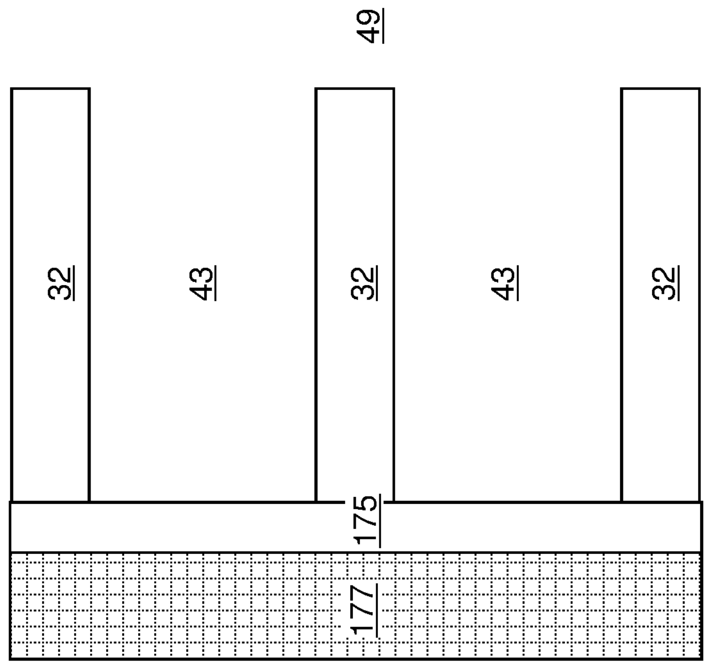
FIGS. 23A, 23B, 24A, 24B, 25A, 25B, 26A and 26B are sequential vertical cross-sectional view of a region of the alternative embodiment of the first exemplary structure during formation of memory opening fill structures at the steps that correspond to respective steps shown in FIGS. 9A-9H according to the first embodiment of the present disclosure.
Figure 23A:
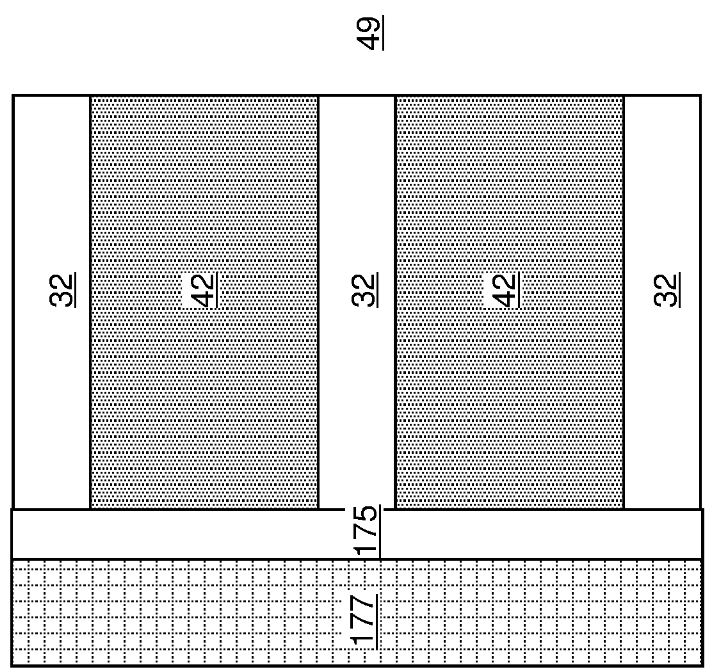
Figure 24B:
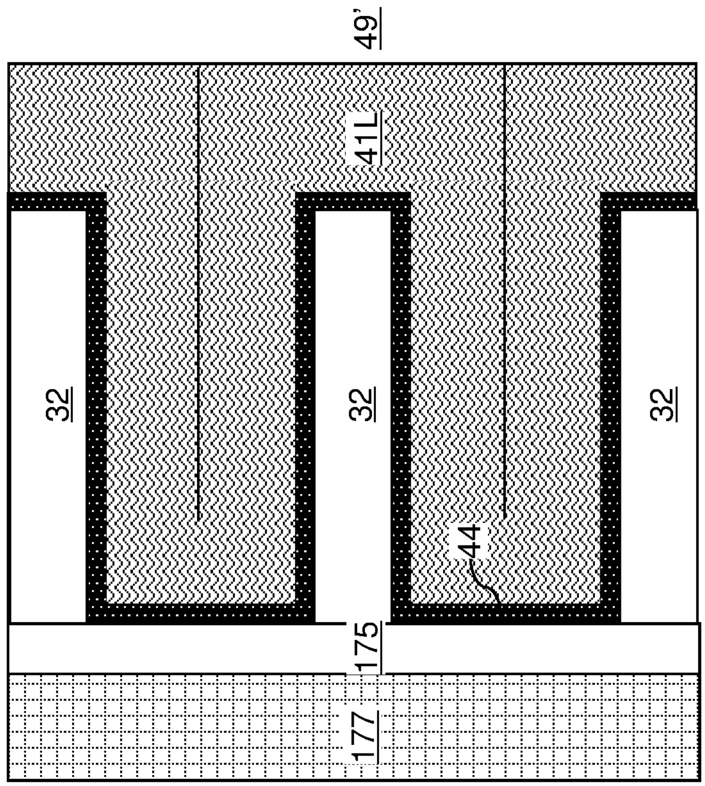
Figure 24A:
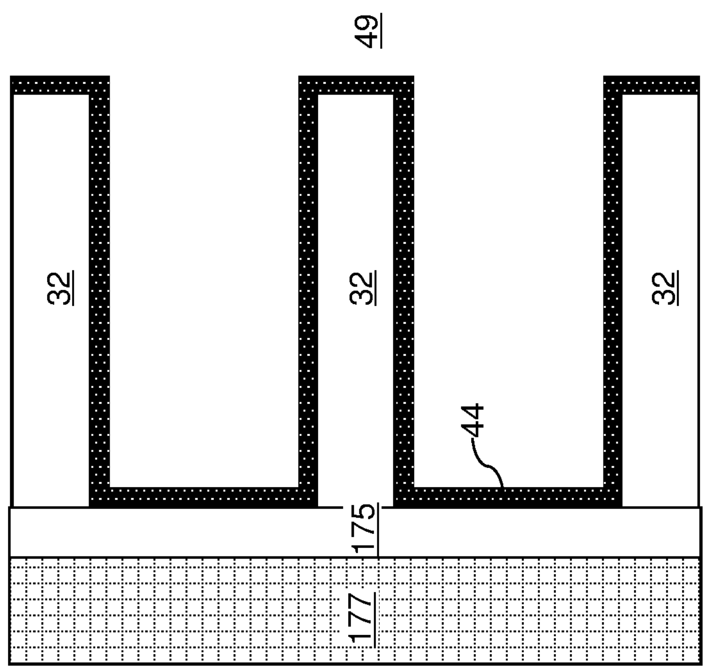

Referring to FIG. 23A, the processing steps of FIGS. 8 and 9A can be performed to remove the sacrificial memory opening ill structures 48 and the sacrificial support opening fill structures 18 from the memory openings 49 and from the support openings 19, respectively.

Referring to FIGS. 23B, 24A, 24B and 25A, the steps described above with respect to FIGS. 9B-9E are performed with any needed changes. Specifically, the sacrificial pillar structures (175, 177) provide additional support for the insulating layers 32 during formation of the backside recesses 43.

Figure 25B:
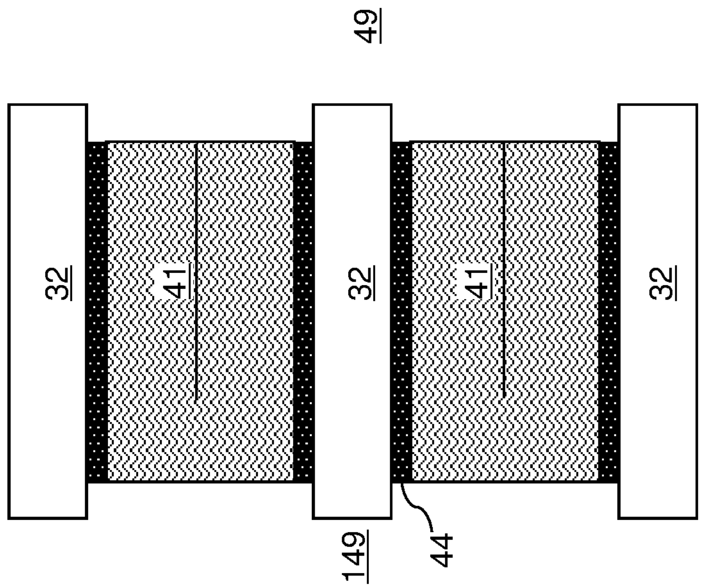
Figure 25A:
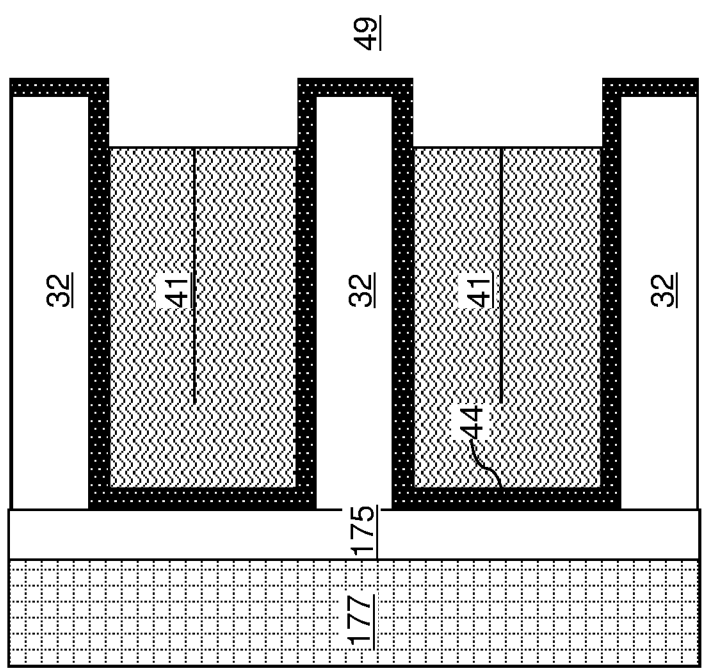

Referring to FIG. 25B the sacrificial pillar structures (175, 177) are removed from the pillar cavities 149 without removing the sacrificial backside trench fill structures (75, 77). For example, the sacrificial pillar structures (175, 177) can be removed by selective etching while the sacrificial backside trench fill structures (75, 77) are covered with a mask (e.g., hard mask or photoresist). At this step, the exposed pillar cavities 149 can function as additional memory openings 49. Subsequently, the recess of layer 41 is performed through the memory openings 49 and the pillar cavities 149 as described above with respect to FIG. 9F.

Figure 26B:
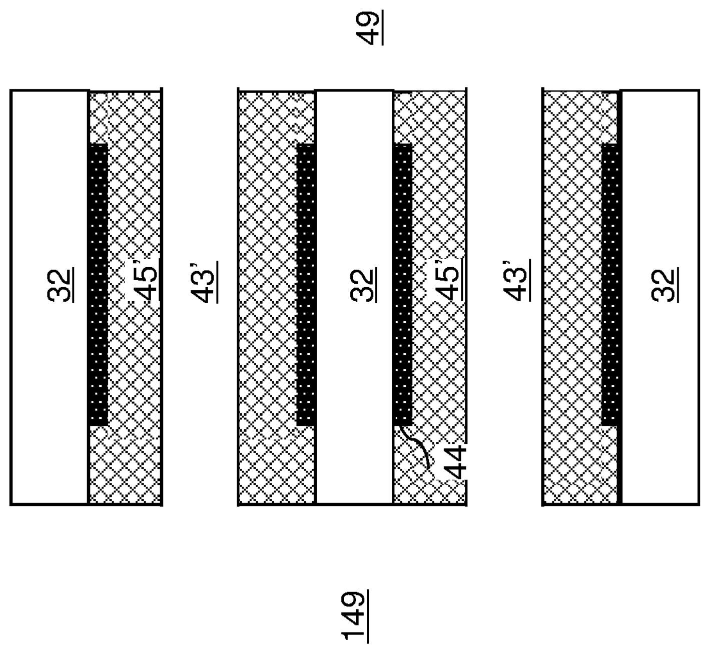
Figure 26A:
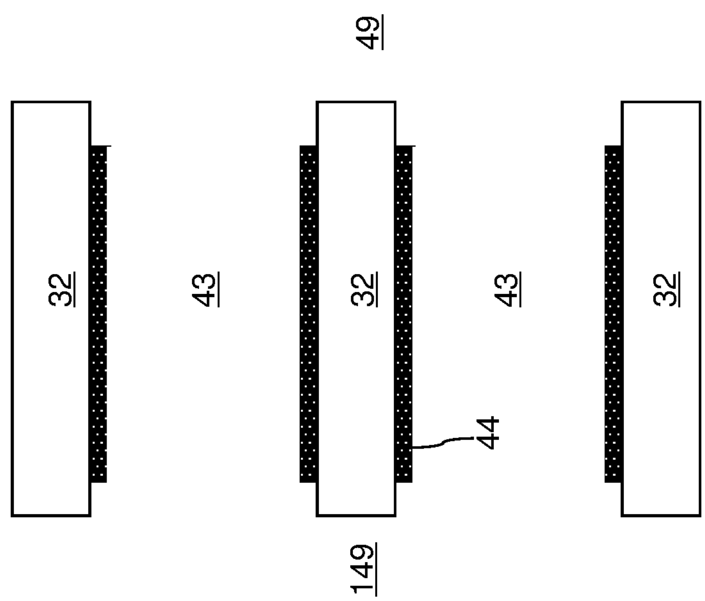

Referring to FIGS. 26A and 26B, the steps described above with respect to FIGS. 9G-9H are performed with any needed changes. The steps described above with respect to FIGS. 9I and 9J are then performed.

Figure 27:
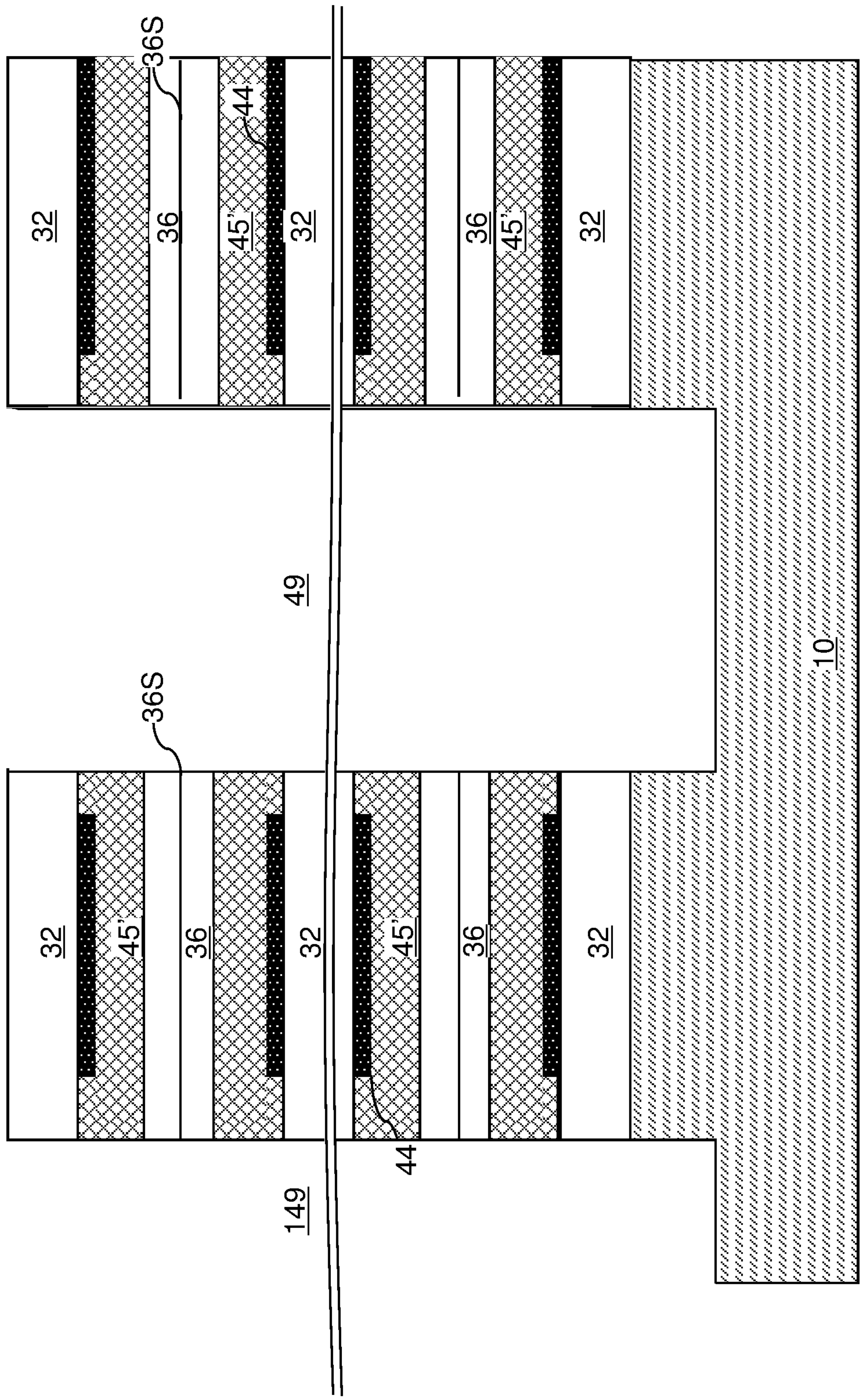
FIG. 27 is vertical cross-sectional view of a region of the alternative embodiment of the first exemplary structure at the step that corresponds to the step of FIG. 10A, according to the first embodiment of the present disclosure.

FIG. 27 is vertical cross-sectional view of a region of the alternative embodiment of the first exemplary structure at the step that corresponds to the step of FIG. 10A, according to the first embodiment of the present disclosure. The steps described above with respect to FIGS. 10B-10F and 11A-11D are then performed with any needed changes. Specifically, the memory opening fill structures 58 are formed in both the memory openings 49 and the pillar cavities 149 to form the structure of FIG. 11D, 12, 13 or 14. The steps described above with respect to FIGS. 15A-20C are then performed with any needed changes Referring to all drawings related to the first embodiment of the present disclosure, a three-dimensional memory device is provided, which comprises: a vertical repetition of multiple instances of a unit layer stack, wherein the unit layer stack comprises, from bottom to top, a seamless insulating layer 32 that is free of any seam therein, a first-type electrically conductive layer 46A, a seamed insulating layer 36 including a horizontally-extending seam therein, and a second-type electrically conductive layer 46B, memory openings 49 vertically extending through the vertical repetition; and memory opening fill structures 58 located within the memory openings 49, wherein each of the memory opening fill structures 58 comprises a respective vertical stack of memory elements.

In one embodiment, each of the memory opening fill structures 58 contacts a closed periphery of a respective horizontally-extending seam in each of the seamed insulating layers 36, and each of the memory opening fill structures 58 comprises a vertical semiconductor channel 60 and a memory film 50 containing the vertical stack of memory elements In one embodiment, the horizontally-extending seam within the seamed insulating layer 36 is equidistant from a horizontal interface between the seamed insulating layer 36 and the second-type electrically conductive layer 46B, and from a horizontal interface between the seamed insulating layer 36 and the first-type electrically conductive layer 46A.

In one embodiment, the three-dimensional memory device comprises: a first backside trench fill structure (74, 76) comprising a first dielectric surface contacting first sidewalls of each layer within the vertical repetition and laterally extending along a first horizontal direction hd1; and a second backside trench fill structure (74, 76) comprising a second dielectric surface contacting second sidewalls of each layer within the vertical repetition laterally extending along the first horizontal direction hd1, and laterally spaced from the first backside trench fill structure (74, 76) along a second horizontal direction hd1.

In one embodiment, each of the first backside trench fill structure (74, 76) and the second backside trench fill structure (74, 76) has a respective laterally-undulating vertical cross-sectional profile in the second horizontal direction hd2; and each of the first backside trench fill structure (74, 76) and the second backside trench fill structure (74, 76) has a greater width at levels of the first-type electrically conductive layers 46A, the seamed insulating layers 36, and the second-type electrically conductive layers 46B than at levels of the seamless insulating layers 32.

In one embodiment, each horizontally-extending seam within the seamed insulating layers 36 is laterally spaced from, and does not contact, any of the first backside trench fill structure (74, 76) and the second backside trench fill structure (74, 76).

In one embodiment, each of the first backside trench fill structure (74, 76) and the second backside trench fill structure (74, 76) comprises: a backside contact via structure 76 contacting a respective source region 61 in the substrate (9, 10); and an insulating spacer 74 laterally surrounding the backside contact via structure 76 and comprising a respective one of the first dielectric surface and the second dielectric surface as an outer surface.

In one embodiment, at least one instance of the seamed insulating layers 36 comprises an air gap 39 encapsulated by a dielectric material layer having an upper horizontally-extending portion and a lower horizontally-extending portion that are adjoined to each other at a periphery of the air gap at a respective horizontally-extending seam.

In one embodiment, within each instance of the unit layer stack: the first-type electrically conductive layer 46A comprises, from bottom to top, a first conductive barrier liner 44 and a first conductive fill material layer 45A; and the second-type electrically conductive layer 46B comprises, from bottom to top, a second conductive fill material layer 45B and a second conductive barrier liner 44, wherein the first conductive fill material layer 45A and the second conductive fill material layer 45B are in direct contact with horizontal surfaces of the second-type insulating layer 36.

In one embodiment shown in FIG. 12, each of the memory opening fill structures 58 comprises a respective straight outer sidewall that extends through each layer within the vertical repetition and contacts each layer within the vertical repetition. In another embodiment shown in FIG. 13, each of the memory opening fill structures 58 comprises a respective laterally-undulating outer sidewall that extends through each layer within the vertical repetition and laterally protrudes outward at levels of the first-type electrically conductive layers 45A and the second-type electrically conductive layers 45B relative to levels of the seamless insulating layers 32 and the seamed insulating layers 36.

Figure 28:
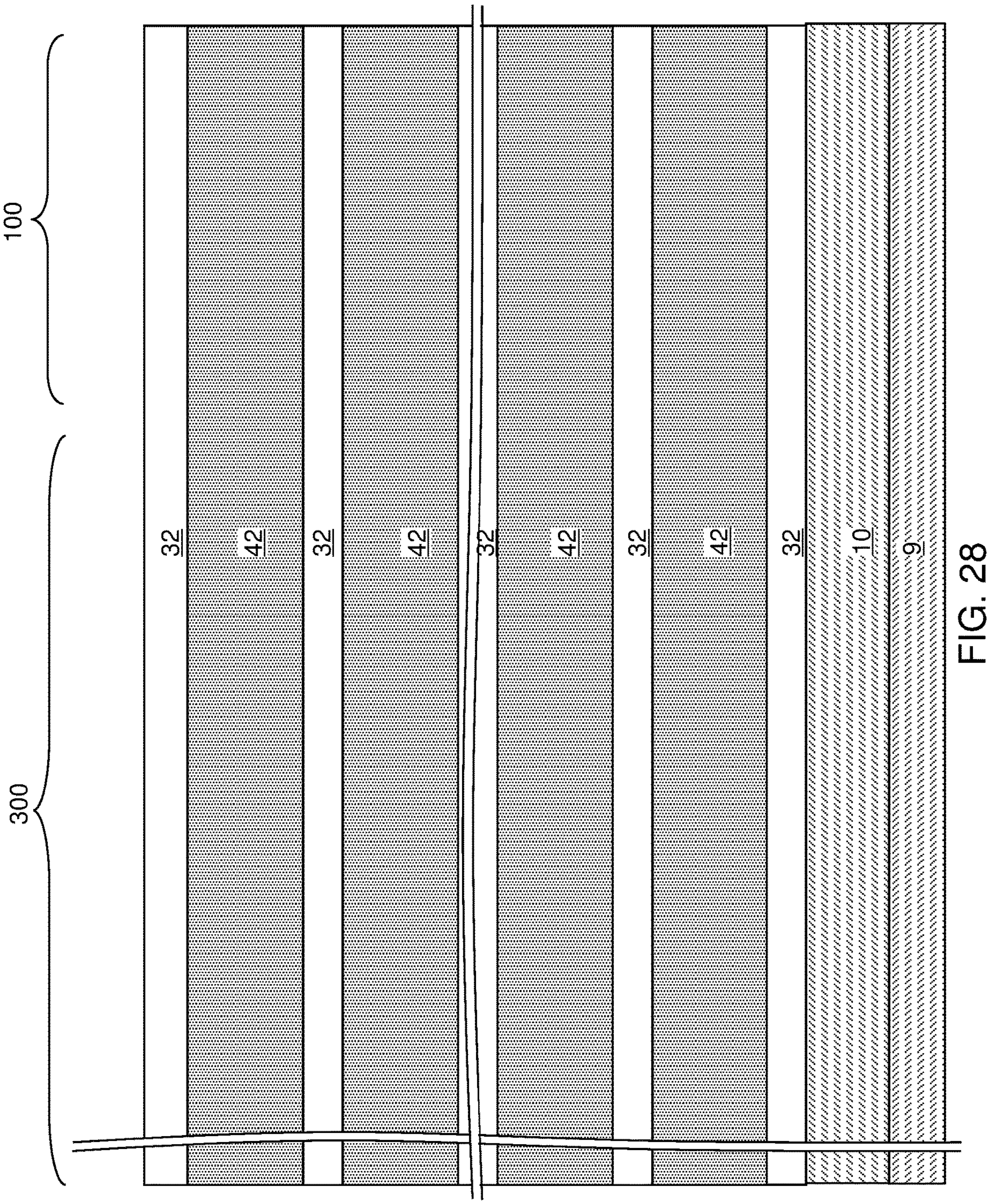
FIG. 28 is a vertical cross-sectional view of a second exemplary structure after formation of a vertical repetition of a unit layer stack according to a second embodiment of the present disclosure.

Referring to FIG. 28, a second exemplary structure according to a second embodiment of the present disclosure is illustrated, which may be the same as the first exemplary structure illustrated in FIG. 2.

Figure 29A:
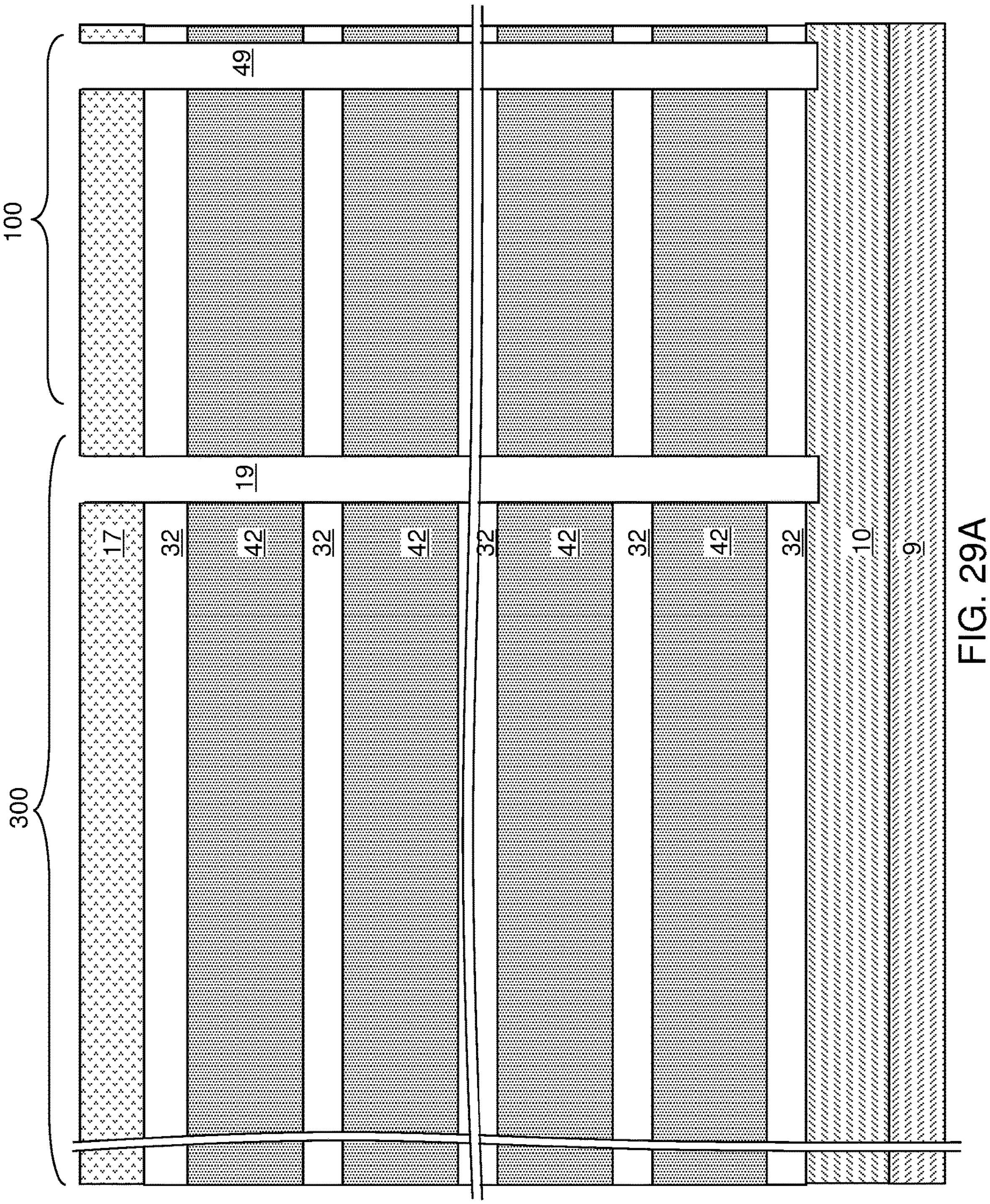
FIG. 29A is a schematic vertical cross-sectional view of the second exemplary structure after formation of memory openings and support openings according to the second embodiment of the present disclosure.
Figure 29B:
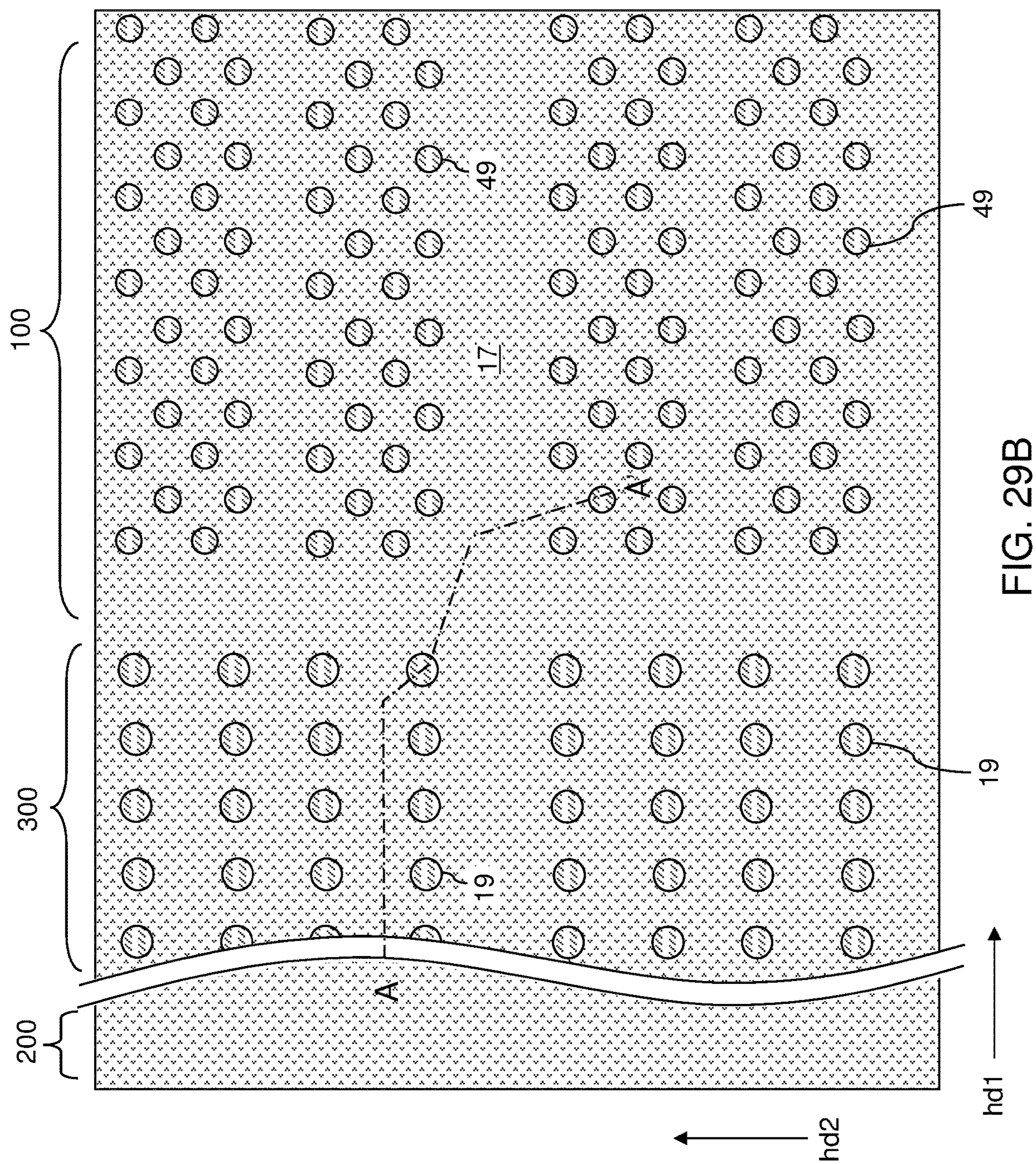
FIG. 29B is a top-down view of the first exemplary structure of FIG. 29A. The vertical plane A-A' is the plane of the cross-section for FIG. 29A.

Referring to FIGS. 29A and 29B, the processing steps of FIGS. 4A and 4B can be performed to form memory openings 49 and support openings 19. For example, a photoresist layer 17 can be applied over the vertical repetition (32, 42), and can be lithographically patterned with the same pattern as the pattern of the memory openings 49 and the support openings 19 illustrated in FIGS. 4A and 4B. An anisotropic etch process can be performed to transfer the pattern of the openings in the photoresist layer 17 through the vertical repetition (32, 42), thereby forming the memory openings 49 and the support openings 19.

Figure 30:
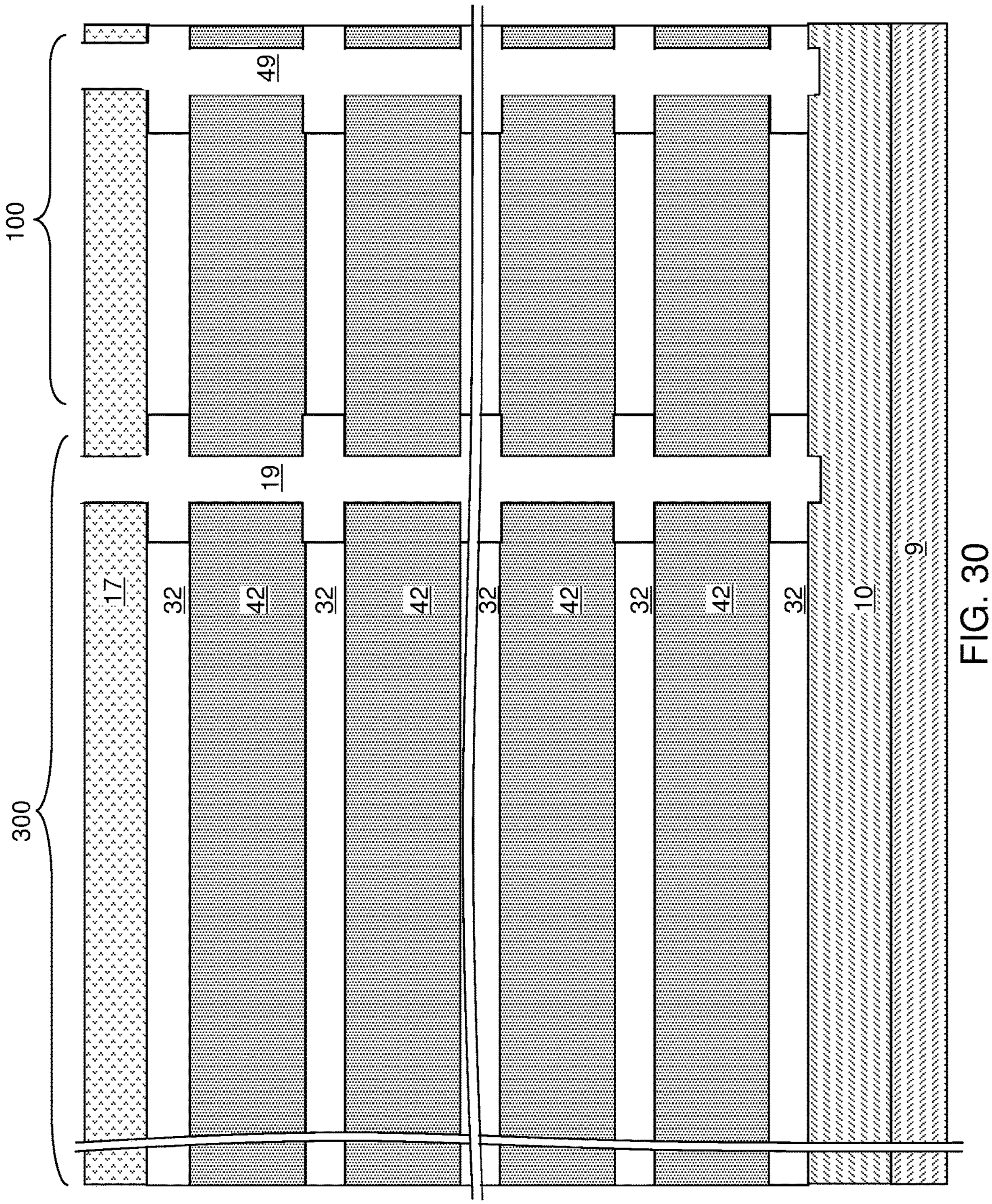
FIG. 30 is a schematic vertical cross-sectional view of the second exemplary structure after laterally recessing the insulating layers selective to the sacrificial material layers according to the second embodiment of the present disclosure.

Referring to FIG. 30, an optional isotropic etch process can be performed to laterally recess sidewalls of the first-type insulating layers 32 selective to the sacrificial material layers 42. For example, if the sacrificial material layers 42 comprise silicon nitride and if the first-type insulating layers 32 comprise silicon oxide, a wet etch process employing dilute hydrofluoric acid can be performed to laterally recess the sidewalls of the first-type insulating layers 32 without recessing the sacrificial material layers 42 around each of the memory openings 49 and the support openings 19. The lateral recess distance may be in a range from 5 nm to 100 nm, although lesser and greater lateral recess distances may also be employed.

Figure 31:
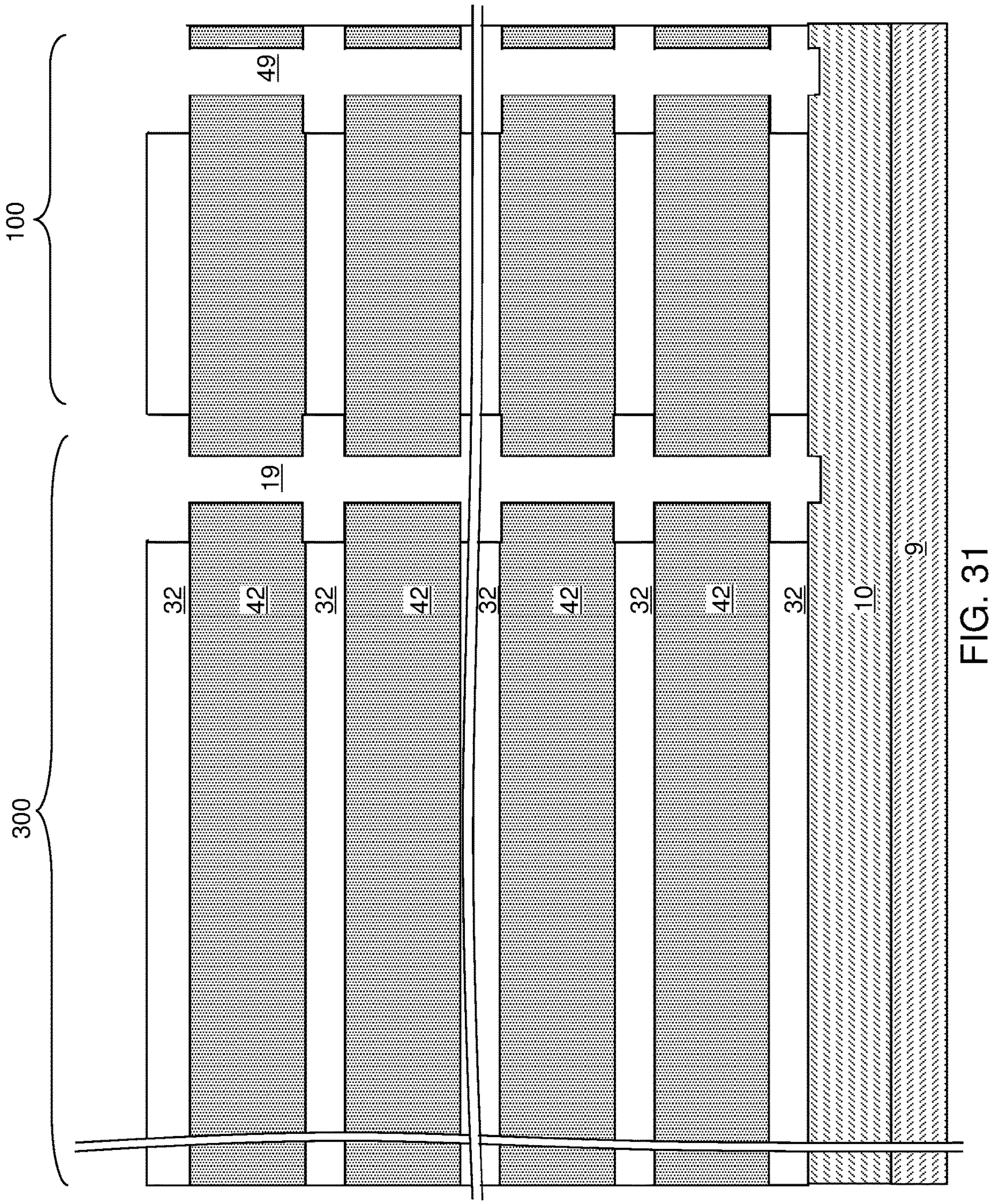
FIG. 31 is a schematic vertical cross-sectional view of the second exemplary structure after removal of the photoresist layer according to the second embodiment of the present disclosure.

Referring to FIG. 31, the photoresist layer 17 can be removed, for example, by ashing.

Figure 32:
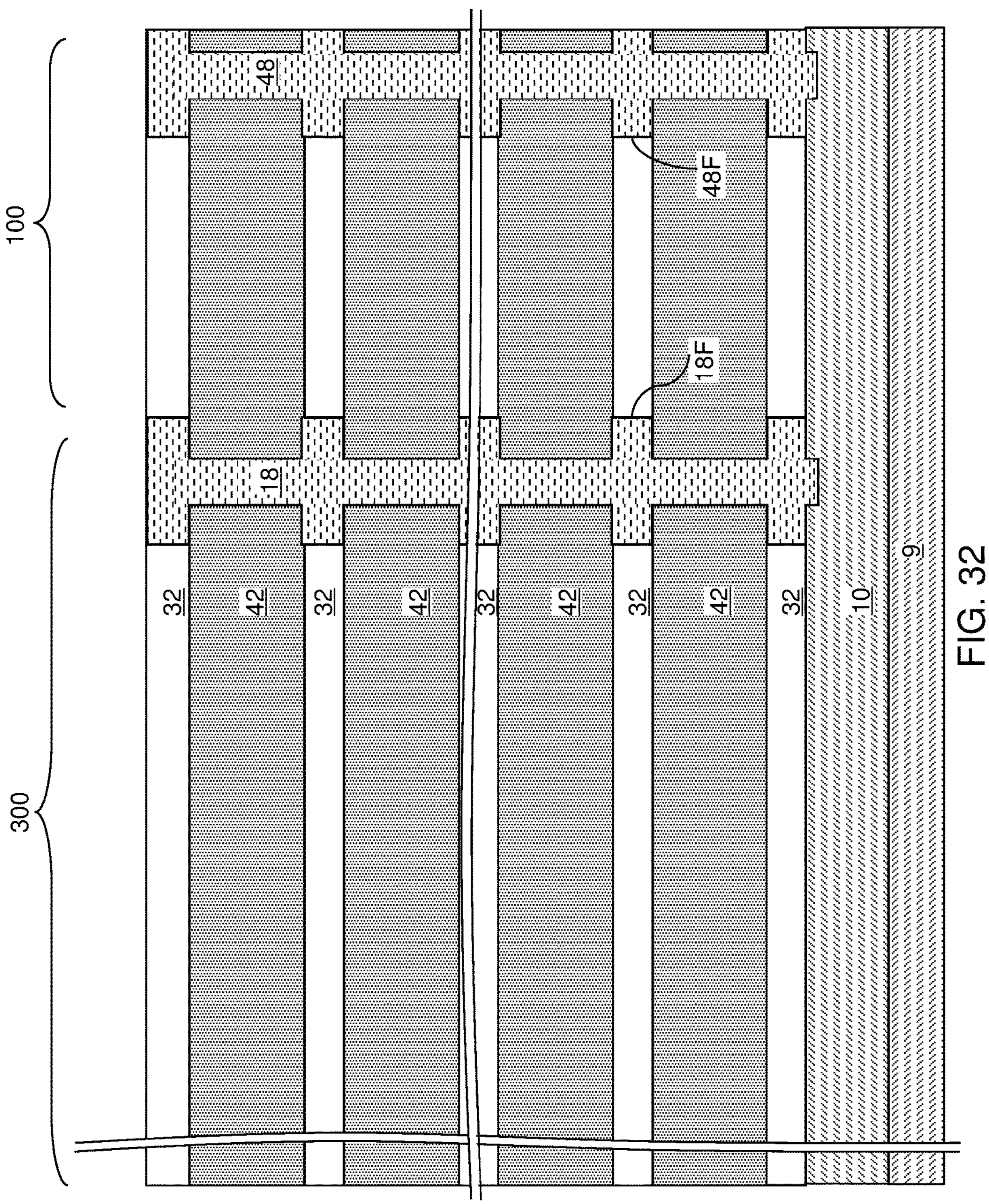
FIG. 32 is a schematic vertical cross-sectional view of the second exemplary structure after formation of sacrificial memory opening fill structures and sacrificial support opening fill structures according to the second embodiment of the present disclosure.

Referring to FIG. 32, a first sacrificial fill material can be deposited in the memory openings 49 and the support openings 19. The first sacrificial fill material comprises a material that is different from the materials of the first-type insulating layers 32 and the sacrificial material layers 42. For example, the first sacrificial fill material may include, for example, amorphous silicon, amorphous carbon, diamond-like carbon, germanium, or silicon-germanium. Excess portions of the first sacrificial fill material can be removed from the horizontal plane including the top surface of the topmost first-type insulating layer 32. Each remaining portion of the first sacrificial fill material located in a memory opening 49 constitutes a sacrificial memory opening fill structure 48. Each remaining portion of the first sacrificial fill material located in a support opening 19 constitutes a sacrificial support opening fill structure 18. Optionally, each of the sacrificial memory opening fill structures 48 and the sacrificial support opening fill structures 18 may comprise laterally-protruding fins (48F, 18F) at each level of the first-type insulating layers 32.

Figure 33A:
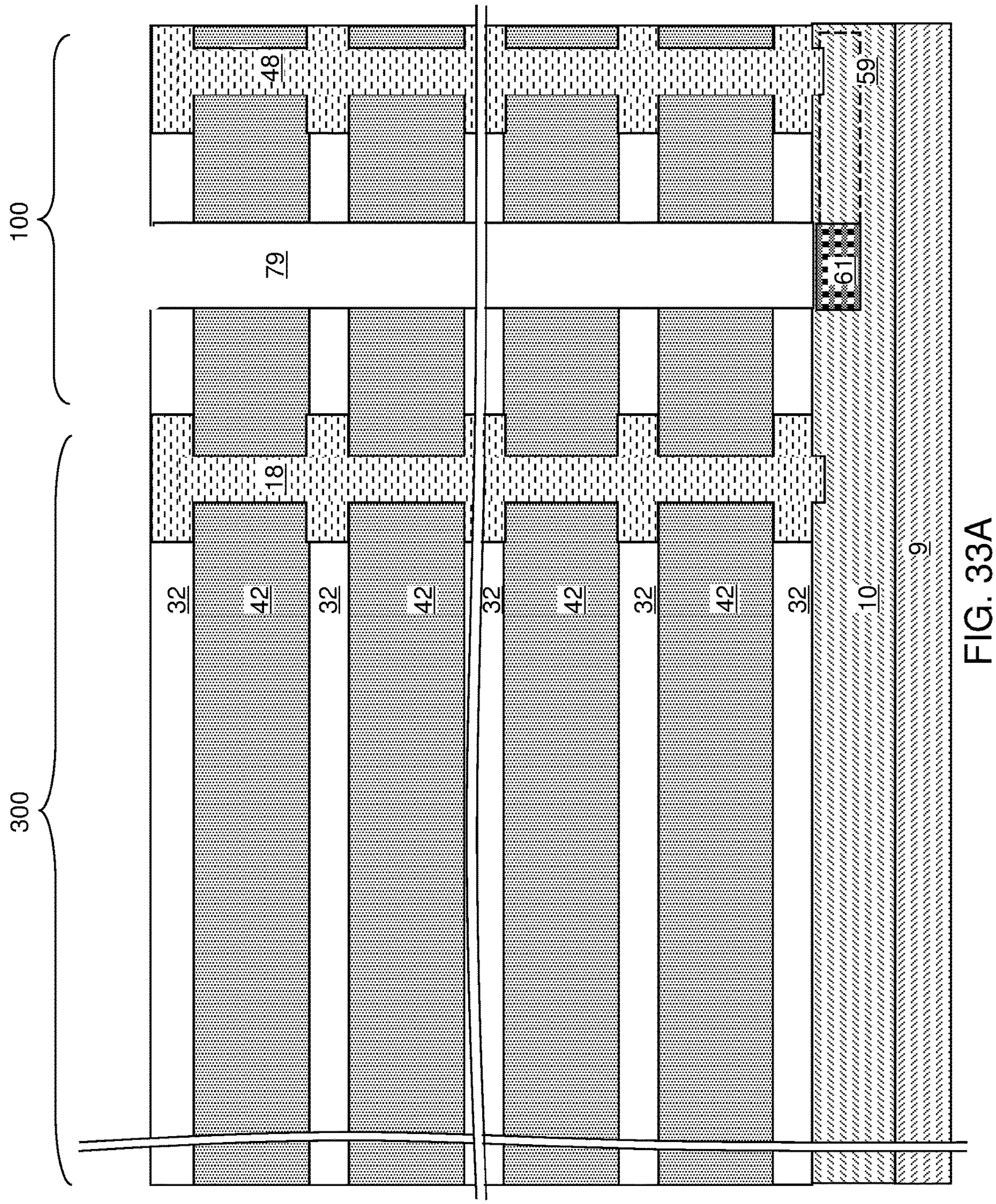
FIG. 33A is a schematic vertical cross-sectional view of the second exemplary structure after formation of backside trenches according to the second embodiment of the present disclosure.
Figure 33B:
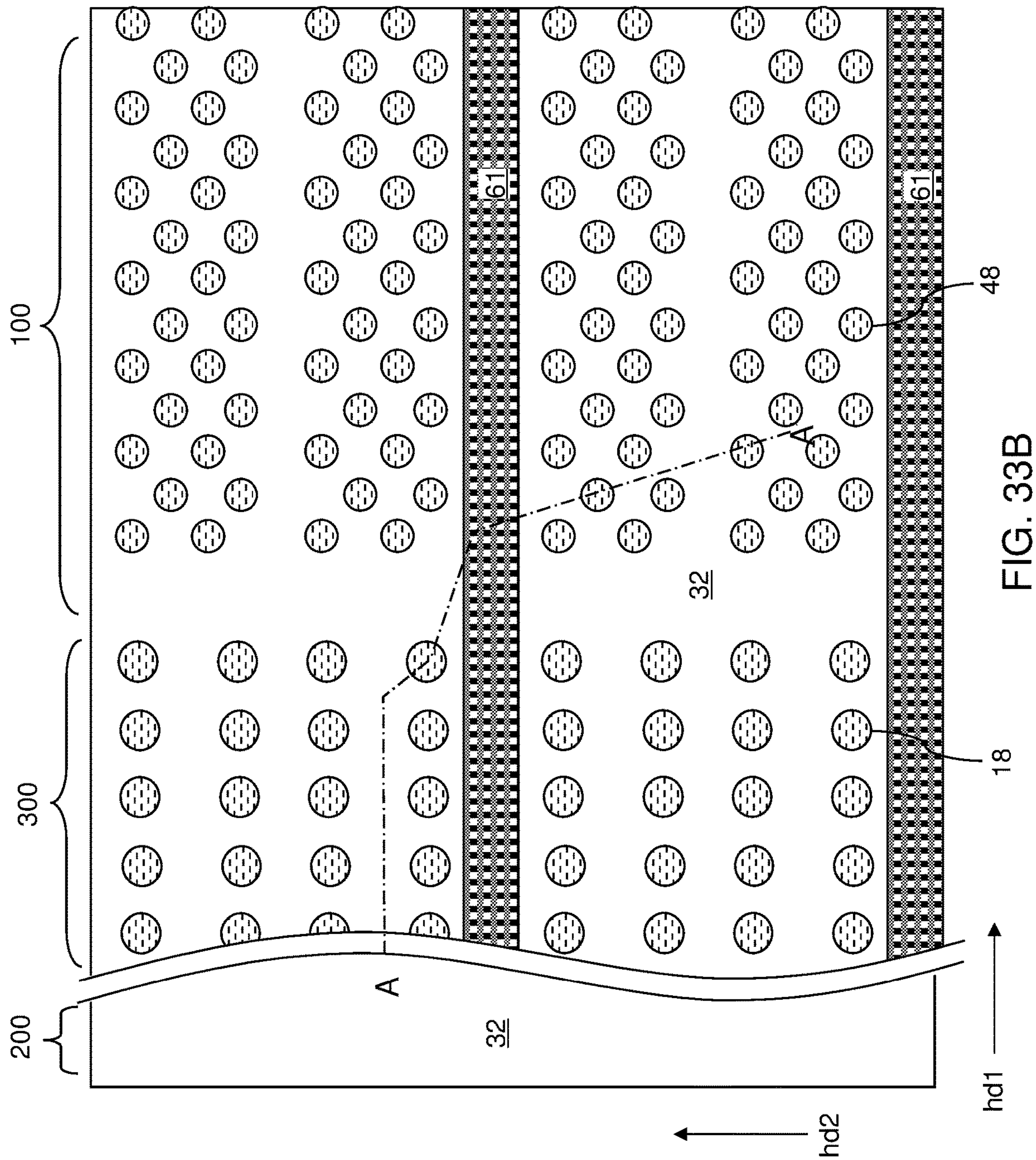
FIG. 33B is a top-down view of the second exemplary structure of FIG. 33A. The vertical plane A-A' is the plane of the vertical cross-sectional view of FIG. 33A.

Referring to FIGS. 33A and 33B, the processing steps of FIGS. 6A and 6B can be performed to form backside trenches 79 and source regions 61. The pattern of the backside trenches 79 may be the same as in the first exemplary structure.

Figure 34A:
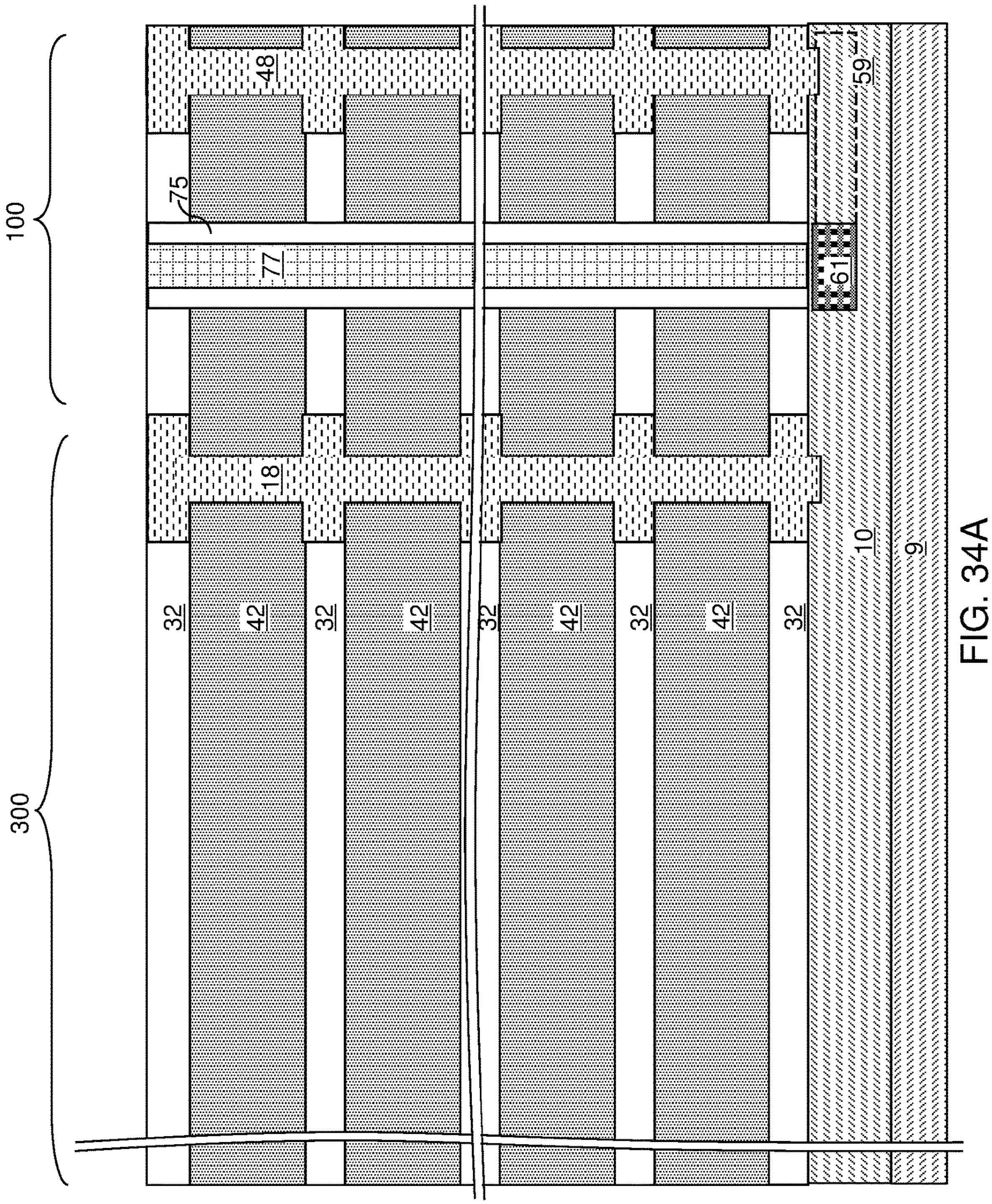
FIG. 34A is a schematic vertical cross-sectional view of the second exemplary structure after formation of sacrificial backside trench fill structures according to the second embodiment of the present disclosure.
Figure 34B:
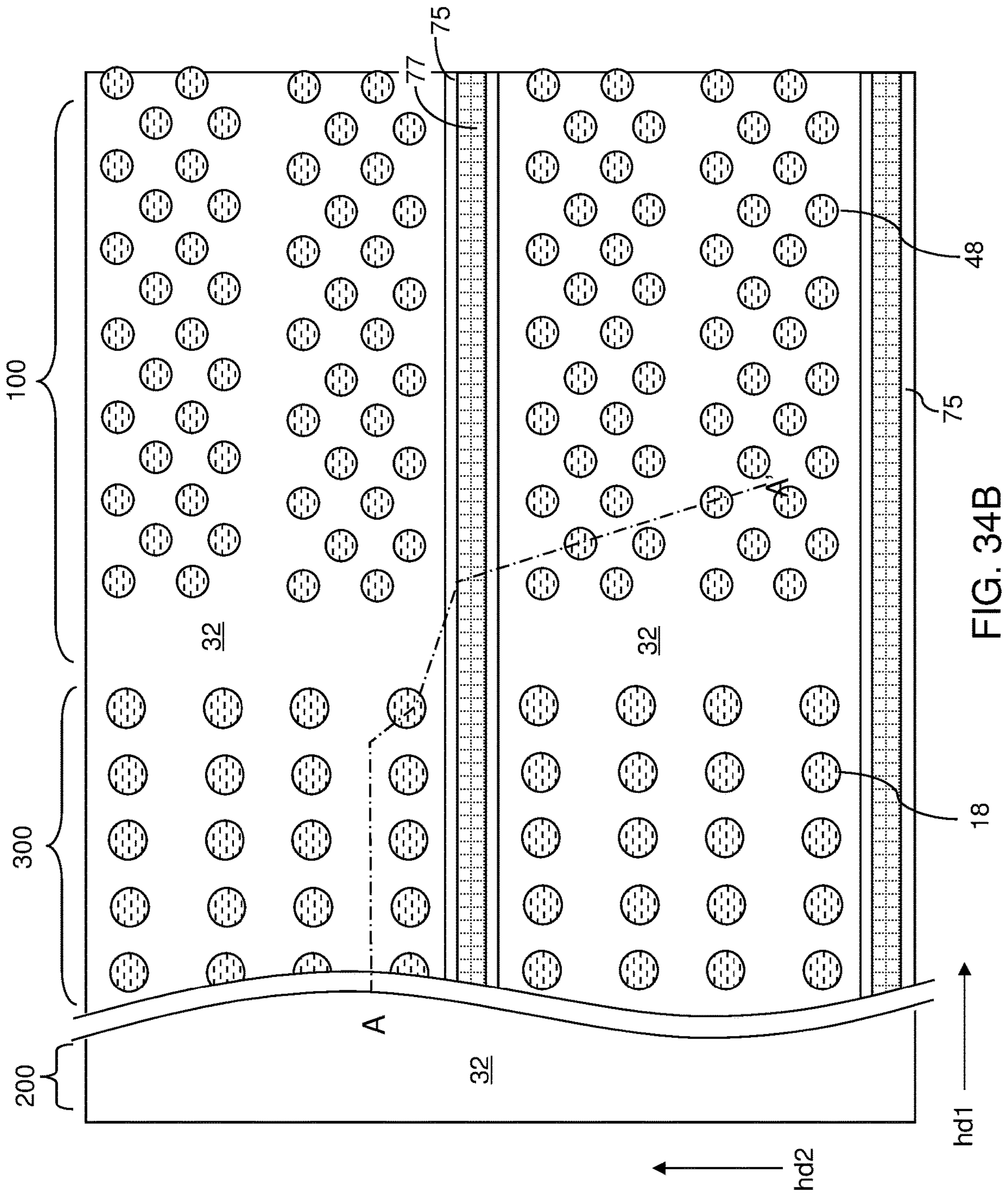
FIG. 34B is a top-down view of the second exemplary structure of FIG. 34A. The vertical plane A-A' is the plane of the vertical cross-sectional view of FIG. 34A.

Referring to FIGS. 34A and 34B, the processing steps of FIGS. 7A and 7B can be performed to form a sacrificial backside trench fill structure (75, 77) within each of the backside trenches 79.

Figure 35A:
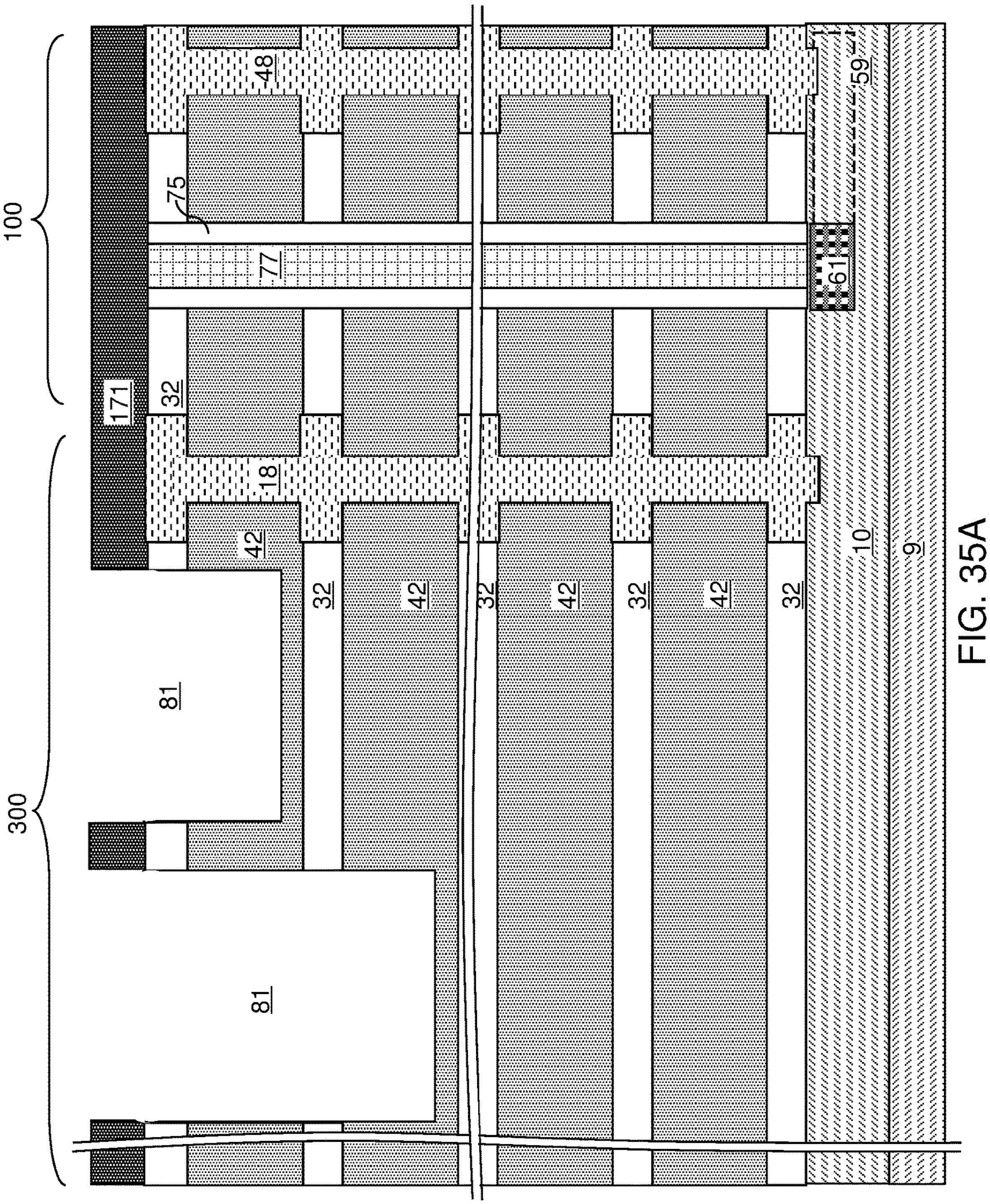
FIG. 35A is a schematic vertical cross-sectional view of the second exemplary structure after formation of contact via cavities according to the second embodiment of the present disclosure.
Figure 35B:
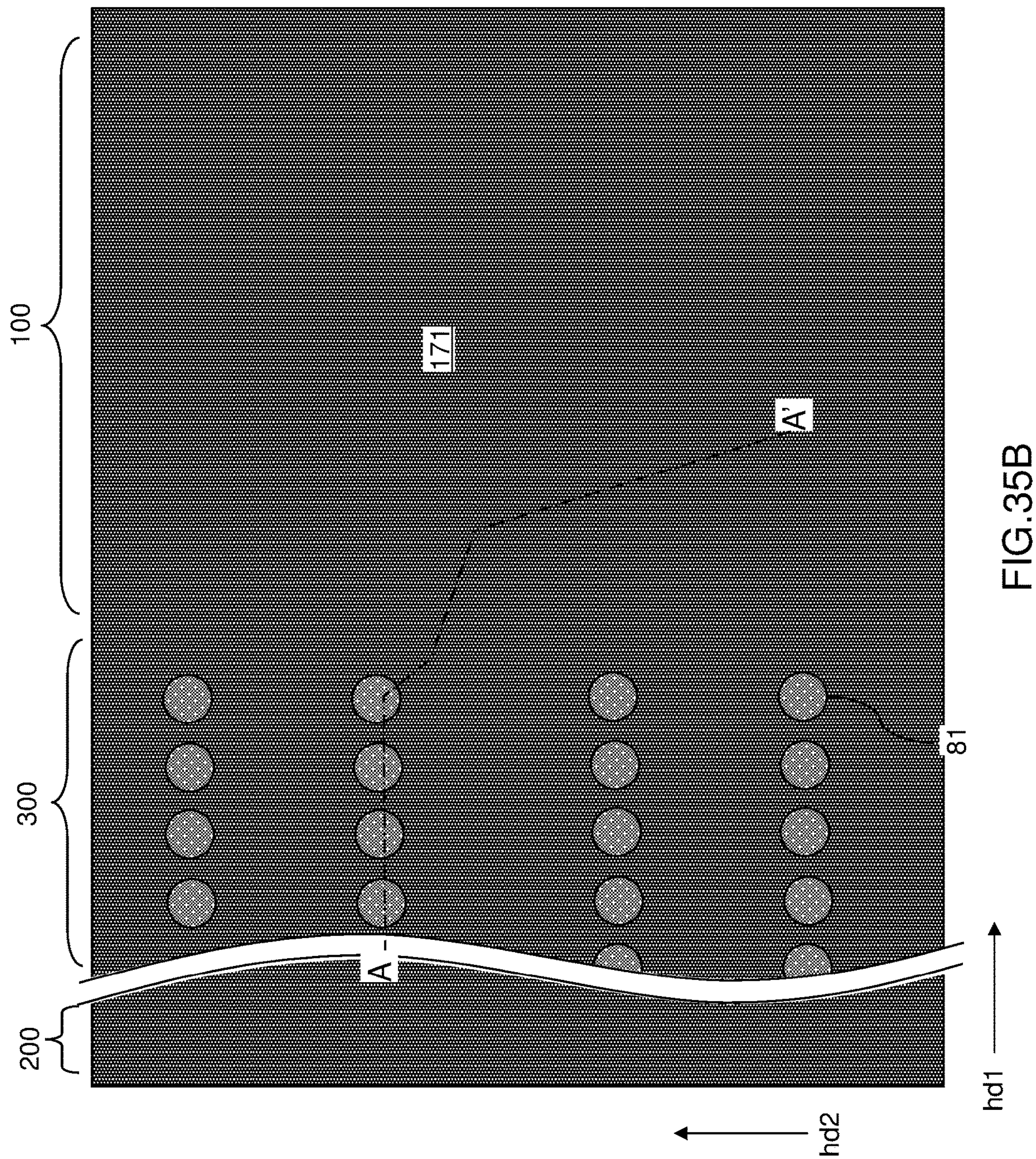
FIG. 35B is a top-down view of the second exemplary structure of FIG. 35A. The vertical plane A-A' is the plane of the vertical cross-sectional view of FIG. 35A.

Referring to FIGS. 35A and 35B, an etch mask layer 171 can be formed over the vertical repetition (32, 42), the sacrificial memory opening fill structures 48, the sacrificial support opening fill structures 18, and the sacrificial backside trench fill structures (75, 77), and can be lithographically patterned to form an array of openings in the contact region 300. The etch mask layer 171 can include an etch-resistant material, such as a hard mask comprising a conductive material or a dielectric metal oxide material. In one embodiment, the array of openings may comprise a rectangular array of circular or elliptical openings having a periodicity along the first horizontal direction hd1 and the second horizontal direction hd2.

A trimmable mask layer (not shown) can be applied over the etch mask layer 171, and can be patterned to cover the entirety of the memory array region 100 and a predominant portion of the contact region 300. Specifically, the trimmable mask layer can be patterned such that the trimmable mask layer covers all openings within the array of openings in the etch mask layer 171 other than a most distal column of openings in the etch mask layer 171 from the memory array region 100. An anisotropic etch process can be performed to transfer the pattern of a most distal column of openings in the etch mask layer 171 through a topmost first-type insulating layer 32 and a topmost sacrificial material layer 42. The trimmable mask layer can be trimmed to physically expose a second most distal column of openings in the etch mask layer 171. Another anisotropic etch process can be performed to etch through a pair of a first-type insulating layer 32 and a sacrificial material layer 42 underneath each unmasked opening in the etch mask layer 171. A trimming process that physically exposes a new column of openings in the etch mask layer 171 and an anisotropic etch that recesses areas of unmasked openings in the etch mask layer 171 by a thickness of a first-tier insulating layer 32 and a thickness of a sacrificial material layer 42 can be iteratively performed to form a two-dimensional array of contact via cavities 81 having different depths. A set of contact via cavities 81 can be formed such that each sacrificial material layer 42 is physically exposed to at least one contact via cavity 81 that does not extend below the respective sacrificial material layer 42. The trimmable mask layer can be subsequently removed. Generally, contact via cavities 81 having different depths can be formed through the vertical repetition (32, 42). A surface of a respective sacrificial material layer 42 of the sacrificial material layers 42 of the vertical repetition (32, 42) is physically exposed at a bottom of each of the contact via cavities 81.

Figure 36:
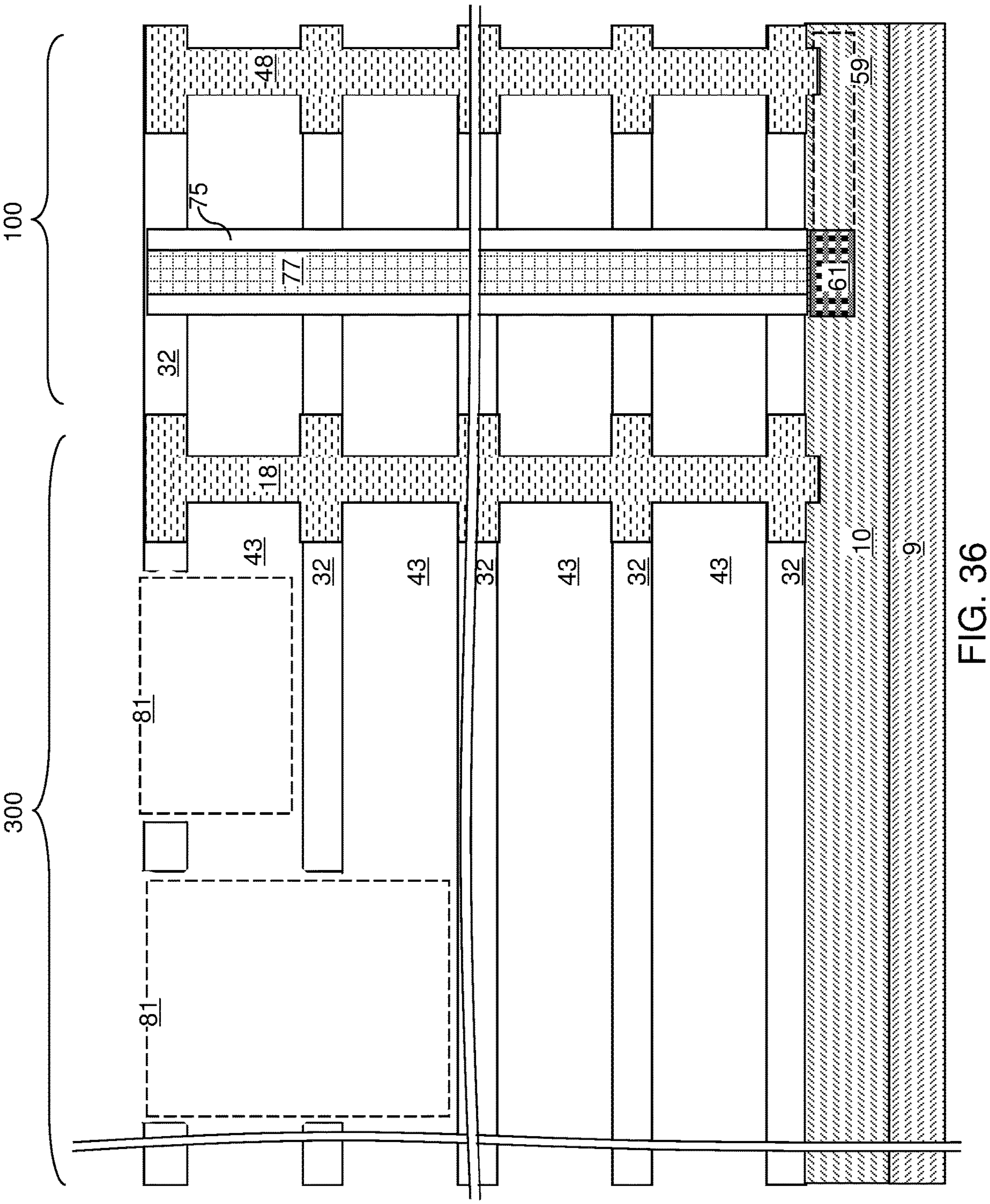
FIG. 36 is a schematic vertical cross-sectional view of the second exemplary structure after formation of lateral recesses according to the second embodiment of the present disclosure.

Referring to FIG. 36, the sacrificial material layers 42 can be removed selective to the first-type insulating layers 32 by introducing an isotropic etchant that etches the material of the sacrificial material layers 42 selective to the material of the first-type insulating layers into the contact via cavities 81. Lateral recesses 43 are formed in volumes from which the sacrificial material layers 42 are removed. The removal of the second material of the sacrificial material layers 42 can be selective to the first material of the first-type insulating layers 32, the material of the sacrificial memory opening fill structures 48 and the sacrificial support opening fill structures 18, and the material of the optional etch-stop spacers 75 or the material of the sacrificial trench fill material portions 77. In one embodiment, the sacrificial material layers 42 can include silicon nitride, and the materials of the first-type insulating layers 32 and the etch-stop spacers 75 can be selected from silicon oxide and dielectric metal oxides.

In an illustrative example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The sacrificial backside trench fill structures (75, 77), the sacrificial memory opening fill structures 48, and the sacrificial support opening fill structures 18 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. Each of the plurality of lateral recesses 43 can extend substantially parallel to the top surface of the substrate (9, 10). A lateral recess 43 can be vertically bounded by a top surface of an underlying first-type insulating layer 32 and a bottom surface of an overlying first-type insulating layer 32. In one embodiment, each lateral recess 43 can have a uniform height throughout.

Figure 37:
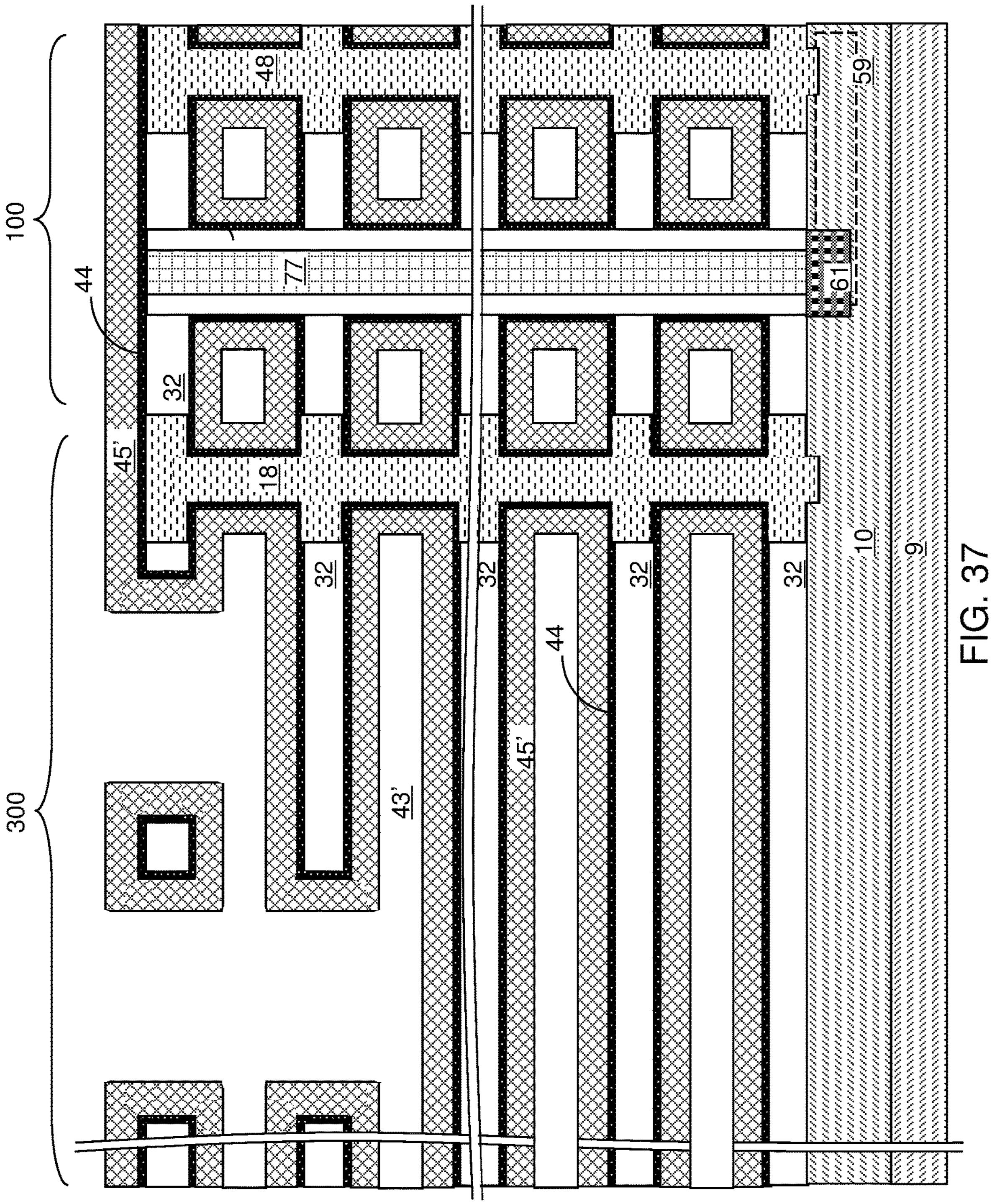
FIG. 37 is a schematic vertical cross-sectional view of the second exemplary structure after formation of in-process electrically conductive layers according to the second embodiment of the present disclosure.

Referring to FIG. 37, at least one conductive fill material can be deposited at peripheral portions of the lateral recesses 43. In one embodiment, the above described liner 44 is deposited directly on physically exposed surfaces of instances of the first-type insulating layer 32 and on physically exposed sidewalls of the sacrificial backside trench fill structures (75, 77).

Conductive fill material layers 45' can be deposited on the liners 44, as described above with respect to the first embodiment. If the liners 44 comprise the sacrificial material liners, then they are consumed during the deposition of the conductive fill material layers 45'. In one embodiment, the thickness of each conductive fill material layer 45' can be in a range from 20% to 45%, such as from 25% to 35%, of the thickness of the sacrificial material layers 42. In one embodiment, the conductive fill material layer 45' may have a thickness that is about the same as the lateral recess distance of the liners 44 from the memory openings 49 and from the support openings 19. Lateral cavities 43' are present within volumes of the lateral recesses 43 that are not filled by the conductive fill material layers 45'.

Figure 38:
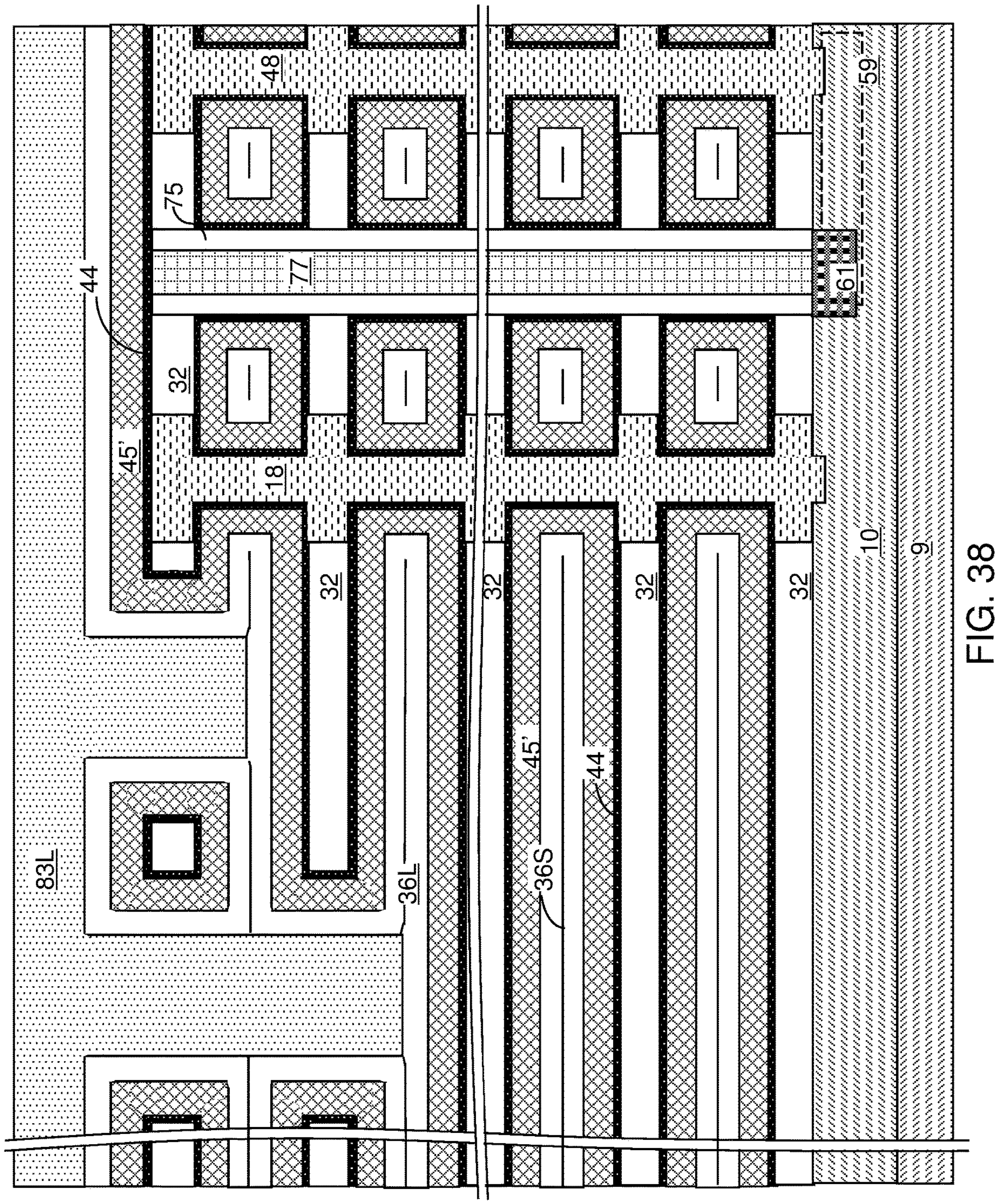
FIG. 38 is a schematic vertical cross-sectional view of the second exemplary structure after formation of insulating fill material layers and a sacrificial via fill material layer according to the second embodiment of the present disclosure.

Referring to FIG. 38, an insulating fill material can be deposited over the at least one conductive fill material of the in-process electrically conductive layers (44, 45') within remaining volumes of the lateral recesses 43 by a conformal deposition process. The insulating fill material includes an insulating material such as undoped silicate glass or a doped silicate glass. The thickness of the insulating fill material can be selected such that a horizontal seam 36S is formed at each levels of the lateral recesses 43. The deposited insulating fill material forms an insulating fill material layer 36L.

A sacrificial via fill material layer 83L can be deposited in remaining volumes of the contact via cavities 81 and over a topmost surface of the insulating fill material layer 36L. The sacrificial via fill material layer 83L includes a sacrificial fill material such as borosilicate glass, organosilicate glass, amorphous carbon, diamond-like carbon, amorphous silicon, germanium, or silicon-germanium.

Figure 39:
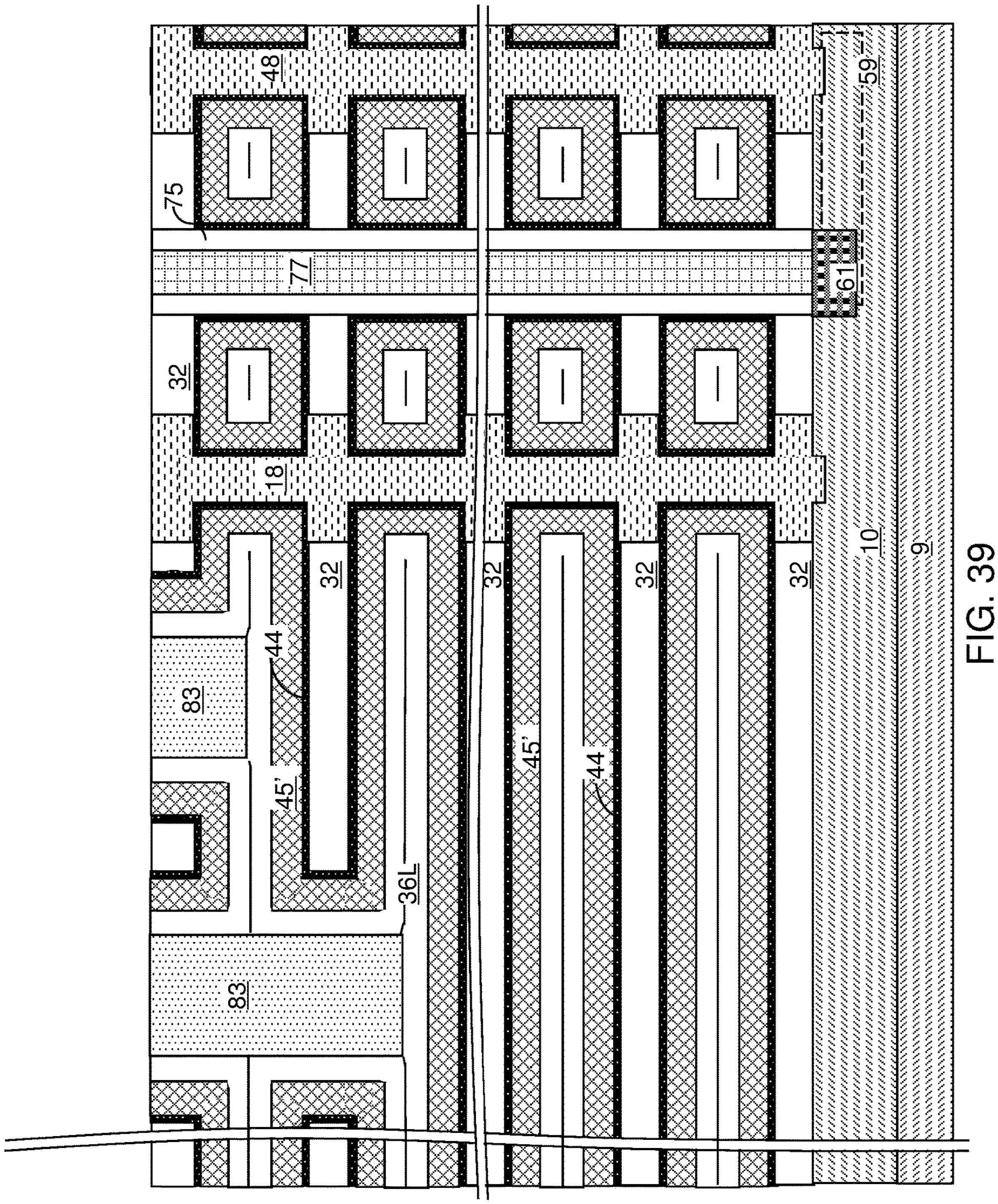
FIG. 39 is a schematic vertical cross-sectional view of the second exemplary structure after a planarization process according to the second embodiment of the present disclosure.

Referring to FIG. 39, a planarization process such as a chemical mechanical polishing (CMP) process and/or a recess etch process can be performed to remove excess portions of the sacrificial via fill material layer 83L, the insulating fill material layer 36L, and the in-process electrically conductive layers (44, 45'). Each remaining portion of the sacrificial via fill material layer 83L that remains within a respective contact via cavity 81 constitutes a sacrificial via fill material portion 83.

Figure 40:
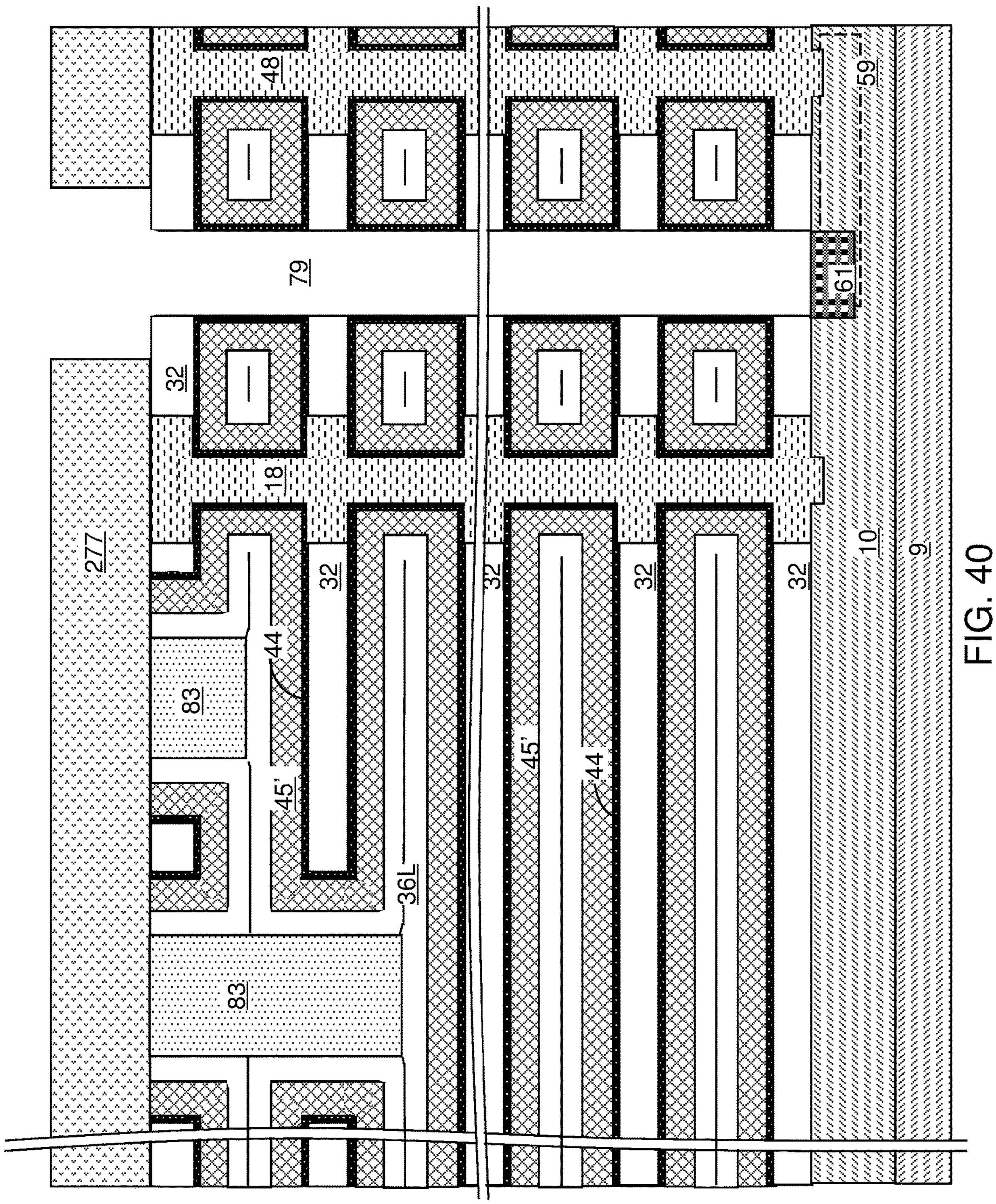
FIG. 40 is a schematic vertical cross-sectional view of the second exemplary structure after removal of sacrificial backside trench fill structures according to the second embodiment of the present disclosure.

Referring to FIG. 40, a first photoresist layer 277 can be applied over the second exemplary structure, and can be lithographically patterned to form elongated openings over the areas of the sacrificial backside trench fill structures (75, 77). At least one etch process can be performed to remove the sacrificial backside trench fill structures (75, 77). Backside voids are formed within volumes from which the sacrificial backside trench fill structures (75, 77) are removed. A horizontal semiconductor channel 59 can be formed between each source region 61 and bottom surfaces of an adjacent set of sacrificial memory opening fill structures 48.

Figure 41:
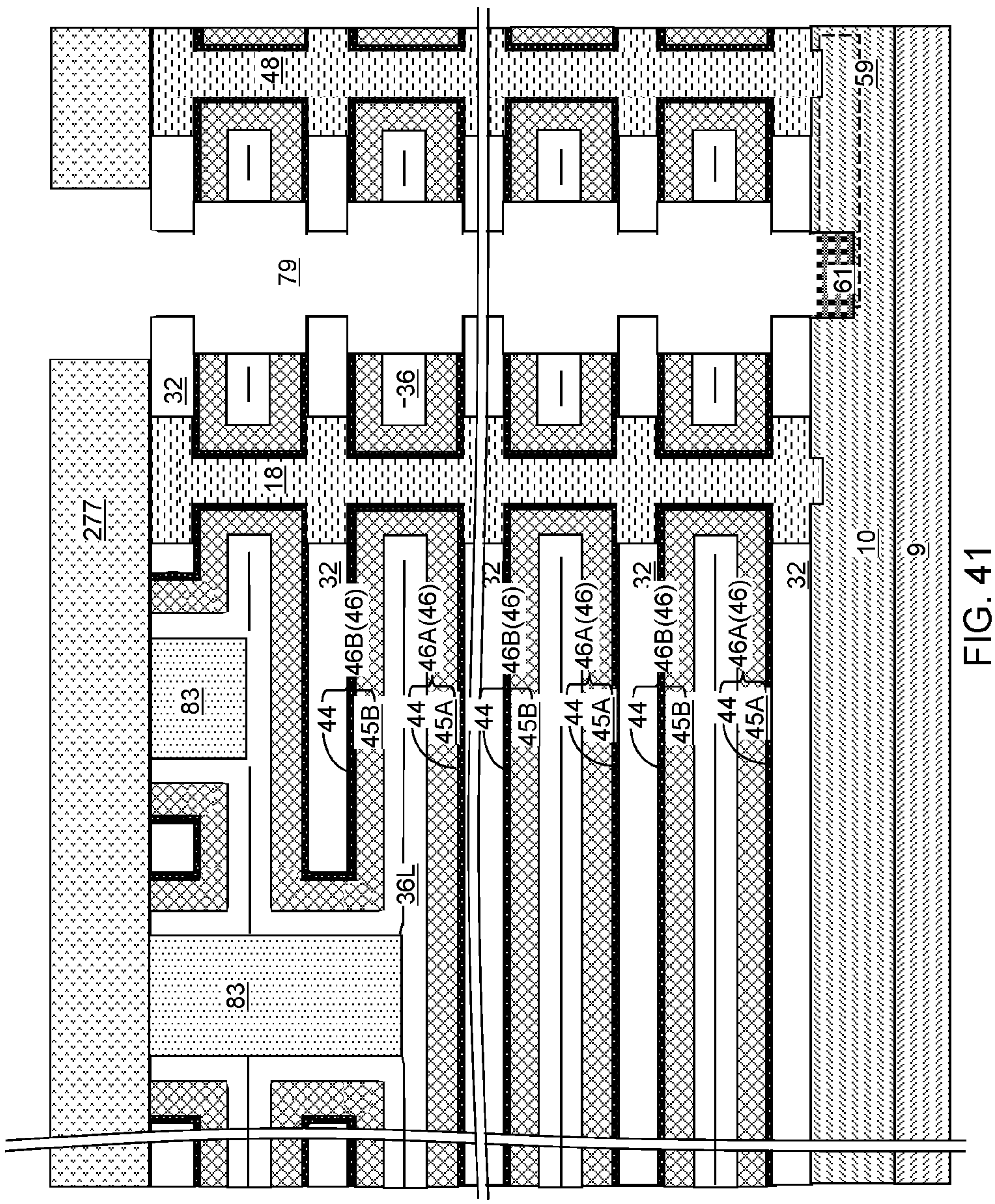
FIG. 41 is a schematic vertical cross-sectional view of the second exemplary structure after isotropically recessing the in-process electrically conductive layers around the backside trenches according to the second embodiment of the present disclosure.

Referring to FIG. 41, proximal portions of the at least one conductive fill material of the in-process electrically conductive layers (44, 45') can be removed from around the backside voids by performing an isotropic etch process that etches the conductive materials of the in-process electrically conductive layers (44, 45'). In one embodiment, the isotropic etch process may be a wet etch process that etches the conductive materials of the in-process electrically conductive layers (44, 45') selective to the materials of the insulating layers (32, 36). The duration of the isotropic etch process can be selected such that each vertically-extending portion of the in-process electrically conductive layers (44, 45') located between a vertically neighboring pair of first-type insulating layers 32 is removed by the isotropic etch process.

Each portion of the at least one conductive fill material filling a respective one of the lateral recesses 43 (i.e., each in-process electrically conductive layers (44, 45')) is divided into a respective pair of a first-type electrically conductive layer 46A and a second-type electrically conductive layer 46B that are disjoined from, and are vertically spaced from, each other. A second-type insulating layer 36 is located between a vertically-neighboring pair of a first-type electrically conductive layer 46A and a second-type electrically conductive layer 46B. Each first-type electrically conductive layer 46A comprises, from bottom to top, an optional first conductive barrier liner 44 and a first conductive fill material layer 45A. Each second-type electrically conductive layer 46B comprises, from bottom to top, a second conductive fill material layer 45B and an optional second conductive barrier liner 44. The first conductive fill material layer 46A and the second conductive fill material 46B are in direct contact with horizontal surfaces of the second-type insulating layer 36.

A vertical repetition of multiple instances of a unit layer stack (32, 46A, 36, 46B) can be formed over the substrate (9, 10). The unit layer stack comprises, from bottom to top, a seamless insulating layer (such as a first-type insulating layer 32) that is free of any seam therein, a first-type electrically conductive layer 46A, a seamed insulating layer (such as a second-type insulating layer 36) including a horizontally-extending seam 36S therein, and a second-type electrically conductive layer 46B. The first photoresist layer 277 can be subsequently removed, for example, by ashing.

Figure 42A:
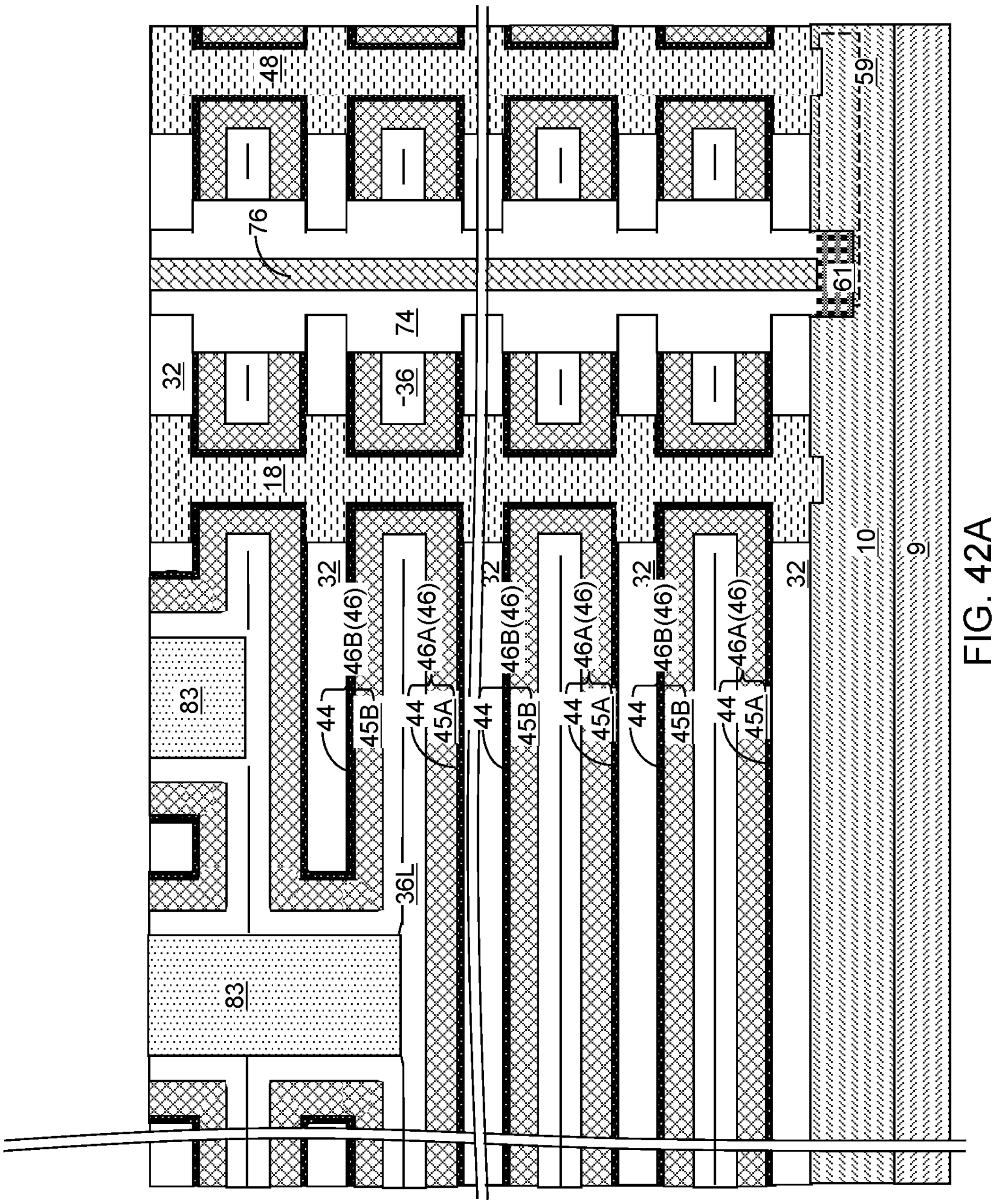
FIG. 42A is a schematic vertical cross-sectional view of the second exemplary structure after formation of backside trench fill structures according to the second embodiment of the present disclosure.
Figure 42B:
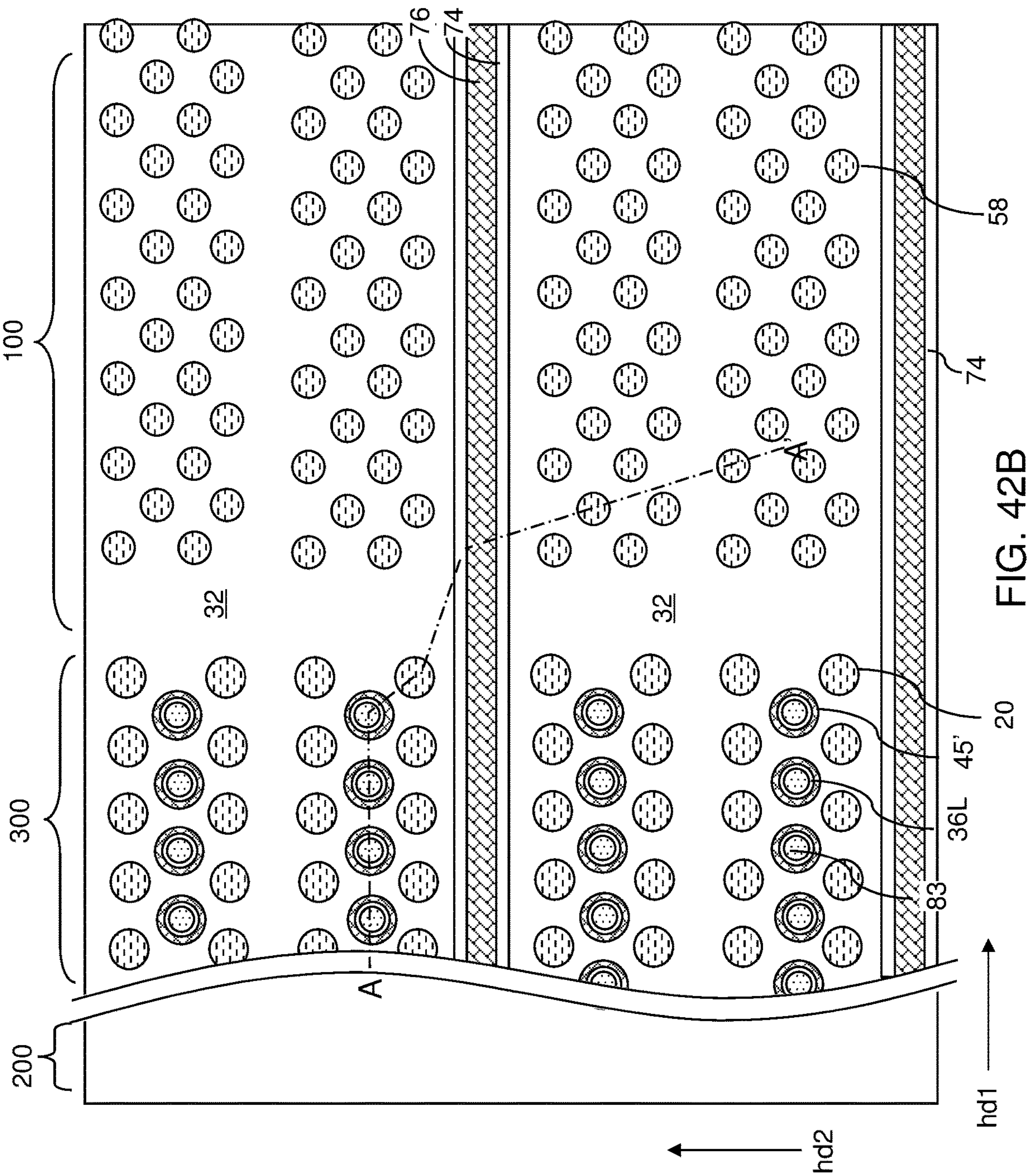
FIG. 42B is a top-down view of the second exemplary structure of FIG. 42A. The vertical plane A-A' is the plane of the vertical cross-sectional view of FIG. 42A.

Referring to FIGS. 42A and 42B, a backside trench fill structure (74, 76) can be formed in each backside trench 79 as described above with respect to the first embodiment.

Figure 43:
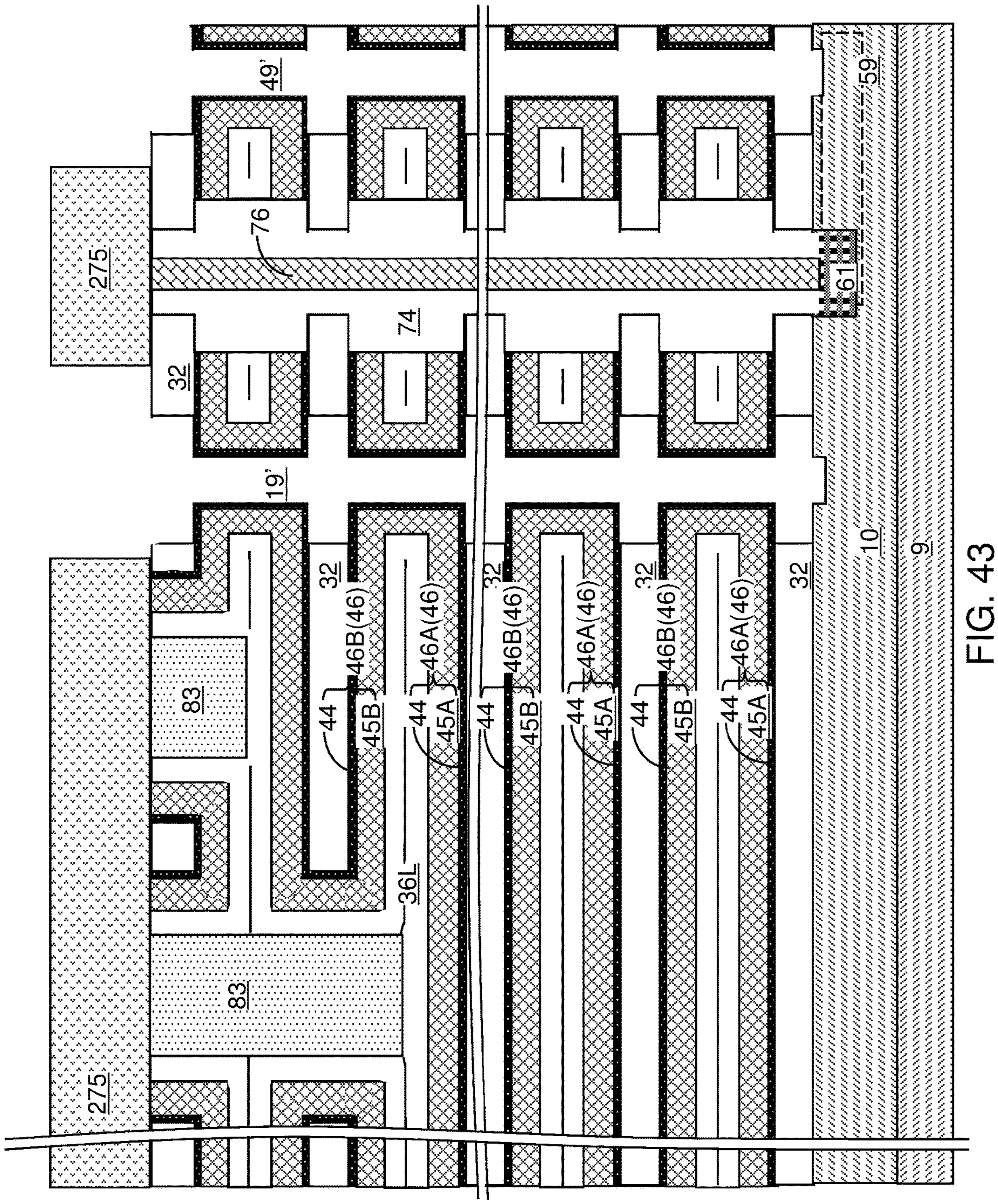
FIG. 43 is a schematic vertical cross-sectional view of the second exemplary structure after removal of sacrificial memory opening fill structures and sacrificial support opening fill structures according to the second embodiment of the present disclosure.

Referring to FIG. 43, an optional second photoresist layer 275 can be applied over the second exemplary structure, and can be lithographically patterned to cover the backside trench fill structures (74, 76) and the sacrificial via fill material portions 83. An isotropic etch process can be patterned to remove the sacrificial memory opening fill structures 48 and the sacrificial support opening fill structures 18. A memory cavity 49' is formed in each volume from which a sacrificial memory opening fill structure 48 is removed, and a support cavity 19' is formed in each volume from which the sacrificial support opening fill structure 18 is removed. Alternatively, if the sacrificial via fill material portions 83 comprise a different material than the sacrificial memory opening fill structures 48 and the sacrificial support opening fill structures 18, then the sacrificial memory opening fill structures 48 and the sacrificial support opening fill structures 18 can be removed by selective etching without forming the second photoresist layer 275.

Figure 44:
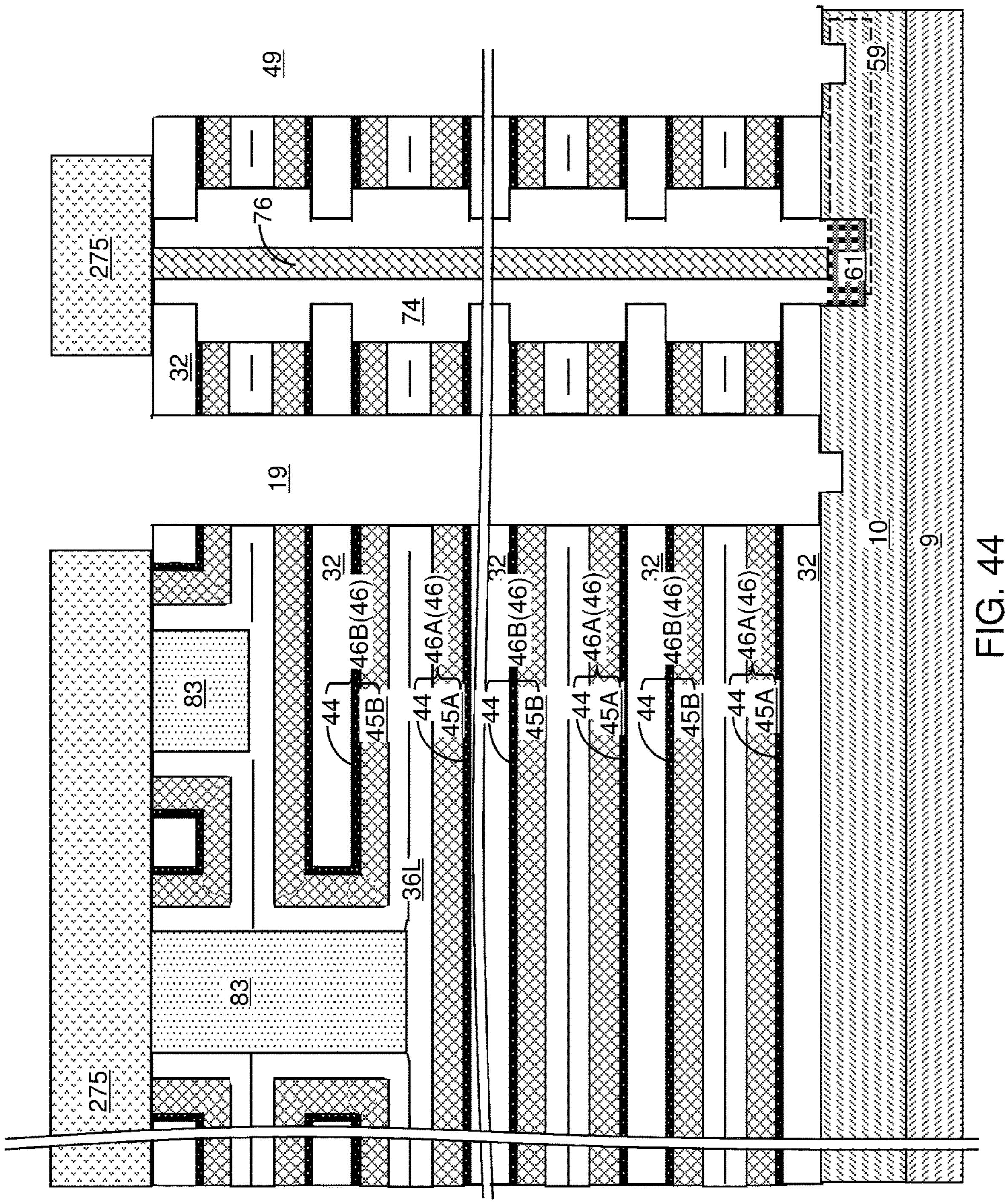
FIG. 44 is a schematic vertical cross-sectional view of the second exemplary structure after isotropically etching the in-process electrically conductive layers according to the second embodiment of the present disclosure.

Referring to FIG. 44, proximal portions of the at least one conductive fill material in the electrically conductive layers (46A, 46B) can be removed from around the memory cavities 49' and the support cavities 19' to re-form the memory openings 49 and support openings 19. Remaining portions of the at least one conductive fill material of the electrically conductive layers (46A, 46B) and the insulating fill material of the second-type insulating layers 36 after removal of the proximal portions of the at least one conductive fill material from around the memory cavities 49' comprise layer stacks (32, 46A, 36, 46B) located within a volume of a respective one of the lateral recesses 43. The volume of the respective one of the lateral recesses 43 is filled with material portions comprising, from bottom to top, a first-type electrically conductive layer 46A, a seamed insulating layer (comprising the second-type insulating layer 36) including a horizontally-extending seam 36S therein, and a second-type electrically conductive layer 46B. Cylindrical surfaces of the second-type insulating layers 36 can be physically exposed around each of the memory openings 49 and the support openings 19. The second photoresist layer 275 (if present) can be subsequently removed, for example, by ashing.

Figure 45:
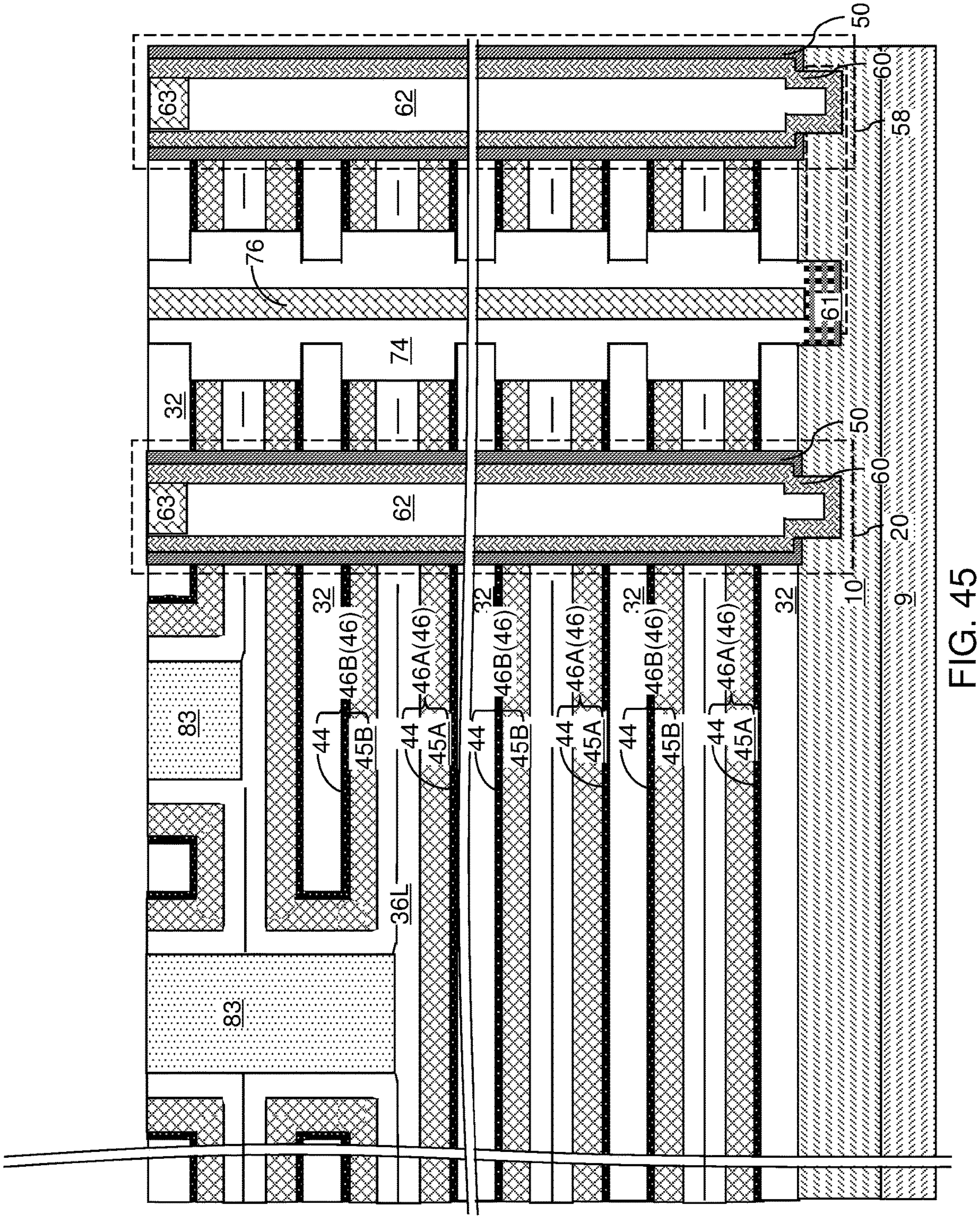
FIG. 45 is a schematic vertical cross-sectional view of the second exemplary structure after formation of memory opening fill structures according to the second embodiment of the present disclosure.

Referring to FIG. 45, the processing steps of FIGS. 10B-10F can be performed to form a memory opening fill structure 58 within each memory opening 49, and to form a support pillar structure 20 within each support opening 19. Generally, the volume of each memory opening fill structure 58 may be greater than the volume of a memory cavity 49'. In one embodiment, the memory opening fill structures 58 can be formed within volumes of the memory cavities 49' and additional volumes of voids formed by removal of the proximal portions of the at least one conductive fill material. In one embodiment, the memory opening fill structures 58 may be formed by forming a memory film 50 including a respective vertical stack of memory elements within each of the memory cavities 49, forming a vertical semiconductor channel 60 over the memory film 50 within each of the memory cavities 49, and forming a drain region 63 at a top end of the vertical semiconductor channel 60 within each of the memory cavities 49.

Figure 46:
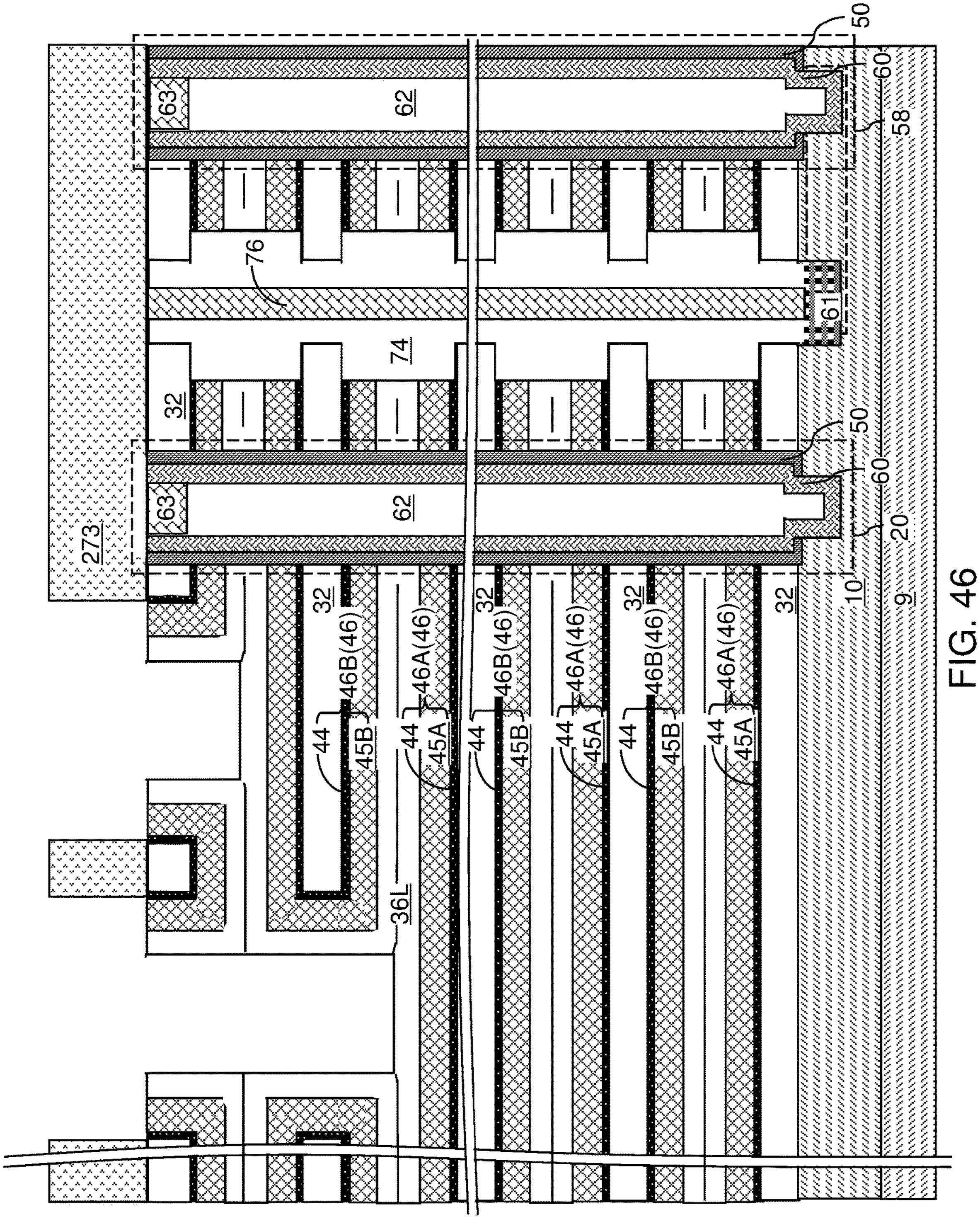
FIG. 46 is a schematic vertical cross-sectional view of the second exemplary structure after removal of sacrificial via fill material portions according to the second embodiment of the present disclosure.

Referring to FIG. 46, an optional third photoresist layer 273 can be applied over the second exemplary structure, and can be lithographically patterned to form openings in areas of the sacrificial via fill material portions 83. An etch process such as a wet etch process can be performed to remove the sacrificial via fill material portions 83 selective to the materials of the second-type insulating layers 36 and the electrically conductive layers 46. Alternatively, the third photoresist layer 273 may be omitted and the sacrificial via fill material portions 83 can be removed by selective etching.

Figure 47:
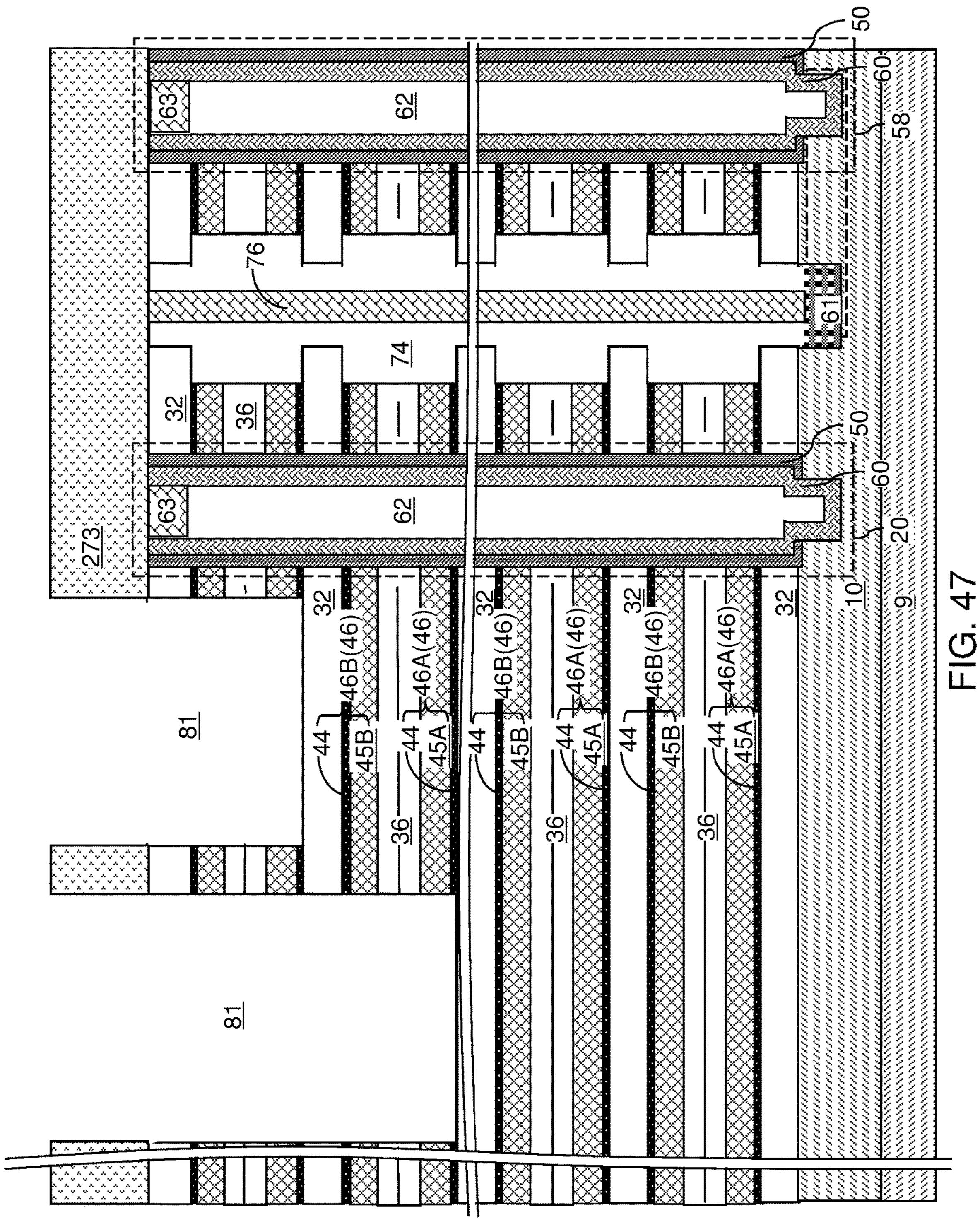
FIG. 47 is a schematic vertical cross-sectional view of the second exemplary structure after isotropically recessing insulating fill material layers and in-process electrically conductive layers according to the second embodiment of the present disclosure.

Referring to FIG. 47, a first isotropic etch process can be performed to remove physically exposed portions of the second-type insulating layer 36 from around the contact via cavities 81. A second isotropic etch process can be performed to remove physically exposed portions of the electrically conductive layers (46A, 46B) from around the contact via cavities 81. Alternatively, an anisotropic etch process may be performed using the third photoresist layer as a mask. Vertically-extending portions of the at least one conductive fill material of the electrically conductive layers (46A, 46B) are removed from the periphery of the contact via cavities 81. A top surface of a respective underlying second-type electrically conductive layer 46B can be physically exposed underneath each of the contact via cavities 81.

Each adjoined pair of a first-type electrically conductive layer 46A and a second-type electrically conductive layer 46B are physically disjoined from each other upon removal of the vertically-extending portions of the at least one conductive fill material from the periphery of the contact via cavities 81. Within each instance of a unit layer stack (32, 46A, 36, 46B), an entirety of a bottom surface of the second-type insulating layer 36 is in direct contact with a top surface of the first conductive fill material layer 45A, and an entirety of a bottom surface of the second conductive fill material layer 45B is in direct contact with a top surface of the second-type insulating layer 36.

In one embodiment, within each instance of the unit layer stack, an entirety of a bottom surface of the first conductive fill material layer 45A is in direct contact with a top surface of the first conductive barrier liner 44 of the first electrically conductive layer 46A, and an entirety of a bottom surface of the second conductive barrier liner 44 is in direct contact with a top surface of the second conductive fill material layer 45B of the second electrically conductive layer 46B. In one embodiment, each instance of the first conductive fill material layer 45A and the second conductive fill material layer 45B has a same material composition (which is herein referred to as a conductive fill material composition) and a same thickness (which is herein referred to as a conductive fill material thickness). In one embodiment, each instance of the first conductive barrier liner 44 and the second conductive barrier liner 44 has a same material composition (which is herein referred to as a conductive liner composition) and a same thickness (which is herein referred to as a conductive liner thickness).

Figure 48:
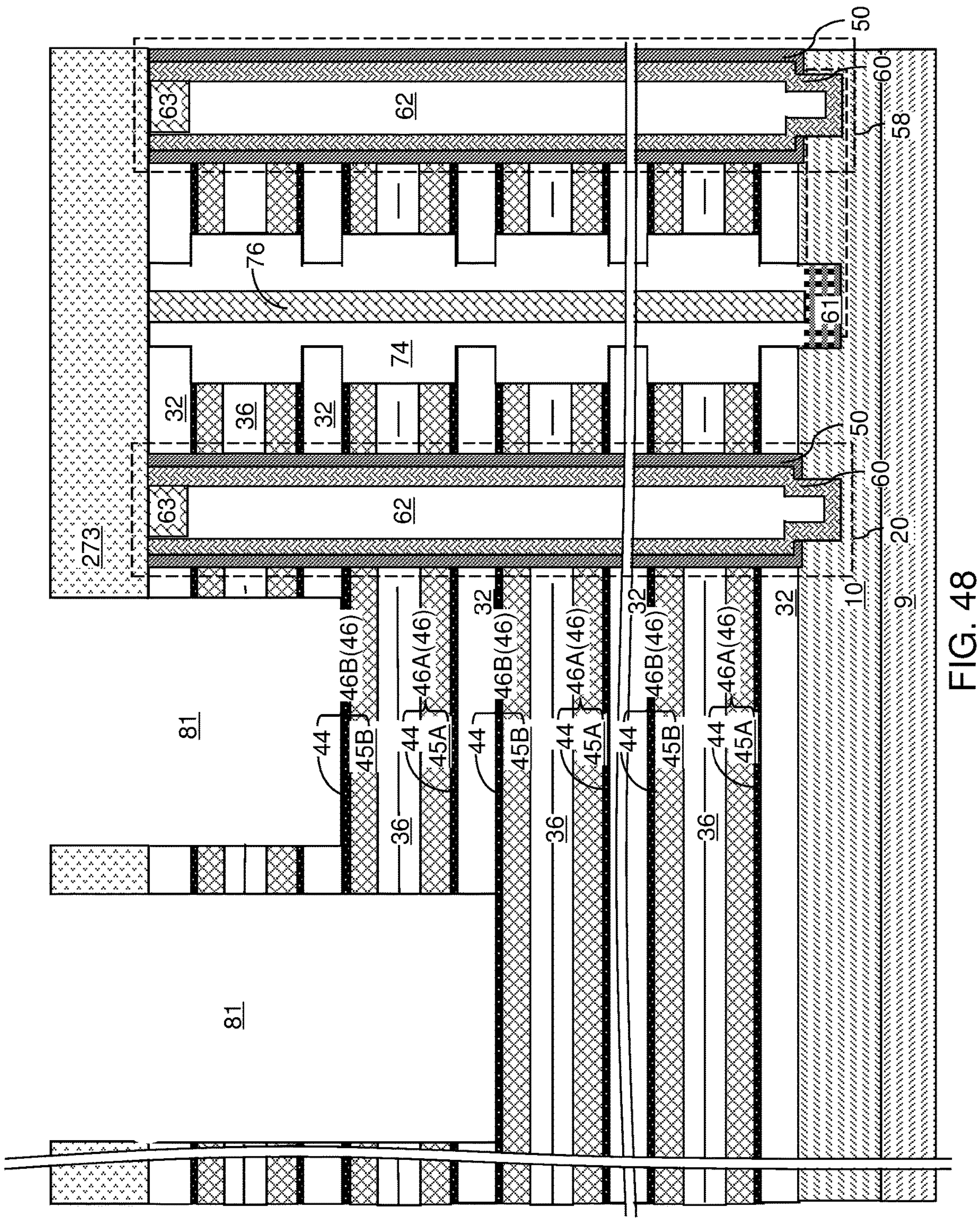
FIG. 48 is a schematic vertical cross-sectional view of the second exemplary structure after anisotropically recessing the insulating fill material layers according to the second embodiment of the present disclosure.

Referring to FIG. 48, an anisotropic etch process can be performed to vertically recess insulating fill material layers at the bottom of each of the contact via cavities 81. Physically exposed portions of the first-type insulating layers 32 can be removed from underneath each of the contact via cavities 81, and a top surface of a second-type electrically conductive layer 46B can be physically exposed at the bottom of the contact via cavities 81. The third photoresist layer 273 can be subsequently removed, for example, by ashing.

Figure 49:
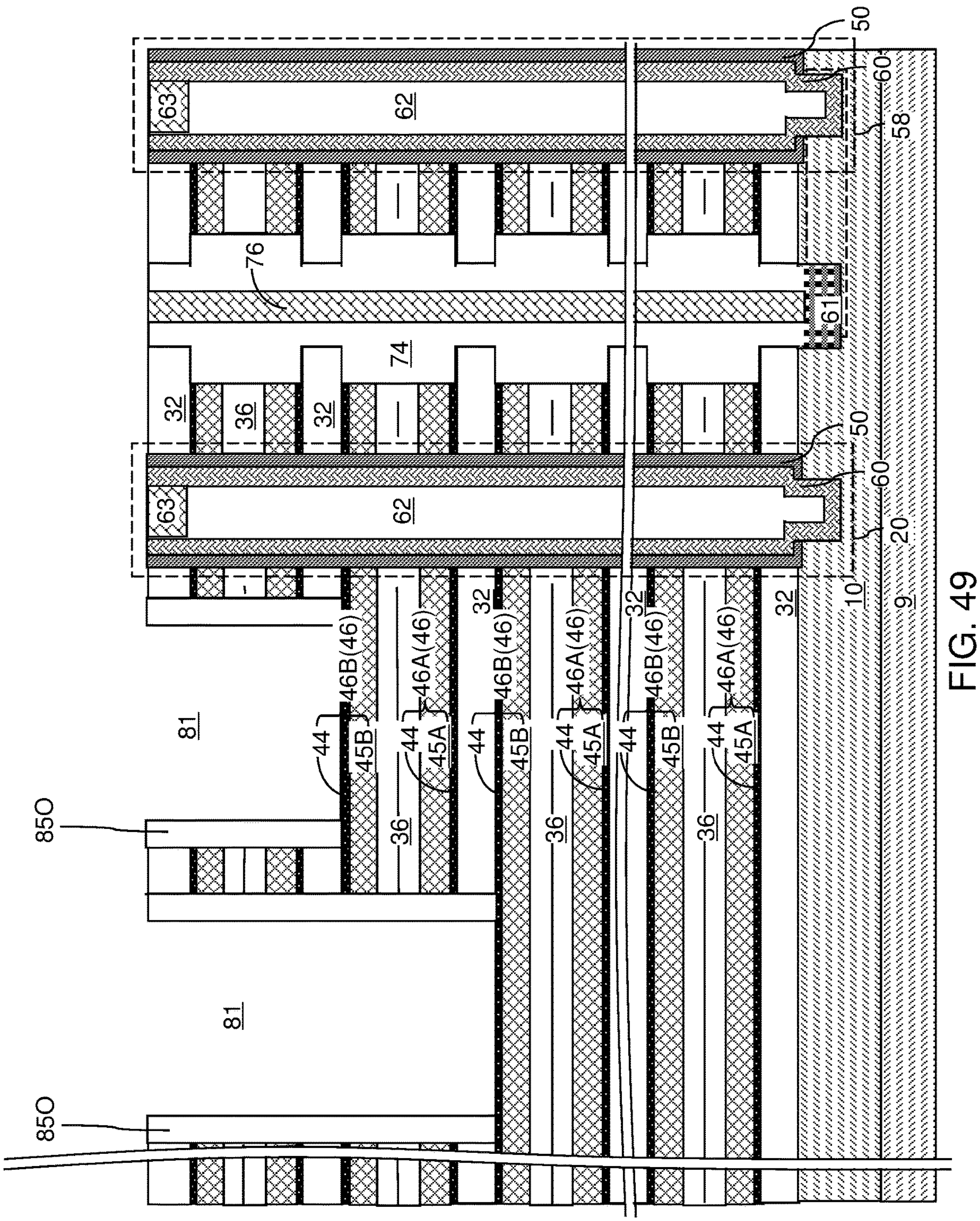
FIG. 49 is a schematic vertical cross-sectional view of the second exemplary structure after formation of outer dielectric tubular spacers according to the second embodiment of the present disclosure.

Referring to FIG. 49, a first conformal dielectric material layer can be conformally deposited and anisotropically etched using a sidewall spacer etch process to form outer dielectric tubular spacers 85O in peripheral regions of the contact via cavities 81. Each outer dielectric tubular spacer 85O contacts an annular top surface of a second-type electrically conductive layer 46B.

Figure 50:
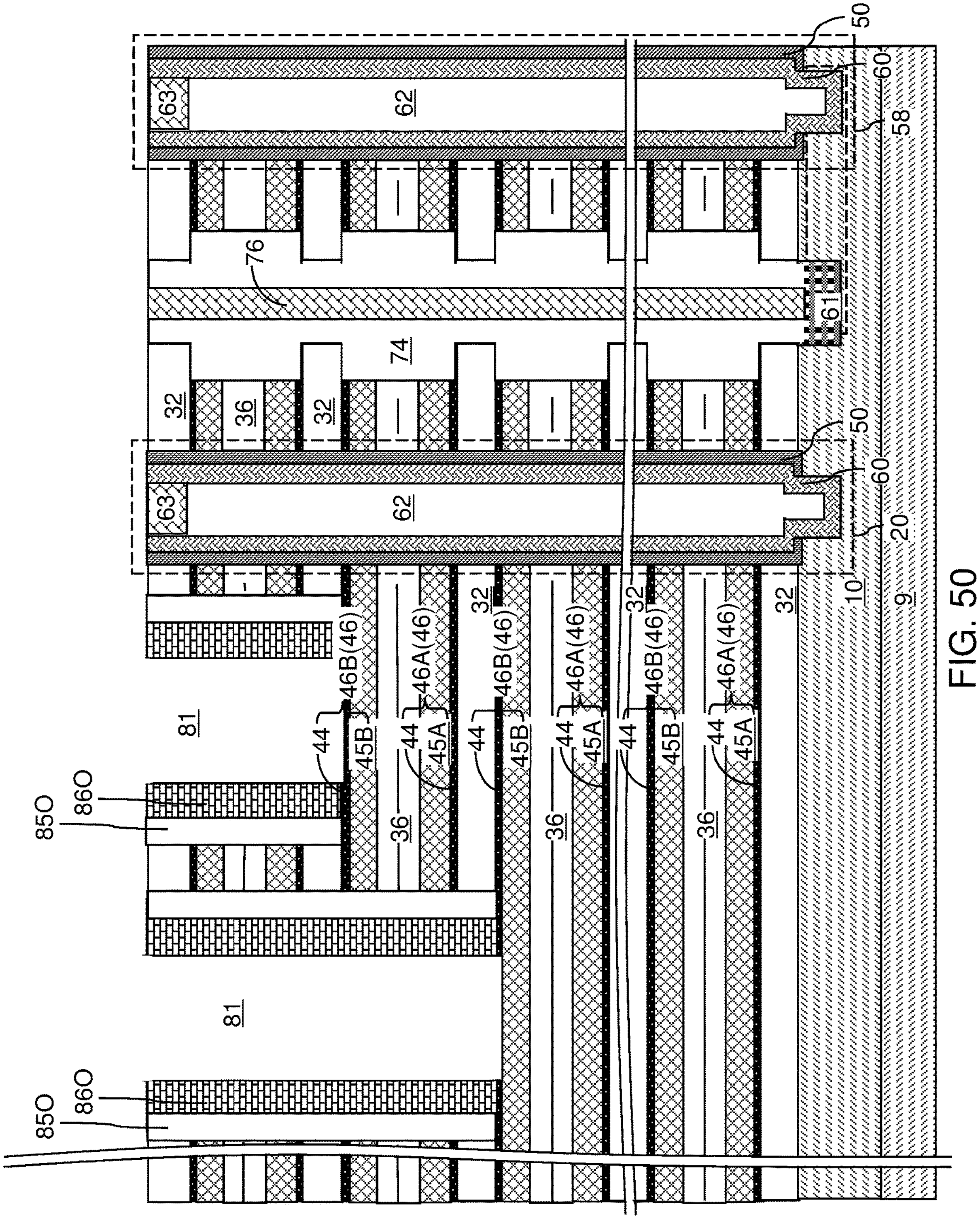
FIG. 50 is a schematic vertical cross-sectional view of the second exemplary structure after formation of tubular contact via structures according to the second embodiment of the present disclosure.

Referring to FIG. 50, a first conformal conductive material layer can be conformally deposited and anisotropically etched to form tubular contact via structures 86O on inner sidewalls of the outer dielectric tubular spacers 85O. In one embodiment, at least one tubular contact via structure 86O can vertically extend through at least one instance of a unit layer stack (32, 46A, 36, 46B), and can contact an annular top surface of a second-type electrically conductive layer 46B in an underlying instance of the unit layer stack (32, 46A, 36, 46B). In one embodiment, a tubular contact via structure 86O contacts a second conductive barrier liner 44 of an underlying instance of the unit layer stack (32, 46A, 36, 46B), and does not contact the second conductive fill material layer 45B of the underlying instance of the unit layer stack (32, 46A, 36, 46B).

Figure 51:
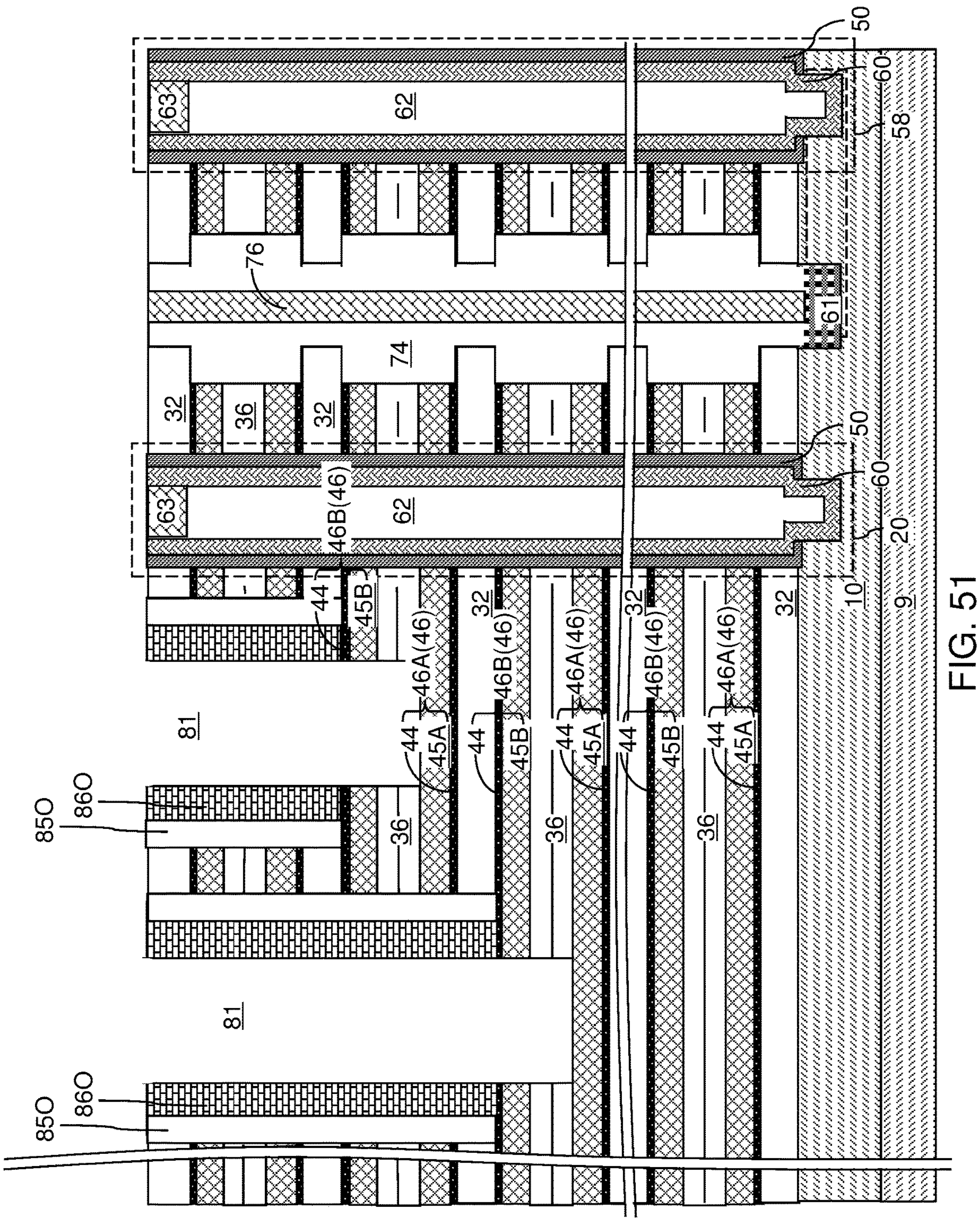
FIG. 51 is a schematic vertical cross-sectional view of the second exemplary structure after anisotropically etching electrically conductive layers and insulating layers according to the second embodiment of the present disclosure.

Referring to FIG. 51, a pair of a second-type electrically conductive layer 46B and a second-type insulating layer 36 can be anisotropically etched underneath each unfilled portion of the contact via cavities 81. A respective one of the second-type electrically conductive layers 46B and a respective one of the seamed insulating layers (i.e., the second-type insulating layers 36) can be removed underneath an opening within each of the tubular contact via structures 86O. A top surface of a first-type electrically conductive layer 46A can be physically exposed underneath each contact via cavity 81.

Figure 52A:
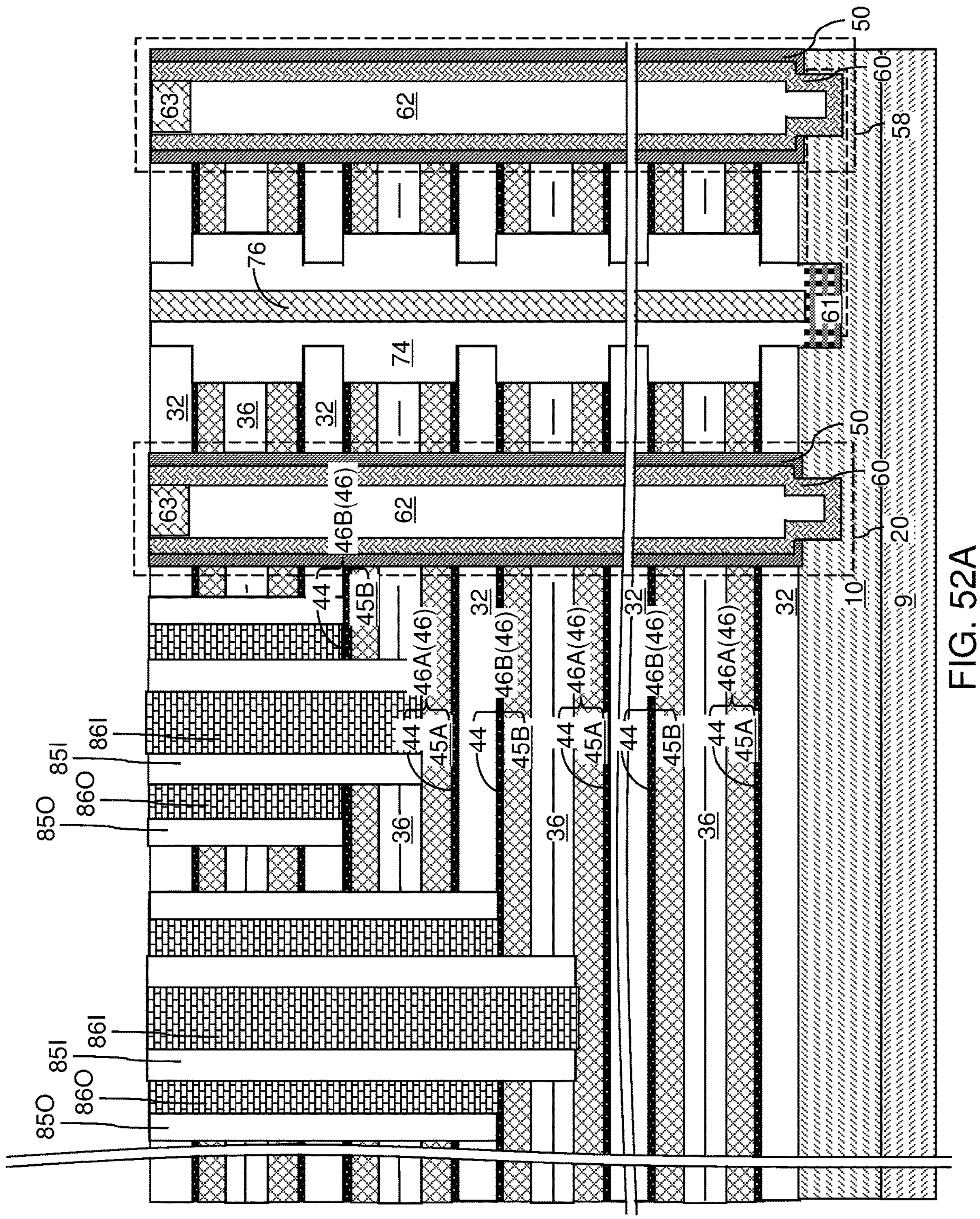
FIG. 52A is a schematic vertical cross-sectional view of the second exemplary structure after formation of inner dielectric tubular spacers and cylindrical contact via structures according to the second embodiment of the present disclosure.
Figure 52B:
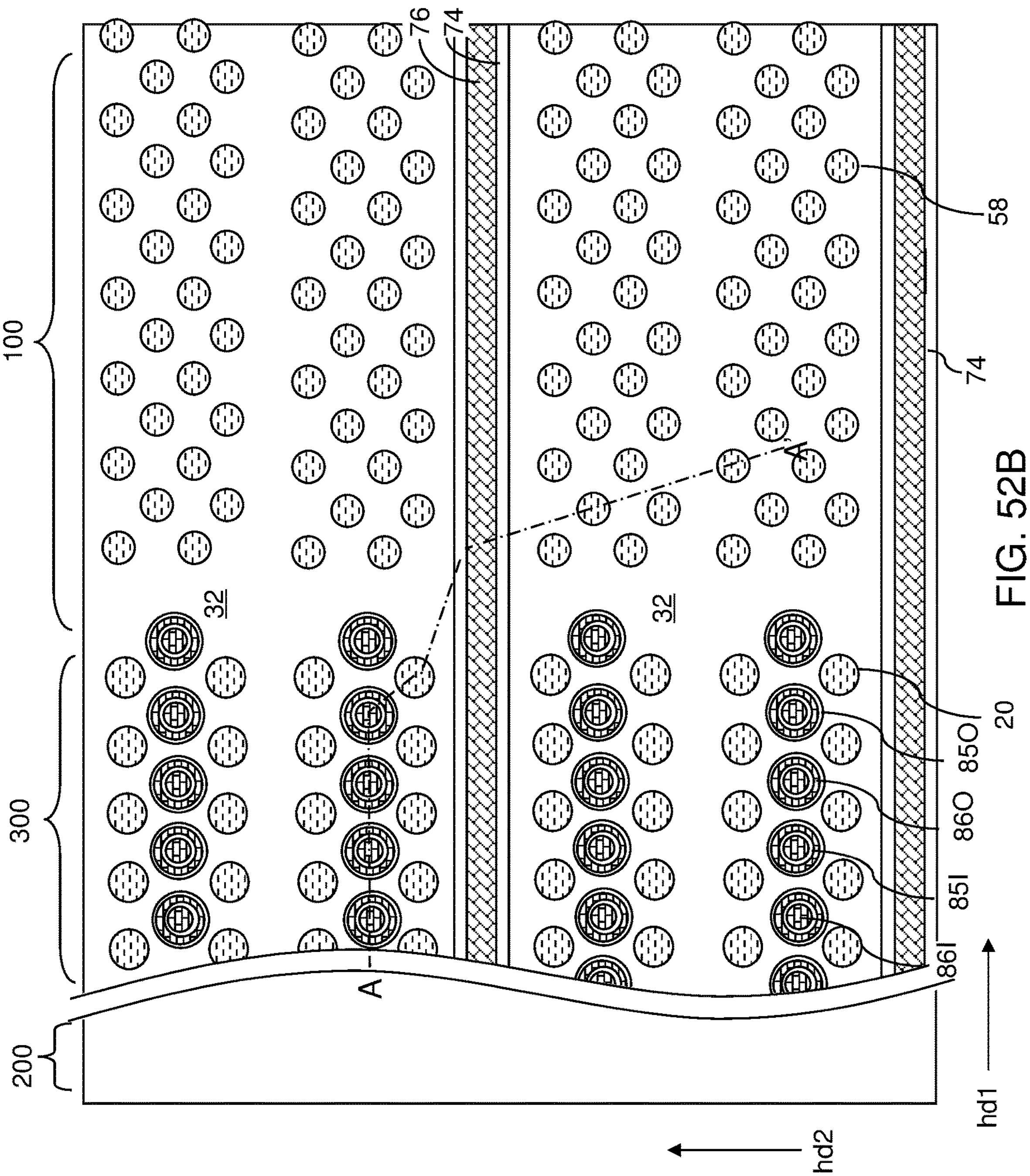
FIG. 52B is a top-down view of the second exemplary structure of FIG. 52A. The vertical plane A-A' is the plane of the vertical cross-sectional view of FIG. 52A.

Referring to FIGS. 52A and 52B, a second conformal dielectric material layer can be conformally deposited and anisotropically etched to form inner dielectric tubular spacers 85I on inner sidewalls of the tubular contact via structures 86O and on an annular top surface segment of a respective one of the first-type electrically conductive layers 45A.

A second conformal conductive material layer can be conformally deposited to form cylindrical contact via structures 86I on inner sidewalls of the inner dielectric tubular spacers 85I. In one embodiment, at least one cylindrical contact via structure 86I can vertically extend through at least one instance of a unit layer stack (32, 46A, 36, 46B), and can contact a top surface of a first-type electrically conductive layer 46A in an underlying instance of the unit layer stack (32, 46A, 36, 46B). The tubular contact via structure 86O contacts a second conductive fill material layer 45B of an underlying instance of the unit layer stack (32, 46A, 36, 46B). The tubular contact via structure 86O surrounds the inner dielectric tubular spacers 85I, and the inner dielectric tubular spacers 85I surround the cylindrical contact via structures 86I. Therefore, the cylindrical contact via structures 86I do not contact the respective tubular contact via structures 86O.

FIGS. 53A-53F are schematic vertical cross-sectional view of an alternative embodiment of the second exemplary structure according to alternative configuration of the second embodiment.

Figure 53A:
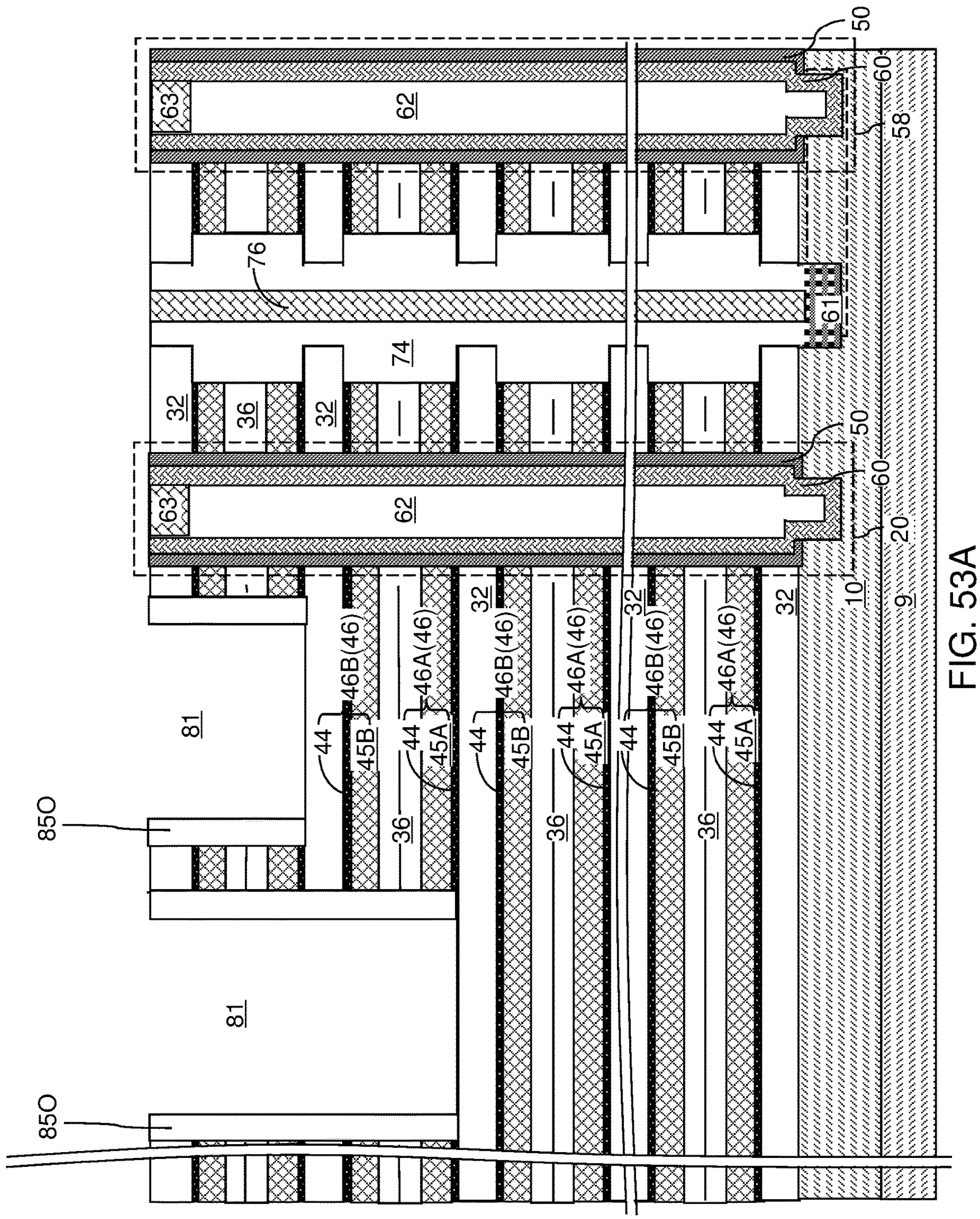
FIGS. 53A-53F are schematic vertical cross-sectional view of an alternative embodiment of the second exemplary structure according to alternative configuration of the second embodiment.

Referring to FIG. 53A, the outer dielectric tubular spacers 85O are formed in peripheral regions of the contact via cavities 81 of the second exemplary structure of FIG. 47 without performing the anisotropic etch of FIG. 48. The outer dielectric tubular spacers 85O may be formed using the process described above with respect to FIG. 49. Each outer dielectric tubular spacer 85O contacts an annular top surface of a first-type insulating layer 32.

Figure 53B:
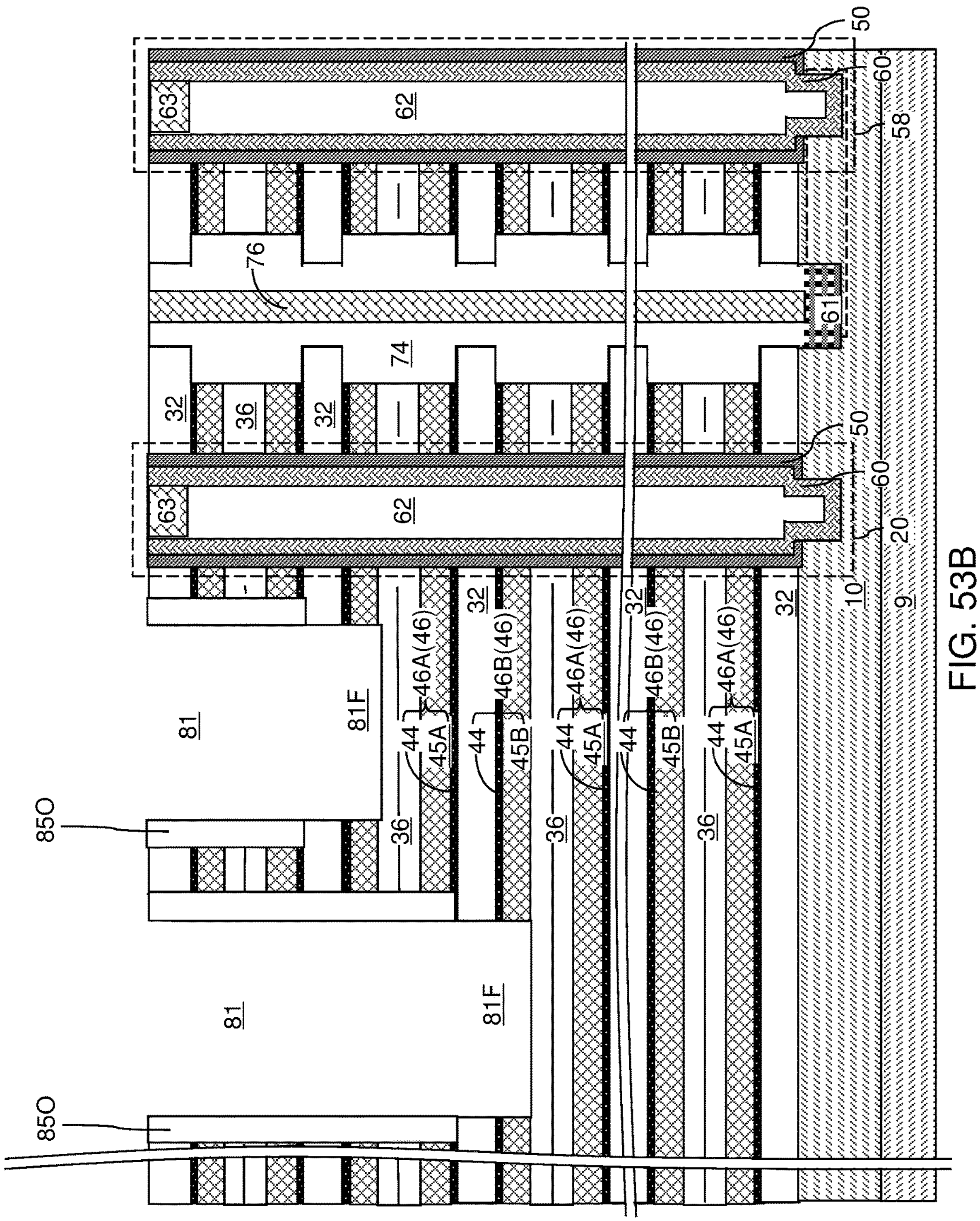

Referring to FIG. 53B, an anisotropic etch is performed to vertically recess one pair of a respective first-type insulating layer 32 and a respective second-type electrically conductive layer 46B using the outer dielectric tubular spacers 85O as a mask to form first extension regions 81F. A respective second-type insulating layer 36 is exposed at the bottom of the first extension regions 81F of the contact via cavities 81. Sidewalls of the respective second-type electrically conductive layer 46B are exposed at the sidewall of the first extension regions 81F of the contact via cavities 81. The first extension regions 81F are narrower than the respective contact via cavities 81 by about two times the thickness of the outer dielectric tubular spacer 85O.

Figure 53C:
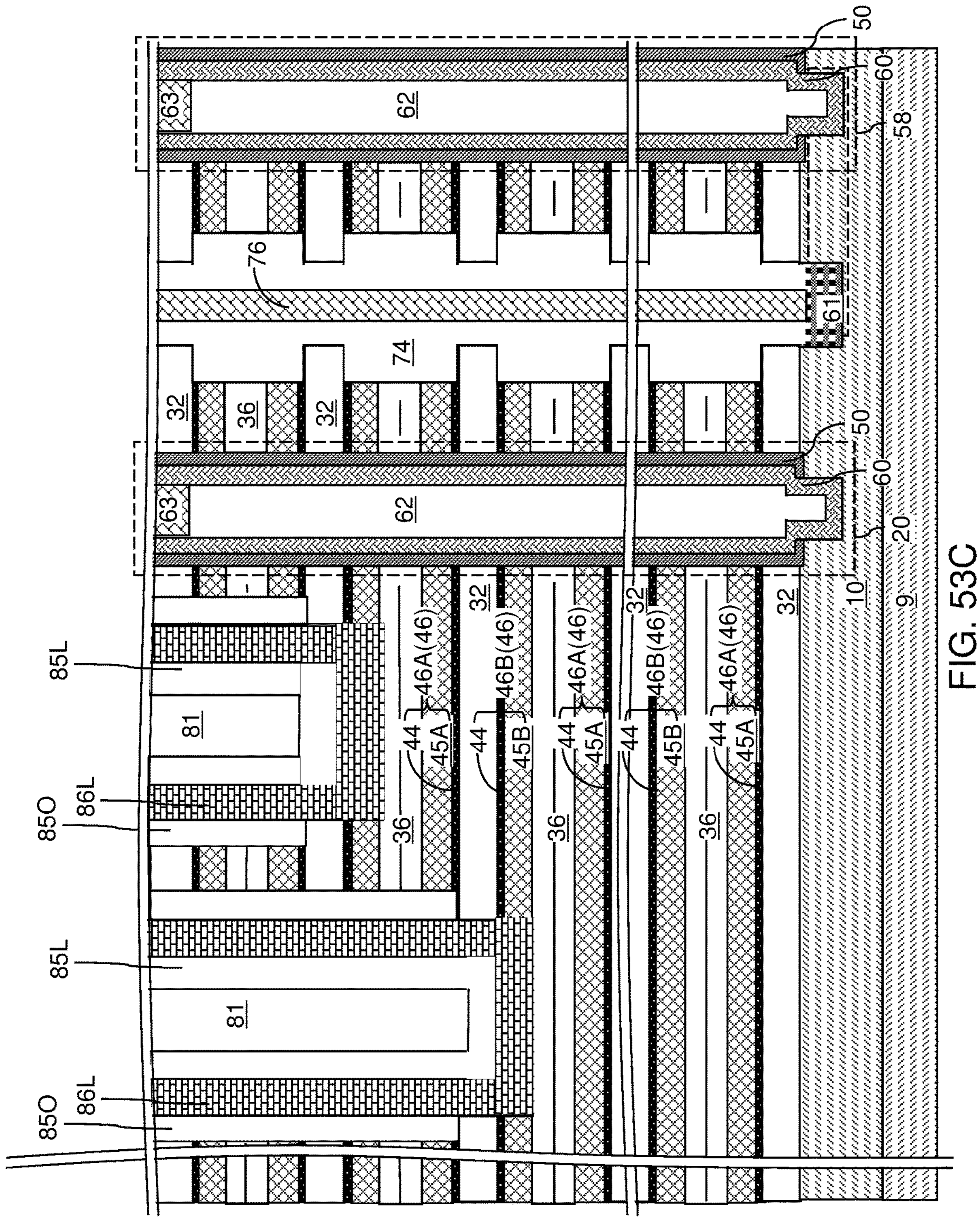

Referring to FIG. 53C, a first conformal conductive material layer 86L can be conformally deposited on inner sidewalls of the outer dielectric tubular spacers 85O and on the sidewalls of the first extension regions 81F. The first conformal conductive material layer 86L contacts the sidewalls of the respective second-type electrically conductive layer 46B which are exposed at the sidewall of the respective first extension regions 81F below the outer dielectric tubular spacers 85O. A middle conformal dielectric layer 85L, such as a silicon oxide layer, is deposited on the first conformal conductive material layer 86L.

Figure 53D:
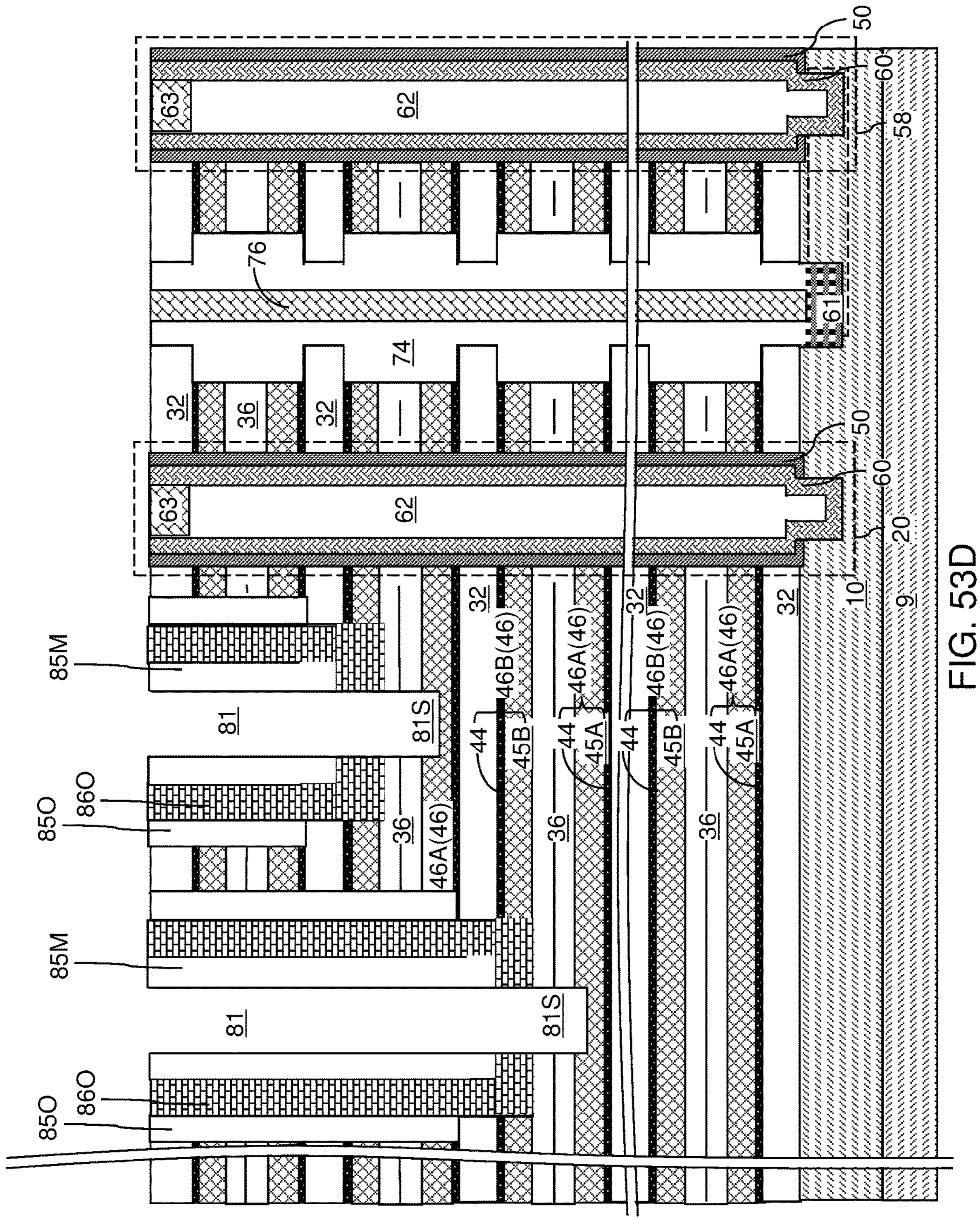

Referring to FIG. 53D, the middle conformal dielectric layer 85L and the first conformal conductive material layer 86L are anisotropically etched using a sidewall spacer etch to form respective middle dielectric tubular spacers 85M and the outer tubular contact via structure 86O. The anisotropic etch may be extended after forming the spacers to punch through the respective underlying second-type insulating layer 36 to form second extension regions 81S of the contact via cavities 81. The second extension regions 81S extend through the respective underlying second-type insulating layer 36 and expose a respective first-type electrically conductive layer 46A.

Figure 53E:
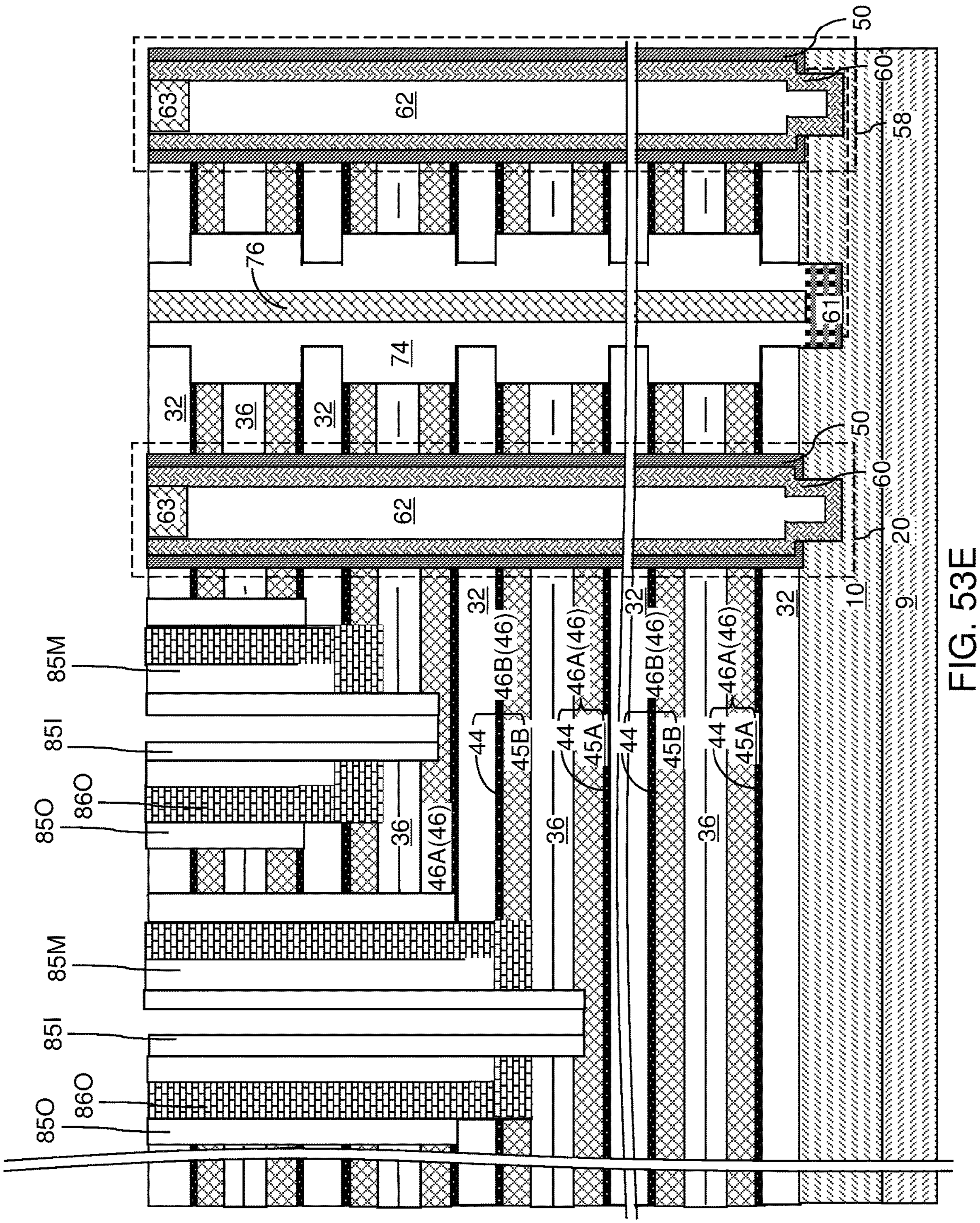

Referring to FIG. 53E, a third conformal dielectric material layer can be conformally deposited on the middle dielectric tubular spacers 85M and anisotropically etched to form inner dielectric tubular spacers 85I on inner sidewalls of the middle dielectric tubular spacers 85M and on an annular top surface segment of a respective one of the first-type electrically conductive layers 46A.

Figure 53F:
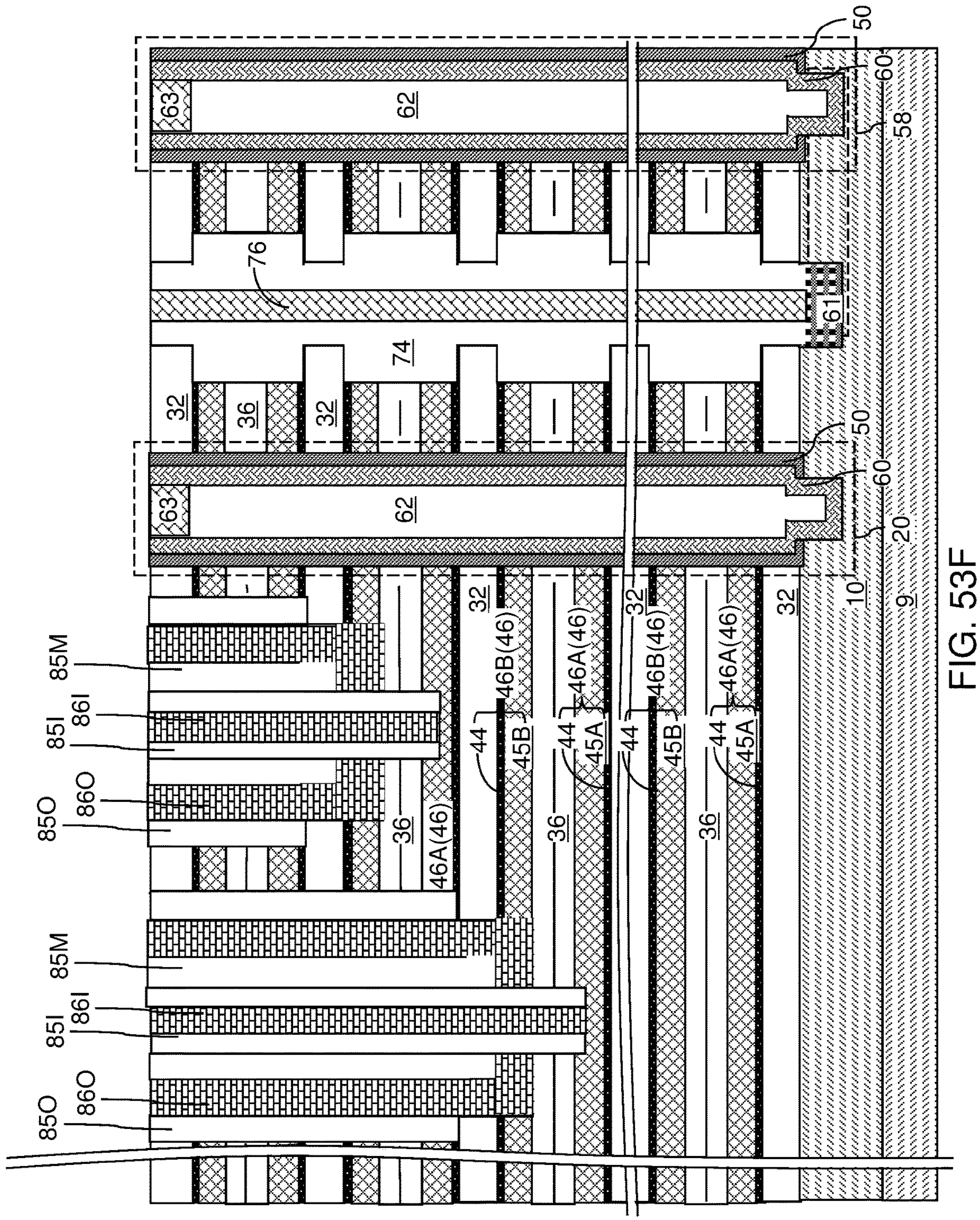

Referring to FIG. 53F, a second conformal conductive material layer can be conformally deposited into the remaining space in the contact via cavities 81 to form cylindrical contact via structures 86I on inner sidewalls of the inner dielectric tubular spacers 85I. In one embodiment, at least one cylindrical contact via structure 86I can vertically extend through at least one instance of a unit layer stack (32, 46A, 36, 46B), and can contact a surface of a first-type electrically conductive layer 46A exposed in the contact via cavity 81 in an underlying instance of the unit layer stack (32, 46A, 36, 46B).

In this embodiment, a tubular contact via structure 86O contacts a sidewall of a second conductive fill material layer 45B of an underlying instance of the unit layer stack (32, 46A, 36, 46B). Thus, the current can flow from the tubular contact via structure 86O through the sidewall of the second conductive fill material layer 45B (i.e., the second-type electrically conductive layer 46B). The middle and inner dielectric tubular spacers (85M, 85I) surround the cylindrical contact via structures 86I. Therefore, the cylindrical contact via structures 86I do not contact the respective tubular contact via structures 86O.

Referring to all drawings related to the second embodiment of the present disclosure, a three-dimensional memory device is provided, which comprises: a vertical repetition of multiple instances of a unit layer stack, wherein the unit layer stack comprises, from bottom to top, a first-type insulating layer 32, a first-type electrically conductive layer 46A, a second-type insulating layer 36, and a second-type electrically conductive layer 46B; memory openings 49 vertically extending through the vertical repetition; memory opening fill structures 58 located within the memory openings 49, wherein each of the memory opening fill structures 58 comprises a respective vertical stack of memory elements; and a laterally insulated contact structure (86I, 85I, 86O, 85O) comprising: a tubular contact via structure 86O vertically extending through at least one instance of the unit layer stack and contacting an annular top surface of the second-type electrically conductive layer 46B in an underlying instance of the unit layer stack; and a cylindrical contact via structure 86I laterally surrounded by the tubular contact via structure 86O and contacting an annular top surface of the first-type electrically conductive layer 46A in the underlying instance of the unit layer stack.

In one embodiment, the first-type electrically conductive layer 46A comprises a first conductive barrier liner 44 and a first conductive fill material layer 45A that overlies the first conductive barrier liner 44; and the second-type electrically conductive layer 46B comprises a second conductive fill material layer 45B and a second conductive barrier liner 44 that overlies the second conductive fill material layer.

In one embodiment, the cylindrical contact via structure 86I contacts the first conductive fill material layer 45A of the underlying instance of the unit layer stack and does not contact the first conductive barrier liner 44 of the underlying instance of the unit layer stack. The tubular contact via structure 86O contacts the second conductive barrier liner 44 of the underlying instance of the unit layer stack and does not contact the second conductive fill material layer 45B of the underlying instance of the unit layer stack.

In one embodiment, the laterally insulated contact structure (86I, 85I, 86O, 85O) comprises an outer dielectric tubular spacer 85O laterally surrounding the tubular contact via structure 86O and contacting an additional annular top surface of the second-type electrically conductive layer 48B in the underlying instance of the unit layer stack.

In one embodiment, the laterally-insulated contact structure (86I, 85I, 86O, 85O) comprises an inner dielectric tubular spacer 85I laterally surrounded by the tubular contact via structure 86O, laterally surrounding the cylindrical contact via structure 86I, and contacting a sidewall of the second-type electrically conductive layer 46B in the underlying instance of the unit layer stack, a sidewall of the second-type insulating layer 36 in the underlying instance of the unit layer stack, and an annular top surface of the first-type electrically conductive layer 46A in the underlying instance of the unit layer stack.

In one embodiment, within each instance of the unit layer stack, an entirety of a bottom surface of the second-type insulating layer 36 is in direct contact with a top surface of the first conductive fill material layer 45A; and an entirety of a bottom surface of the second conductive fill material layer 45B is in direct contact with a top surface of the second-type insulating layer 36. In one embodiment, within each instance of the unit layer stack: an entirety of a bottom surface of the first conductive fill material layer 45A is in direct contact with a top surface of the first conductive barrier liner 44; and an entirety of a bottom surface of the second conductive barrier liner 44 is in direct contact with a top surface of the second conductive fill material layer 45B.

In one embodiment, each of the memory opening fill structures 58 comprises a vertical semiconductor channel 60 and a memory film 50 containing the vertical stack of memory elements. In one embodiment, at least one of the tubular contact via structure 86O and the cylindrical contact via structure 86I comprises a conductive material having a different material composition than the conductive fill material composition of the instances of the first conductive fill material layer 45A and the second conductive fill material layer 45B.

In one embodiment, within each instance of the unit layer stack, the first-type insulating layer 32 comprises a seamless insulating layer that is free of any seam therein; and the second-type insulating layer 36 comprises a seamed insulating layer including a horizontally-extending seam therein.

In one embodiment, each of the memory opening fill structures 58 is laterally spaced from the horizontally-extending seams of instances of the seamed insulating layers by a respective seamless portion of the seamed insulating layers 36.

In one embodiment, the horizontally-extending seam within the seamed insulating layer 36 is equidistant from a horizontal interface between the seamed insulating layer 36 and the second-type electrically conductive layer 46B; and from a horizontal interface between the seamed insulating layer 36 and the first-type electrically conductive layer 46A.

In one embodiment, the three-dimensional memory device comprises: a first backside trench fill structure (74, 76) comprising a first dielectric surface contacting first sidewalls of each layer within the vertical repetition and laterally extending along a first horizontal direction hd1; and a second backside trench fill structure (74, 76) comprising a second dielectric surface contacting second sidewalls of each layer within the vertical repetition laterally extending along the first horizontal direction hd1, and laterally spaced from the first backside trench fill structure (74, 76) along a second horizontal direction hd1.

Figure 54A:
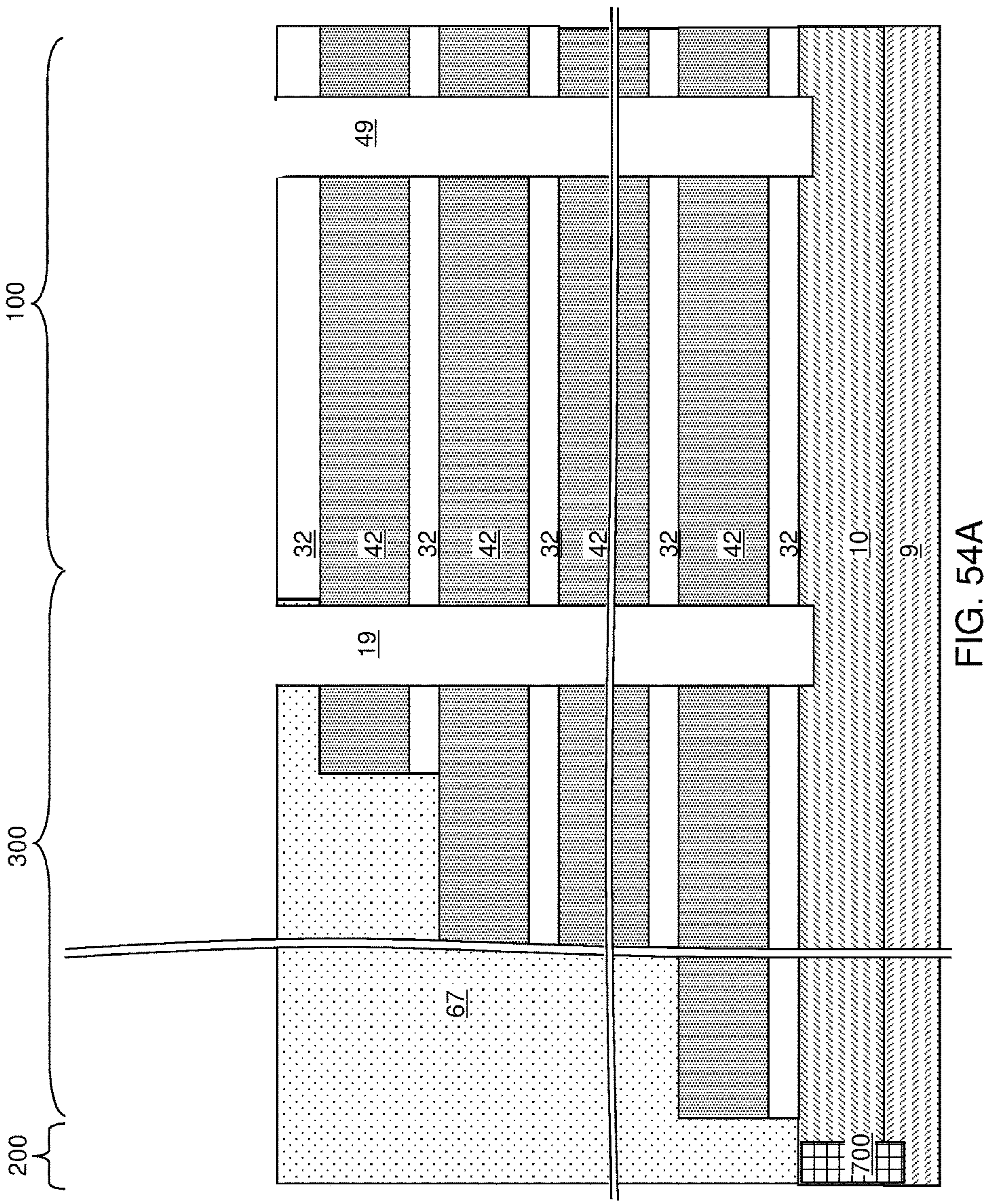
FIG. 54A is a schematic vertical cross-sectional view of the third exemplary structure after formation of memory openings and support openings according to a third embodiment of the present disclosure.
Figure 54B:
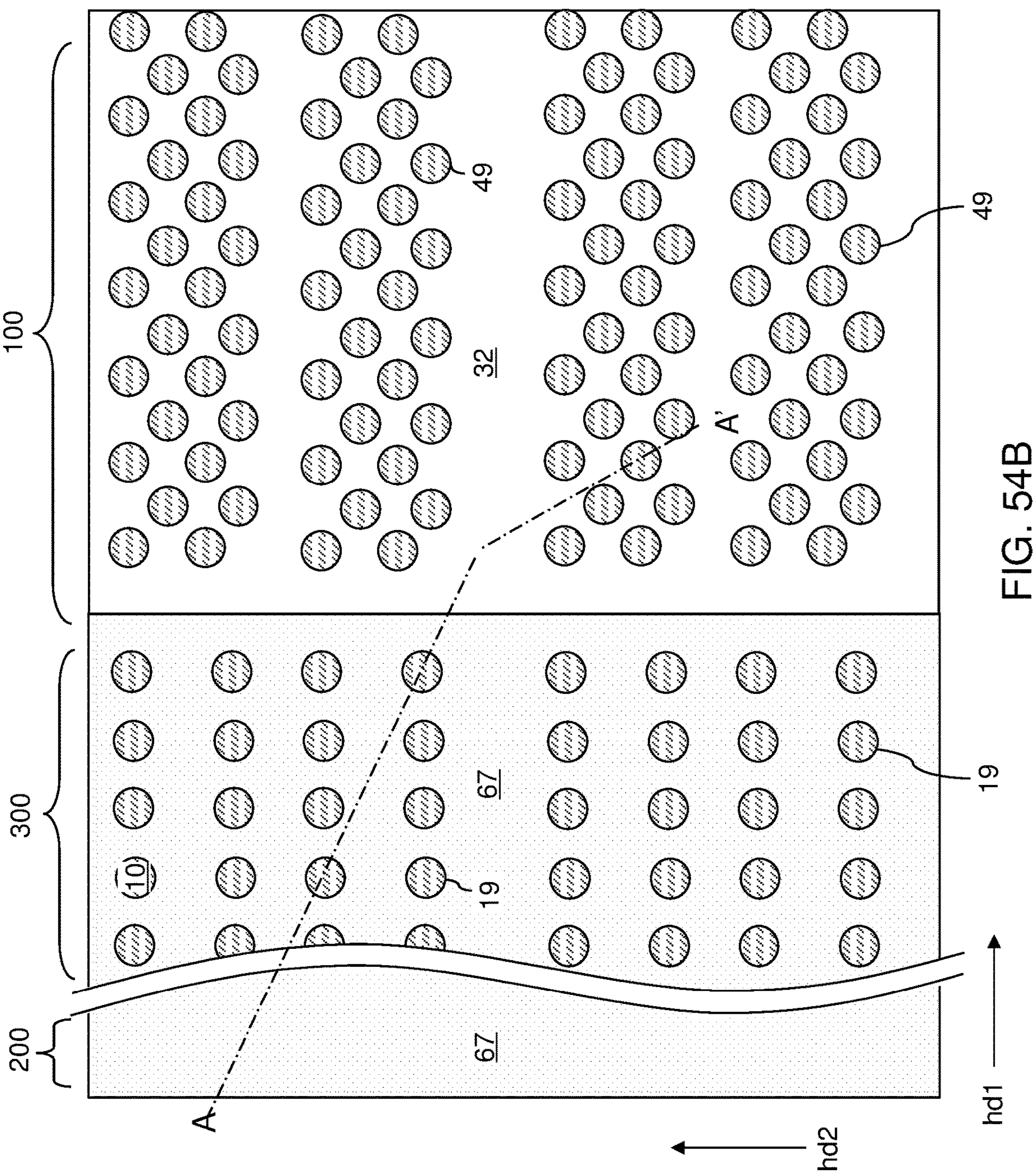
FIG. 54B is a top-down view of the third exemplary structure of FIG. 54A. The vertical plane A-A' is the plane of the vertical cross-sectional view of FIG. 54A.

Referring to FIGS. 54A and 54B, a third exemplary structure according to a third embodiment of the present disclosure is illustrated, which can be the same as the first exemplary structure illustrated in FIGS. 4A and 4B. Specifically, memory openings 49 and support openings 19 can be formed in the same manner as in the first embodiment.

Figure 55:
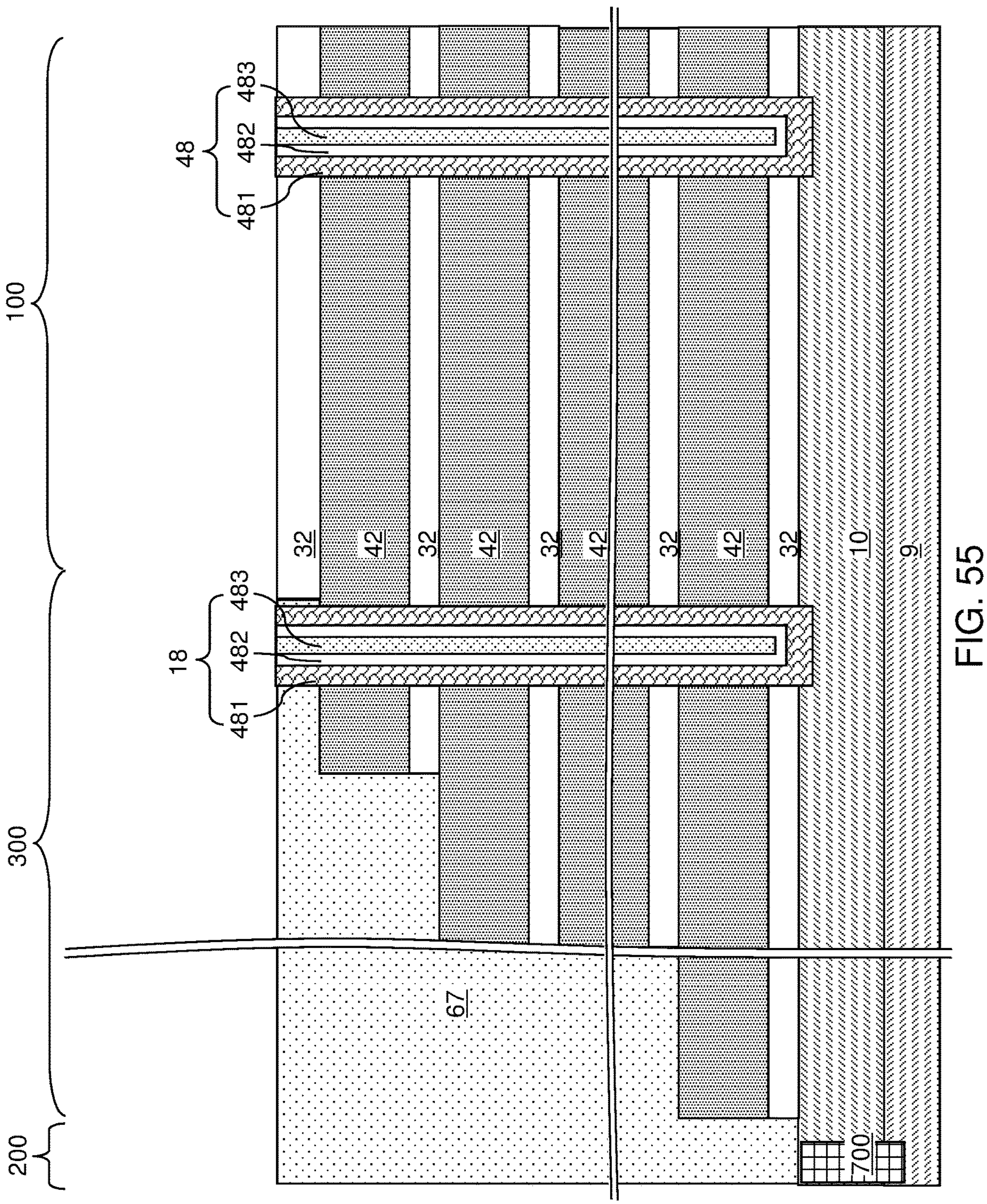
FIG. 55 is a schematic vertical cross-sectional view of the third exemplary structure after formation of sacrificial memory opening fill structures and sacrificial support opening fill structures according to the third embodiment of the present disclosure.

Referring to FIG. 55, at least one sacrificial fill material can be deposited in each of the memory openings 49 and the support openings 19. For example, a first sacrificial fill material layer, a second sacrificial fill material layer, and a third sacrificial fill material layer can be sequentially deposited in the memory openings 49 and the support openings 19, and excess portions of the first sacrificial fill material layer, the second sacrificial fill material layer, and the third sacrificial fill material layer can be removed from the horizontal plane including a top surface of a topmost first-type insulating layer 32 by a planarization process, which may employ a chemical mechanical polishing (CMP) process or a recess etch process. In one embodiment, the material of the first sacrificial fill material layer may include a material that can be removed selective to the material of the second sacrificial fill material layer. Further, the material of the third sacrificial fill material layer may include a material that can be removed selective to the material of the second sacrificial fill material layer.

Each remaining portion of the at least one sacrificial fill material in a memory opening 49 constitutes a sacrificial memory opening fill structure 48. Each remaining portion of the at least one sacrificial fill material in a support opening 19 constitutes a sacrificial support opening fill structure 18. In one embodiment, each of the sacrificial memory opening fill structures 48 and the support opening fill structures 18 can comprise a respective set of a first sacrificial fill material portion 481 that is a remaining portion of the first sacrificial fill material layer, a second sacrificial fill material portion 482 that is a remaining portion of the second sacrificial fill material layer, and a third sacrificial fill material portion 483 that is a remaining portion of the third sacrificial fill material layer. Alternatively, only two sacrificial fill material portions may be included.

In an illustrative example, the first sacrificial fill material portions 481 may comprise a semiconductor material such as amorphous silicon, the second sacrificial fill material portions 482 may comprise a dielectric material such as silicon oxide, and the third sacrificial fill material portions 483 may comprise a carbon material such as amorphous carbon or diamond-like carbon. In one embodiment, the lateral thickness between an inner sidewall and an outer sidewall of each first sacrificial fill material portion 481 may be the same as, or may be about the same as, the thickness of at least one conductive fill material to be subsequently deposited to form electrically conductive layers.

Generally, each of the sacrificial memory opening fill structures 48 may comprise a first sacrificial fill material portion 481 comprising a first sacrificial fill material and having a tubular shape, a second sacrificial fill material portion 482 comprising a second sacrificial fill material and laterally surrounded by the first sacrificial fill material portion 481, and a third sacrificial fill material portion 483 having a cylindrical shape and comprising a third sacrificial fill material and laterally surrounded by the second sacrificial fill material portion 482.

In an alternative embodiment, each of the sacrificial memory opening fill structures 48 and the support opening fill structures 18 can comprise a single sacrificial material. For example, each of the sacrificial memory opening fill structures 48 and the support opening fill structures 18 can consist essentially of amorphous silicon.

Figure 56A:
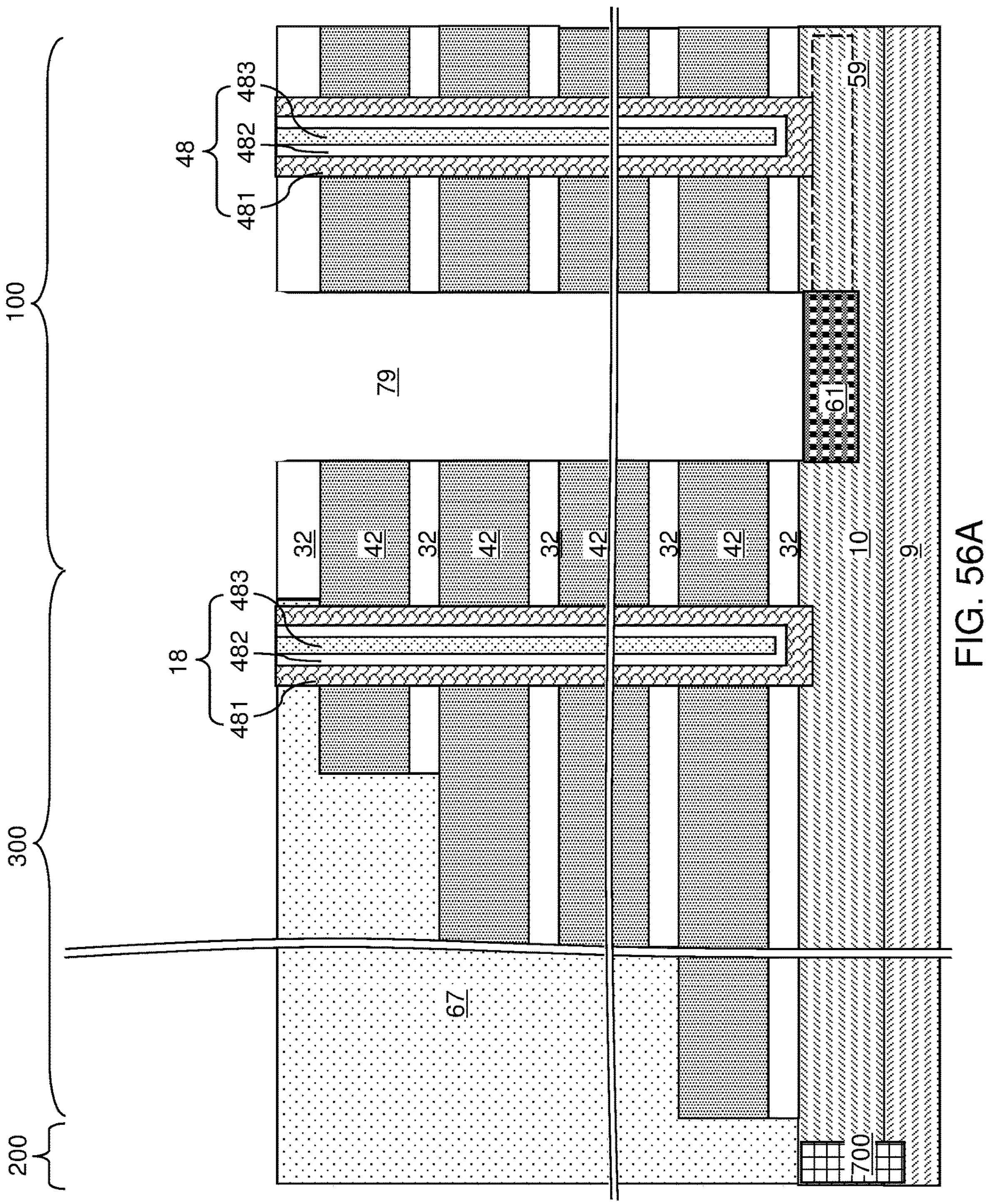
FIG. 56A is a schematic vertical cross-sectional view of the third exemplary structure after formation of backside trenches according to the third embodiment of the present disclosure.
Figure 56B:
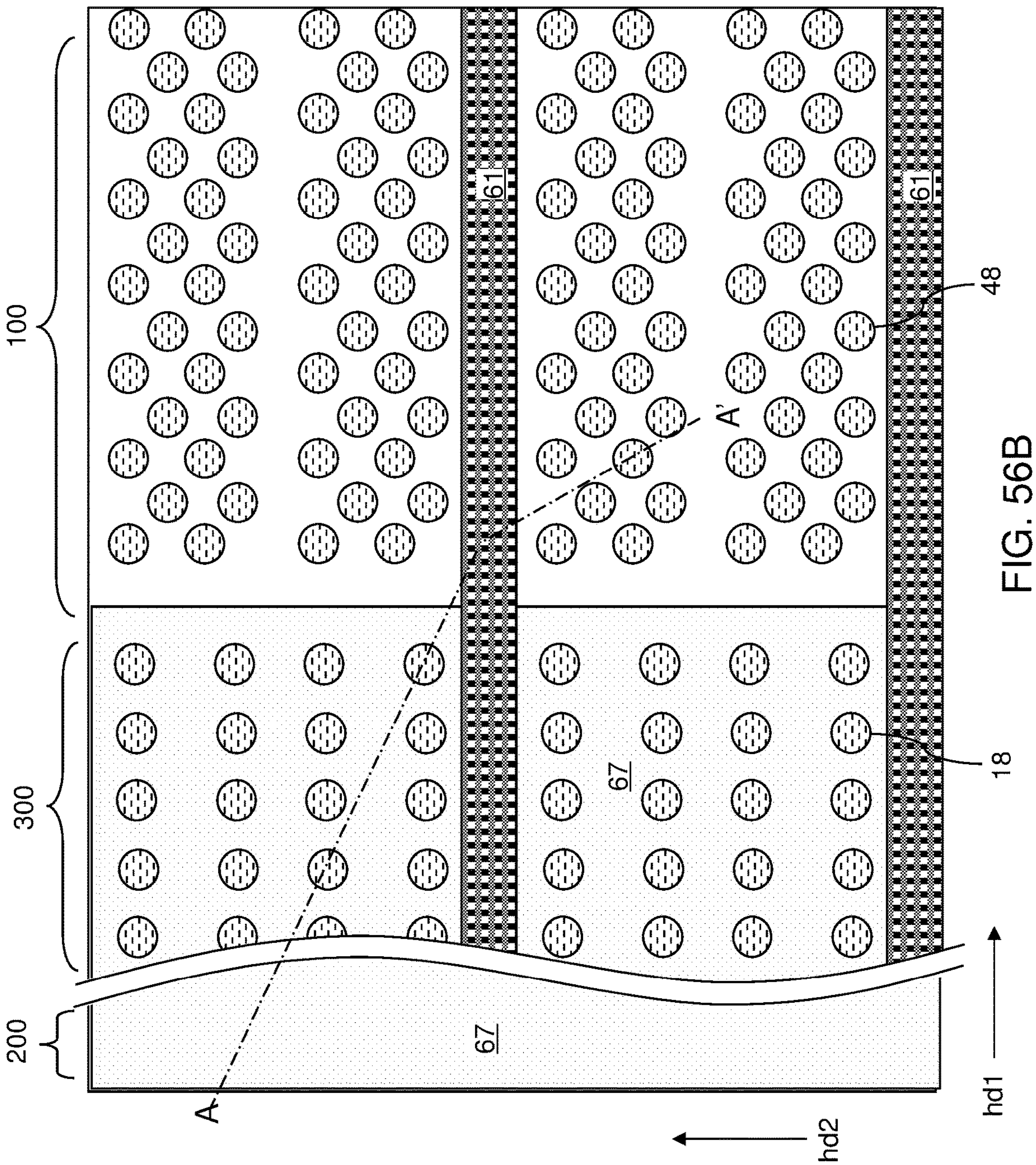
FIG. 56B is a top-down view of the third exemplary structure of FIG. 56A. The vertical plane A-A' is the plane of the vertical cross-sectional view of FIG. 56A.

Referring to FIGS. 56A and 56B, the processing steps of FIGS. 6A and 6B can be performed to form backside trenches 79 and source regions 61. Sidewalls of the multiple instances of the unit layer stack (32, 42) are physically exposed to the backside trenches 79.

Figure 57:
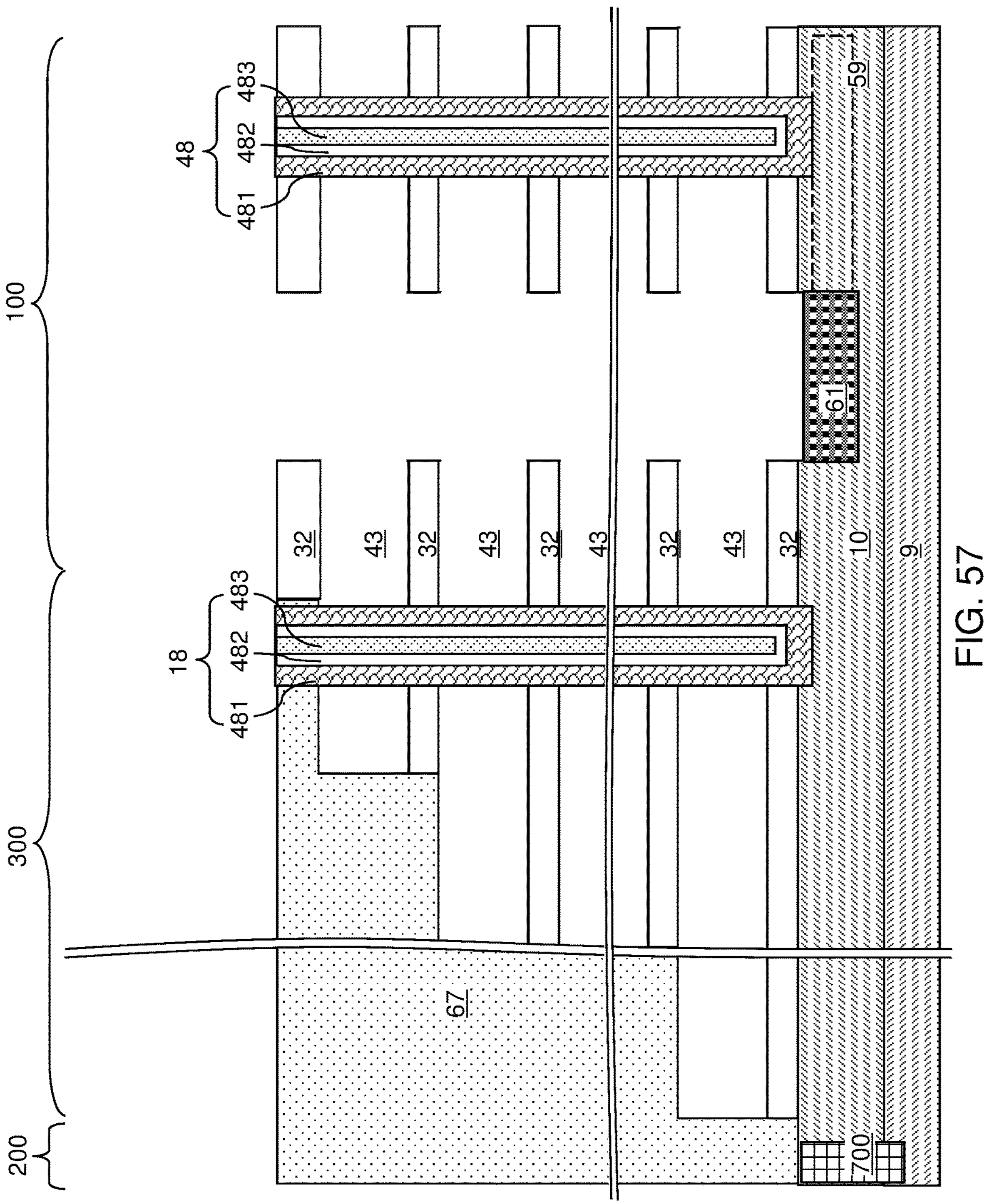
FIG. 57 is a schematic vertical cross-sectional view of the third exemplary structure after formation of lateral recesses according to the third embodiment of the present disclosure.

Referring to FIG. 57, the sacrificial material layers 42 can be removed selective to the first-type insulating layers 32 by introducing an isotropic etchant that etches the material of the sacrificial material layers 42 selective to the material of the first-type insulating layers into the backside trenches 79. Lateral recesses 43 are formed in volumes from which the sacrificial material layers 42 are removed. The removal of the second material of the sacrificial material layers 42 can be selective to the first material of the first-type insulating layers 32, the material of the sacrificial retro-stepped dielectric material portion 67, the semiconductor material of the semiconductor material layer 10, and the material of the sacrificial memory opening fill structures 48 and the support opening fill structures 18 (e.g., the material of the first sacrificial fill material portions 481). In one embodiment, the sacrificial material layers 42 can include silicon nitride, the materials of the first-type insulating layers 32 and the sacrificial retro-stepped dielectric material portion 67 can be selected from silicon oxide and dielectric metal oxides, and the materials of the sacrificial memory opening fill structures 48 and the support opening fill structures 18 (e.g., the material of the first sacrificial fill material portions 481) can include amorphous silicon.

In an illustrative example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The sacrificial retro-stepped dielectric material portion 67, the sacrificial memory opening fill structures 48, and the sacrificial support opening fill structures 18 provide structural support while the lateral recesses 43 are present within volumes previously occupied by the sacrificial material layers 42.

Figure 58:
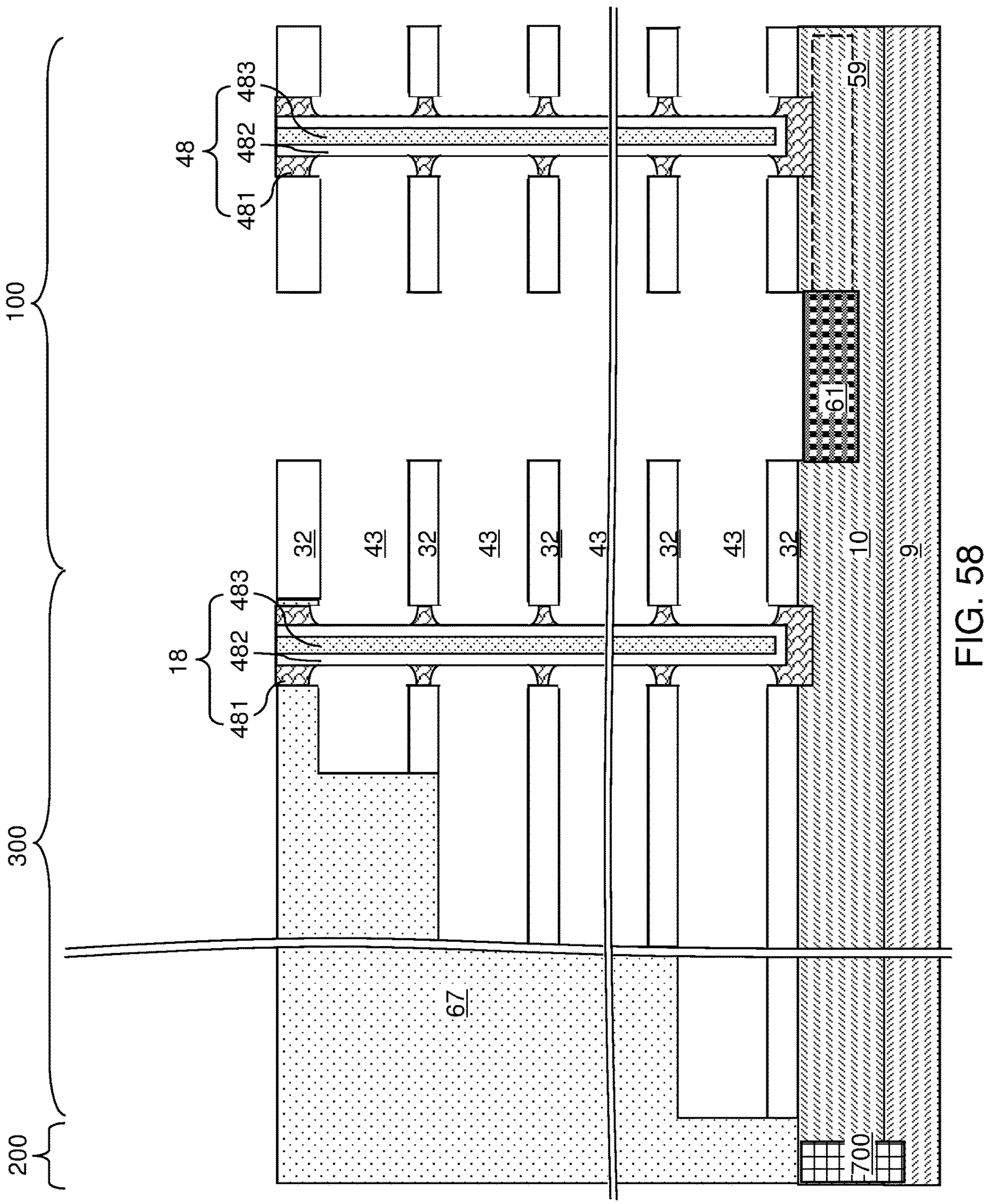
FIG. 58 is a schematic vertical cross-sectional view of the third exemplary structure after removing cylindrical regions of a first sacrificial fill material portion from each of the sacrificial memory opening fill structures and the sacrificial support opening fill structures according to the third embodiment of the present disclosure.

Referring to FIG. 58, cylindrical portions of the sacrificial memory opening fill structures 48 and the sacrificial support opening fill structure 18 are recessed around each of the lateral recesses 43. In one embodiment, cylindrical regions of each first sacrificial fill material portion 481 exposed in the backside recesses 43 can be removed from each of the sacrificial memory opening fill structures 48 and the sacrificial support opening fill structures 18 through each backside recess 43 by performing an isotropic etch process that etches the material of the first sacrificial fill material portions 481 selective to the material of the second sacrificial fill material portions 482. In one embodiment, an isotropic etchant that etches the first sacrificial fill material selective to the second sacrificial fill material can be performed to remove the cylindrical regions of each first sacrificial fill material portion 481 selective to the second sacrificial fill material portions 482. In an illustrative example, the first sacrificial fill material can include amorphous silicon, the second sacrificial fill material can include silicon oxide, and the isotropic etchant can include hot trimethyl-2 hydroxyethyl ammonium hydroxide ("hot TMY") or tetramethyl ammonium hydroxide (TMAH).

Alternatively, if the sacrificial memory opening fill structures 48 and the sacrificial support opening fill structures 18 comprise a single material (e.g., amorphous silicon), then a timed lateral selective etch may be performed to etch (i.e., recess) only the outer portions of the sacrificial memory opening fill structures 48 and the sacrificial support opening fill structures 18.

Figure 59:
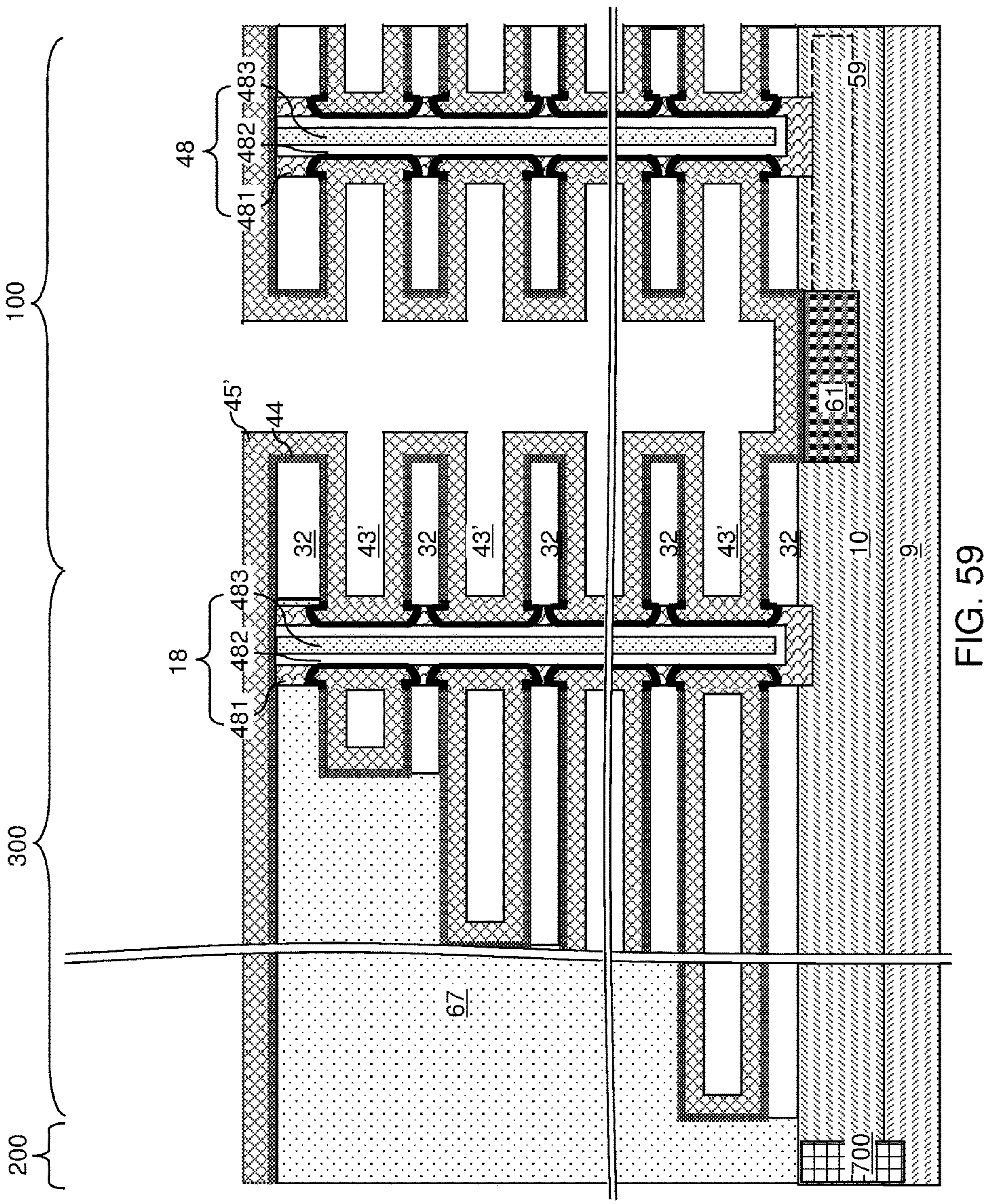
FIG. 59 is a schematic vertical cross-sectional view of the third exemplary structure after formation of an in-process electrically conductive layer according to the third embodiment of the present disclosure.

Referring to FIG. 59, the optional liner 44 and the conductive fill material layer 45' can be deposited at peripheral portions of the lateral recesses 43, as described above with respect to FIGS. 9C and 9H. In this embodiment, the steps of FIGS. 9D to 9G may be omitted. The deposited at least one conductive fill material constitutes an in-process electrically conductive layer (44, 45'). In one embodiment, proximal portions of the at least one conductive fill material of the in-process electrically conductive layer (44, 45') can be deposited within volumes from which a material of the sacrificial memory opening fill structures 48 and the support opening fill structures 18 (such as the material of the cylindrical portions of the first sacrificial fill material portions 481) is removed.

Figure 60:
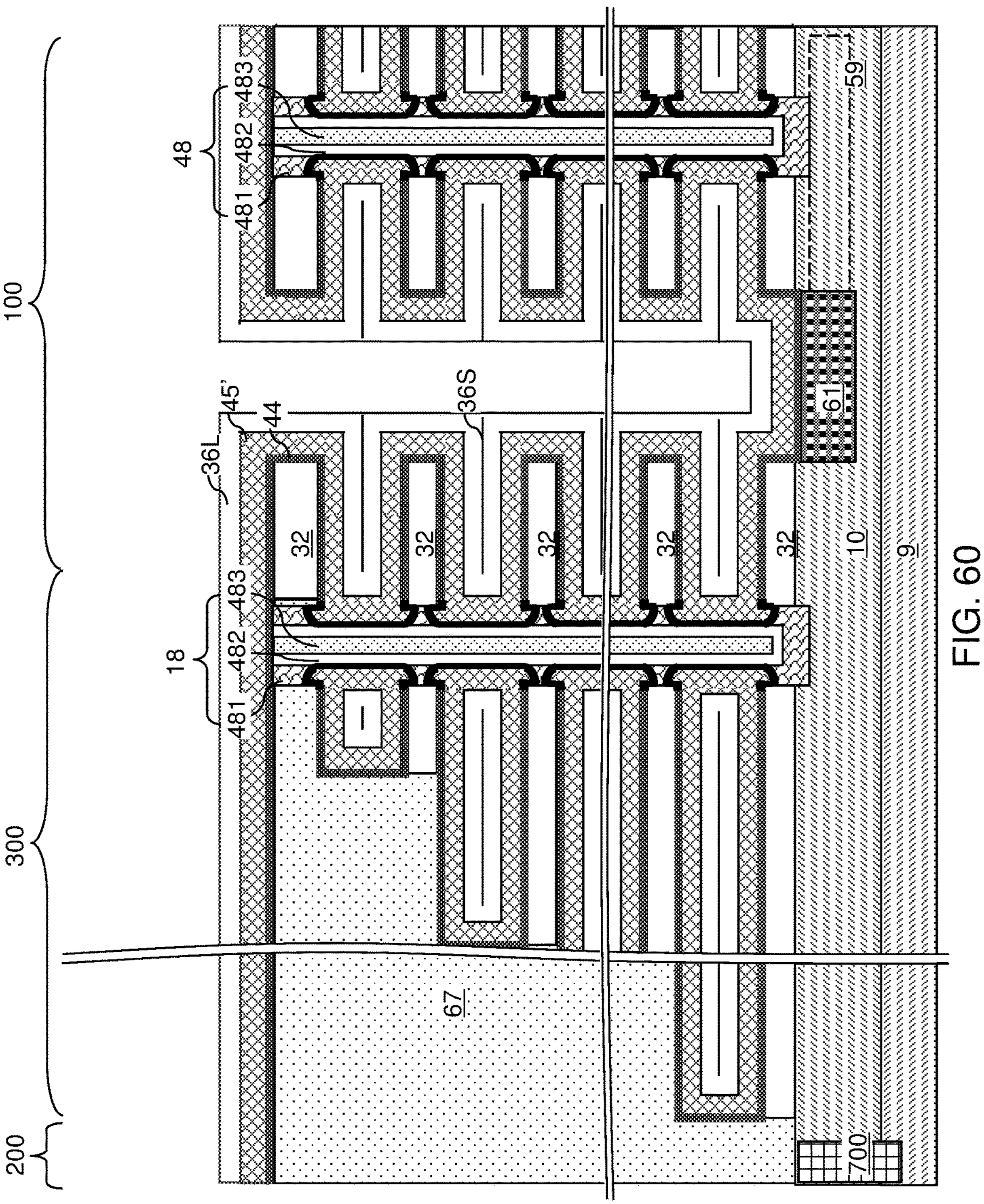
FIG. 60 is a schematic vertical cross-sectional view of the third exemplary structure after formation of an insulating fill material layer according to the third embodiment of the present disclosure.

Referring to FIG. 60, an insulating fill material can be deposited over the at least one conductive fill material (44, 45') within remaining volumes of the lateral recesses 43 by a conformal deposition process, as described above with respect to FIG. 9I. The insulating fill material includes an insulating material, such as undoped silicate glass or a doped silicate glass. The thickness of the insulating fill material can be selected such that a horizontal seam 36S is formed at each levels of the lateral recesses 43. The deposited insulating fill material forms an insulating fill material layer 36L.

Figure 61:
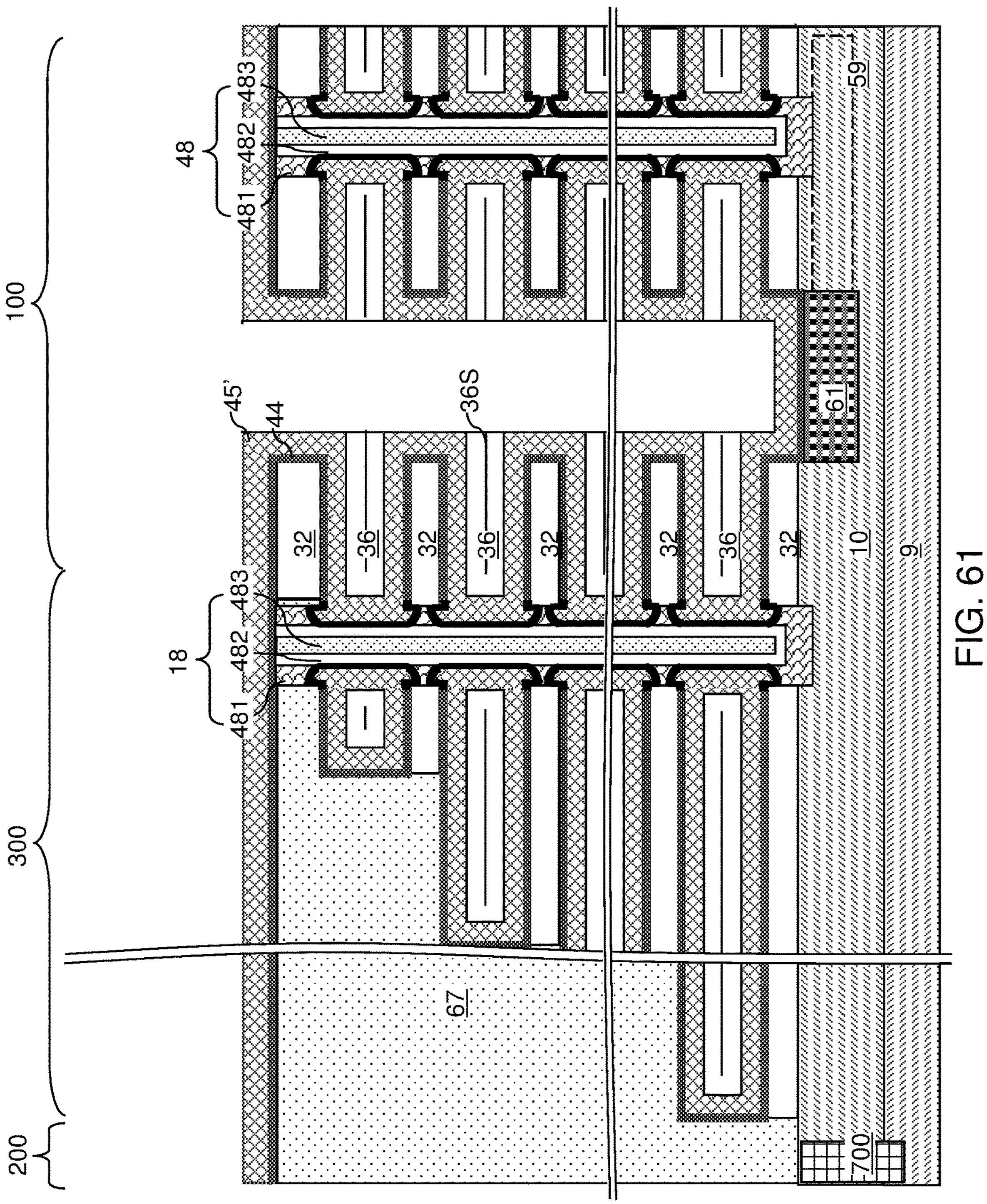
FIG. 61 is a schematic vertical cross-sectional view of the third exemplary structure after formation of second-type insulating layers according to the third embodiment of the present disclosure.

Referring to FIG. 61, an etch-back process can be performed to recess the insulating fill material layer 36L, as described above with respect to FIG. 9J. Remaining portions of the insulating fill material that remain in volumes of the lateral recesses 43 after recessing the insulating fill material from inside the backside trenches 79 comprise seamed insulating layers comprising a respective horizontally-extending seam 36S therein. The seamed insulating layers are herein referred to as second-type insulating layers 36. The second-type insulating layers 36 may include the same material as, or may include a material that is different from, the material of the first-type insulating layers 32. In one embodiment, the horizontally-extending seam 36S within each second-type insulating layer 36 can be equidistant from a horizontal plane including a top surface of the second-type insulating layer 36 and from a horizontal plane including a bottom surface of the second-type insulating layer 36.

Figure 62:
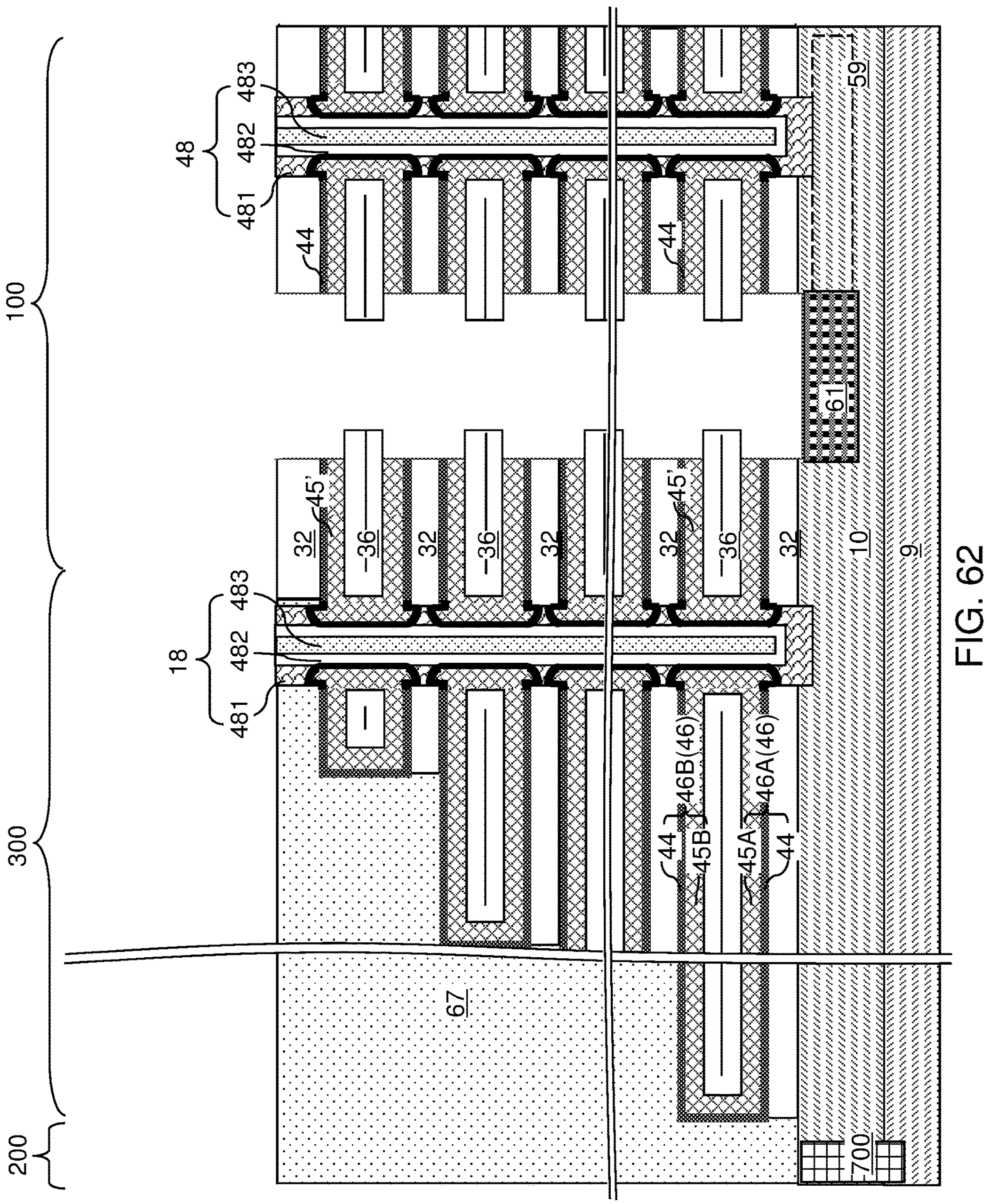
FIG. 62 is a schematic vertical cross-sectional view of the third exemplary structure after isotropically recessing the in-process electrically conductive layer according to the third embodiment of the present disclosure.

Referring to FIG. 62, proximal portions of the at least one conductive fill material of the in-process electrically conductive layers (44, 45') can be removed from around the backside trenches 79 by performing an isotropic etch process that etches the conductive materials of the in-process electrically conductive layers (44, 45'). In one embodiment, the isotropic etch process may be a wet etch process that etches the conductive materials of the in-process electrically conductive layers (44, 45') selective to the materials of the insulating layers (32, 36). The duration of the isotropic etch process can be selected such that each vertically-extending portion of the in-process electrically conductive layers (44, 45') located between a vertically neighboring pair of first-type insulating layers 32 is removed by the isotropic etch process.

Each portion of the at least one conductive fill material filling a respective one of the lateral recesses 43 (i.e., each in-process electrically conductive layers (44, 45')) is divided into a respective pair of a first-type electrically conductive layer 46A and a second-type electrically conductive layer 46B that are disjoined from, and are vertically spaced from, each other. A second-type insulating layer 36 is located between a vertically-neighboring pair of a first-type electrically conductive layer 46A and a second-type electrically conductive layer 46B. Each first-type electrically conductive layer 46A comprises, from bottom to top, a first conductive barrier liner 44 and a first conductive fill material layer 45A. Each second-type electrically conductive layer 46B comprises, from bottom to top, a second conductive fill material layer 45B and a second conductive barrier liner 44. The first conductive fill material layer 46A and the second conductive fill material 46B are in direct contact with horizontal surfaces of the second-type insulating layer 36.

A vertical repetition of multiple instances of a unit layer stack (32, 46A, 36, 46B) can be formed over the substrate (9, 10). The unit layer stack comprises, from bottom to top, a seamless insulating layer (such as a first-type insulating layer 32) that is free of any seam therein, a first-type electrically conductive layer 46A, a seamed insulating layer including a horizontally-extending seam 36S therein (such as a second-type insulating layer 36), and a second-type electrically conductive layer 46B.

Figure 63:
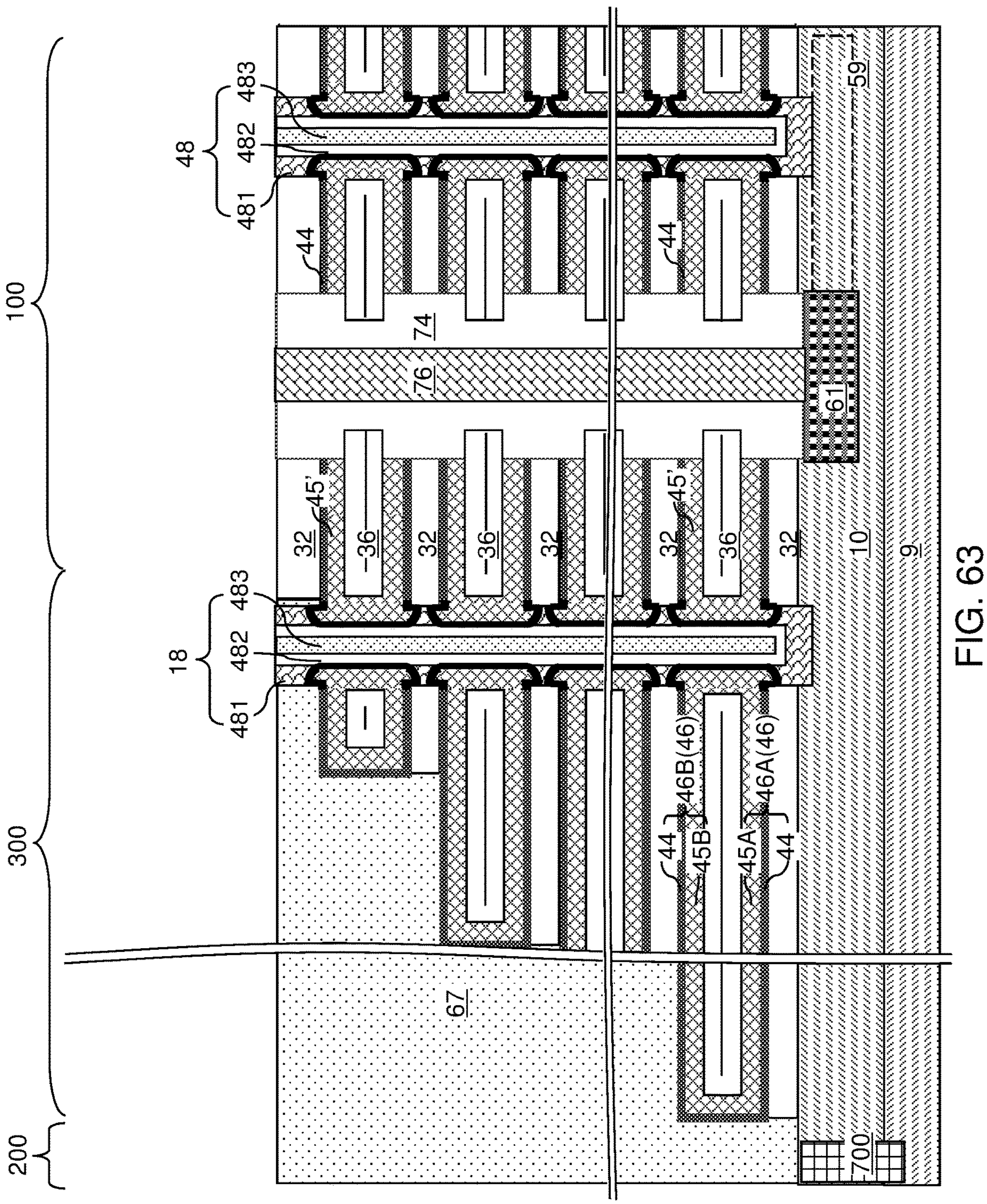
FIG. 63 is a schematic vertical cross-sectional view of the third exemplary structure after formation of backside trench fill structures according to the third embodiment of the present disclosure.

Referring to FIG. 63, the backside trench fill structure (74, 76) can be formed in each respective backside trench 79, as described above with respect to the first embodiment. In one embodiment, each of the first backside trench fill structure (74, 76) and the second backside trench fill structure (74, 76) has a respective laterally-undulating vertical cross-sectional profile in a vertical plane that is perpendicular to the first horizontal direction hd1, and each of the first backside trench fill structure (74, 76) and the second backside trench fill structure (74, 76) has a greater width at levels of the first-type electrically conductive layers 46A, the seamless insulating layers (i.e., the first-type insulating layers 32), and the second-type electrically conductive layers 46B than at levels of the seamed insulating layers (i.e., the second-type insulating layers 36).

In one embodiment, each horizontally-extending seam 36S within the seamed insulating layers 36 is in direct contact with a respective one of the first dielectric surface and the second dielectric surface. In one embodiment, each of the first backside trench fill structure (74, 76) and the second backside trench fill structure (74, 76) comprises a backside contact via structure 76 contacting a respective source region 61 in the substrate (9, 10), and an insulating spacer 74 laterally surrounding the backside contact via structure 76 and comprising a respective one of the first dielectric surface and the second dielectric surface as an outer surface.

Figure 64:
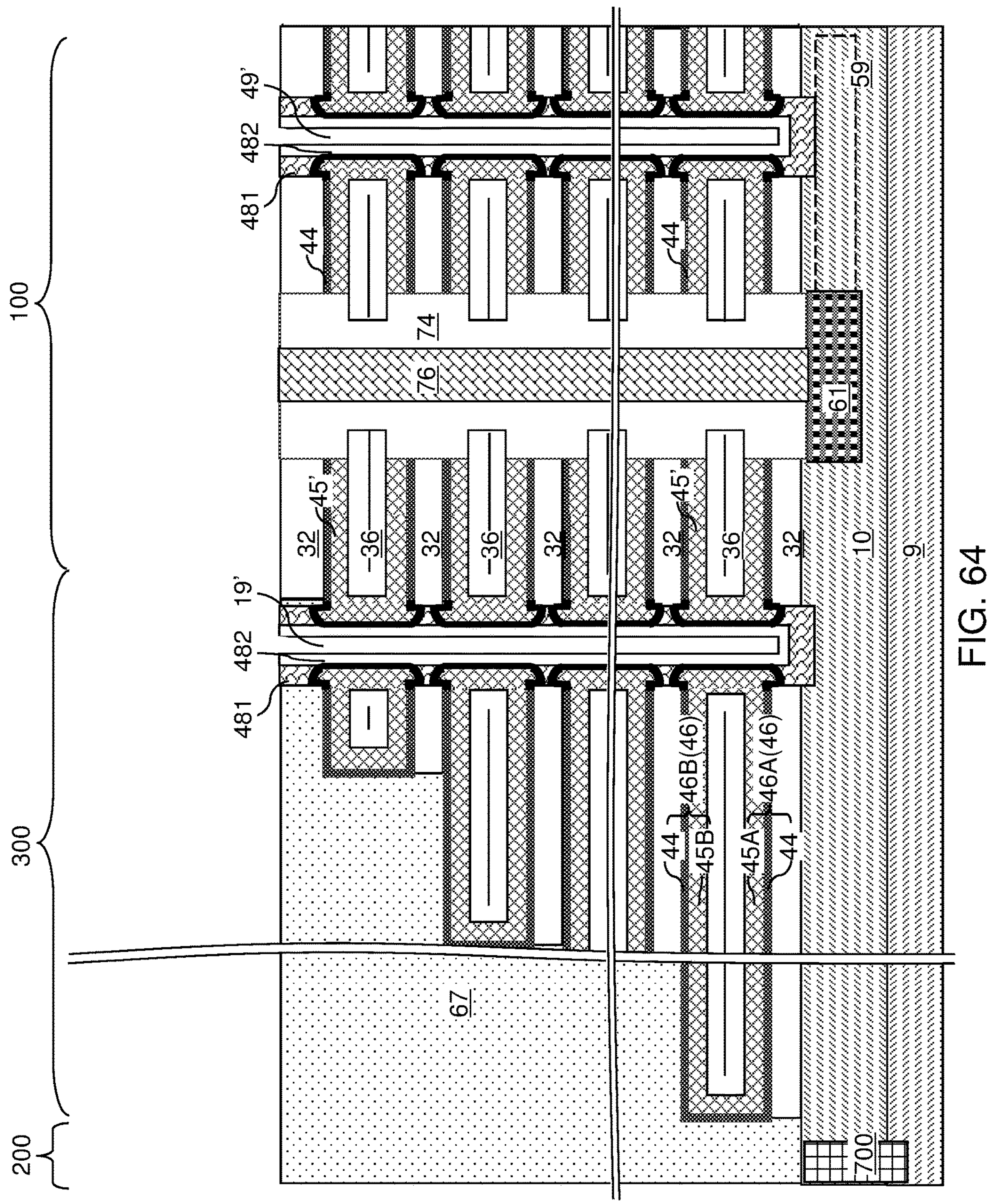
FIG. 64 is a schematic vertical cross-sectional view of the third exemplary structure after removal of third sacrificial fill material portions from the sacrificial memory opening fill structures and the sacrificial support opening fill structures according to the third embodiment of the present disclosure.

Referring to FIG. 64, the third sacrificial fill material portions 483 can be removed from the sacrificial memory opening fill structures 48 and the sacrificial support opening fill structures 18. For example, an isotropic removal process can be performed to remove the material of the third sacrificial fill material portions 483 in the sacrificial memory opening fill structures 48 and the sacrificial support opening fill structures 18 selective to the material of the second sacrificial fill material portions 482. In an illustrative example, if the third sacrificial fill material portions 483 comprise amorphous carbon, an ashing process can be employed to remove the third sacrificial fill material portions 483. A memory cavity 49' or a support cavity 19' is formed in each volume from which a third sacrificial fill material portion 483 is removed.

Figure 65:
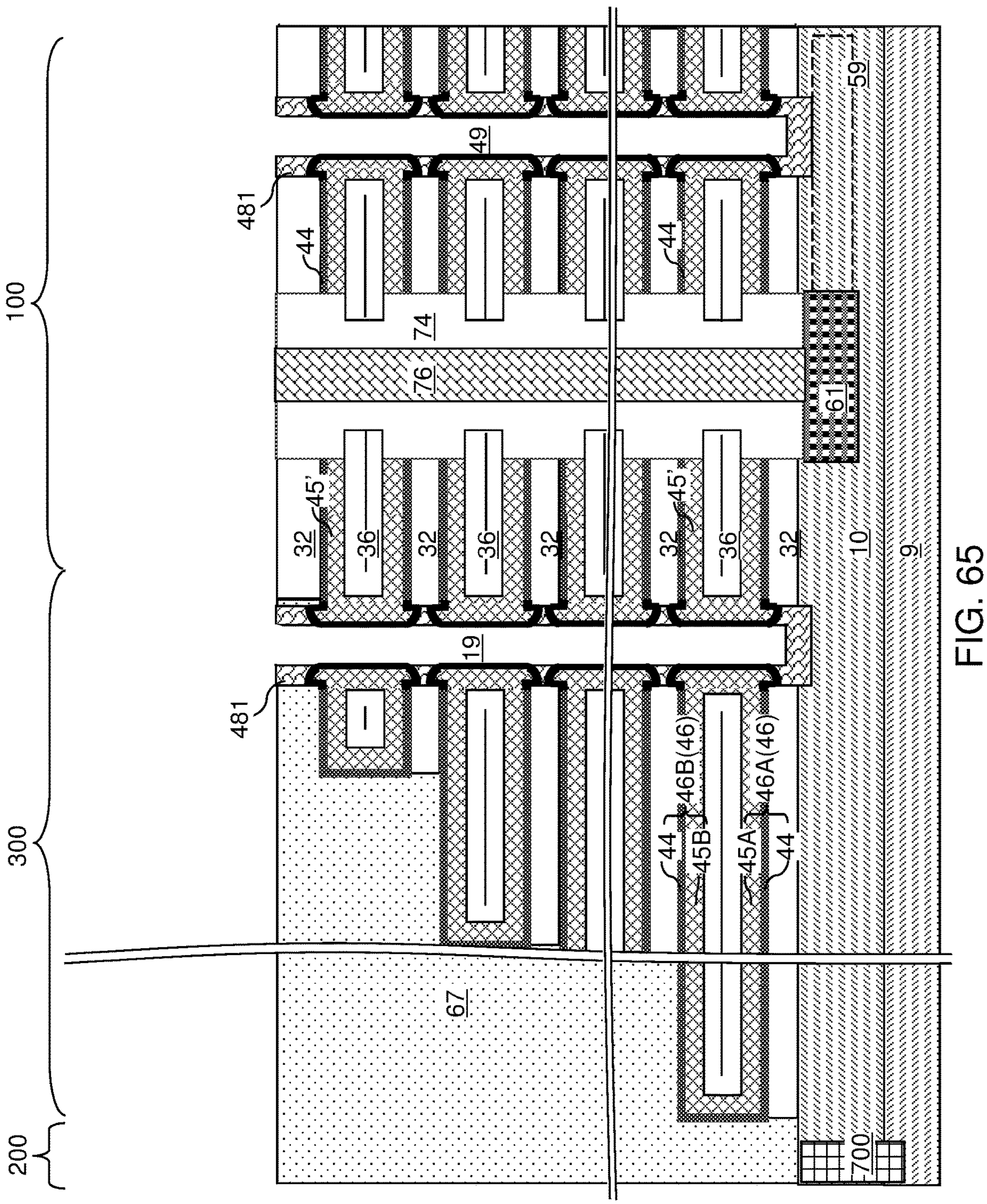
FIG. 65 is a schematic vertical cross-sectional view of the third exemplary structure after removal of second sacrificial fill material portions from the sacrificial memory opening fill structures and the sacrificial support opening fill structures according to the third embodiment of the present disclosure.

Referring to FIG. 65, the second sacrificial fill material portions 482 of the sacrificial memory opening fill structures 48 and the sacrificial support opening fill structures 18 can be removed. For example, if second sacrificial fill material portions 482 comprise silicon oxide, a wet etch process employing dilute hydrofluoric acid can be performed to remove the second sacrificial fill material portions 482.

Figure 66:
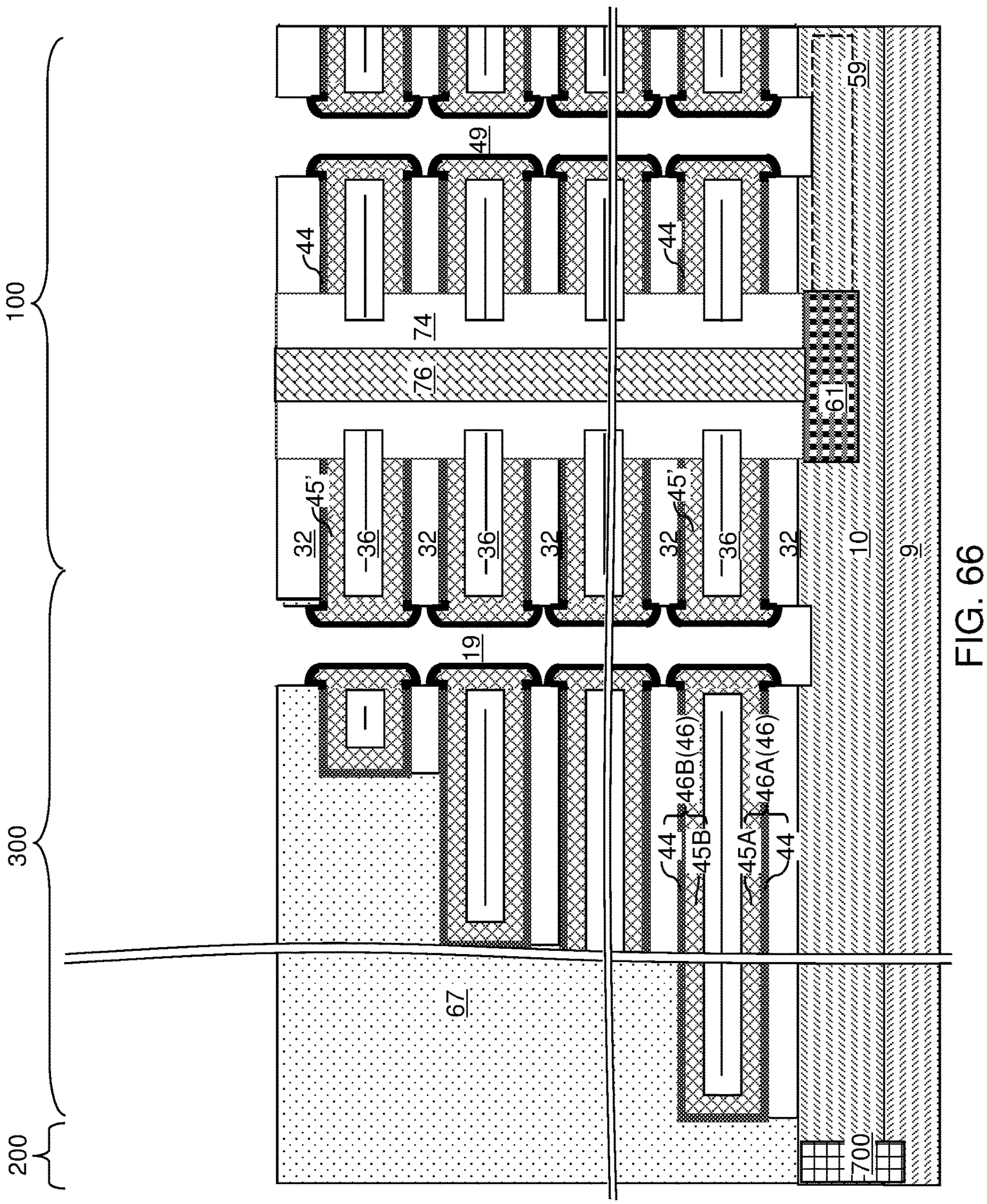
FIG. 66 is schematic vertical cross-sectional view of the third exemplary structure after removal of first sacrificial fill material portions from the sacrificial memory opening fill structures and the sacrificial support opening fill structures according to the third embodiment of the present disclosure.

Referring to FIG. 66, the first sacrificial fill material portions 481 of the sacrificial memory opening fill structures 48 and the sacrificial support opening fill structures 18 can be removed. For example, if first sacrificial fill material portions 481 comprise amorphous silicon, a wet etch process employing hot trimethyl-2 hydroxyethyl ammonium hydroxide ("hot TMY") or tetramethyl ammonium hydroxide (TMAH) can be performed to remove the first sacrificial fill material portions 481. The entirety of the sacrificial memory opening fill structures 48 and the support opening fill structures 18 can be removed. Voids are formed within the volumes of the memory cavities 49 and the support cavities 19.

In the alternative embodiment in which the sacrificial memory opening fill structures 48 and the support opening fill structures 18 include only one material, such as amorphous silicon, the steps of FIGS. 64 and 65 may be omitted. Instead, the entire remaining portions of the sacrificial memory opening fill structures 48 and the support opening fill structures 18 are removed in one etching step described above with respect to FIG. 66.

Figure 67:
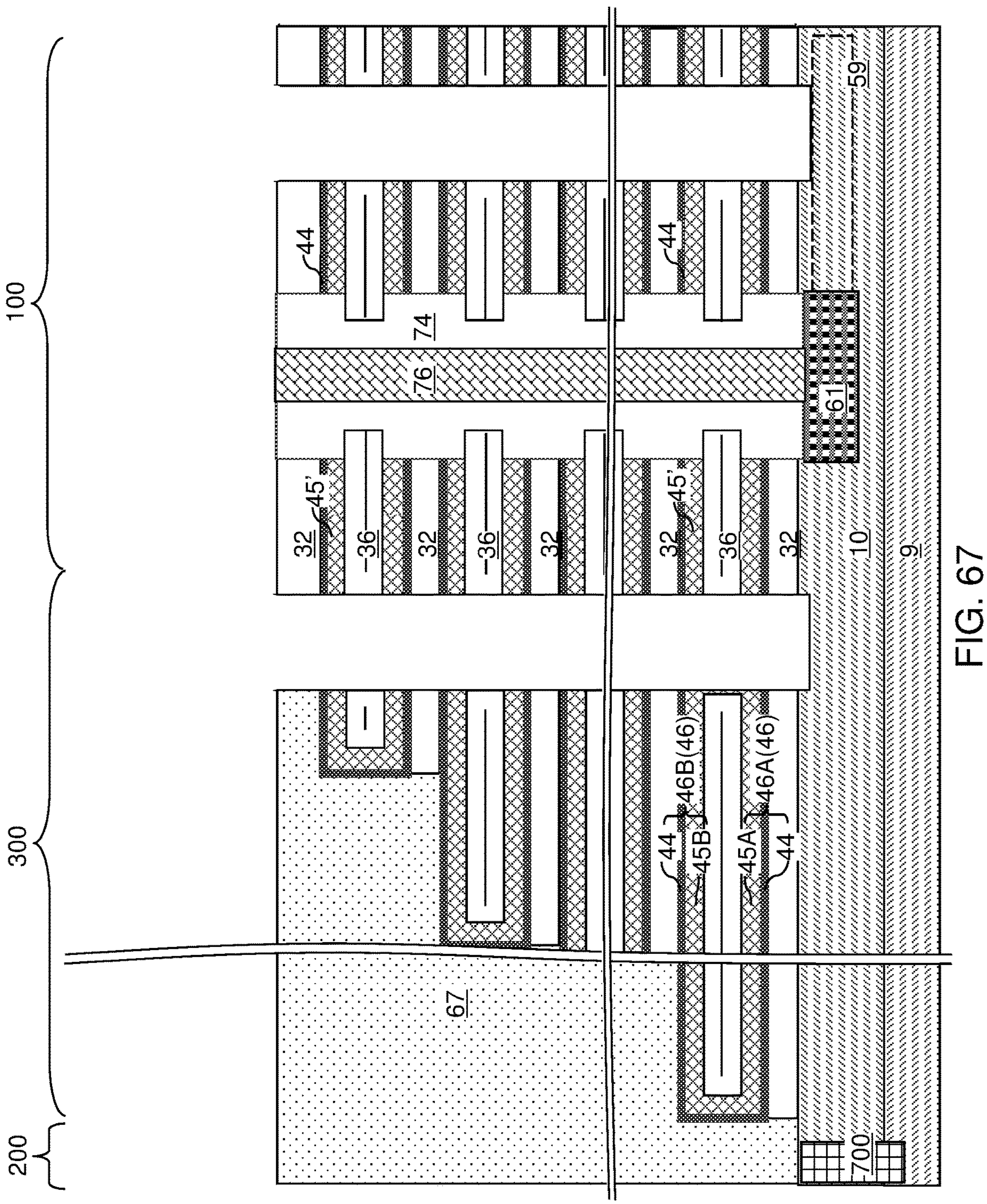
FIG. 67 is schematic vertical cross-sectional view of the third exemplary structure after removal of proximal portions of at least one conductive fill material from around the memory openings and the support openings according to the third embodiment of the present disclosure.

Referring to FIG. 67, an etch process that etches the materials of the electrically conductive layers (46A, 46B) selective to the materials of the insulating layers (32, 36) and the sacrificial retro-stepped dielectric material portion 67 can be performed. Proximal portions of the at least one conductive fill material of the first-type electrically conductive layers 46A and the second-type electrically conductive layers 46B can be removed from around the memory cavities 49 and the support cavities 19. In one embodiment, voids are formed within volumes of the memory openings 49 and within volumes of the support openings 19. In other words, the volumes of the memory cavities 49 can include the volumes of the memory openings 49 as formed at the processing steps of FIGS. 54A and 54B, and the volumes of the support cavities 19 can include the volumes of the support openings 19 as formed at the processing steps of FIGS. 54A and 54B. Sidewalls of the second-type insulating layers 36 (which include the deposited insulating fill material) are physically exposed after removing the proximal portions of the at least one conductive fill material from around the memory cavities 49.

Figure 68:
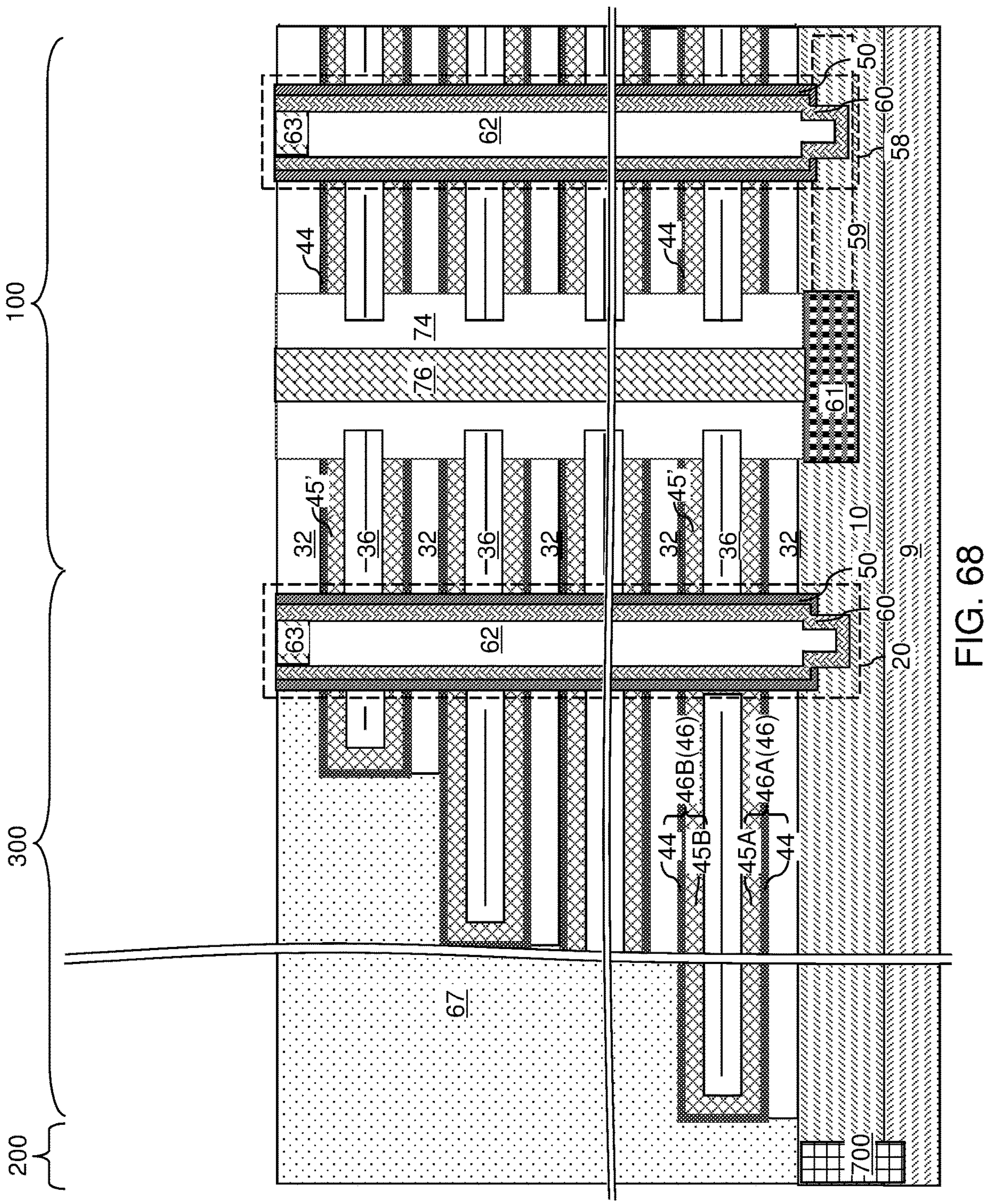
FIG. 68 is schematic vertical cross-sectional view of the third exemplary structure after formation of memory opening fill structures and support opening fill structures according to the third embodiment of the present disclosure.

Referring to FIG. 68, the processing steps of FIGS. 10B-10F can be performed to form a memory opening fill structure 58 within each memory opening 49, and to form a support pillar structure 20 within each support cavities 19. In one embodiment, the memory opening fill structures 58 can be formed within volumes of the memory cavities 49, and the support pillars 20 can be formed within the volumes of the support openings 19. In one embodiment, the memory opening fill structures 58 may be formed by forming a memory film 50 including a respective vertical stack of memory elements within each of the memory cavities 49, forming a vertical semiconductor channel 60 over the memory film 50 within each of the memory cavities 49, and forming a drain region 63 at a top end of the vertical semiconductor channel 60 within each of the memory cavities 49.

Figure 69:
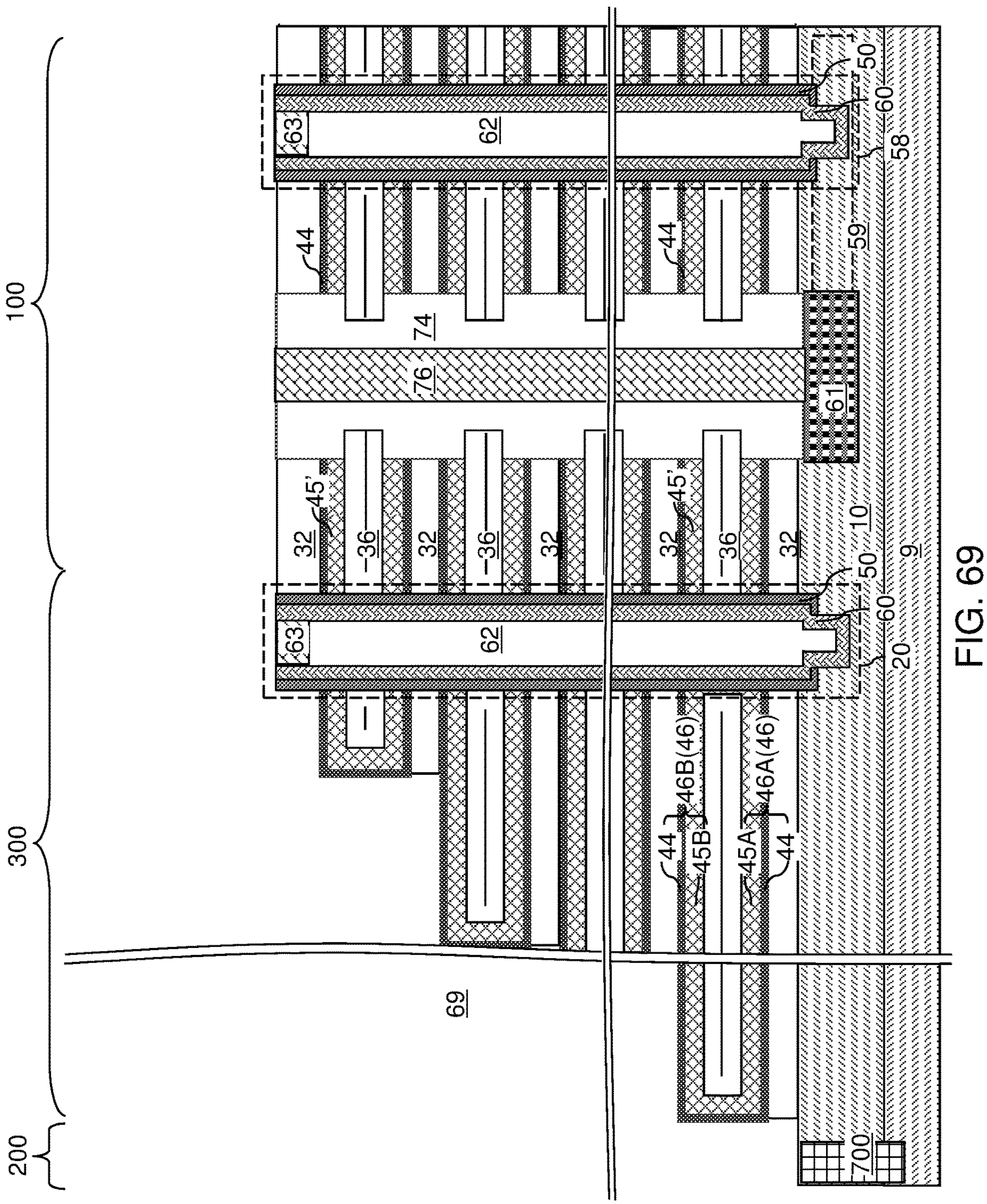
FIG. 69 is a schematic vertical cross-sectional view of the third exemplary structure after removal of the sacrificial retro-stepped dielectric material portion according to the third embodiment of the present disclosure.

Referring to FIG. 69, the processing steps of FIG. 16 can be performed to remove the sacrificial retro-stepped dielectric material portion 67 selective to the materials of the first-type insulating layers 32, the electrically conductive layers (46A, 46B), the memory opening fill structures 58, and the support pillar structures 20.

Figure 70:
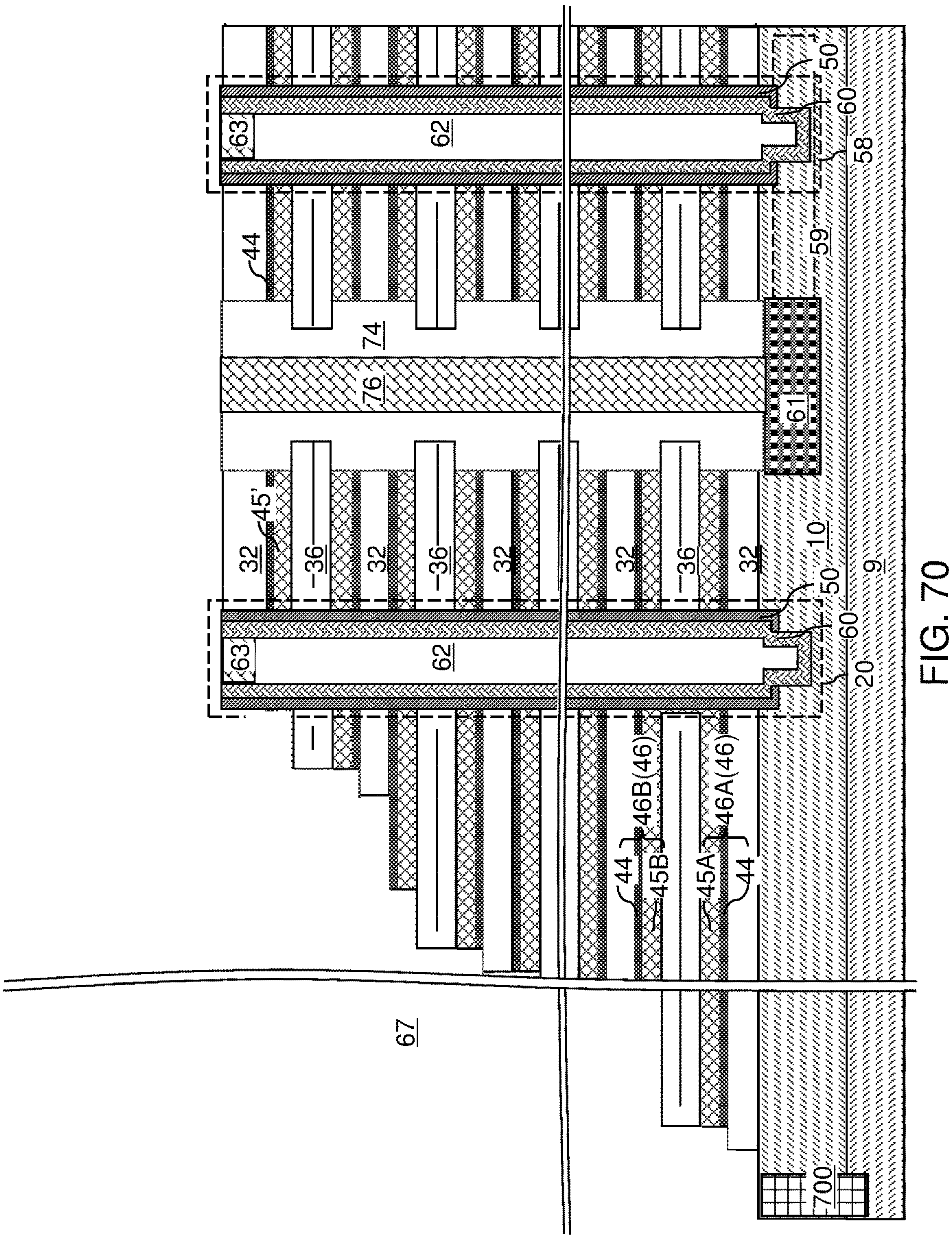
FIG. 70 is a schematic vertical cross-sectional view of the third exemplary structure after isotropic recessing of the in-process electrically conductive layers according to the third embodiment of the present disclosure.

Referring to FIG. 70, the processing steps of FIG. 17 can be performed.

Figure 71A:
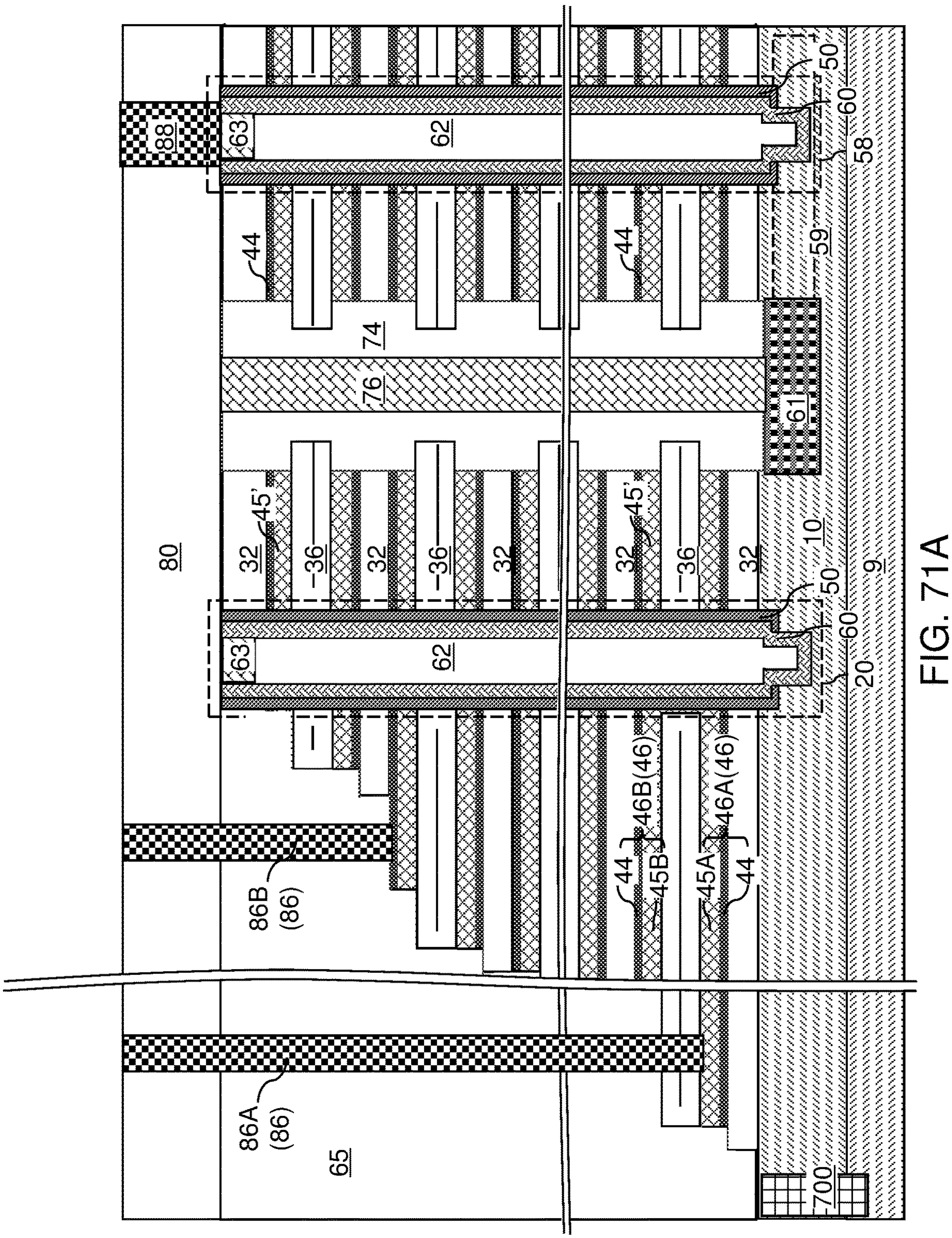
FIG. 71A is a schematic vertical cross-sectional view of the third exemplary structure after formation of contact via structures according to the third embodiment of the present disclosure.
Figure 71B:
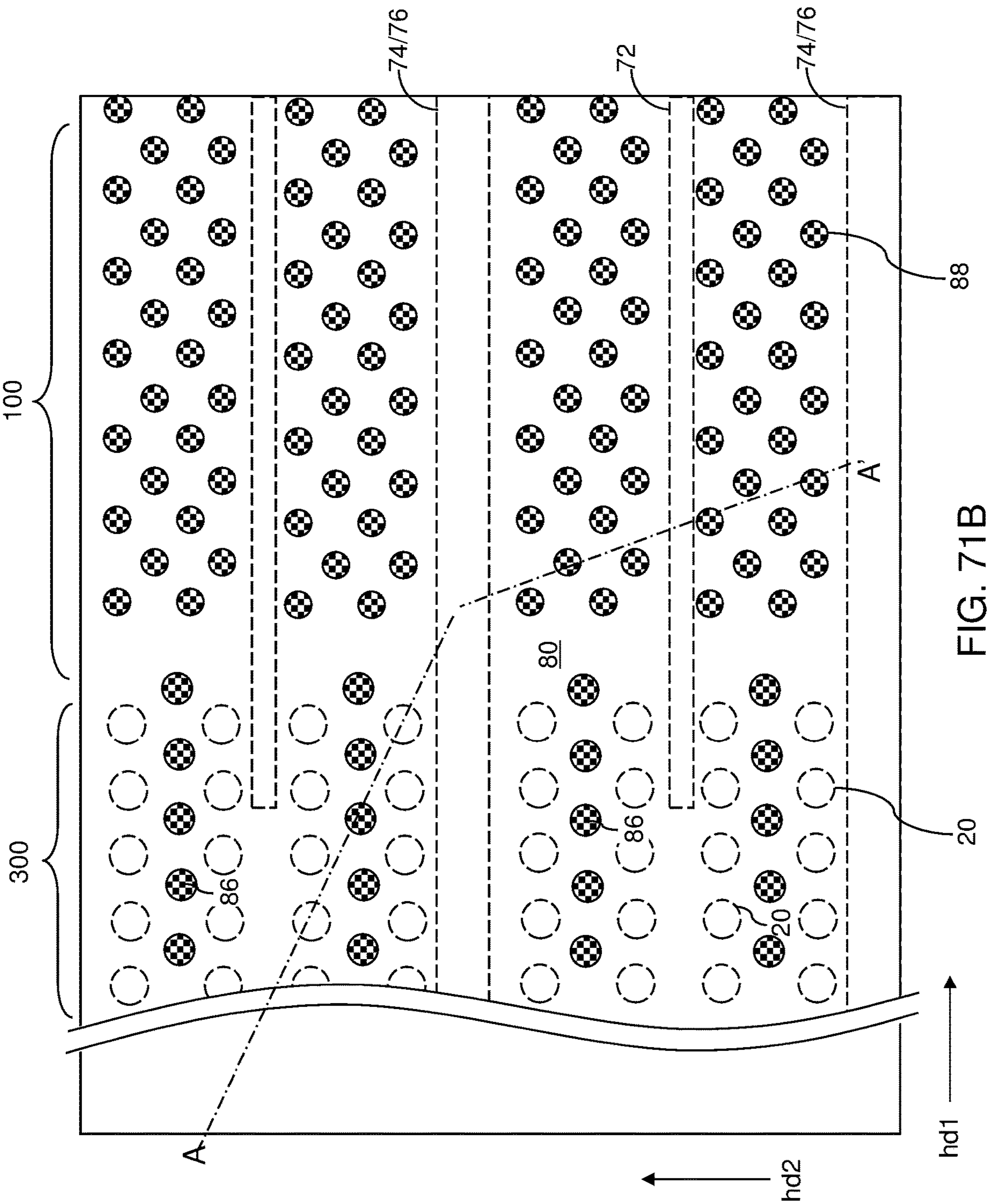
FIG. 71B is a top-down view of the third exemplary structure of FIG. 71A. The vertical plane A-A' is the plane of the vertical cross-sectional view of FIG. 71A.

Referring to FIGS. 71A and 71B, the processing steps of FIGS. 18A-18C, 19A-19C, and 20A-20C can be performed to pattern the stepped surfaces in the contact region 300, to form a retro-stepped dielectric material portion 65, and to form various contact via structures (88, 85A, 85B). The three-dimensional memory device may comprise a retro-stepped dielectric material portion 65 overlying stepped surfaces of the vertically repetition of a unit layer stack (32, 46A, 36, 46B), first-type contact via structures 86A vertically extending through the retro-stepped dielectric material portion 65 and contacting a top surface of a respective instance of the first-type electrically conductive layer 46A, and second-type contact via structures 86B vertically extending through the retro-stepped dielectric material portion 65 and contacting a top surface of a respective instance of the second-type electrically conductive layer 86B.

Figure 72:
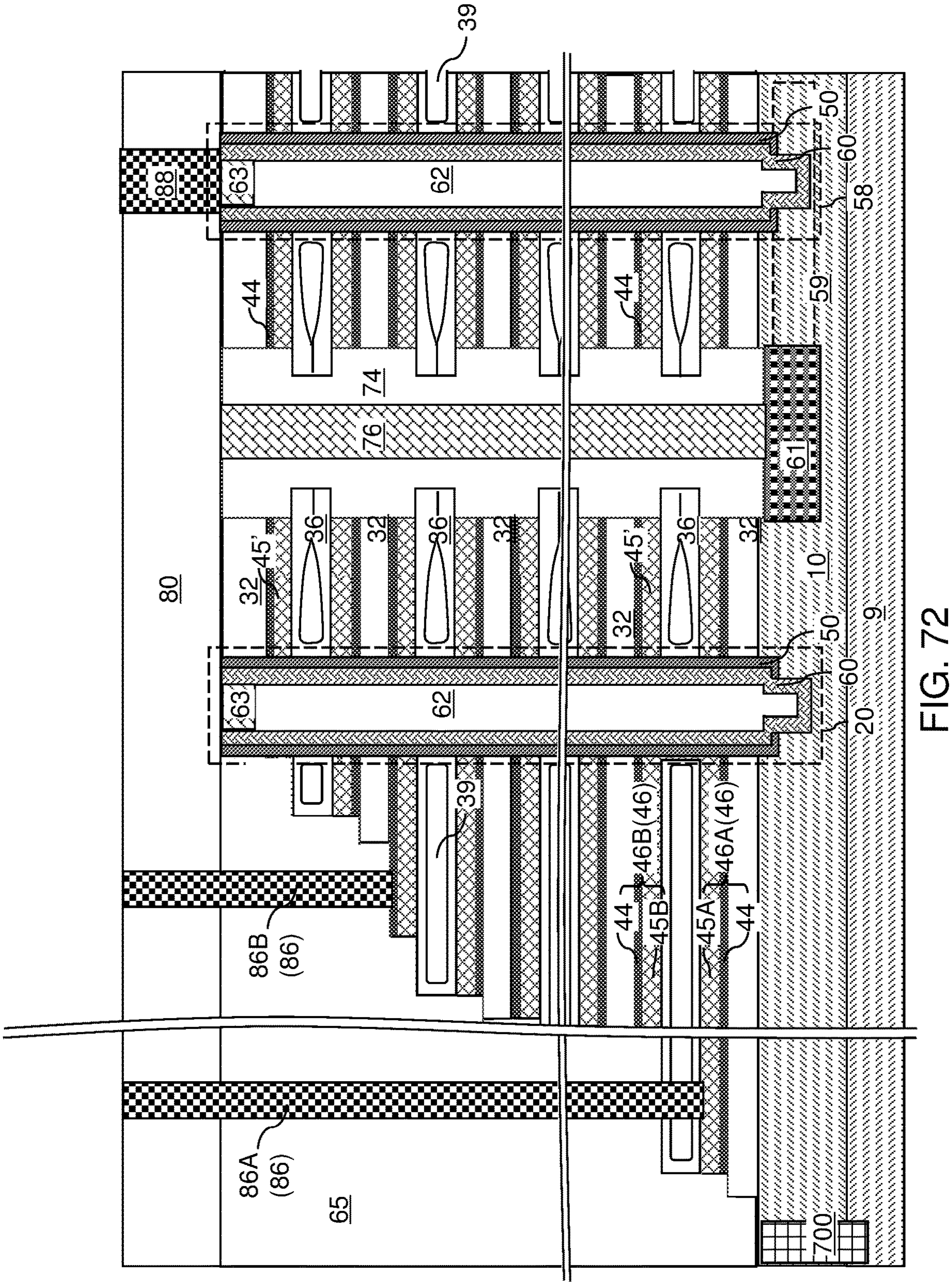
FIG. 72 is a schematic vertical cross-sectional view of an alternative configuration of the third exemplary structure according to the third embodiment of the present disclosure.

Referring to FIG. 72, an alternative configuration of the third exemplary structure according to the third embodiment of the present disclosure can be derived from the third exemplary structure by employing a non-conformal deposition process at the processing step of FIG. 60 to deposit an insulating fill material layer 36L. In this case, at least one instance, or each instance, of the seamed insulating layers (i.e., the second-type insulating layers 36) comprises the air gap 39 that is free of any solid phase material and is encapsulated by a dielectric material layer (i.e., one of the second-type insulating layers 36). The dielectric material layer has an upper horizontally-extending portion and a lower horizontally-extending portion that are adjoined to each other at a periphery of the air gap 39 at a respective horizontally-extending seam 36S.

In one alternative configuration of the third exemplary structure, the memory opening fill structures 58 comprises a respective laterally-undulating outer sidewall that extends through each layer within the vertical repetition (32, 46A, 36, 46B) and laterally protrudes outward at levels of the first-type electrically conductive layers 46A, the second-type electrically conductive layers 46B, and the levels of the first-type insulating layers 32 relative to levels of the second-type (seamed) insulating layers 36, similar to that shown in FIG. 13. In other words, the second-type (seamed) insulating layers 36 protrude inwards into the laterally-undulating outer sidewall of the memory opening fill structures 58. This decreases neighboring word line interference.

In another alternative configuration of the third exemplary structure, the second-type (seamed) insulating layers 36 have a different thickness than the first-type insulating layers 32. For example, the second-type (seamed) insulating layers 36 are thinner (e.g., 20 to 100% thinner) than the first-type insulating layers 32. This decreases the overall thickness of the vertical repetition.

Referring to all drawings related to the third embodiment of the present disclosure, a three-dimensional memory device is provided, which comprises: a vertical repetition of multiple instances of a unit layer stack, wherein the unit layer stack comprises, from bottom to top, a first-type insulating layer 32, a first-type electrically conductive layer 46A comprising a first conductive barrier liner 44 and a first conductive fill material layer 45A, a second-type insulating layer 36, and a second-type electrically conductive layer 46B comprising a second conductive fill material layer 45B and a second conductive barrier liner 44; memory openings 49 vertically extending through the vertical repetition; and memory opening fill structures 58 located within the memory openings 49, wherein each of the memory opening fill structures 58 comprises a respective vertical stack of memory elements. The first conductive fill material layer 45A and the second conductive fill material layer 45B are in direct contact with horizontal surfaces of the second-type insulating layer 36. The first conductive barrier liner 44 is in direct contact with a horizontal surface of the first-type insulating layer 32. The second conductive barrier liner 44 is in direct contact with a horizontal surface of another first-type insulating layer 32 of an adjacent unit layer stack.

In one embodiment, within each instance of the unit layer stack: an entirety of a bottom surface of the second-type insulating layer 36 is in direct contact with a top surface of the first conductive fill material layer 45A; and an entirety of a bottom surface of the second conductive fill material layer 45B is in direct contact with a top surface of the second-type insulating layer 36.

In one embodiment, within each instance of the unit layer stack: an entirety of a bottom surface of the first conductive fill material layer 45A is in direct contact with a top surface of the first conductive barrier liner 44; and an entirety of a bottom surface of the second conductive barrier liner 44 is in direct contact with a top surface of the second conductive fill material layer 45B.

In one embodiment, each instance of the first conductive fill material layer 45A and the second conductive fill material layer 45B has a same conductive fill material composition and a same conductive fill material thickness. In one embodiment, each instance of the first conductive barrier liner 44 and the second conductive barrier liner 44 has a same conductive liner composition and a same conductive liner thickness.

In one embodiment, within each instance of the unit layer stack: the first-type insulating layer 32 comprises a seamless insulating layer that is free of any seam therein; and the second-type insulating layer 36 comprises a seamed insulating layer including a horizontally-extending seam 36S therein.

In one embodiment, each of the memory opening fill structures 58 is laterally spaced from the horizontally-extending seams 36S by a respective seamless portion of the seamed insulating layers 36.

In one embodiment, the horizontally-extending seam within the seamed insulating layer 36 in each instance of the unit layer stack is equidistant from a horizontal interface between the seamed insulating layer 36 and the second-type electrically conductive layer 46B; and from a horizontal interface between the seamed insulating layer 36 and the first-type electrically conductive layer 46A.

In one embodiment, the three-dimensional memory device comprises: a first backside trench fill structure (74, 76) comprising a first dielectric surface contacting first sidewalls of each layer within the vertical repetition and laterally extending along a first horizontal direction hd1; and a second backside trench fill structure (74, 76) comprising a second dielectric surface contacting second sidewalls of each layer within the vertical repetition laterally extending along the first horizontal direction hd1, and laterally spaced from the first backside trench fill structure (74, 76) along a second horizontal direction hd2.

In one embodiment, each of the first backside trench fill structure (74, 76) and the second backside trench fill structure (74, 76) has a respective laterally-undulating vertical cross-sectional profile in the second horizontal direction hd2; and each of the first backside trench fill structure (74, 76) and the second backside trench fill structure (74, 76) has a greater width at levels of the first-type electrically conductive layers 46A, the seamless insulating layers 32, and the second-type electrically conductive layers 46B than at levels of the seamed insulating layers 36.

In one embodiment, each horizontally-extending seam 36S within the seamed insulating layers 36 is in direct contact with a respective one of the first dielectric surface and the second dielectric surface.

In one embodiment, each of the first backside trench fill structure (74, 76) and the second backside trench fill structure (74, 76) comprises: a backside contact via structure 76 contacting a respective source region 61 in the substrate (9, 10); and an insulating spacer 74 laterally surrounding the backside contact via structure 76 and comprising a respective one of the first dielectric surface and the second dielectric surface as an outer surface.

In one embodiment, at least one instance of the seamed insulating layers 36 comprises an air gap 39 encapsulated by a dielectric material layer having an upper horizontally-extending portion and a lower horizontally-extending portion that are adjoined to each other at a periphery of the air gap at a respective horizontally-extending seam 36S. In one embodiment, the seams may be spaced from the retro-stepped dielectric material portion 65 in a first area of a staircase region, and may contact the retro-stepped dielectric material portion 65 in a second area of the staircase region.

The various exemplary structures can include a three-dimensional memory device. In one embodiment, the three-dimensional memory device comprises a three-dimensional NAND memory device. The electrically conductive layers 46 can comprise, or can be electrically connected to, a respective word line of the three-dimensional NAND memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:

a vertical repetition of multiple instances of a unit layer stack, wherein the unit layer stack comprises, from bottom to top, a first-type insulating layer, a first-type electrically conductive layer comprising a first conductive barrier liner and a first conductive fill material layer, a second-type insulating layer, and a second-type electrically conductive layer comprising a second conductive fill material layer and a second conductive barrier liner;

memory openings vertically extending through the vertical repetition; and memory opening fill structures located within the memory openings, wherein each of the memory opening fill structures comprises a respective vertical stack of memory elements;

wherein:

the first conductive fill material layer and the second conductive fill material layer are in direct contact with horizontal surfaces of the second-type insulating layer;

the first conductive barrier liner is in direct contact with a horizontal surface of the first-type insulating layer; and the second conductive barrier liner is in direct contact with a horizontal surface of another first-type insulating layer of an adjacent unit layer stack.

2. The three-dimensional memory device of claim 1, wherein within each instance of the unit layer stack:

an entirety of a bottom surface of the second-type insulating layer is in direct contact with a top surface of the first conductive fill material layer; and an entirety of a bottom surface of the second conductive fill material layer is in direct contact with a top surface of the second-type insulating layer.

3. The three-dimensional memory device of claim 1, wherein, within each instance of the unit layer stack:

an entirety of a bottom surface of the first conductive fill material layer is in direct contact with a top surface of the first conductive barrier liner; and an entirety of a bottom surface of the second conductive barrier liner is in direct contact with a top surface of the second conductive fill material layer.

4. The three-dimensional memory device of claim 1, wherein each instance of the first conductive fill material layer and the second conductive fill material layer has a same conductive fill material composition and a same conductive fill material thickness.

5. The three-dimensional memory device of claim 4, wherein each instance of the first conductive barrier liner and the second conductive barrier liner has a same conductive liner composition and a same conductive liner thickness.

6. The three-dimensional memory device of claim 1, wherein within each instance of the unit layer stack:

the first-type insulating layer comprises a seamless insulating layer that is free of any seam therein; and the second-type insulating layer comprises a seamed insulating layer including a horizontally-extending seam therein.

7. The three-dimensional memory device of claim 6, wherein each of the memory opening fill structures is laterally spaced from each horizontally-extending seam by a respective seamless portion of the seamed insulating layer.

8. The three-dimensional memory device of claim 6, wherein the horizontally-extending seam within the seamed insulating layer in each instance of the unit layer stack is equidistant from a horizontal interface between the seamed insulating layer and the second-type electrically conductive layer, and from a horizontal interface between the seamed insulating layer and the first-type electrically conductive layer.

9. The three-dimensional device of claim 6, further comprising:

a first backside trench fill structure comprising a first dielectric surface contacting first sidewalls of each layer within the vertical repetition and laterally extending along a first horizontal direction; and a second backside trench fill structure comprising a second dielectric surface contacting second sidewalls of each layer within a first vertical repetition of the vertical repetition of multiple instances, laterally extending along the first horizontal direction, and laterally spaced from the first backside trench fill structure along a second horizontal direction.

10. The three-dimensional memory device of claim 9, wherein:

each of the first backside trench fill structure and the second backside trench fill structure has a respective laterally-undulating vertical cross-sectional profile in the second horizontal direction; and each of the first backside trench fill structure and the second backside trench fill structure has a greater width at levels of each of the first-type electrically conductive layer, seamless insulating layer, and second-type electrically conductive than at levels of each seamed insulating layer.

11. The three-dimensional memory device of claim 9, wherein each horizontally-extending seam within each seamed insulating layer is in direct contact with a respective one of the first dielectric surface and the second dielectric surface.

12. The three-dimensional memory device of claim 9, wherein each of the first backside trench fill structure and the second backside trench fill structure comprises:

a backside contact via structure contacting a respective source region in a substrate; and an insulating spacer laterally surrounding the backside contact via structure and comprising a respective one of the first dielectric surface and the second dielectric surface as an outer surface.

13. The three-dimensional memory device of claim 6, wherein the seamed insulating layer comprises an air gap encapsulated by a dielectric material layer having an upper horizontally-extending portion and a lower horizontally-extending portion that are adjoined to each other at a periphery of the air gap at the horizontally-extending seam.

14. The three-dimensional memory device of claim 1, further comprising:

a retro-stepped dielectric material portion overlying stepped surfaces of the vertical repetition;

first-type contact via structures vertically extending through the retro-stepped dielectric material portion and contacting a top surface of a respective instance of the first-type electrically conductive layer; and second-type contact via structures vertically extending through the retro-stepped dielectric material portion and contacting a top surface of a respective instance of the second-type electrically conductive layer.

* * * * *